United States Patent
Szwarcman et al.

(10) Patent No.: US 11,275,265 B2
(45) Date of Patent: Mar. 15, 2022

(54) CONTROL OF ILLUMINATION SPECTRA FOR LCD DISPLAYS

(71) Applicant: StoreDot Ltd., Herzeliya (IL)

(72) Inventors: Daniel Szwarcman, Pardes-Hanna Karkur (IL); Ziv Sobol, Ra'anana (IL)

(73) Assignee: MOLECULED LTD., Herzeliya (IL)

( * ) Notice: Subject to any disclaimer, the term of this patent is extended or adjusted under 35 U.S.C. 154(b) by 0 days.

(21) Appl. No.: 15/691,775

(22) Filed: Aug. 31, 2017

(65) Prior Publication Data
US 2018/0039131 A1 Feb. 8, 2018

Related U.S. Application Data

(63) Continuation-in-part of application No. 15/353,015, filed on Nov. 16, 2016, now Pat. No. 9,868,859.
(Continued)

(51) Int. Cl.
*C09K 11/06* (2006.01)
*G02F 1/1335* (2006.01)
(Continued)

(52) U.S. Cl.
CPC ..... *G02F 1/133514* (2013.01); *C08G 83/001* (2013.01); *C09B 11/12* (2013.01);
(Continued)

(58) Field of Classification Search
CPC ......... G02F 1/133514; G02F 1/133617; G02F 1/133621; G02F 2001/133614;
(Continued)

(56) References Cited

U.S. PATENT DOCUMENTS 3,996,192 A 12/1976 Hahnke et al.
5,250,214 A 10/1993 Kanemoto et al.
(Continued)

FOREIGN PATENT DOCUMENTS

EP 0805441 11/1997
EP 2253635 11/2010
(Continued)

OTHER PUBLICATIONS

U.S. Appl. No. 15/959,329, filed Apr. 23, 2018, Szwarcman et al.
(Continued)

*Primary Examiner* — Ruiyun Zhang
(74) *Attorney, Agent, or Firm* — Reches Patents

(57) ABSTRACT

Color conversion films for a LCD (liquid crystal display) having RGB (red, green, blue) color filters, as well as such displays, formulations, precursors and methods are provided, which improve display performances with respect to color gamut, energy efficiency, materials and costs. The color conversion films absorb backlight illumination and convert the energy to green and/or red emission at high efficiency, specified wavelength ranges and narrow emission peaks. Film integration and display configurations further enhance the display performance with color conversion films utilizing various color conversion elements and possibly patterned and/or integrated with a crosstalk blocking matrix. For example, color conversion and/or assistant dyes may be used to enhance spectral regions transmitted through the color filters and shape the illumination spectrum, to improve efficiency and performance.

3 Claims, 62 Drawing Sheets

Related U.S. Application Data which is a continuation-in-part of application No. 15/252,597, filed on Aug. 31, 2016, now Pat. No. 10,100,197, and a continuation-in-part of application No. 15/252,492, filed on Aug. 31, 2016, now Pat. No. 9,771,480.

(60) Provisional application No. 62/255,853, filed on Nov. 16, 2015, provisional application No. 62/255,860, filed on Nov. 16, 2015, provisional application No. 62/255,857, filed on Nov. 16, 2015.

(51) Int. Cl.

| | |
|---|---|
| *C09B 11/24* | (2006.01) |
| *C09B 69/00* | (2006.01) |
| *C09B 11/12* | (2006.01) |
| *G02F 1/13357* | (2006.01) |
| *C09K 11/02* | (2006.01) |
| *C09B 67/44* | (2006.01) |
| *G03F 7/00* | (2006.01) |
| *C09B 69/10* | (2006.01) |
| *C09B 62/465* | (2006.01) |
| *G03F 7/105* | (2006.01) |
| *C08G 83/00* | (2006.01) |

(52) U.S. Cl.
CPC ............ *C09B 11/24* (2013.01); *C09B 62/465* (2013.01); *C09B 67/0083* (2013.01); *C09B 69/008* (2013.01); *C09B 69/103* (2013.01); *C09K 11/025* (2013.01); *C09K 11/06* (2013.01); *G02F 1/133516* (2013.01); *G02F 1/133528* (2013.01); *G02F 1/133617* (2013.01); *G02F 1/133621* (2013.01); *G03F 7/0007* (2013.01); *G03F 7/105* (2013.01); C09K 2211/1007 (2013.01); C09K 2211/1011 (2013.01); C09K 2211/1018 (2013.01); C09K 2211/1048 (2013.01); C09K 2211/1088 (2013.01); C09K 2323/00 (2020.08); C09K 2323/03 (2020.08); *G02F 1/133614* (2021.01); G02F 2202/36 (2013.01)

(58) Field of Classification Search
CPC ..... G03F 7/105; G03F 7/0007; C08K 5/3437; C08K 5/29; C09B 69/103; C09B 62/465; C09K 11/06; C09K 11/025; C09K 2323/00; C09K 2323/03; C09K 2323/035; Y10T 428/10; Y10T 428/1036
USPC ........ 428/1.1, 1.3, 1.31; 348/33, 34; 349/97, 349/106, 108, 164
See application file for complete search history.

(56) References Cited

U.S. PATENT DOCUMENTS

| | | |
|---|---|---|
| 5,459,268 A | 10/1995 | Haugland et al. |
| 5,610,932 A | 3/1997 | Kessler et al. |
| 5,686,261 A | 11/1997 | Zhang et al. |
| 5,851,621 A | 12/1998 | Wolleb et al. |
| 6,243,151 B1 * | 6/2001 | Nose ................ G02F 1/133603 349/61 |
| 6,576,352 B2 | 6/2003 | Hirari |
| 7,704,284 B2 | 4/2010 | Eliu et al. |
| 7,986,087 B2 * | 7/2011 | Asano ................... G02B 5/201 313/112 |
| 8,163,910 B2 | 4/2012 | Lukhtanov |
| 8,580,579 B2 | 11/2013 | Hell et al. |
| 8,735,444 B2 | 5/2014 | Hell et al. |
| 9,105,785 B2 | 8/2015 | Shmueli et al. |
| 9,618,665 B2 | 4/2017 | Ito et al. |
| 9,771,480 B2 | 9/2017 | Kuks et al. |
| 9,868,859 B2 | 1/2018 | Szwarcman et al. |
| 2004/0135495 A1* | 7/2004 | Wu ........................ C09K 11/06 313/503 |
| 2004/0135502 A1 | 7/2004 | Kobayashi et al. |
| 2004/0142137 A1 | 7/2004 | Lehmann et al. |
| 2004/0225037 A1 | 11/2004 | Lam et al. |
| 2005/0170363 A1 | 8/2005 | Reddington et al. |
| 2007/0134596 A1 | 6/2007 | Lungu |
| 2009/0004462 A1 | 1/2009 | Zhang et al. |
| 2009/0213296 A1 | 8/2009 | Park et al. |
| 2009/0306277 A1 | 12/2009 | Goenner et al. |
| 2010/0183805 A1 | 7/2010 | Nieminen |
| 2010/0330380 A1 | 12/2010 | Colreavy et al. |
| 2011/0082273 A1 | 4/2011 | Laas et al. |
| 2012/0024345 A1 | 2/2012 | Reisfeld et al. |
| 2012/0054345 A1 | 2/2012 | Reisfeld et al. |
| 2012/0135459 A1 | 5/2012 | Hell et al. |
| 2012/0138124 A1 | 6/2012 | Shmueli et al. |
| 2014/0118814 A1 | 5/2014 | Uhm et al. |
| 2014/0186679 A1 | 7/2014 | Archer et al. |
| 2014/0208978 A1 | 7/2014 | Sunder et al. |
| 2014/0321101 A1* | 10/2014 | Kadowaki ......... G02F 1/133617 362/84 |
| 2016/0146987 A1 | 5/2016 | Ito et al. |
| 2016/0251516 A1 | 9/2016 | Sorensen et al. |
| 2017/0037259 A1 | 2/2017 | Wang |
| 2017/0137626 A1 | 5/2017 | Kuks et al. |
| 2017/0137627 A1 | 5/2017 | Szwarcman et al. |
| 2017/0137628 A1 | 5/2017 | Szwarcman et al. |
| 2017/0137630 A1 | 5/2017 | Szwarcman et al. |
| 2017/0137705 A1 | 5/2017 | Szwarcman et al. |
| 2017/0139270 A1 | 5/2017 | Szwarcman et al. |
| 2017/0139271 A1 | 5/2017 | Szwarcman et al. |
| 2017/0139277 A1 | 5/2017 | Szwarcman et al. |
| 2017/0283616 A1 | 10/2017 | Kuks |
| 2018/0051174 A1 | 2/2018 | Szwarcman et al. |
| 2018/0057689 A1 | 3/2018 | Kuks et al. |
| 2018/0105696 A1 | 4/2018 | Kuks et al. |
| 2018/0208839 A1 | 7/2018 | Szwarcman et al. |

FOREIGN PATENT DOCUMENTS

| | | |
|---|---|---|
| EP | 2305691 | 4/2011 |
| EP | 2752464 | 7/2014 |
| JP | 62278570 | 12/1987 |
| JP | 2005002290 | 1/2005 |
| JP | 2006306933 | 11/2006 |
| JP | 2012/233151 | 11/2012 |
| JP | 2017125123 | 7/2017 |
| WO | WO-2004/101709 | 11/2004 |
| WO | WO 2008/111949 | 9/2008 |
| WO | WO2010/149190 | 12/2010 |
| WO | WO-2011/123820 | 10/2011 |
| WO | WO-2013/056720 | 4/2013 |
| WO | WO 2013/103156 | 7/2013 |
| WO | WO-2015/016175 | 2/2015 |
| WO | WO 2015/097262 A1 | 7/2015 |
| WO | WO 2016/121194 | 8/2016 |
| WO | WO-2017085720 | 5/2017 |

OTHER PUBLICATIONS

U.S. Appl. No. 16/005,730, filed Jun. 12, 2018, Schwarz et al.
U.S. Office Action for U.S. Appl. No. 15/661,151, dated Jul. 3, 2018.
Peter Edman et al. "Extended Förster theory of donor-donor energy migration in bifluorophoric macromolecules. Part II. Method for determining intramolecular distances with experimental validation using mono and bifluorophoric systems" Physical Chemistry Chemical Physics, pp. 2795-2801, May 25, 2000.
Chemical Abstracts Service 2018 American Chemical Society Registry Excerpts p. 1.
U.S. Office Action for U.S. Appl. No. 15/691,776, dated Feb. 14, 2018.
SciFinder 2018, American Chemical Society (ACS) Registry Excerpts, 24 pages.

(56) References Cited

OTHER PUBLICATIONS

U.S. Office Action for U.S. Appl. No. 15/353,294, dated Apr. 2, 2018.
U.S. Notice of Allowance for U.S. Appl. No. 15/691,774, dated Apr. 3, 2018.
U.S. Office Action for U.S. Appl. No. 15/785,443, dated May 3, 2018.
Office Action for U.S. Appl. No. 15/691,776, dated Feb. 27, 2019.
U.S. Appl. No. 15/252,597, filed Aug. 31, 2016, Kuks et al.
U.S. Appl. No. 15/691,774, filed Aug. 31, 2017, Armon et al.
U.S. Appl. No. 15/691,775, filed Aug. 31, 2017, Szwarcman et al.
U.S. Appl. No. 15/691,776, filed Aug. 31, 2017, Kuks et al.
International Search Report for PCT application No. PCT/IL2016/051234, dated Mar. 14, 2017.
Reisfeld, Reneta. Doped polymeric systems produced by sol-gel technology: optical properties and potential indusrial applications. Polimery—Warsaw, 2006, 51.2: 95. Dec. 1, 2006.
Inoue et al. "Development of Color Resists Containing Novel Dyes for Liquid Crystal Displays" translated from R&D Report, "Sumitomo Kagaku", Nov. 35, 2013, pp. 1-7.
Uddin et al. "Synthesis of 5- and 6-Carboxy-X-rhodamines", Organic Letters, Nov. 6, 2008, vol. 10, No. 21, pp. 4799-4801.
Soibinet et al. "Rhod-5N as a fluorescent molecular sensor of cadmium(II) ion", J Fluoresc. Nov. 2008;18(6):1077-82.
Pal et al. "Spectroscopic and photophysical properties of some new rhodamine derivatives in cationic, anionic and neutral micelles", Journal of Photochemistry and Photobiology A: Chemistry vol. 98, Issues 1-2, Aug. 2, 1996, pp. 65-72.
Ross et al. "Facile Synthesis of Rhodamine Esters using Acetyl Chloride in Alcohol Solution", Journal Synthetic Communications vol. 36, 2006—Issue 12, p. 1745-1750.
Belov et al. "Rhodamine spiroamides for multicolor single-molecule switching fluorescent nanoscopy", Chemistry. Oct. 19, 2009;15(41):10762-76.
Drexhage, K. H. "Fluorescence efficiency of laser dyes. [Xanthenes, oxazines 7-aminocoumarins]" J. Res. Natl. Bur. Stand., A; 1976 vol. 80:3.
Mitronova et al. "New fluorinated rhodamines for optical microscopy and nanoscopy", Chemistry. Apr. 19, 2010;16(15):4477-88.
Sinel'Nikov et al. "Fluorescence of the lactone form of rhodamine B", Russian Journal of Physical Chemistry A Aug. 2013, vol. 87, Issue 8, pp. 1409-1416.
Zhang et al. "Fluorescence lifetimes and quantum yields of ten rhodamine derivatives: Structural effect on emission mechanism in different solvents", Journal of Luminescence vol. 145, Jan. 2014, pp. 448-453.
Kobayashi et al. "LCD Backlights", Wiley, 2009.
Lakowicz, "Principles of Fluorescence Spectroscopy", Springer, third edition, 2006.
Mottran et al. "Hydrophobic analogues of rhodamine B and rhodamine 101: potent fluorescent probes of mitochondria in living C. elegans", Beilstein J. Org. Chem. 2012, vol. 8, pp. 2156-2165.
"Rhodamine Dyes", IUPAC Gold Book, 1995, accessed Aug. 7, 2017.
Office Action of U.S. Appl. No. 15/415,886 dated Aug. 11, 2017.
Office Action of U.S. Appl. No. 15/353,015 dated Apr. 6, 2017.
Madsen et al. "Synthesis of Rhodamine 6G-Based Compounds for the ATRP Biocompatible polymers", Biomacromolecules, Jun. 13, 2011, vol. 12, No. 6, pp. 2225-2234.
International Search Report of PCT Application No. PCT/IL2016/050955 dated Nov. 23, 2016.
Kim et al. "Sol-Gel Derived Transparent Zirconium-Phenyl Siloxane Hybrid for Robust High Refractive Index LED Encapsulant" ACS Applied Materials & Interfaces, Feb. 24, 2014, vol. 6, No. 5, pp. 3115-3121.
Reisfeld et al. "Solid-state lasers based on inorganic-organic hybrid materials obtained by combined sol-gel polymer technology", Polym. Adv. Technol., May 19, 2004, vol. 15, No. 6, pp. 291-301.
Kazes et al. "Organic-Inorganic Sol-Gel Composites Incorporating Semiconductor Nanocrystals for Optical Gain Applications", Advanced Materials, May 4, 2009, vol. 21, No. 17, pp. 1716-1720.
Kazes et al. "Blue laser dye spectroscopic properties in solgel inorganic-organic hybrid films", Optics Letters, Feb. 1, 2006, vol. 31, No. 3, pp. 356-358.
Deshpande et al. "Efficient lasing acting from Rhodamine-110 (RH-110) impregnated sol-gel silica samples prepared by dip method", Journal of Luminescence, May 2010, vol. 130, No. 5, pp. 839-844.
Yariv et al. "Efficiency and photostabilty of dye-doped solid-state lasers in different hosts" Optical Materials, Feb. 2001, vol. 16. No. 1-2, pp. 29-38.
Geffroy et al. "Organic light-emitting diode (OLED) technology: materials, devices and display technologies", Polymer International, 2006, vol. 55, pp. 572-582.
Liu et al. "Manipulation of exciton distribution for high-performance fluorescent/phosphorescent hybrid white organic light-emitting diodes", Journal of Materials Chemistry C, 2017, vol. 5, pp. 7668-7683.
Reineke et al. "White organic light-emitting diodes: Status and perspective", Reviews of Modern Physics, Jul. 30, 2013, vol. 85, No. 3, pp. 1245-1293.
Nguyen et al. "Practical Synthetic Route to Functionalized Rhodamine Dyes", Organic Letters, Sep. 1, 2003, vol. 5, No. 18, pp. 3245-3248.
Kolmakov et al. "Polar Red-Emitting Rhodamine Dyes with Reactive Groups: Synthesis, Photophysical Properies, and Two-Color STED Nanoscopy Applications", Chemistry—A European Journal, Dec. 11, 2013, vol. 20, No. 1, pp. 146-157.
Gyuzel et al. "Functionalization of the meso-phenyl Ring of Rhodamine Dyes Trough S N Ar with Sulfur Nuclephiles: Synthesis, Biophysical Characterization, and Comprehensive NMR Analysis", European Journal of Organic Chemistry, Jan. 1, 2015 vol. 2015, No. 2, pp. 337-349.
Polyakova et al. "New GM1 Ganglioside Derivatives for Selective Single and Double Labelling of the Natural Glycosphingolipid Skeleton", Eur. J. Org. Chem., 2009, pp. 5162-5177.
Office action of U.S. Appl. No. 15/622,158, dated Oct. 19, 2017.
International Search Report for PCT application No. PCT/IL2017/050976, dated Dec. 20, 2017.
Jbeily et al. "Synthesis of fluorinated rhodamines and application for confocal laser scanning microscopy", Journal of Fluorine Chemistry, 2016, vol. 189, pp. 70-78.
Leuder, "Liquid Crystal Displays", Wiley, second edition 2010.
Office Action for U.S. Appl. No. 15/841,347, dated Dec. 27, 2018.
Notice of Allowance for U.S. Appl. No. 15/661,151, dated Dec. 27, 2018.
Young-Hoon Ahn et al. "Combinatorial Rosamine Library and Application to in Vivo Glutathione Probe" *J. Am. Chem. Soc.*, Mar. 23, 2007, 129 (15), pp. 4510-4511.
Young-Hoon Ahn et al. "Combinatorial Rosamine Library and Application to in Vivo Glutathione Probe" *J. Am. Chem. Soc.*, Mar. 23, 2007, 129 (15), Supporting Information pages S1-S15.
Siang Hui Lim, et al. "Rosamines Targeting the Cancer Oxidative Phosphorylation Pathway" PLoS One. Mar. 12, 2014; 9(3): e82934.
Database Registry Chemical Abstracts Service, Columbus Ohio, accesses via SCIFINDER, Dec. 18, 2018, pp. 1-2.
Notice of Allowance of U.S. Appl. No. 15/841,347, dated May 16, 2019.
Viktoria Levchenko et al. "Enhancement of luminescence of Rhodamine B by gold nanoparticles in thin films on glass for active optical materials applications" vol. 34, Issue 2, Dec. 2011, pp. 360-364.
Office Action for U.S. Appl. No. 15/924,302, dated Jul. 25, 2019.

\* cited by examiner

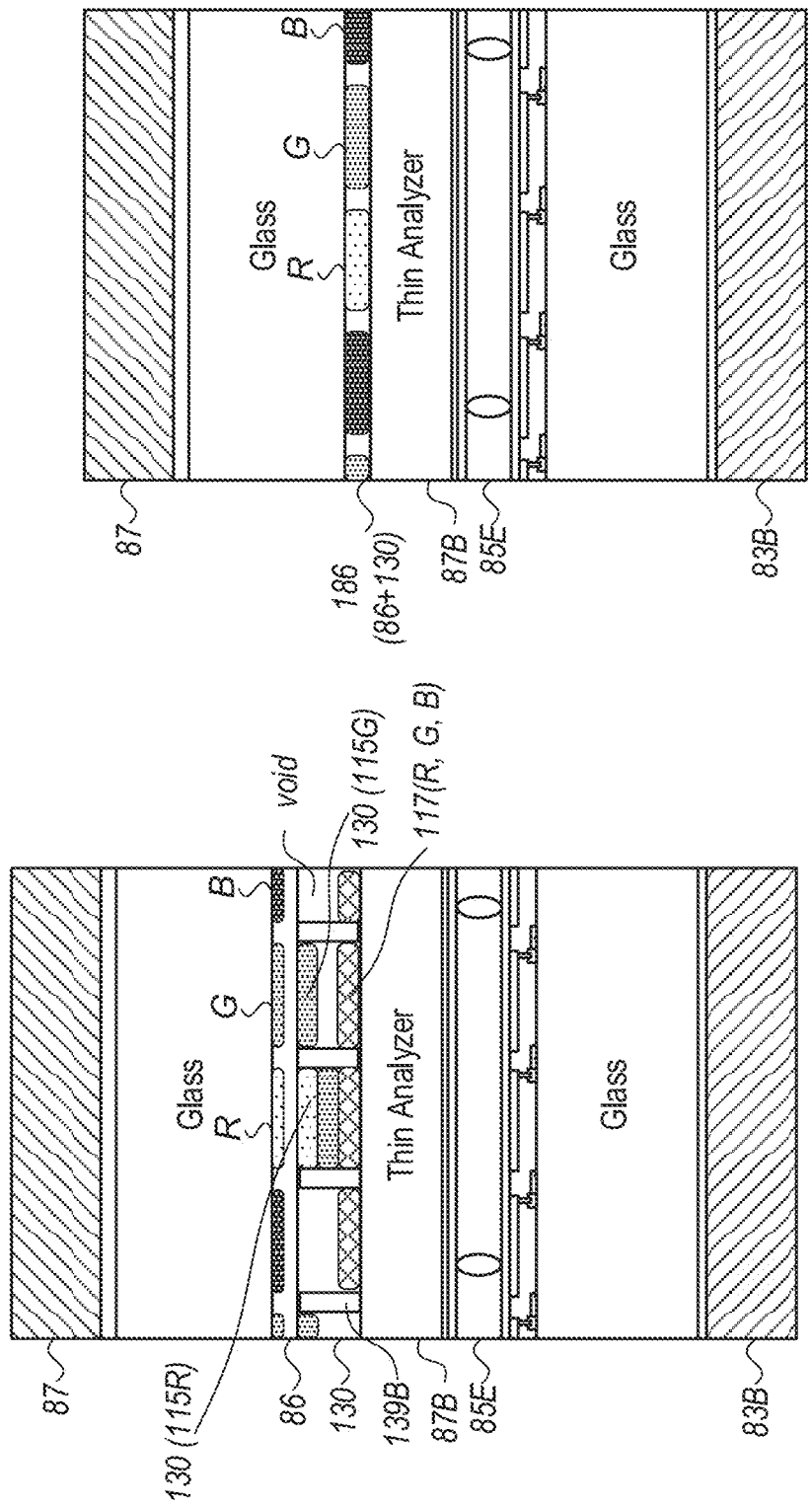

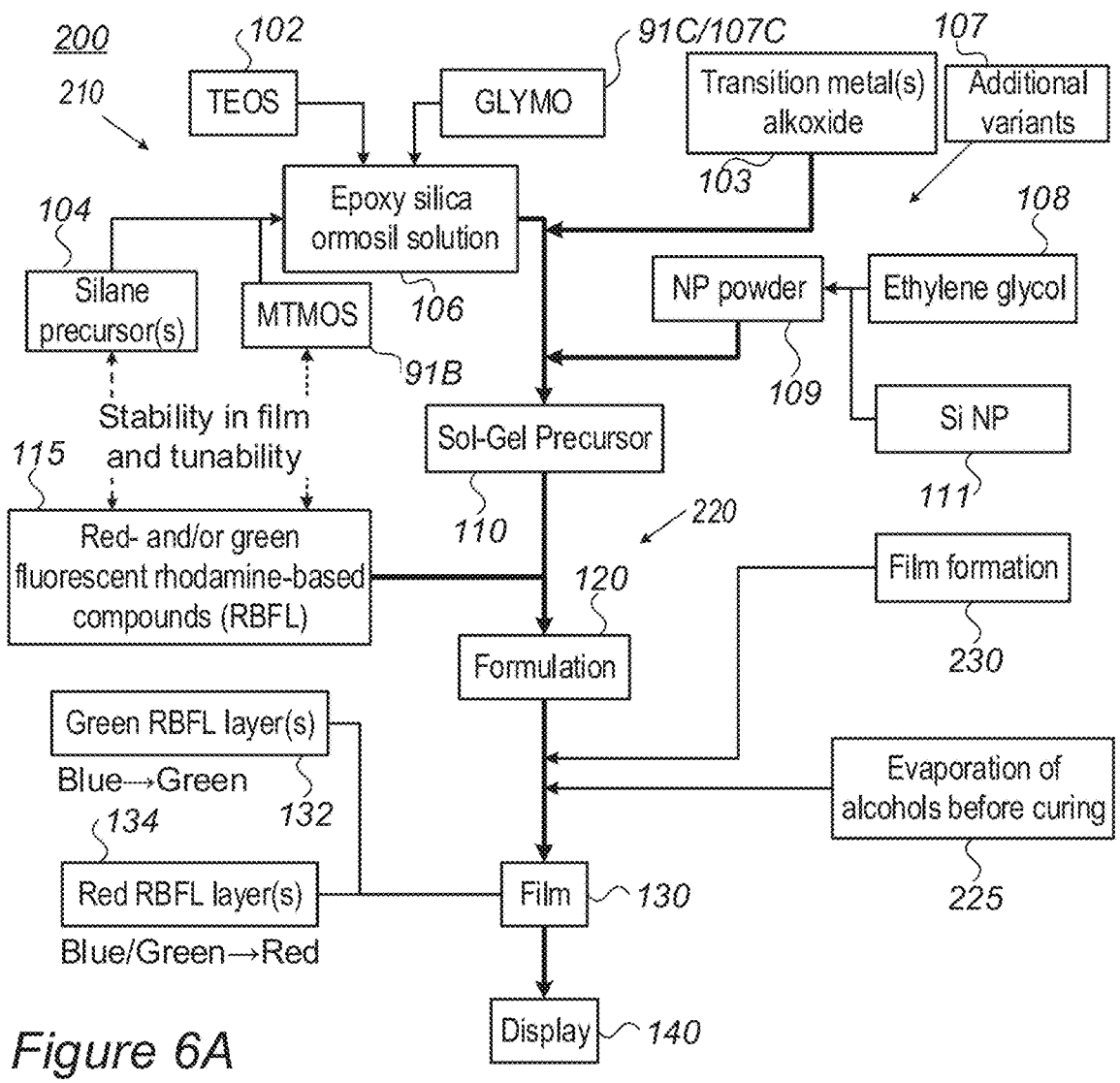
*Figure 6A*
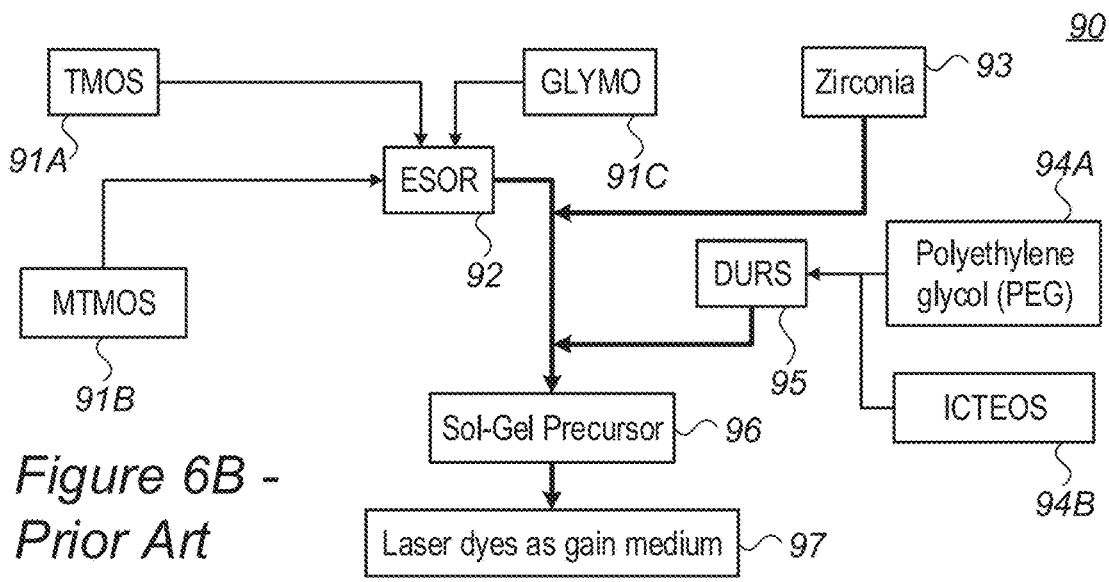
*Figure 6B - Prior Art*

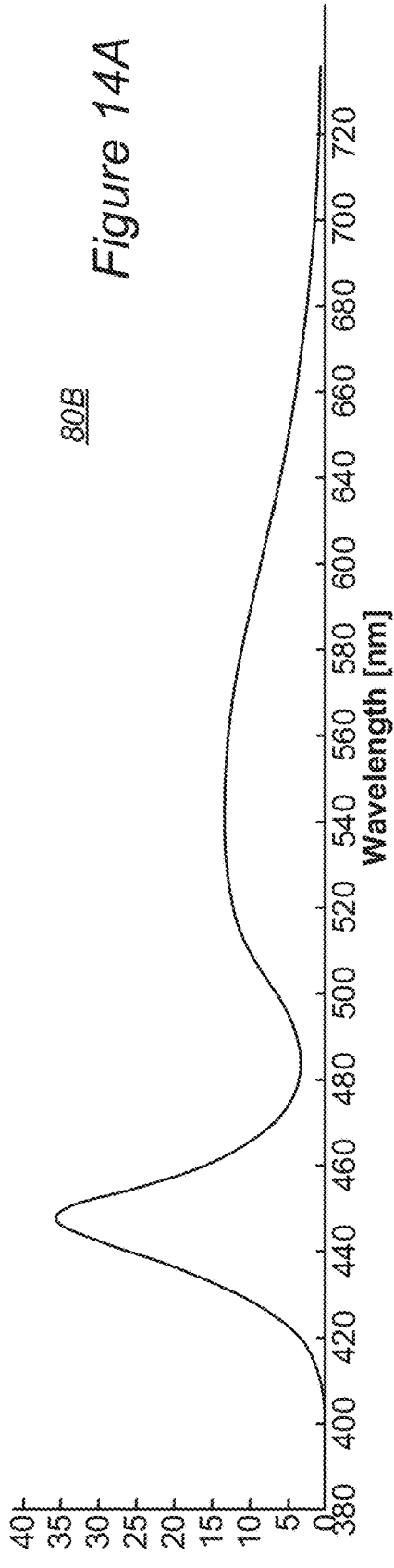
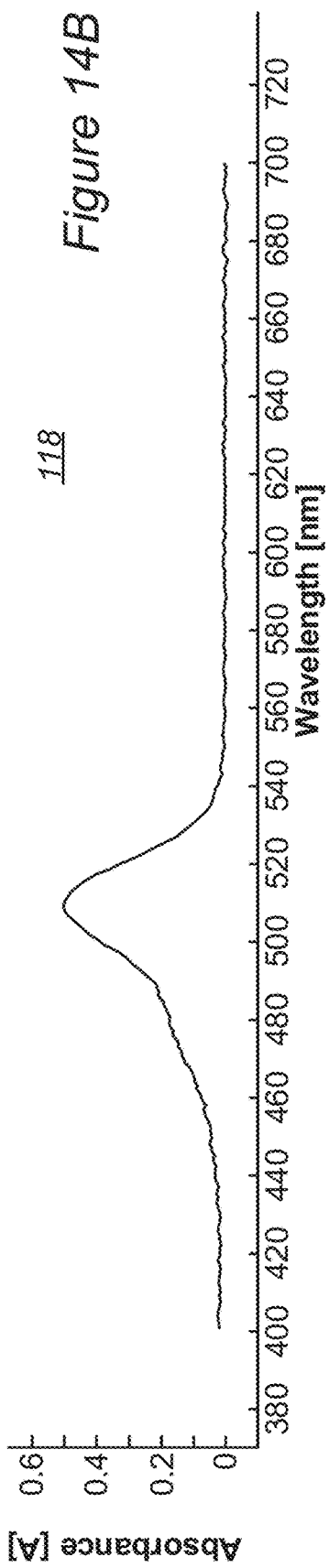
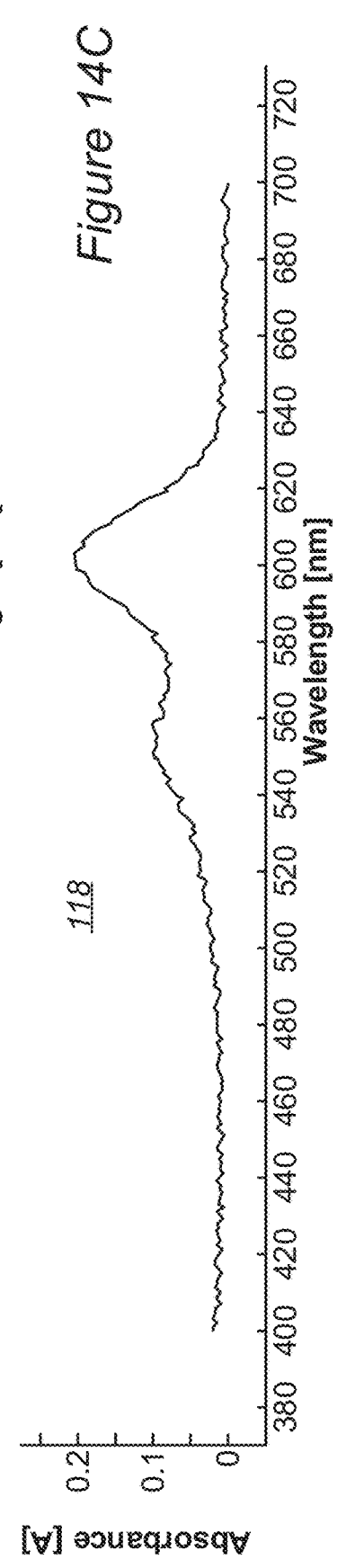
Figure 14A
Figure 14B
Figure 14C

```
                                    105
                                    ―――                                    ┌─ 200
    ┌──────────────────────────────────────────────────────────────────────┐
    │ Preparing a hybrid sol-gel precursor formulation of epoxy silica ormosil solution, NP │
    │ powder and metal(s) alkoxide matrix, using TEOS and optionally TMOS derivative(s) in  │
    │        the epoxy silica ormosil solution and ethylene glycol in the NP powder         │
    └──────────────────────────────────────────────────────────────────────┘
   210
                    ┌──────────────────────────────────────────┐
                    │   Preparing the formulation under acidic conditions   │─── 212
                    └──────────────────────────────────────────┘

┌──────────────────────────────────────────┐
                    │  Adjusting types and amounts of the TMOS derivatives  │─── 215
                    │     to tune emission wavelengths of the fluorophores  │
                    └──────────────────────────────────────────┘

┌──────────────────────────────────────────┐
                    │    Mixing the prepared hybrid sol-gel precursor with  │─── 220
                    │     rhodamine-based photo fluorescent (RBF) compound(s) │
                    └──────────────────────────────────────────┘

┌───────────────────────────────────┐
                          │   Evaporating alcohols from the mixture  │─── 225
                          └───────────────────────────────────┘

┌──────────────────────────────────────────┐
                    │ Spreading and drying the mixture to form a film (e.g., by bar coating) │─── 230
                    └──────────────────────────────────────────┘

┌──────────────────────────────────────────┐
                    │  Drying the mixture by heating, evaporating and/or IR radiation │─── 240
                    └──────────────────────────────────────────┘
                                                                              ┌─ 300
    ┌──────────────────────────────────────────────────────────────────────┐
    │ Preparing a formulation from 65-70% monomers, 25-30% oligomers, 5% photointiator │
    │                              and RBF compound(s)                                 │
    └──────────────────────────────────────────────────────────────────────┘
   310
                          ┌───────────────────────────────────┐
                          │     Spreading the formulation to form a film    │─── 330
                          └───────────────────────────────────┘

┌───────────────────────────────────┐
                          │           UV curing the formulation              │─── 340
                          └───────────────────────────────────┘

┌──────────────────────────────────────────┐
                    │  Determining UV curing parameters to avoid damage to the │─── 345
                    │                    RBF compound(s)                       │
                    └──────────────────────────────────────────┘
```

*Figure 14J (Continued, 1.)*

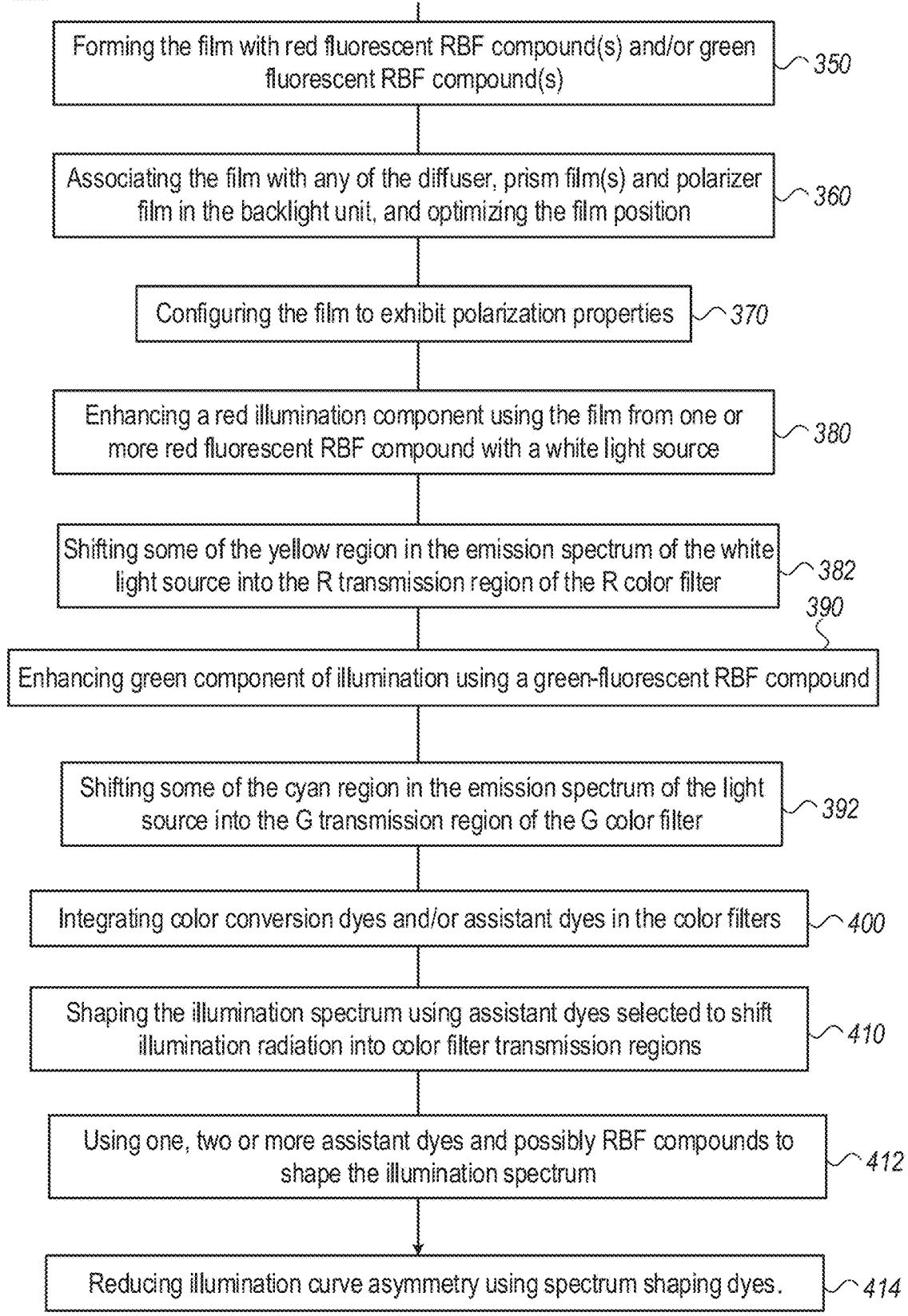
Figure 14J (Continued, 2.)

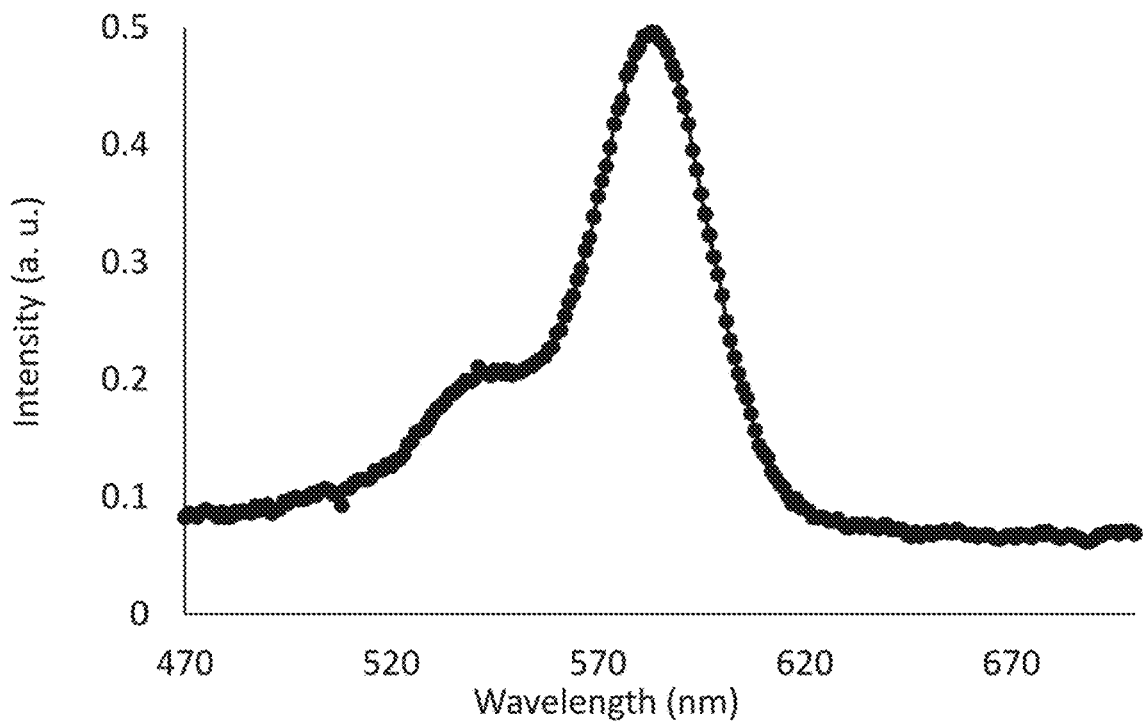
Figure 18A
Figure 18B
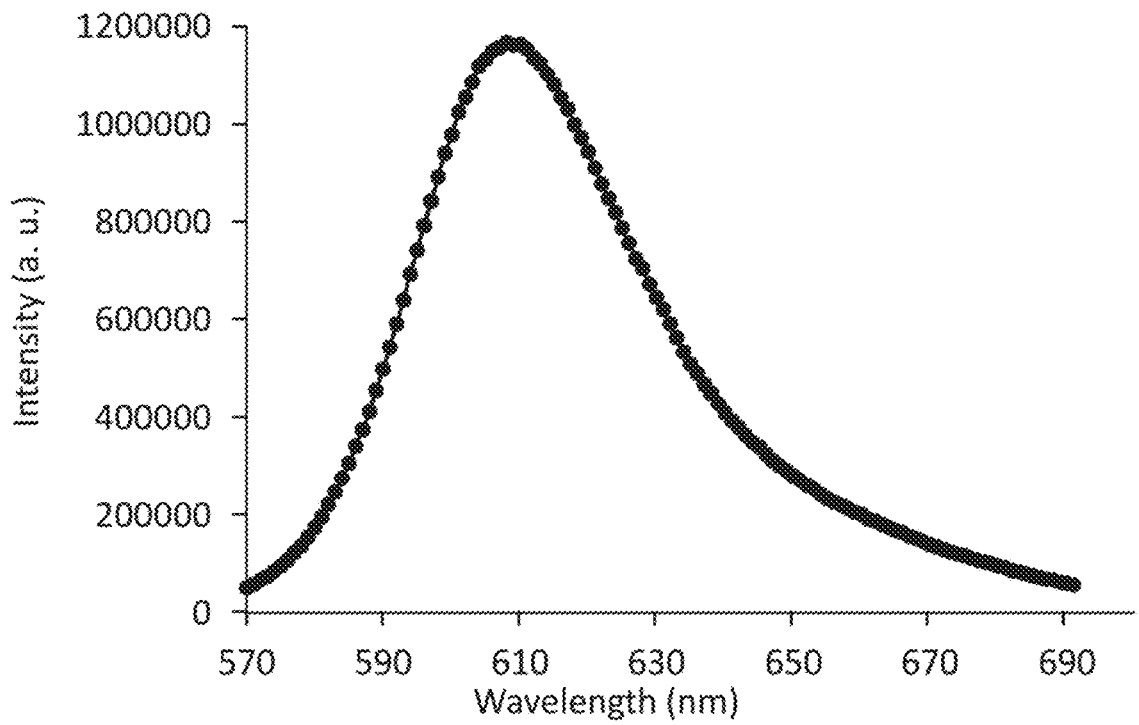

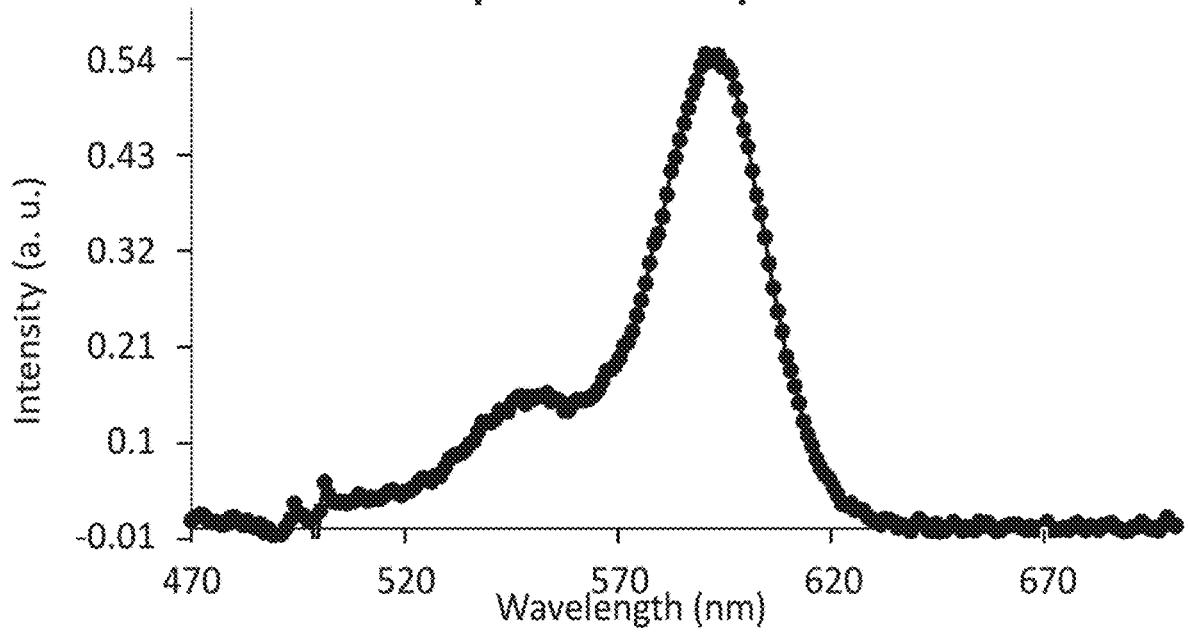
*Figure 20A*
*Figure 20B*
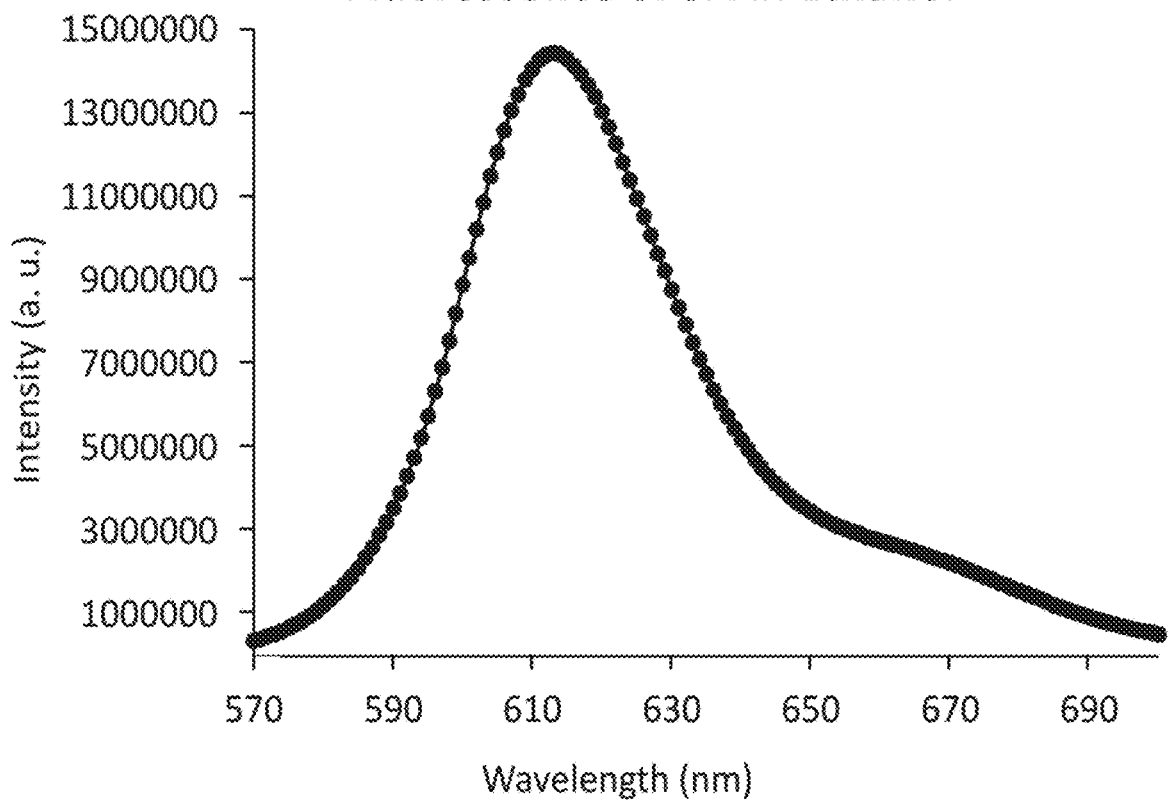

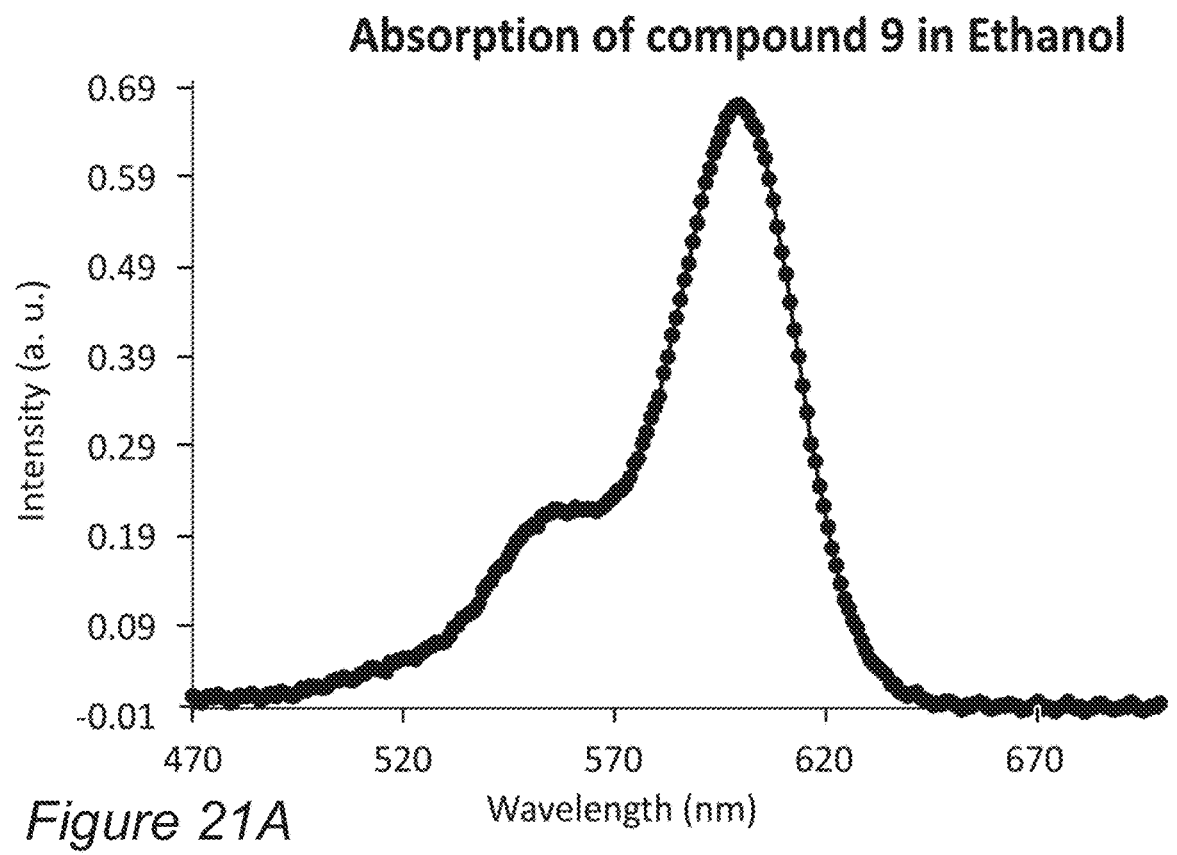
Figure 21A
Figure 21B
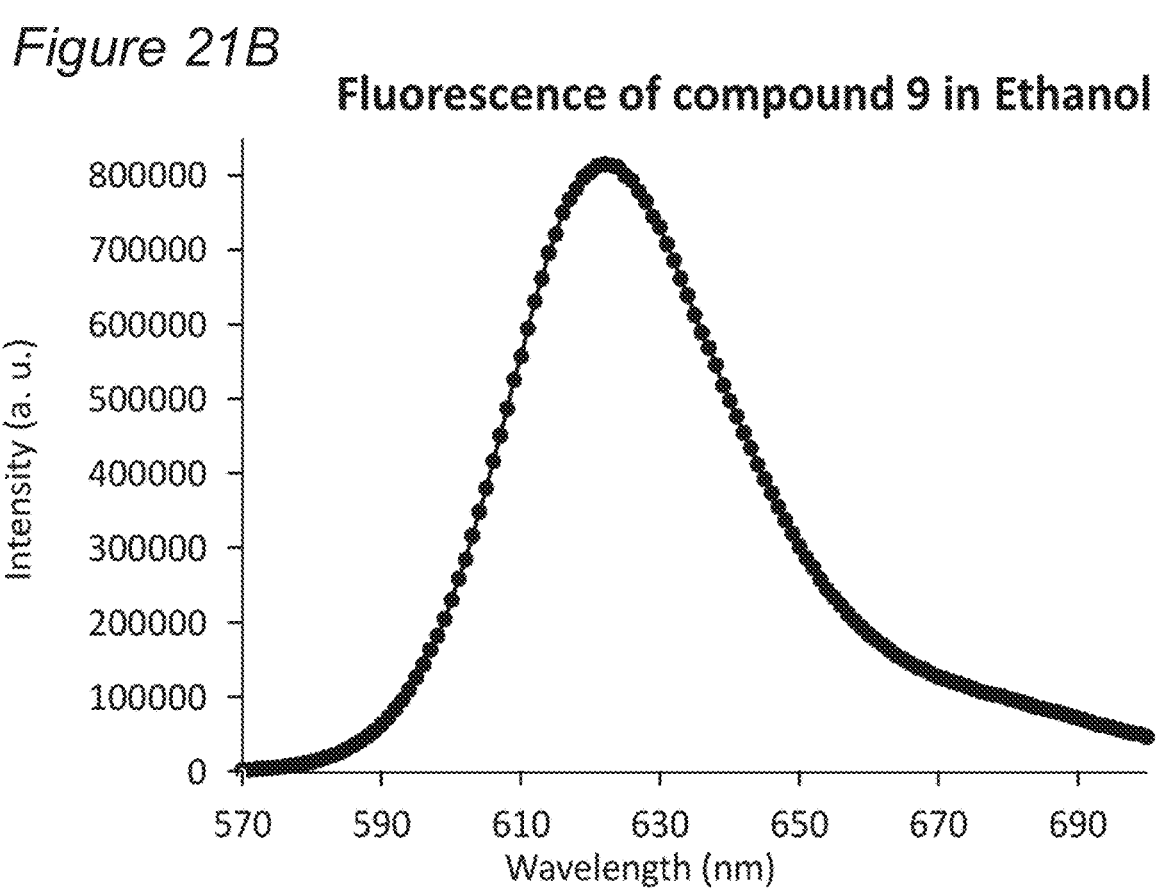

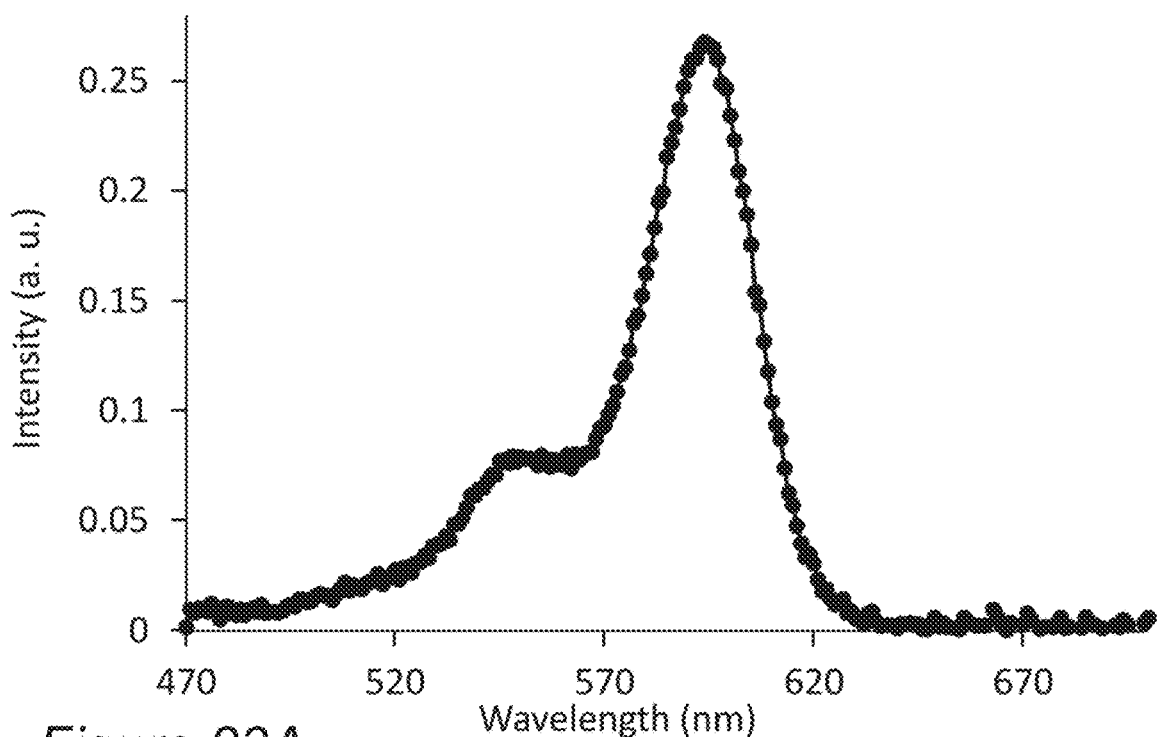
Figure 23A
Figure 23B
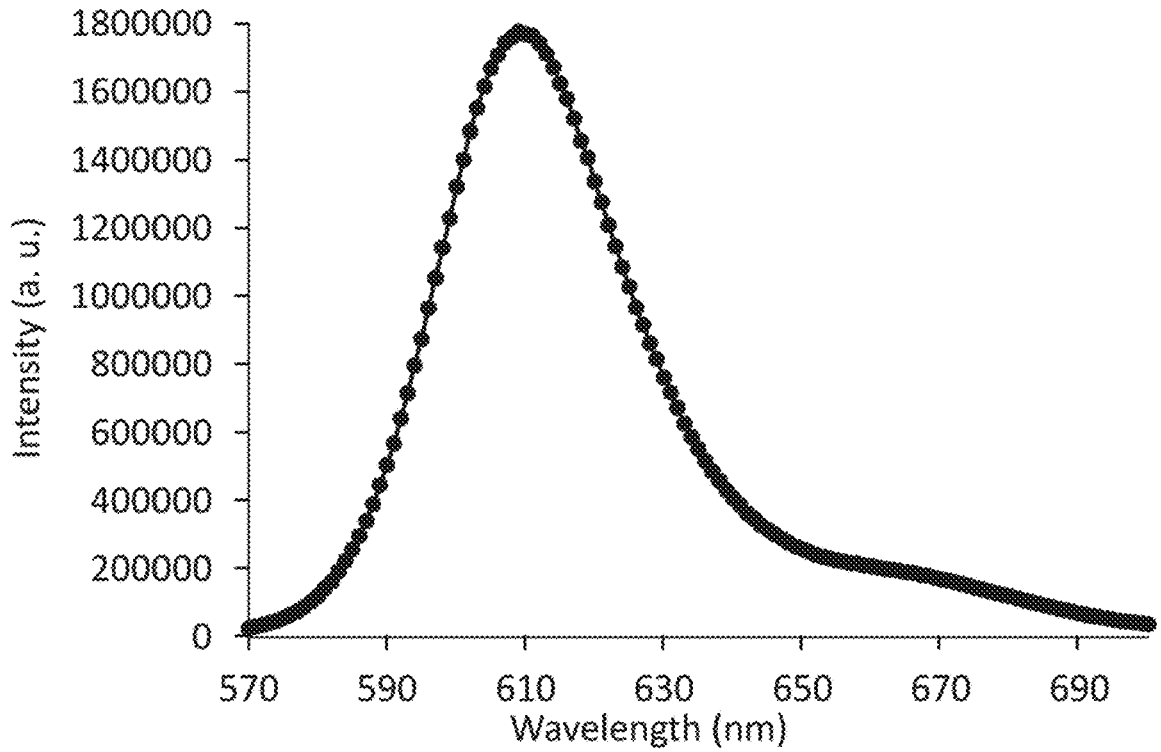

CONTROL OF ILLUMINATION SPECTRA FOR LCD DISPLAYS

CROSS REFERENCE TO RELATED APPLICATIONS

This application is a continuation-in-part of U.S. application Ser. No. 15/353,015, filed on Nov. 16, 2016; U.S. application Ser. No. 15/353,015 is a continuation-in-part of U.S. application Ser. No. 15/252,597, filed on Aug. 31, 2016; and a continuation-in-part of U.S. application Ser. No. 15/252,492, filed on Aug. 31, 2016, which claims the benefit of U.S. Provisional Application No. 62/255,853 filed on Nov. 16, 2015, and further claims the benefit of U.S. Provisional Application Nos. 62/255,853, 62/255,857 and 62/255,860, all filed on Nov. 16, 2015. All applications are hereby incorporated by reference in their entirety.

BACKGROUND OF THE INVENTION

1. Technical Field

The present invention relates to the field of color conversion in displays, and more particularly, to the control of illumination spectra for LCD displays.

2. Discussion of Related Art

Improving displays with respect to their energy efficiency and color gamut performance is an ongoing challenge in the industry.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides color conversion and/or assistant dyes used to enhance spectral regions transmitted through the color filters and possibly shape the illumination spectrum, to improve efficiency and performance.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 6A is a high level schematic illustration of precursors, formulations, films and displays, according to some embodiments of the invention. FIG. 6B illustrates schematically prior art methods according to Reisfeld 2006.

FIGS. 14A-14I illustrate schematically examples for illumination and absorption spectra, according to some embodiments of the invention.

FIG. 15A: absorption at 579 nm. FIG. 15B: emission at 605 nm.

FIG. 16A: absorption at 581 nm. FIG. 16B: emission at 608 nm.

FIG. 17A: absorption at 564 nm. FIG. 17B: emission at 587 nm.

FIGS. 18A-18B depict absorption and emission spectra of a mixture of compounds 5 and 6 in ethanol. FIG. 18A: absorption at 583 nm. FIG. 18B: emission at 608 nm.

FIG. 19A: absorption at 583 nm. FIG. 19B: emission at 608 nm.

FIGS. 20A-20B depict absorption and emission spectra of compound 9A in ethanol. FIG. 20A: absorption at 590 nm. FIG. 20B: emission at 613 nm.

FIGS. 21A-21B depict absorption and emission spectra of compound 9 in ethanol. FIG. 21A: absorption at 600 nm. FIG. 21B: emission at 622 nm.

FIG. 22A: absorption at 604 nm. FIG. 22B: emission at 621 nm.

FIGS. 23A-23B depict absorption and emission spectra of compound 11a in ethanol. FIG. 23A: absorption at 594 nm. FIG. 23B: emission at 609 nm.

FIG. 24A: absorption at 606 nm. FIG. 24B: emission at 623 nm.

FIG. 25A: absorption at 506 nm. FIG. 25B: emission at 527 nm.

FIG. 26A: absorption at 505 nm. FIG. 26B: emission at 525 nm.

FIG. 27A: absorption at 507 nm. FIG. 27B: emission at 525 nm.

FIG. 28A: absorption at 512 nm. FIG. 28B: emission at 538 nm.

FIG. 29A: absorption at 514 nm. FIG. 29B: emission at 533 nm.

FIG. 30A: absorption at 503 nm. FIG. 30B: emission at 525 nm.

FIG. 31A: absorption at 501 nm. FIG. 31B: emission at 523 nm.

FIG. 32A: absorption at 509 nm. FIG. 32B: emission at 531 nm.

FIG. 33A: absorption at 602 nm. FIG. 33B: emission at 621 nm.

FIG. 34A: emission intensity data over time. FIG. 34B: d(x,y) data over time.

DETAILED DESCRIPTION OF THE INVENTION

Figure 1:
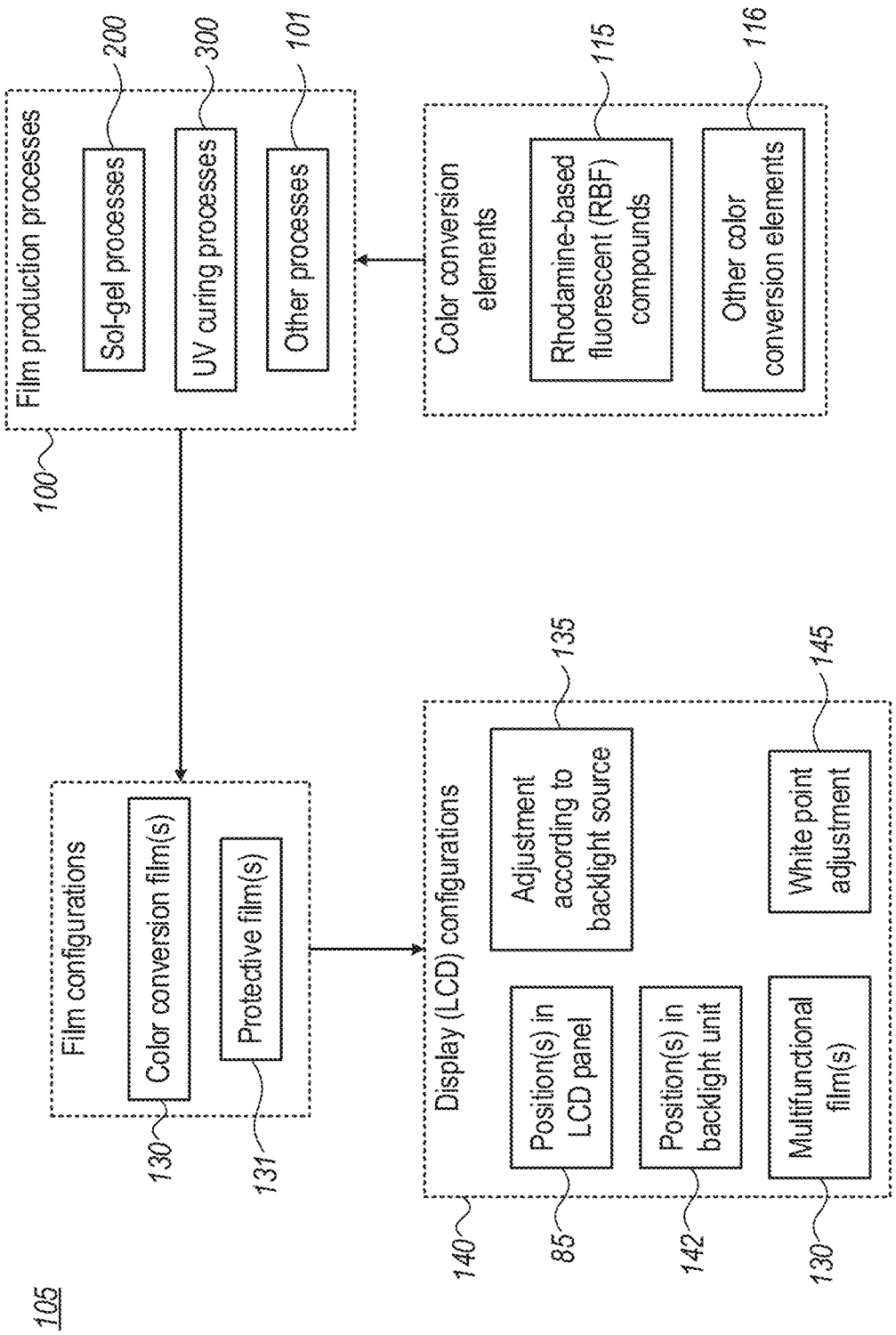
FIG. 1 is a high level schematic overview illustration of disclosed film production processes, film configurations and display configurations, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Facing the challenge of improving the efficiency and color performance of displays without having to rely on compounds involved in displays containing quantum-dot-based technologies (e.g., in color filters, color conversion materials etc.), the inventors have discovered ways of using organic molecules to significantly improve display properties. In the following, display configurations are presented with respect to the use of color conversion films and then sol-gel and UV (ultraviolet) technologies are disclosed for preparing color conversion films as well as for preparing associated protective films or coatings for the color conversion films.

Color conversion films for a LCD (liquid crystal display) having RGB (red, green, blue) color filters, as well as such displays, formulations, precursors and methods are provided, which improve display performances with respect to color gamut, energy efficiency, materials and costs. The color conversion films absorb backlight illumination and convert the energy to green and/or red emission at high efficiency, specified wavelength ranges and narrow emission peaks. For example, rhodamine-based fluorescent compounds are used in matrices produced by sol-gel processes and/or UV (ultraviolet) curing processes which are configured to stabilize the compounds and extend their lifetime—to provide the required emission specifications of the color conversion films. Film integration and display configurations further enhance the display performance with color conversion films utilizing various color conversion elements and possibly patterned and/or integrated with a crosstalk blocking matrix. For example, the color conversion film(s) may be integrated in the LCD panel below the color filters, either before or after the analyzer associated with the liquid crystal film.

Color conversion and/or assistant dyes may be used to enhance spectral regions transmitted through the color filters and shape the illumination spectrum, to improve efficiency and performance.

FIG. 1 is a high level schematic overview illustration of disclosed film production processes 100, film configurations 130 and display configurations 140, according to some embodiments of the invention. Embodiments combine color conversion elements (such as rhodamine-based fluorescent (RBF) compounds 115 and/or other color conversion elements 116 (such as fluorescent organic and/or inorganic compounds, quantum dots etc.) into films 130 by various film production processes 100 (such as sol-gel processes 200, UV curing processes 300 and/or other processes 101) to yield a variety of film configurations 130 such as color conversion films 130 and/or protective films 131 (which may be also color conversion films 130), which are then used in a variety of display configurations 140. Films 130, 131 prepared by as sol-gel processes 200 and UV curing processes 300 may be combined to form film 130. Film(s) 130 may be used in display(s) 140 in one or more ways, such as any of: positioned in one or more locations in a backlight unit 142 and/or in LCD panel 85 and used as multifunctional films 130 (e.g., configured to function as any of: color conversions films, protective films, diffusers, polarizers etc.). Further display configurations 140 may comprise adjusting film(s) 130 according to the backlight source 135 (see e.g., red enhancement below, possibly also green enhancement) and/or adjusting the display white point 145, adjustment which may be carried out by modifying any of the color conversion elements, film production processes 100 and/or film configurations 130. Some embodiments provide integrative approaches to display configuration, which take into account multiple factors at all illustrated levels, as exemplified below.

Display Configurations

Film Positions and Optional Patterning

FIGS. 2A-2H and 3A-3E are high level schematic illustrations of configurations of digital display 140 with color conversion film(s) 130, according to some embodiments of the invention. Digital displays 140 are illustrated schematically as comprising a backlight unit 142 and a LCD panel 85, the former providing RGB illumination 84A to the latter.

Figure 2A:
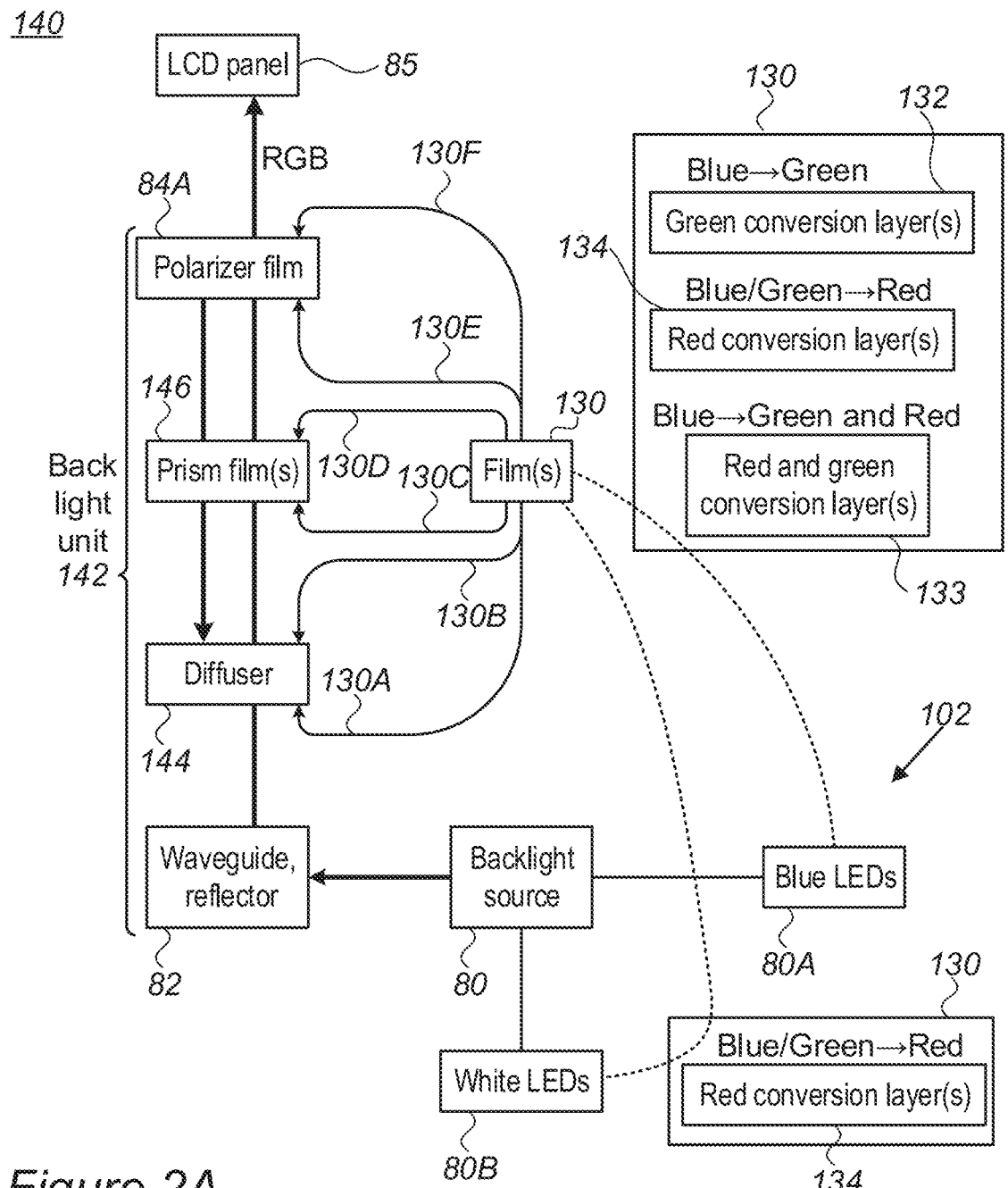
FIGS. 2A-2U are high level schematic illustrations of configurations of digital displays with color conversion film(s), according to some embodiments of the invention.

Backlight unit 142 is illustrated schematically in FIG. 2A in a non-limiting manner as comprising a backlight source 80 (e.g., white LEDs 80B or blue LEDs 80A), a waveguide with reflector 82 (the latter for side-lit waveguides), a diffuser 144, prism film(s) 146 (e.g., brightness enhancement film (BEF), dual BDF (DBEF), etc.) and polarizer film(s) 148, which may be configured in various ways. Films 130 may be applied at various positions in backlight unit 142 such as on either side (130A, 130B) of diffuser 144, on either side (130C, 130D) of at least one of prism film(s) 146, on either side (130E, 130F) of at least one polarizer film(s) 148, etc. In certain embodiments, film 120 may be deposited on any of the film in back light unit 142.

In certain embodiments, films 130 may be used to replace diffuser 144 and/or polarizer film 148 (and possibly prism film(s) 146), once appropriate optical characteristics are provided in films 130 as explained herein.

The location of film(s) 130 may be optimized with respect to radiation propagation in backlight unit 142, in both forwards (84A) and backward (84B) directions due to reflections in backlight unit 142. For example, optimization considerations may comprise fluorescence efficiency, energy efficiency, stability of rhodamine-based fluorescent (RBF) compounds 115 or other color conversion elements in film(s) 130, and so forth. As a non-limiting example, in the position of the lower film 130A, B (e.g., on diffuser 144) more radiation is expected to excite RBF compounds 115—increasing its conversion efficiency but increasing losses and reducing the durability of RBF compounds 115. In the position of the higher film 130E, F (e.g., on polarizer film 148) less radiation is expected to excite RBF compounds 115—reducing its conversion efficiency but reducing losses and increasing the durability of RBF compounds 115 and/or other color conversion elements in film(s) 130.

Some embodiments of displays 140 comprise a blue light source 80A (such as blue LEDs—light emitting diodes) with film(s) 130 configured to provide red and green components in RGB illumination 84A, e.g., by using red-fluorescent RBF compound(s) (e.g., with silane precursor(s) such as PhTMOS (trimethoxyphenylsilane) and/or TMOS (trimethoxysilane) with fluorine substituents—see below) and green-fluorescent RBF compound(s) (e.g., with silane precursor(s) such as $F_1$TMOS (trimethoxy(3,3,3-trifluoropropyl)silane)—see below). It is emphasized that various silane precursor(s) 104 may be used with either red-fluorescent or green-fluorescent RBF compounds 115 as disclosed below.

The red and green fluorescent RBF compound(s) may be provided in a single film layer 133 or in multiple film layers 134, 132. The process may be optimized to provide required absorption and emission characteristics of RBF compounds in film 130, while maintaining stability thereof during operation of display 140. Similarly, film(s) 130 with either one or more color conversion elements (e.g., other fluorescent compounds, organic or inorganic, quantum dots etc.) may be integrated in display 140 in a similar way according to respective considerations. In the following any of the mentioned RBF compound(s) may, in some embodiments, be replaced or augmented by other color conversion elements (e.g., other fluorescent compounds, organic or inorganic, quantum dots etc.).

Some embodiments of displays 140 comprise a white light source 80B (such as white LEDs) with film(s) 130 configured to provide red and green components in RGB illumination 84A, e.g., by using red-fluorescent RBF compound(s) (e.g., with PhTMOS and/or TMOS with fluorine substituents as silane precursor(s)). The red fluorescent RBF compound(s) may be provided in a single film layer or in multiple film layers 134. The process may be optimized to provide required absorption and emission characteristics of RBF compounds in film 130, while maintaining stability thereof during operation of display 140. Red-fluorescent RBF compound(s) may be used to shift some of the yellow region in the emission spectrum of white light source 80B into the red region, to reduce illumination losses in LCD panel 85 while maintaining the balance between B and R+G in RGB illumination 84A.

Figure 2B:
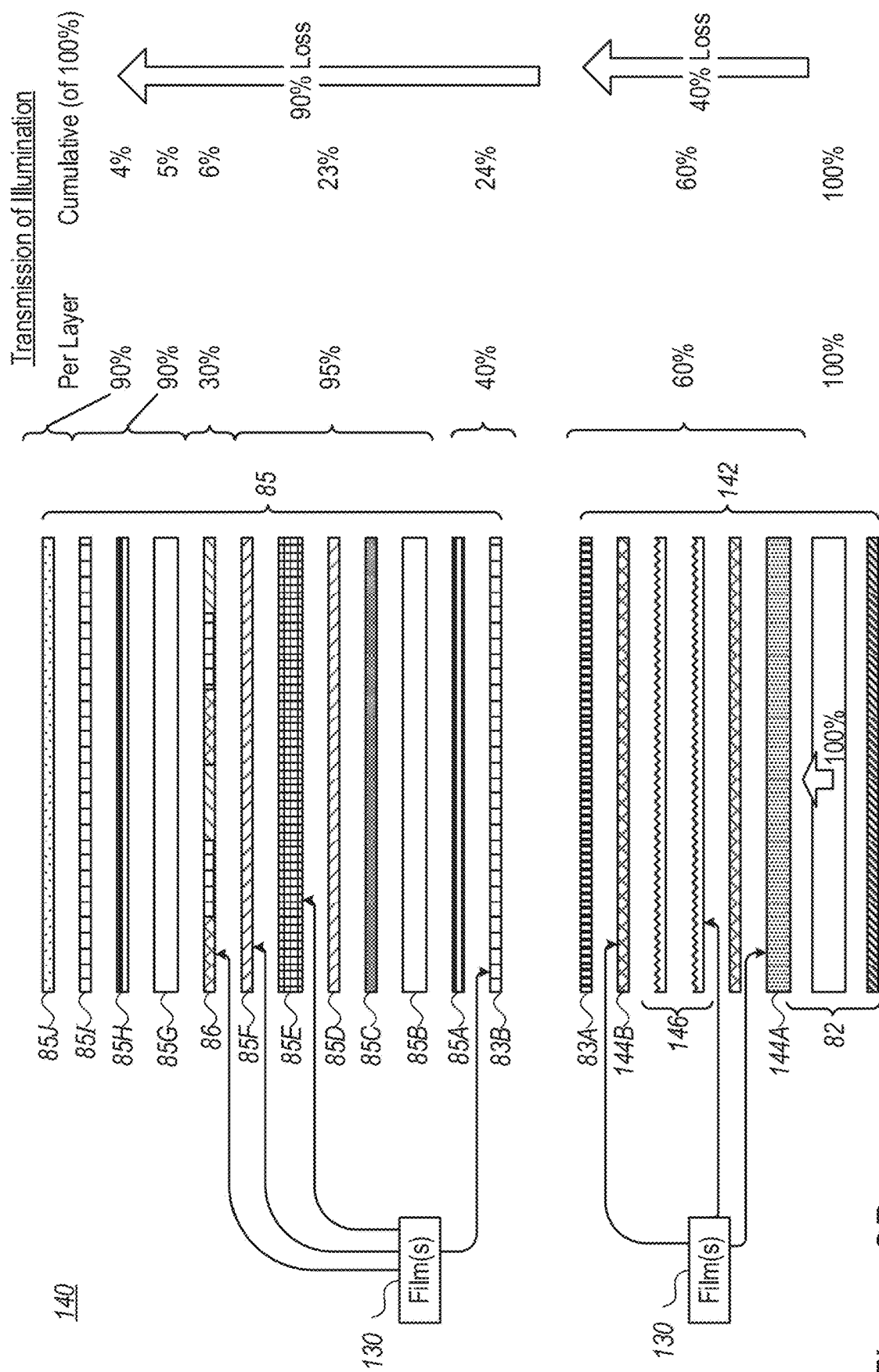

FIG. 2B illustrates in more details various films and elements in display 140 to which film 130 may be associated or which may be replaced by film 130 in some embodiments. LCD panel 85 is shown to include compensation films 85A, 85H, glass layers 85B, 85G, thin film transistors (TFT) 85C, ITO (indium tin oxide) layers 85D, 85F, liquid crystal cell (LC) 85E, RGB color filters 86, polarizer film 85I and protective film 85J (e.g., anti-glare, anti-reflection). FIG. 2B further illustrates typical illumination transmission in each layer and cumulatively, indicating ca. 40% loss in backlight unit 142 and 90% loss in LCD panel 85, the latter mainly resulting from RGB color filters 86 and polarizers 83B, 83A in LCD panel 85 and backlight unit 142, respectively. One or more film(s) 130 may be attached to or replace any of various layers in backlight unit 142 and/or in LCD panel 85, depending on considerations of minimizing further illumination losses, film performance and lifetime of the fluorescent dyes (RBF compounds 115). As non-limiting examples, FIG. 2B illustrates schematically associating on or more films 130 with any of diffuser 144A and/or light guide 82, prism layer(s) 146, diffuser 144B, polarizers 83A, 83B (in either or both backlight unit 142 and LCD panel 85, respectively), LC 85E, ITO 85F and/or color filters 86. It is emphasized that FIG. 2B merely provides a non-limiting example of a display configuration, and films 130 may be applied at various positions and any display configuration.

In some embodiments, similar considerations may be used with respect to positioning of any type of color conversion film 130, which may comprise color conversion elements other than RBF compounds 115, such as organic (non-rhodamine-based) or inorganic fluorescent compounds, quantum dots etc. Various display 140 configurations may be provided, which optimize illumination loss with film parameters and lifetime of the color converting elements.

Figure 2C:
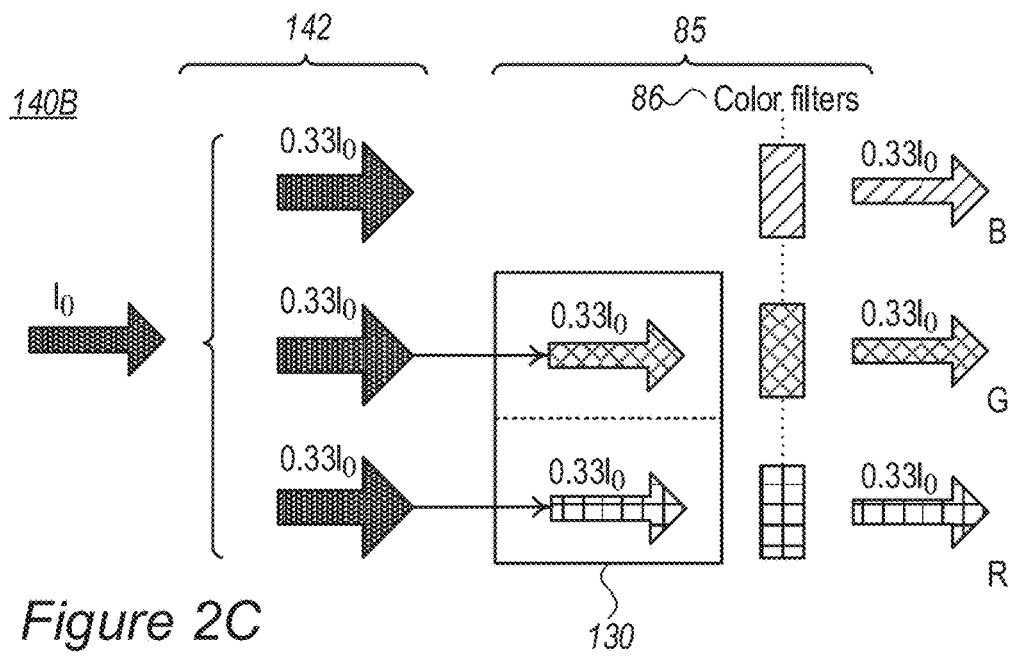
Figure 2D:
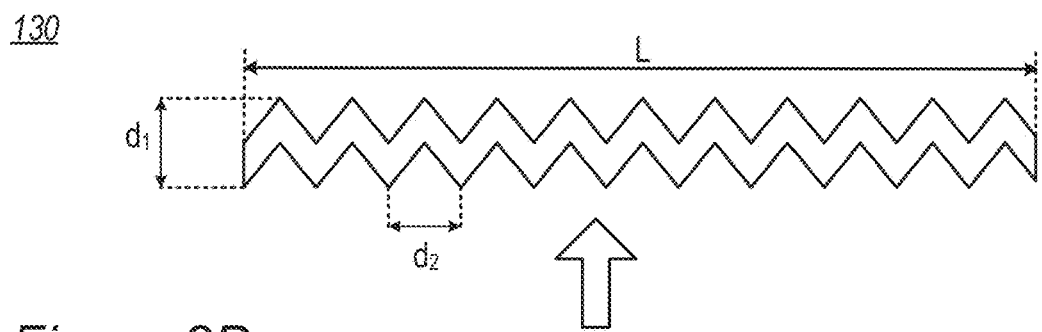

FIG. 2D illustrates an example for configuration of film 130 folded into a zig-zag form, characterized by an overall length L, overall thickness $d_1$ and step $d_2$ between folds. Film 130 may be folded to increase the film thickness through which the illumination passes, without increasing the actual thickness of film 130 (formulated otherwise—to reduce the light flux per area of film 130). The folding may increase the lifetime of RBF compounds 115 in film or of any other comprise color conversion elements on which film 130 may be based, such as organic (non-rhodamine-based) or inorganic fluorescent compounds, quantum dots etc.

Figure 2E:
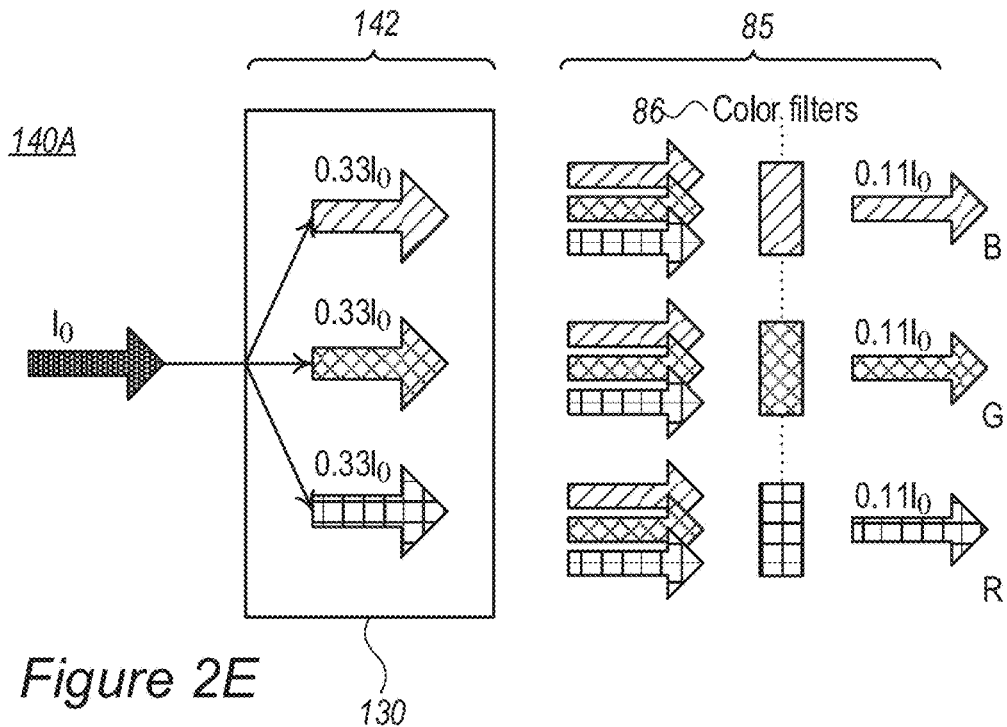

FIGS. 2C and 2E schematically illustrate some of the above considerations, by comparing display 140B with color conversion film 130 in LCD panel 85 versus display 140A (FIG. 2E) with color conversion film 130 in backlight unit 142. The schematic illustrations depict the illumination intensity as $I_0$, and illumination components R, G, B as they are produced in the respective display. In display 140A, color conversion film 130 in backlight unit 142 provides illumination at RGB, assuming in a non-limiting manner no loss on the conversion. In LCD panel 85, color filters 86 remove two of the three illumination components, leaving ca. 10% of the original illumination at each color component (see also FIG. 2B, illustrating a more realistic lower rate of less than 5% per color component). When placing color conversion film 130 in LCD panel 85 (e.g., as a patterned film 130), as illustrated for display 140B (FIG. 2C, assuming blue LED illumination), a blue component may be delivered directly to blue color filter 86 without color conversion or filtering, while R and G may be converted from corresponding blue component just before filters 86, so that that filters 86 pass most or all of the illumination they receive, which is wavelength-adjusted just before entering color filters 86—resulting in a much higher efficiency than in display 140A of ca. 30% of the original illumination at each color component (corresponding to 10-15% per color component in terms of FIG. 2B).

Such gain in efficiency may be achieved by some embodiments having any type of color conversion film 130, which may comprise color conversion elements other than RBF compounds 115, such as organic (non-rhodamine-based) or inorganic fluorescent compounds, quantum dots etc. Various display configurations may be provided which increase illumination use efficiency by positioning respective color conversion film 130 in LCD panel 85, before color filters 86. Some embodiments comprise respective LCD panels 85 having color conversion film 130 integrated therein and positioned before color filters 86 thereof, as well as corresponding displays 140.

Figure 2H:
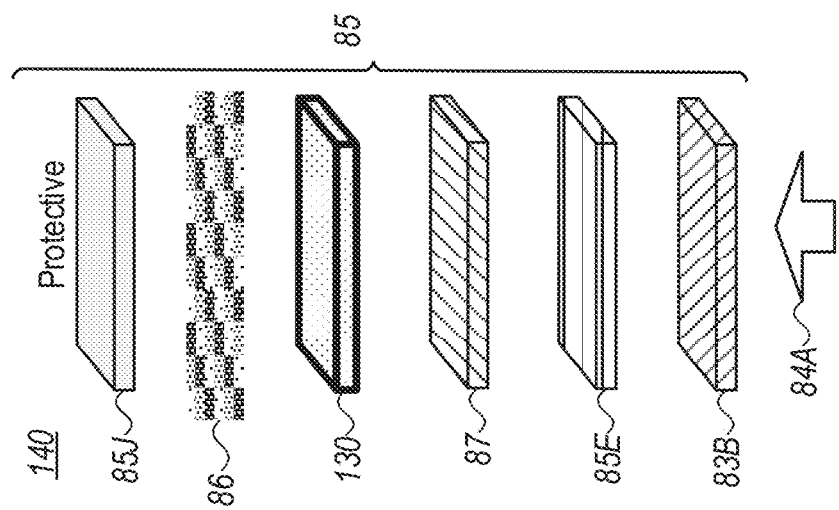
Figure 2G:
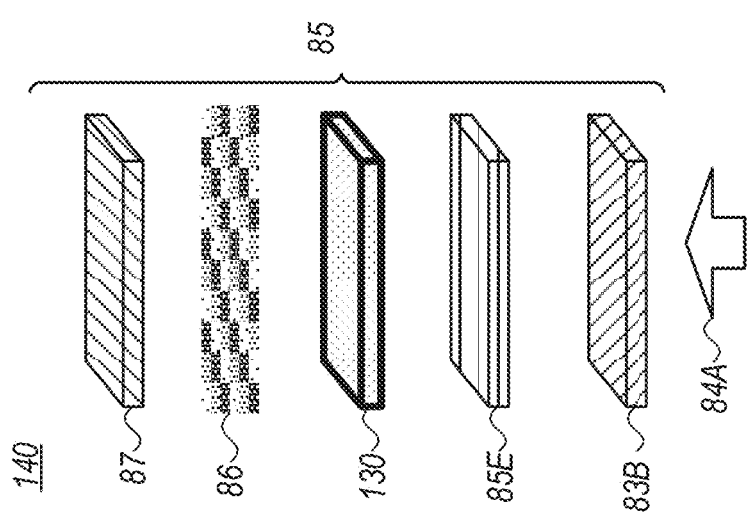
Figure 2F:
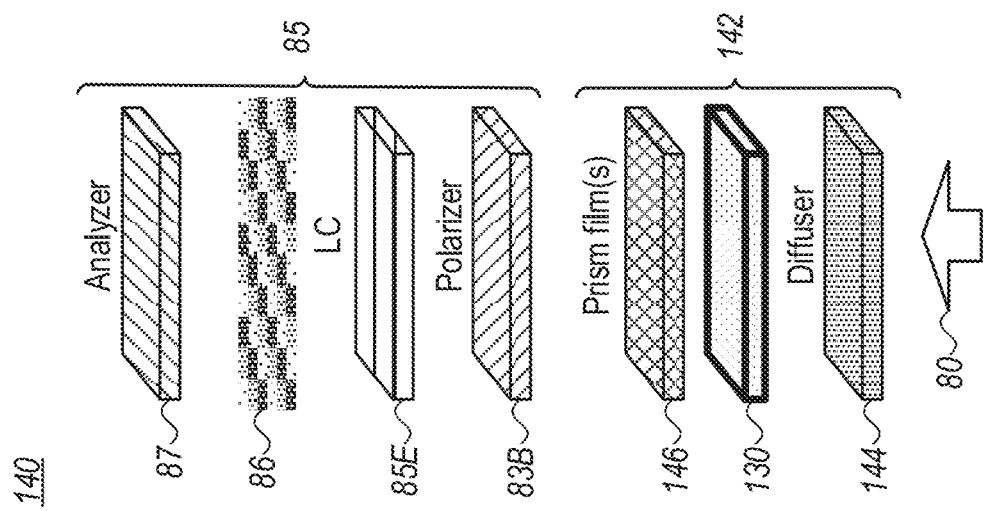

FIGS. 2F-2M are high level schematic illustrations of configurations of digital display 140 with color conversion film(s) 130, according to some embodiments of the invention. FIG. 2F illustrates, schematically, embodiments in which color conversion film 130 is positioned in backlight unit 142, e.g., between diffuser 144 and prism 146 or associated therewith, as disclosed above.

FIG. 2G illustrates, schematically, embodiments in which color conversion film 130 is positioned in LCD panel 85 between polarizer 83B and an analyzer film 87 (e.g., a corresponding polarizing film), e.g., between liquid crystal layer 85E and analyzer film 87 and below RGB color filter layer 86. In such configurations, with LCD panel 85 comprising, sequentially with respect to received illumination 84A: polarizing film 83B, liquid crystal layer 85E, color conversion film 130, RGB color filter layer 86 and analyzer film 87—the position of color conversion film 130 may be optimized to provide maximal light conversion efficiency while retaining long life time (due to less radiation passing though film 130 after non-polarized illumination has been filtered out by polarizer 83B) and maintaining the polarization of the illumination. The latter effect may be achieved by corresponding configuration of color conversion film 130 to maintain or even enhance the respective polarization, e.g., by aligning RBF compounds 115 during preparation of color conversion film 130, as disclosed herein. One or more color conversion film(s) 130 may be positioned in certain embodiments between polarizer 83B and liquid crystal layer 85E.

FIG. 2H illustrates, schematically, embodiments in which color conversion film 130 is positioned in LCD panel 85 after analyzer film 87 and below RGB color filter layer 86. In certain embodiments, RGB color filter layer 86 in LCD panel 85 may be positioned after analyzer film 87, and be preceded by color conversion film 130. In such configurations, with LCD panel 85 comprising, sequentially with respect to received illumination 84A: polarizing film 83B, liquid crystal layer 85E, analyzer film 87, color conversion film 130, RGB color filter layer 86 and protective film 85J. The position of color conversion film 130 may be optimized to provide maximal light conversion efficiency while retaining long life time (due to less radiation passing though film 130 after non-polarized illumination has been filtered out by polarizer 83B). Polarization maintenance is not necessarily required in these embodiments, as color conversion film 130 is positioned after liquid crystal layer 85E and analyzer film 87. One or more color conversion film(s) 130 may be positioned in certain embodiments between analyzer film 87 and protective film 85J. In certain embodiments, multiple films 130 may be used in display 140, e.g., combining embodiments illustrated in FIGS. 2F-2H, possibly with different films 130 which are configured each with respect to its position in display 140. In certain embodiments, color conversion film(s) 130 may be patterned with respect to a patterning of RGB color filter layer 86 to yield a spatial correspondence between film regions with R and G emission peaks and respective R and G color filters, as disclosed herein (see e.g., FIG. 2C). Color conversion film(s) 130 may comprise one or more layers, with corresponding red-fluorescent RBF compound(s) and green-fluorescent RBF compound(s) as disclosed herein. Color conversion film(s) 130 may comprise independent film(s) and/or corresponding layers applied onto any of the LCD panel components disclosed herein, according to their respective position in LCD panel 85.

In certain embodiments, considerations for positioning color conversion film(s) 130 within LCD panel 85 may be carried out according to estimations of transmission of illumination, similar to the non-limiting example presented in FIG. 2B. The considerations may comprise minimizing radiation intensity passing through color conversion film(s) 130 with respect to the complexity of modifying LCD panel 85. Additional considerations may comprise reduction of parallax effects due to film thickness, which may be achieved by close association of film(s) 130 with color filters 86, applying at least part(s) of film(s) 130 as coatings on color filters 86 or on other films in LCD panel 85, and possibly providing barriers in film(s) 130 to limit stray light.

Figure 2J:
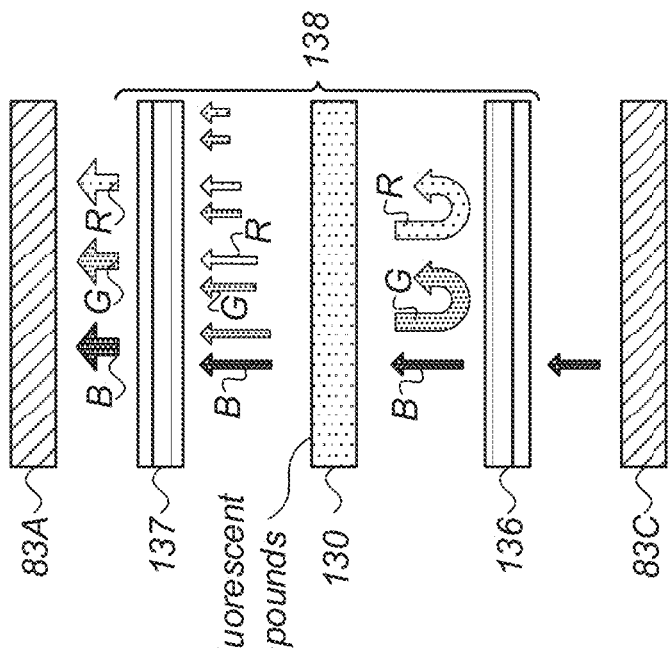
Figure 2I:
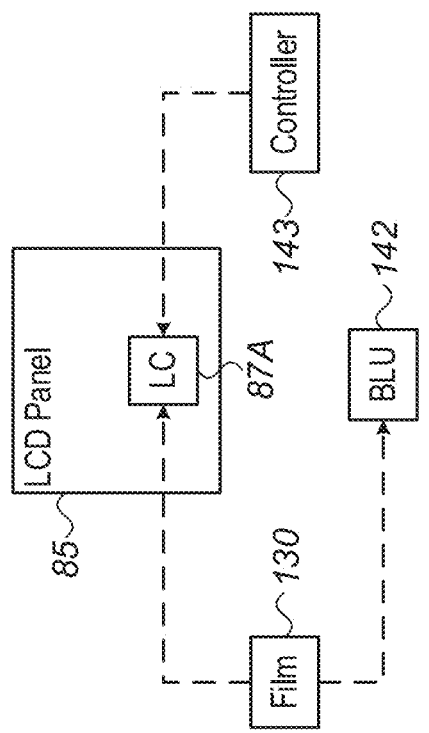

FIG. 2I is a high level schematic illustration of an intensity regulating mechanism implemented by a controller 143, according to some embodiments of the invention. Controller 143 may be configured to regulate transmission through LC unit 87A, (e.g., by controlling LC layer 85E and/or polarizers 83B, 87) in relation to the intensity of fluorescence from color conversion film 130. For example, controller 143 may be configured to tune down transmission through LC unit 87A when color conversion film 130 is fresh and provides a high level of fluorescence, and gradually tune up transmission through LC unit 87A as color conversion film 130 degrades and provides less fluorescence. Such operation of controller 143 may be configured to provide a constant output from display 140, even within a given range of degradation of color conversion film 130 to increase the lifetime of display 140.

FIG. 2J is a high level schematic illustration of a fluorescence-intensifying section 138 with color conversion film 130, according to some embodiments of the invention. Section 138 may comprise optical elements 136 and optionally 137, configured to enhance red and green radiation by reflecting fluorescent radiation from green-fluorescent and red-fluorescent RBF compounds 115 (indicated schematically by the arrows) back in direction of color filters 86 (not illustrated). The distribution and density of green-fluorescent and red-fluorescent RBF compounds 115 in color conversion film 130 may be configured to take into account recurring fluorescence to provide the required white point parameters. Section 138 may be configured to pass the blue illumination component without reflections (attenuated only by the absorption by RBF compounds 115). For example, optical element 136 may comprise DBEF (Dual Brightness Enhancement Film) film(s) which may be configured to be transparent to blue light and reflective to red and green light. Optical element 137 may also comprise DBEF film(s) configured to be transparent to blue light and reflective to red and green light, to form some back and forth reflections of R and/or G light through color conversion film 130. Optical element 137 is optional in the sense that fluorescence-intensifying section 138 may comprise only optical elements 136 to enhance R and/or G light by simple reflection. In certain embodiments, fluorescence-intensifying section 138 may be also configured to enhance the degree of polarization of the illumination, by selectively reflecting (by optical element 136) and/or transmitting (by optical element 137) light with specified polarization properties, in particular red and green light with specified polarization properties. Fluorescence-intensifying section 138 may at least partly compensate for possible loss of polarization by fluorescence of RBF compounds 115 in color conversion film 130. Fluorescence-intensifying section 138 may be positioned in either back light unit 142 and/or LCD panel 85, and may be combined with any of the disclosed display configurations. Advantageously, fluorescence-intensifying section 138 may be configured to reduce stray light, compensate for absorption and/or enhance polarization of light passing through color conversion film 130.

In certain embodiments, enhancements may be applied to color conversion film 130 integrated in backlight unit 142 and/or in LCD panel 85. For example, a short-pass reflector (SPR) layer (see e.g., layer 139A in FIG. 2L) may be positioned before color conversion film 130 to reflect backward fluorescent emission of RBF compounds 115 into the forward direction, to prevent absorption loss of the backward fluorescent emission. It is noted that SPR layer 139A may be implemented as any of, e.g., single-edge short-pass dichroic beam splitter(s), bandpass filter(s) and/or blocking single-band bandpass filter(s) or their combinations. In certain embodiments, a layer may be positioned after color conversion film 130 to enhance the fluorescent output of color conversion film 130 by directing more radiation through it, to reduce stray fluorescent emission and possibly to reduce cross talk between RGB color filters 86 (see also crosstalk-reducing layer 139B disclosed below). In certain embodiments, possible polarization scrambling by film 130 may be compensated by a layer positioned before or after film 130, such as a thin analyzer (polarizer) layer 87B.

Figures 2K, 2L:
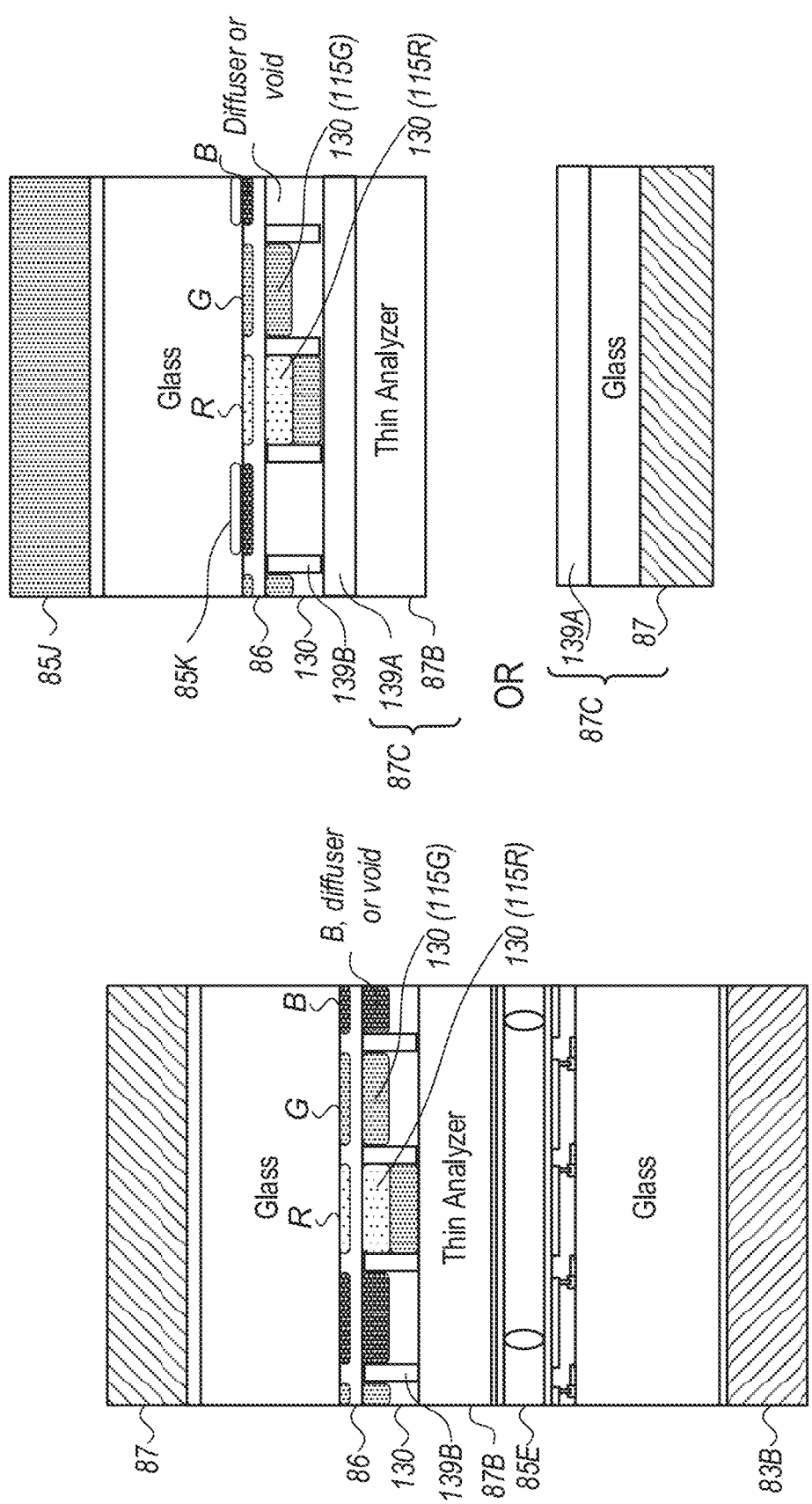

FIGS. 2K and 2L are high level schematic illustrations of patterned color conversion films 130 with a matrix-like crosstalk-reducing layer 139B, according to some embodiments of the invention. FIG. 2K illustrates schematically a cross section through a part of LCD panel 85, between polarizer 83B and analyzer 87 of embodiments similar to the illustrated in FIG. 2G.

In certain embodiments, color conversion film 130 may be patterned and attached to or adjacent to RGB color filters layer 86. Regions of color conversion film 130 which are adjacent to B (blue) color filter regions of layer 86 may be devoid of RBF compounds 115 and pass all the blue light (see also FIG. 2D); regions of color conversion film 130 which are adjacent to G (green) color filter regions of layer 86 may comprise only green-fluorescent RBF compounds 115 to convert blue light to green light; and regions of color conversion film 130 which are adjacent to R (red) color filter regions of layer 86 may comprise both green-fluorescent and red-fluorescent RBF compounds 115 to convert blue light to green light and green light to red light, respectively. The film stack comprising patterned color conversion film 130, color filters layer 86 and possibly liquid crystal (LC) layer 85E, polarizer 83B and analyzer 87 (indicated as an LC unit 87A)—may be produced or processed jointly to achieve exact alignment of patterned color conversion film 130 and color filters layer 86.

Color conversion films 130 may have a crosstalk-reducing layer 139B embedded therein (see also FIG. 2M below), and/or patches of color conversion film 130 may be incorporated within the structural framework of crosstalk-reducing layer 139B. Color conversion film 130 with crosstalk-reducing layer 139B may be patterned to comprise compartments of film 130 with green-fluorescent RBF compounds 115, denoted 130 (115G)—before the G filter regions of RGB filter 86, compartments of film 130 with both red-fluorescent and green-fluorescent RBF compounds 115, denoted 130 (115R) and 130 (115G), respectively—before the R filter regions of RGB filter 86 and compartments with blue or no film 130 (e.g., possibly blue emitting film "B", a diffuser and/or a void, as explained below) before the B filter regions of RGB filter 86.

FIG. 2L illustrates schematically a cross section through a part of LCD panel 85, with additional optical elements configured to optimize the LCD output and the radiation movement through the LC panel. For example, SPR layer 139A may be used before layer 130 to recycle backscattered fluorescent light and possibly to increase blue transmission by configuration in the respective polarization; and optical elements 85J, 85K may be used to control radiation after layer 130. For example, optical elements 85K may comprise diffuser or concave micro lens configured to correct possible spatial distribution differences in illumination between the B, R and G component from film 130 and filters 86 (e.g., possibly correcting deviations introduced be film 130). Optical elements 85K may comprise, in addition or in place of analyzer 87, and possibly integrated in protective layer 85J, optical elements configured to reflect back and/or absorb ambient light, a black matrix with micro lenses to further improve the LCD output. In certain embodiments, thin analyzer 87B may be positioned before SPR layer 139A to enhance the degree of polarization of the radiation reaching film 130, optionally to compensate for possible polarization scrambling in film 130. Thin analyzer 87B and SPR layer 139A (illustrated as stack 87C) may be replaced by (main) analyzer 87, a glass substrate and SPR layer 139A in alternative embodiments of stack 87C.

Figure 2M:
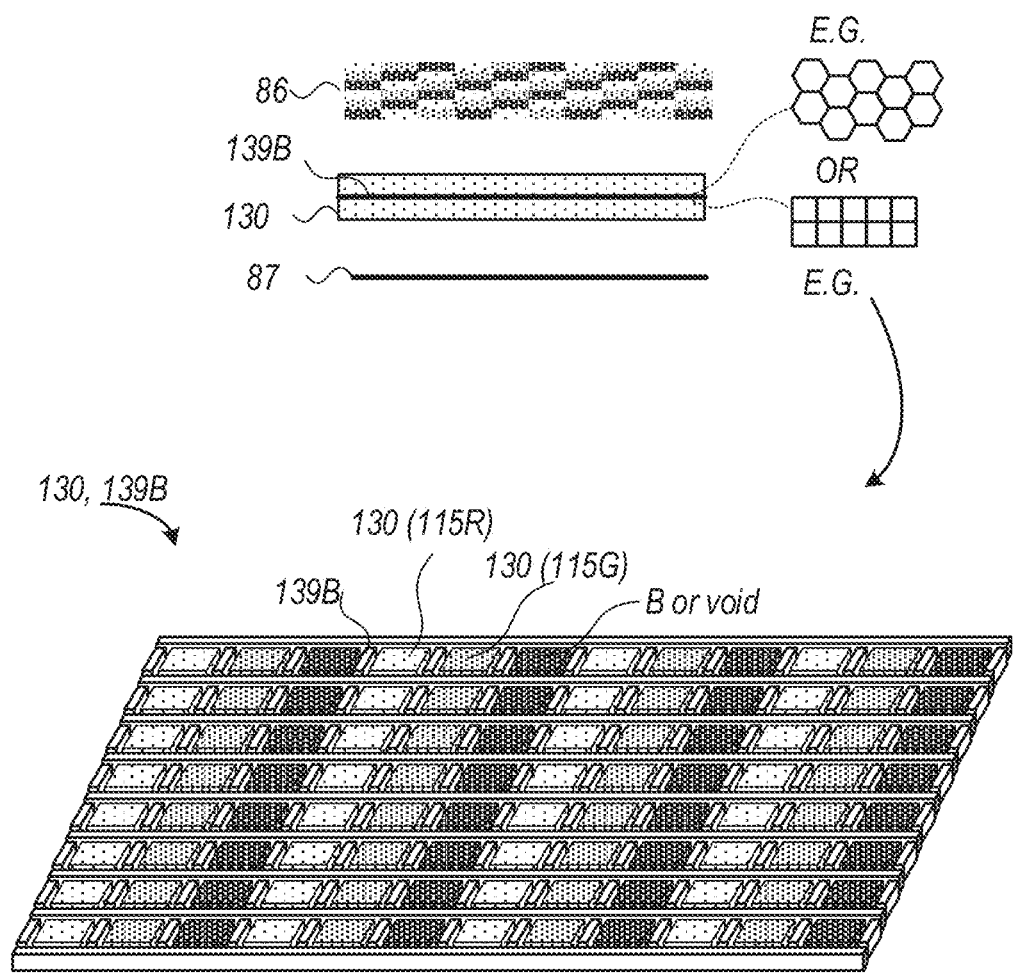

FIG. 2M provides a schematic cross section view of a part of LCD panel 85 as well as a perspective view of color conversion films 130 with crosstalk-reducing layer 139B, showing the top compartments thereof (130 (115G) of the red compartments are not visible in the image, see in FIGS. 2K, 2L). In non-limiting examples, layer 139B may have a honeycomb structure, a rectangular structure or any other structure designed to correspond to patterns of color filters 86 and/or to patterns of color conversion film 130 disclosed above. The combination of color conversion films 130 and crosstalk-reducing layer 139B may be implemented by a range of technologies, such as deposition methods, photolithography, solution-based coating methods and/or by producing a film (such as a white film, a black film, a reflective film etc.) with holes by the corresponding color-conversion materials (patches of film 130 with respective RBF compounds 115). Layers 130, 139B may be positioned next to LC layer 85E and/or after analyzer 87 (see e.g., FIGS. 2G, 2H, respectively), depending on the level pf polarization layers 130, 139B are configured to provide.

In certain embodiments, the configuration illustrated schematically in FIG. 2L may be used with backlight unit 142 having blue illumination source 80A or with backlight unit 142 having white illumination source 80B, as illustrated e.g., in FIG. 2A and in FIG. 2N described below.

Figure 2N:
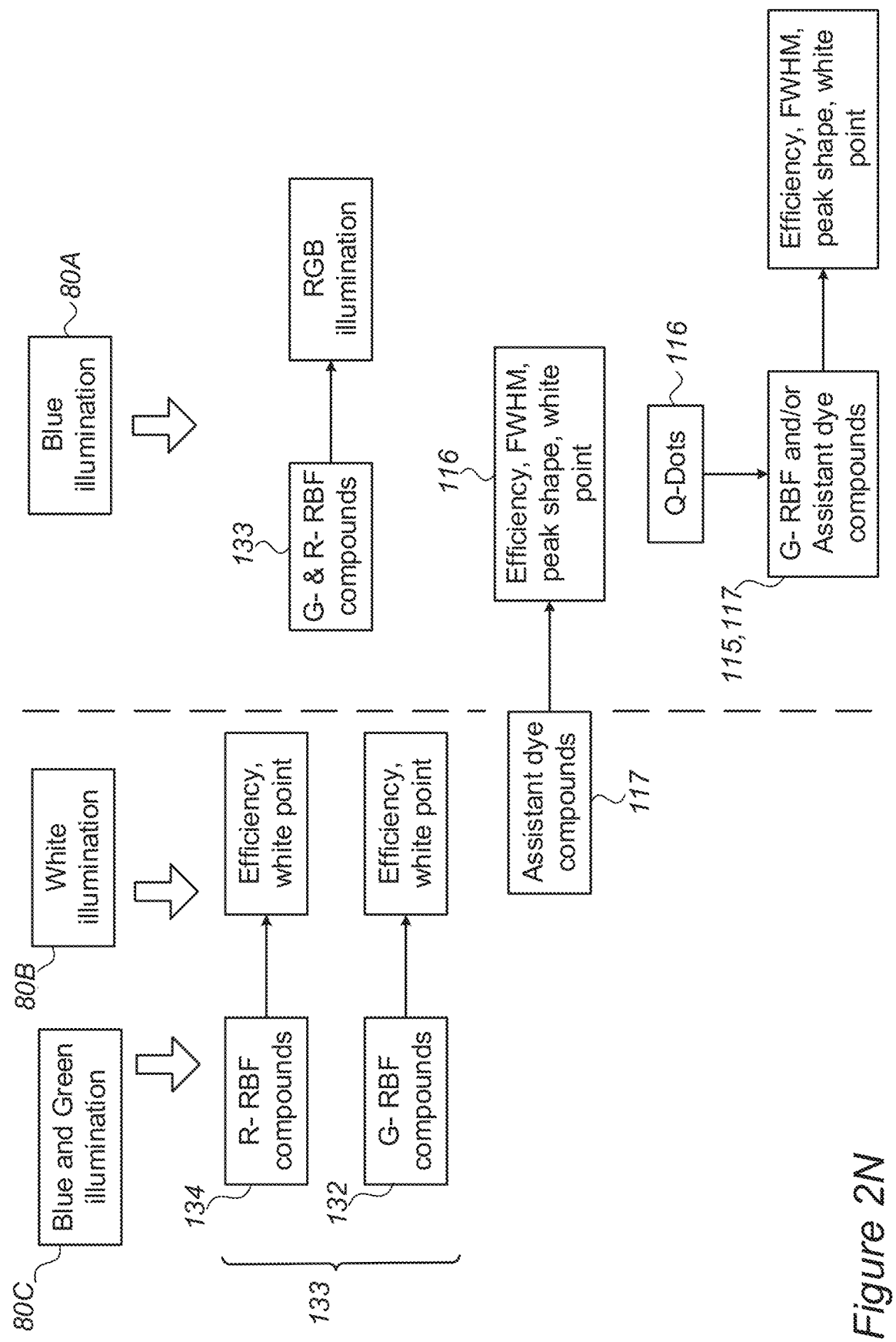

FIG. 2N is a high level schematic block diagram illustrating various configurations of LCD panel 85 and display 140, according to some embodiments of the invention. Various configurations and combinations illustrated in FIG. 2N are explained in more detail and demonstrated in FIGS. 5C-5F and 14A-14F below. Disclosed configurations may be implemented for backlight units 142 configured to provide white illumination 80B (e.g., using white LEDs) and/or blue illumination 80A (e.g., using blue LEDs), as discussed below.

For white illumination 80B, red-fluorescent and green-fluorescent RBF compounds 115 in respective layers 134, 132 (or possibly in mixed layer 133) may be used to enhance efficiency (illumination intensity of LCD display 140) and/or adjust its white point. Efficiency enhancement may be achieved by changing the white illumination spectrum to bring a larger part of the spectrum into the transmission ranges of RGB filters 86, as illustrated e.g., in FIGS. 5A-5D and the respective disclosure sections. White point adjustment may be achieved by changing the ratios between the illumination components in the transmission ranges of RGB filters 86 within the illumination spectrum, as illustrated e.g., in FIGS. 3C-3E and the respective disclosure sections.

For blue illumination 80A, red-fluorescent and green-fluorescent RBF compounds 115 in one or more layers 133 may be used to adapt the illumination spectrum to the transmission ranges of RGB filters 86, as disclosed herein (see also FIG. 2C).

It is noted that the configuration of red-fluorescent and green-fluorescent RBF compounds 115 in color conversion films 130 or color conversion elements may be applied when using blue illumination 80A for providing green and red illumination; when using white illumination 80B for enhancing green and red illumination and adjusting the illumination spectrum; and possibly when using blue and green illumination 80C (e.g., with blue and green LEDs in backlight units 142) for providing red illumination and enhancing red illumination and adjusting the illumination spectrum.

In any of the above-disclosed cases, assistant dye compounds 117 may be used as disclosed below (e.g., FIGS. 2O, 5D) to enhance any of the efficiency, FWHM, peak shape and/or white point of the illumination reaching RGB filters 86 and the illumination provided by LCD display 140. Assistant dye compounds 117 may be selected to have specified absorption and emission peaks and/or to have absorption curves and fluorescence curves which change the shape of illumination spectrum 80A and/or 80B and/or change the shape and intensity of illumination components in the transmission ranges of RGB filters 86. Two non-limiting examples for assistant dyes 117 are 5-FAM and 5-Carboxyfluorescein. Another non-limiting example of assistant dye 117 is HPTS; pyranine (8-Hydroxypyrene-1, 3,6-Trisulfonic Acid, Trisodium Salt), having an absorption peak at shorter wavelengths than 5-FAM (e.g., at ca. 450 nm vs. 490 nm), with a similar emission peak at 520-530 nm (depending on embedding conditions). Other non-limiting examples of assistant dye 117 are rhodamine 12, rhodamine 101 from Atto-tec® and perylene dye F300 from Lumogen®.

FIG. 2O is a high level schematic illustration of patterned color conversion films 130 with a layer 117 of assistant dyes, according to some embodiments of the invention. Layer 117 of assistant dyes may be patterned, possibly with different assistant dyes associated with each of R, G and B filters 86, indicated schematically as assistant dye layers 117(R, G, B). In certain embodiments (not shown), assistant dye layers 117 may be integrated in one or more of patterned color conversion film(s) 130.

In certain embodiments, an illumination efficiency calculation may be used to adjust the relative amounts of illumination in each spectral range (e.g., R, G, B ranges). First, color conversion factors may be adjusted to provide relative amounts of R, G, B illumination reaching color filters 86 (e.g., green and red color conversion for blue illumination 80A, red color conversion for blue and green illumination 80C), second, color conversion dyes (and possibly assistant dyes) may be provided to adjust the illumination spectrum and fine tune the relative amounts of R, G, B illumination reaching color filters 86 (e.g., red and green enhancement for blue illumination 80A, red and green enhancement for white illumination 80B, red and possibly green enhancement for blue and green illumination 80C). Third, conversion efficiencies and adjustment efficiencies may be calculated together with efficiency figures of other components to adjust the relative intensities of R, G, B illumination provided by LCD display 140. For example, red and green enhancements may be configured to compensate for higher losses through red and green conversion films and possibly for higher losses for R illumination (due to double conversion—to green and then to red) than for G illumination (see also FIGS. 2B and 2C).

In certain embodiments, assistant dye(s) may comprise phosphorous compound(s) selected to convert blue illumination 80A to illumination at longer wavelengths, as an assistant component (e.g., in association with R color filters 86 as 117R).

In the case of blue illumination 80A which is used with quantum dots 116, red-fluorescent and/or green-fluorescent RBF compounds 115 and/or assistant dyes 117 may be used to enhance any of the efficiency, FWHM, peak shape and/or white point of the illumination reaching RGB filters 86 and the illumination provided by LCD display 140 (FIG. 2N).

Red-fluorescent and/or green-fluorescent RBF compounds 115 and/or assistant dye compounds 117 may be selected to have specified absorption curves and fluorescence curves which change the shape of illumination spectrum 80A after it is modified by quantum dots 116 and/or change the shape and intensity of illumination components in the transmission ranges of RGB filters 86. In particular, red-fluorescent and/or green-fluorescent RBF compounds 115 and/or assistant dye compounds 117 may be selected to correct symmetry issues in the transmission ranges of RGB filters 86 which are prevalent when using certain color conversion technologies (see e.g., FIG. 5F).

FIG. 2P is a high level schematic illustration of an integrated layer 186 of patterned color conversion film 130 with RGB color filters 86, according to some embodiments of the invention. In certain embodiments, one or more of RGB color filters 86 may be configured to comprise red-fluorescent and/or green-fluorescent RBF compounds 115 and/or assistant dyes 117 and be configured as respective integrated RGB color filters 186.

Figure 2Q:
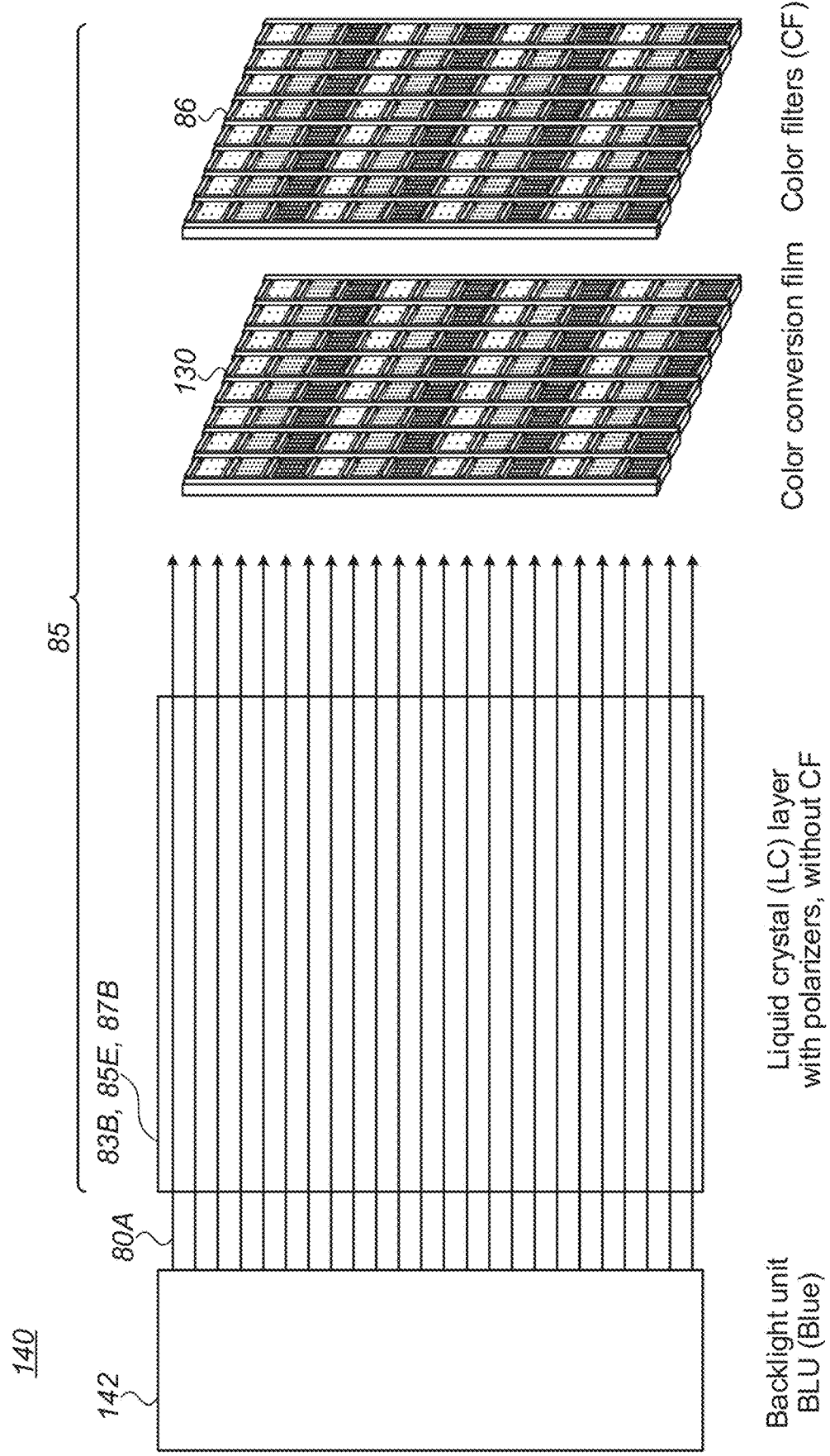

FIG. 2Q is a high level schematic enlarged view of an LCD 140 having a possibly collimated backlight unit 142, according to some embodiments of the invention. For example, light source 80 may provide blue illumination 80A which is collimated, composed of parallel beams. An LCD panel 85 may comprise a liquid crystal (LC) layer 85E with associated polarizers and control circuitry (not shown), which is configured to control the images of LCD 140, with a color conversion film 130 and a color filter layer 86 (which may be separate or integrated) following, to provide the displayed image. The above-display configuration of color conversion film 130 and color filter layer 86 is enabled by the fact that illumination 80A is collimated, preventing spatial discrepancies (such as scattering and cross talk) between positions of LC elements and positions of color filter elements.

It is noted that any of the disclosed embodiments may be implemented in various pixel arrangements (e.g., stripe, mosaic, delta and boomerang arrangements, as non-limiting examples) and with respect to any number of subpixels per pixel (e.g., 1, 2, 3 or more subpixels per pixel, possibly with various color allocations per subpixel), possibly with corresponding spatial adjustments and configurations, and possibly only to some of the sub-pixels in the array. Clearly, the patterning of color conversion film 130 may be configured to follow the patterning of color filter layer 86 and/or be integrated therewith. Elements of color conversion film 130 may be configured to be produced together with color filter layer 86 with minimal or possibly no additional complexity, using same or possibly modified production processes.

Figure 2R:
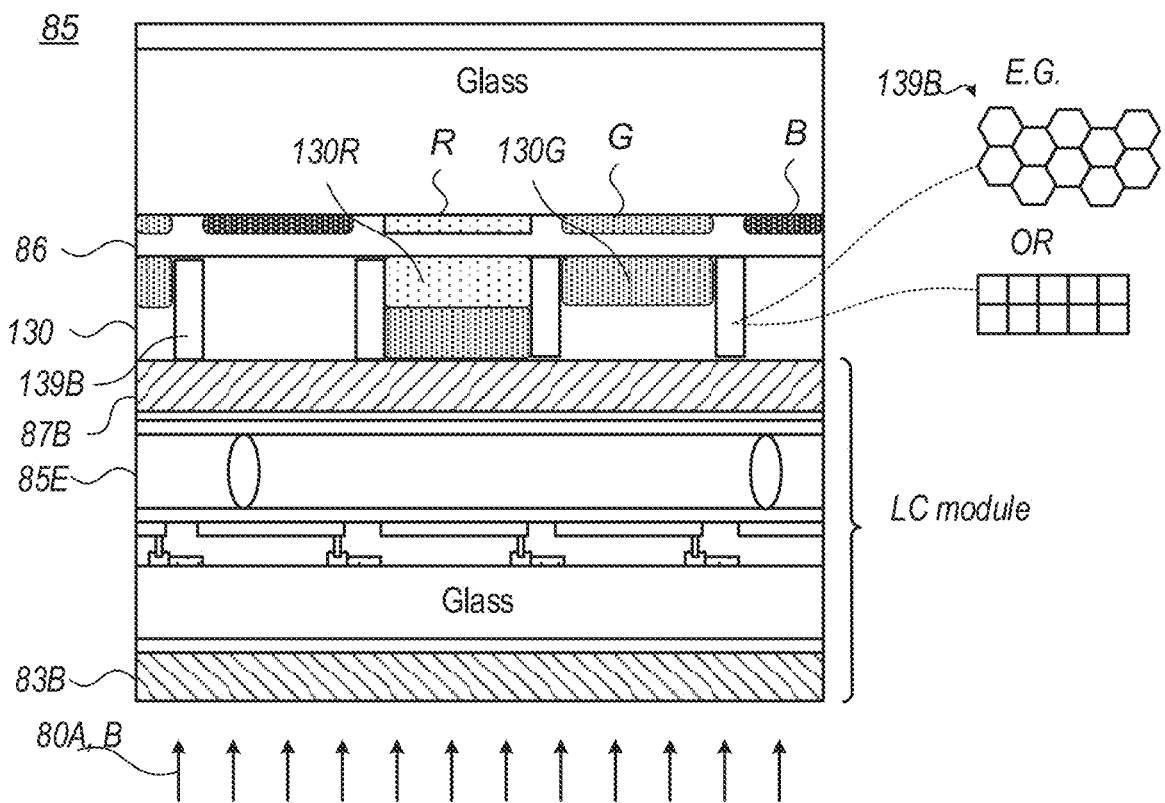

FIG. 2R is a high level schematic illustration of patterned color conversion film 130 with a matrix-like crosstalk-reducing layer 139B in an above-LC configuration, according to some embodiments of the invention. Illumination 80A and/or 80B (possibly collimated) may be configured to enable maintaining the direction of illumination exiting the LC module as it propagates through color conversion film 130 to color filters 86 and exits display 140—to achieve a low level of blurring and high efficiency. FIG. 2R is a schematic cross section through a part of LCD panel 85, including polarizer 83B, LC layer 85E, polarizer (analyzer) 87B, and patterned color conversion film 130 and color filters layer 86 positioned above polarizer (analyzer) 87B.

Figure 2S:
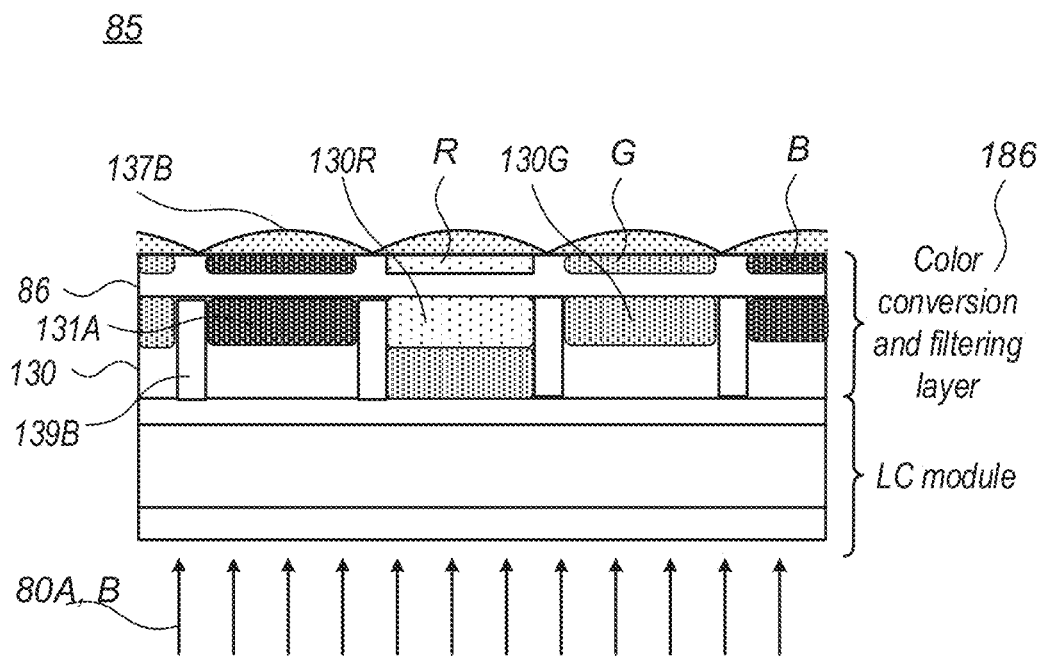
Figure 2T:
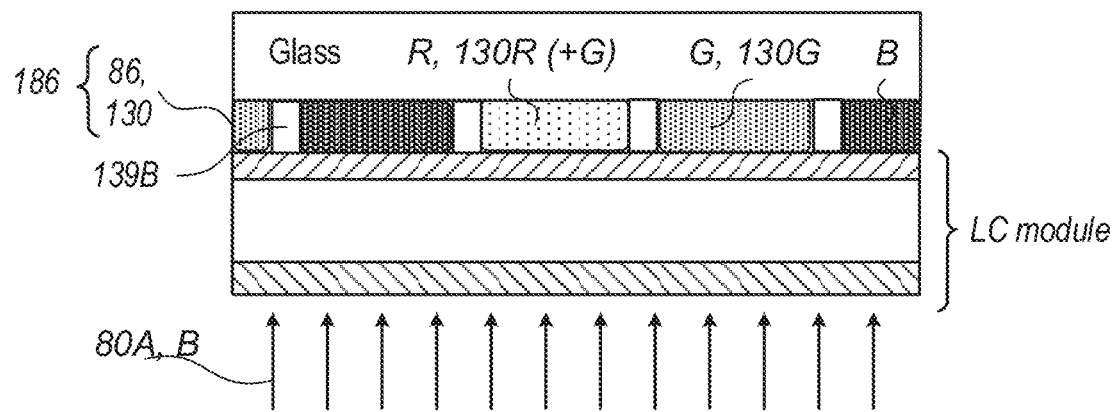

FIG. 2S is a high level schematic illustration of LCD panel 85 comprising the color conversion and filtering layer above the LC module, with a top optical-elements array 137B, according to some embodiments of the invention. The color conversion and filtering layer may comprise separate color conversion layer 130 and color filters layer 86 or integrated color conversion and filtering layer 186 as shown in FIG. 2T below. LCD panel 85 may comprise top optical-elements array 137B having e.g., a micro-lens array (FIG. 2S), which is placed above color filters 86 and configured to increase the brightness and radiance of LCD 140 at the center of a vertical viewing direction. LCD panel 85 may comprise top optical-elements array 137B having optical elements such as lenslets, encapsulated within a transparent material (typically having a lower refractive index than the lenslets), providing a flat optical element which is placed above color filters 86 and configured to increase the brightness and radiance of LCD 140 at the center of a vertical viewing direction.

FIG. 2S further illustrates schematically blue diffuser elements 131A, which may be applicable to any of the embodiments disclosed herein, configured to provide a similar spatial distribution of blue light as the red and green light spatial distributions, which are affected by color conversion elements 130R (e.g., 130(115R)) and/or 130G (e.g., 130(115G)). In certain embodiments, top optical-elements array 137B may comprise optical elements (e.g., micro-lenses) only over blue sub-pixels (in addition or in place of blue diffuser elements 131A) to equalize the light spatial distributions of R, G and B light.

Figure 2U:
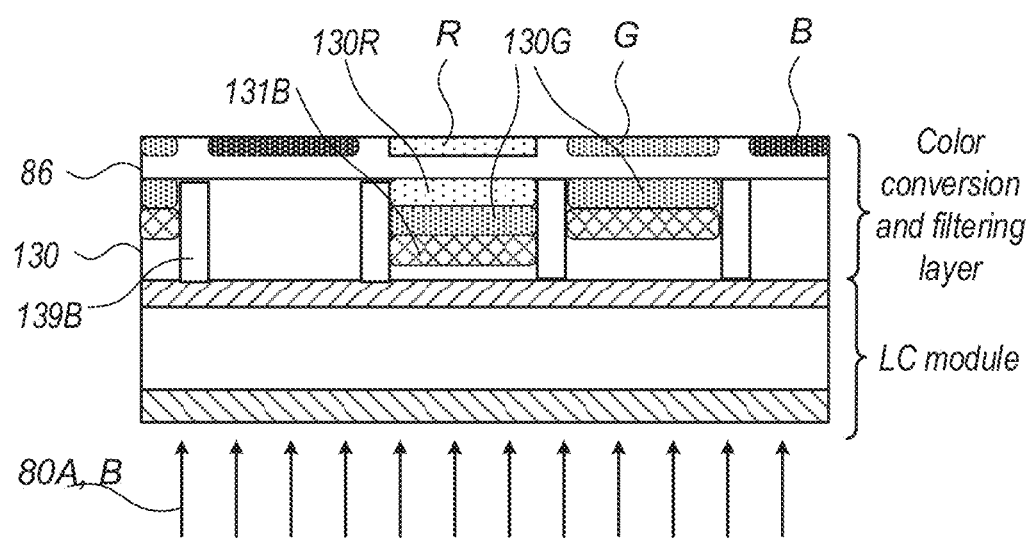

FIGS. 2T and 2U are high level schematic illustrations of a part of LCD panel 85, according to some embodiments of the invention. FIG. 2T is a schematic cross section view. In certain embodiments, patterned color conversion film 130 and color filters layer 86 may be integrated into a single layer 186 configured to perform both functions of color conversion and filtering. Layer 186 may be pixelated in any pattern of pixels and subpixels, and may have regions B, G+130G and R+130R (possibly with additional colors, e.g., yellow) configured to provide blue, green and red light from illumination 80A and/or 80B (possibly collimated), e.g., collimated blue illumination 80A, through color conversion and color filtering. Corresponding concentrations and amounts of absorptive and fluorescent dyes may be produced into the compartments of layer 186 according to the principles disclosed herein, possibly integrated in a production process which is similar to the current process of producing color filters layer 86. Supporting elements and/or matrix-like crosstalk-reducing layer 139B may be part of layer 186 to maintain collimation of the provided light and minimize light stray.

FIG. 2U further illustrates schematically red and/or green diffuser elements 131B, which may be applicable to any of the embodiments disclosed herein, configured to regulate the spatial distribution of red and/or green light, respectively, possibly to compensate for effects of color conversion elements 130R and/or 130G, respectively. In certain embodiments, blue diffuser elements 131A may be applied together with red and/or green diffuser elements 131B. Any of the embodiments may be configured to equalize the light spatial distributions of R, G and B light.

In certain embodiments, color conversion film 130 may be patterned and attached to or adjacent to RGB color filters layer 86. Regions of color conversion film 130 which are adjacent to B (blue) color filter regions of layer 86 may be devoid of color conversion compounds and pass all the blue light; regions of color conversion film 130G which are adjacent to G (green) color filter regions of layer 86 may comprise only green color conversion compounds, such as green-fluorescent rhodamine-based compounds disclosed in U.S. patent application Ser. No. 15/252,597, included herein by reference in its entirety, to convert blue light to green light; and regions of color conversion film 130R which are adjacent to R (red) color filter regions of layer 86 may comprise both green and color conversion compounds such as green-fluorescent and red-fluorescent rhodamine-based compounds disclosed in U.S. patent application Ser. Nos. 15/252,597 and 15/252,492, included herein by reference in their entirety, to convert blue light to green light and green light to red light, respectively.

Color conversion films 130 may comprise crosstalk-reducing layer 139B embedded therein (patterned in squares, hexagons, or other shapes), and/or patches of color conversion film 130 may be incorporated within the structural framework of crosstalk-reducing layer 139B. Color conversion film 130 with crosstalk-reducing layer 139B may be patterned to comprise compartments 130G of film 130 with green color conversion compounds adjacent and before the G filter regions of RGB filter 86, compartments 130R, 130G (possibly combined or integrated) of film 130 with both green and red color conversion compounds adjacent and before the R filter regions of RGB filter 86 and compartments with blue or no film 130 (e.g., possibly blue emitting film, a diffuser and/or a void) adjacent and before the B filter regions of RGB filter 86.

In certain embodiments, additional layers may be added, such as short-pass reflector (SPR) layer(s) to recycle back-scattered fluorescent light and possibly to increase blue transmission by configuration in the respective polarization, optical elements configured to control radiation after color conversion layer 130 such as diffuser(s) or concave micro lenses configured to correct possible spatial distribution differences in illumination between the B, R and G component from color conversion film 130 and filters 86, to reflect back and/or absorb ambient light, to further improve the LCD output e.g., using a black matrix with micro lenses, etc. In certain embodiments, a thin analyzer layer may be used as polarizer (analyzer) 87 to enhance the degree of polarization of the radiation reaching color conversion film 130, optionally to compensate for possible polarization scrambling therein.

Figure 3A:
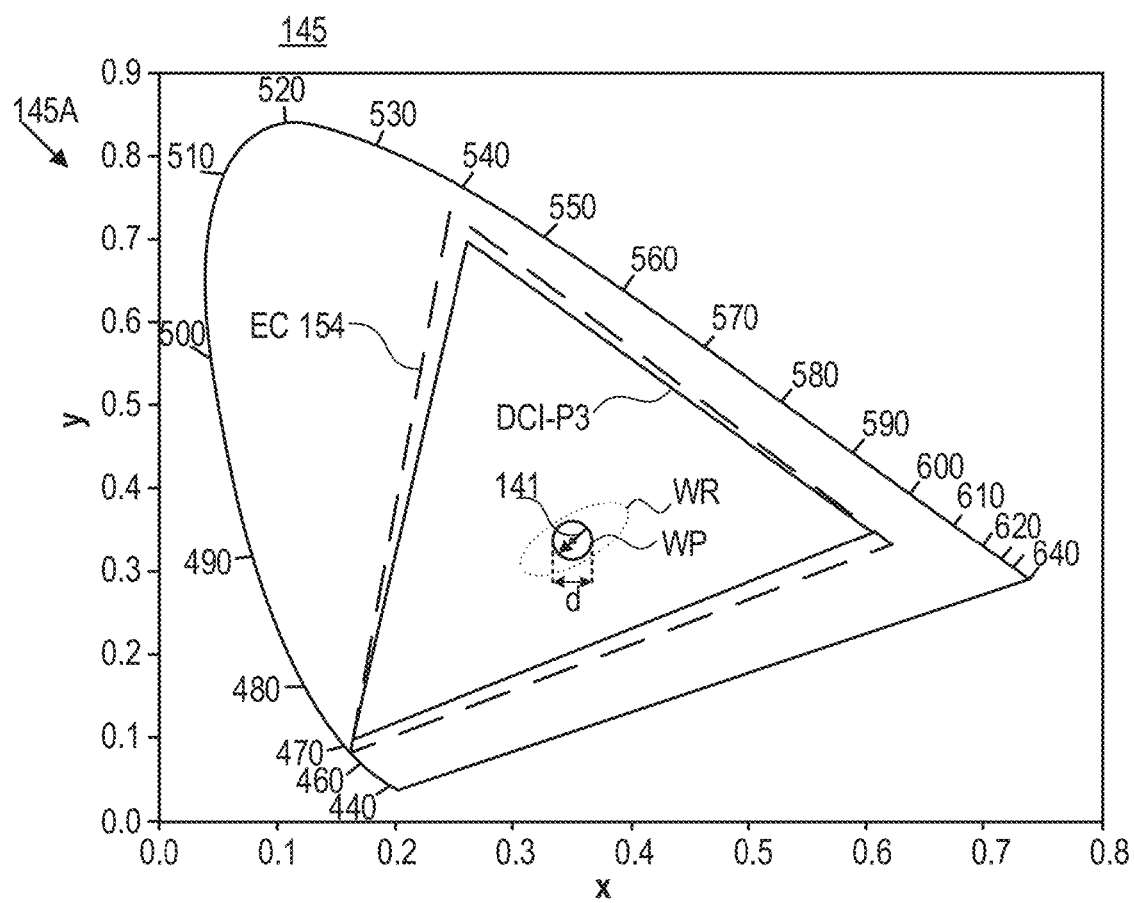
FIGS. 3A-3F schematically illustrates white point adjustment that extends a display lifetime, according to some embodiments of the invention.
Figure 3B:
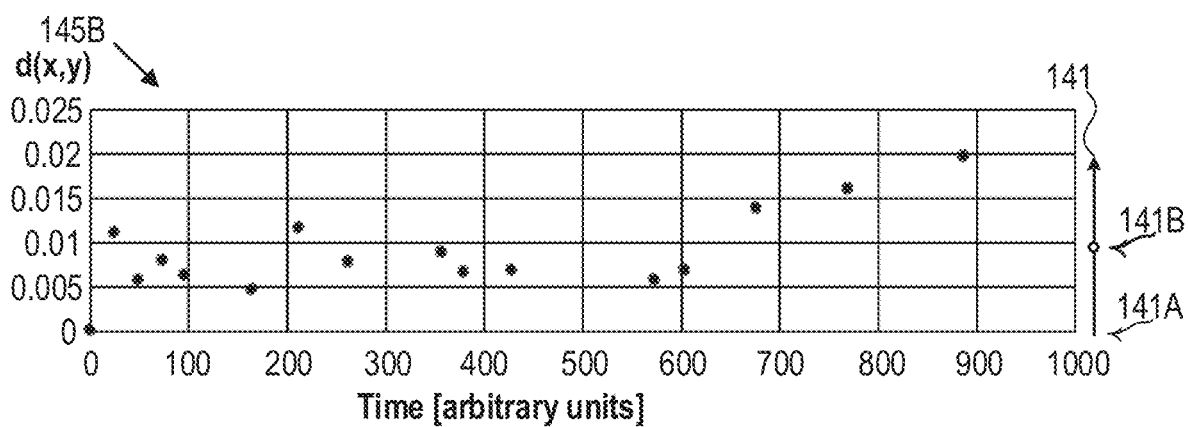
Figure 3C:
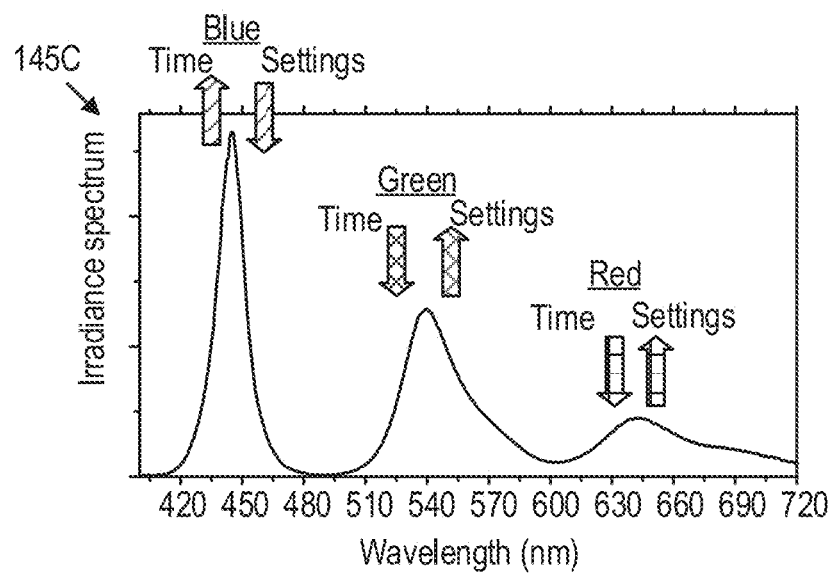

FIGS. 3A-E schematically illustrates white point adjustment 145 that extends a display lifetime of display 140, according to some embodiments of the invention. Illustration 145A (FIG. 3A) shows an example of EC-154 (Z3 with JK-71+Z2 with ES-61, see line 9 in Table 1 below) sample color gamut compared to DCI (digital cinema initiatives) P3 cinema standard color gamut over the CIE 1931 color space with a white region indicated by WR and a white point denoted by WP, having a diameter which is denoted by d and may be e.g., 0.01 in the diagram's x coordinates. The region WP denotes the range within which display 140 is considered to be within the specifications with respect to its color performance. Once the actual white point of display 140 is outside region WP, even when it remains within a possibly larger region WR corresponding to white color, display 140 is considered over its lifetime and not operating according to specifications. In a typical setting, films 130 are configured to provide a white point 141A at the center of the region WP and as with time RBF compounds 115 or other color conversion elements degrade 141 (indicated in graph 145C, FIG. 3C, showing the emission spectrum of film 130 by arrows which are denoted Time) white point 141A moves until it exits region WP and the display is considered over its lifetime. The degradation in terms of the distance on color diagram 145A is illustrated in graph 145B (FIG. 3B) using non-limiting experimental data of the distance from point 141A over the operation time (in arbitrary units, a.u., scaled to 1000) of the display. In some embodiments of display 140 however, film(s) 130 may be fine-tuned to have the exact white point within region WP but at a point 141B on the edge of it which is opposite to the direction of degradation marked by arrow 141 (illustrations 145D, 145E in FIGS. 3D and 3E, respectively, show an enlarged view of white region WR). Such fine tuning to white point 141A enables the display characteristics to be changed to ca. double as much as with white point 141A while staying within the specified region WP, and as a result ca. double the lifetime of display 140. The semi-quantitative example in graph 145B illustrates an increase in display lifetime, from ca. 600 a.u. to ca. 900 a.u., when changing the white-point from 141A to 141B. As a result of the change, instead of the display starting exactly white and becoming somewhat colder white (see graph 145C, the green and red components decrease with time and correspondingly the blue component increases), display 140 starts a bit warmer, goes through the exact white point and ends a bit colder, with a longer lifetime overall. Setting a higher concentration of RBF compounds 115 or other color conversion elements in film 130 thus enables effective lengthening of the lifetime of display 140. Examples for increased dye concentrations may be up to 20% for green dyes and up to 40% for red dyes. Some embodiments comprising raising the concentration of one or more types of dyes (such as red-fluorescent and green-fluorescent RBF compounds 115), to fine tune the exact white point of display 140. The increased concentration of dyes may result in a somewhat warmer white within specified region WP. Illustrations 145D and 145E (FIGS. 3D, 3E) emphasize that white point 141B may be selected according to known degradation 141 of color conversion film 130 with respect to specified white point WP, for any type of film 130, including films using organic (non-rhodamine-based) or inorganic fluorescent compounds, quantum dots etc.

Polarization

Film 130 may comprise at least one layer 134 with red fluorescent RBF compound, or at least one layer 134 with red fluorescent RBF compound and thereupon at least one layer 132 with green fluorescent RBF compound. At least one of the layers of film 130 may be configured to exhibit polarization properties.

Figure 4:
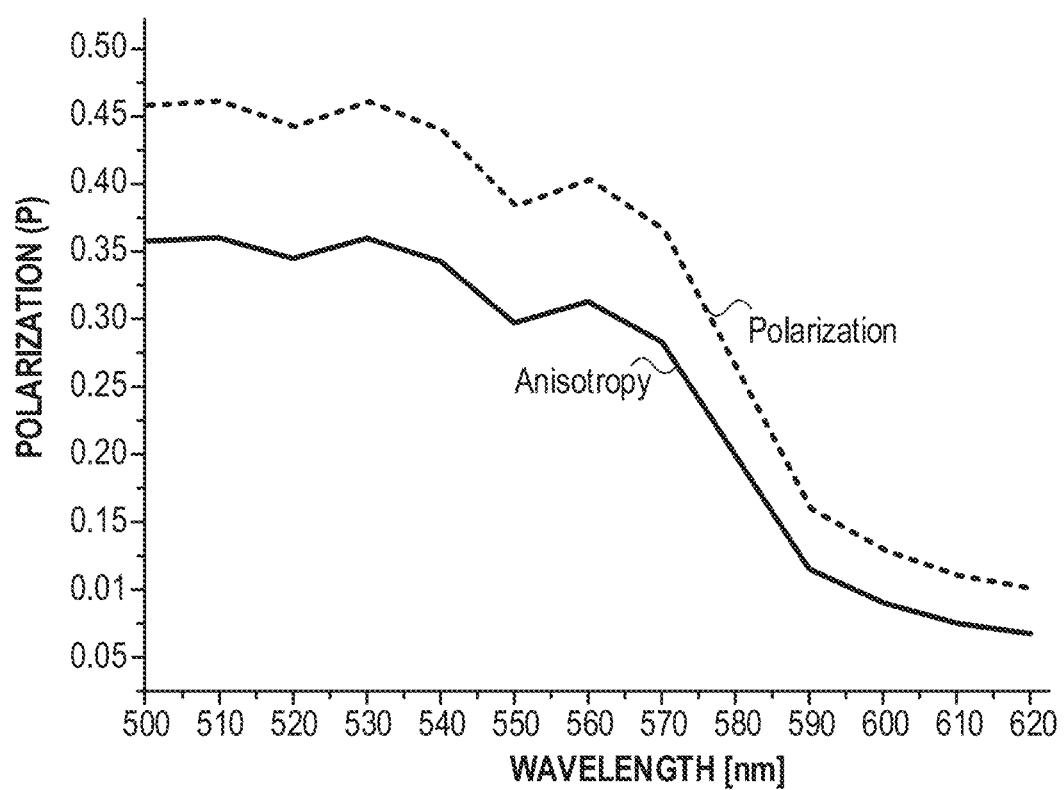
FIG. 4 is an illustration example of polarization anisotropy of film(s) with RBF (rhodamine-based fluorescent) compound(s), according to some embodiments of the invention.

FIG. 4 is an illustration example of polarization anisotropy of film(s) 130 with RBF compound(s) 115, according to some embodiments of the invention. The inventors have found out that in certain cases, during the embedding of RBF compound(s) 115 in film 130, the molecules self-assemble to affect light polarization, providing at least partially polarized light emission. Process parameters may be adjusted to enhance the degree of polarization of light emitted from film 130, e.g., by providing conditions that cause self-assembly to occur to a larger extent. Without being bound by theory, the inventors suggest that the polarized emission of fluorescence is related to the limitations on rotational motions of the macromolecular fluorophores during the lifetime of the excitation state (limitations relating to their size, shape, degree of aggregation and binding, and local environment parameters such as solvent, local viscosity and phase transition). The inventors have further found that these limitations may be at least partially controlled by the preparation process of film 130 which may thus be used to enhance illumination polarization in display 140.

For example, FIG. 4 illustrates polarization and anisotropy measurement of films 130 prepared with red and green fluorescent compounds (specifically, green coumarin 6 dye and rhodamine 101 red molecular dyes, using the sol-gel process). In the example, the anisotropy values range between 0.3-0.5 at the emission wavelengths.

Films 130 having different red and/or green fluorescent RBF compound 115, as well as films 130 prepared by UV curing also present polarization properties and may be used in device 140 to enhance or at least partially replace polarizer films (e.g., 83A, 83B, 85I etc. see FIGS. 2A and 2B).

Some embodiments comprise any type of color conversion film 130, which may comprise color conversion elements other than RBF compounds 115, such as organic (non-rhodamine-based) or inorganic fluorescent compounds, quantum dots etc.—configured to provide polarize fluorescent radiation as disclosed above. Such films 130 may be used to enhance or at least partially replace polarizer films in respective displays 140.

Red Enhancement

Figure 5A:
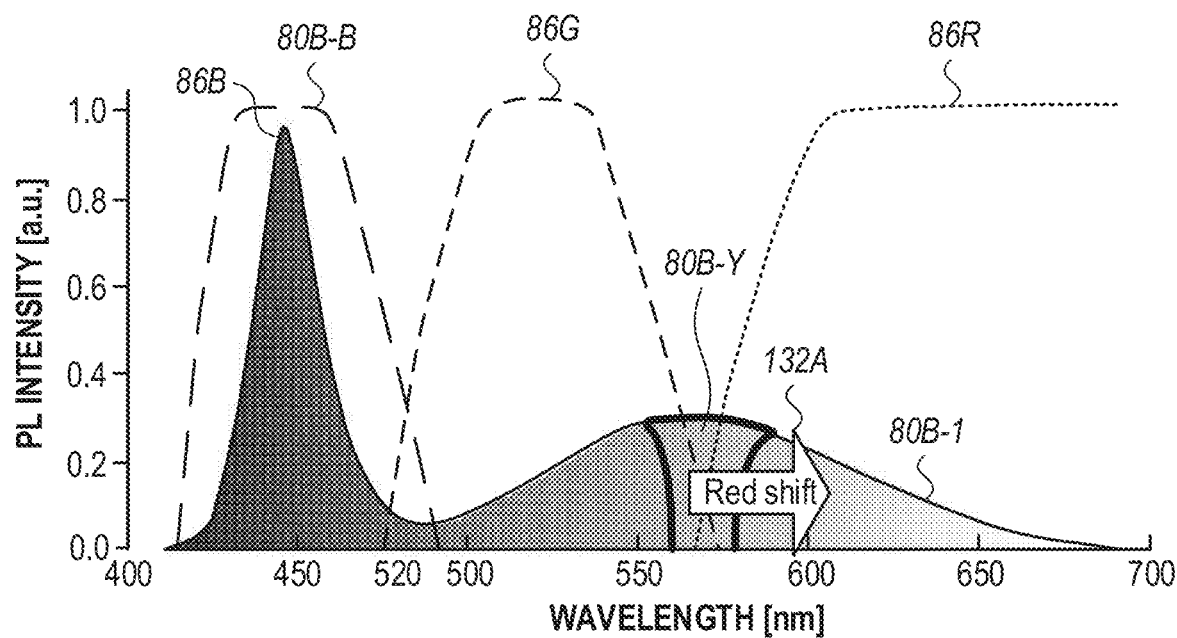
FIG. 5A is a high level schematic illustration of red (R) enhancement in devices with white illumination, according to some embodiments of the invention.

FIG. 5A is a high level schematic illustration of red (R) enhancement in devices with white illumination, according to some embodiments of the invention. FIG. 5A schematically illustrates a typical white light spectrum 80B-1 (of white illumination source 80B), optimized to provide RGB illumination 84A in prior art backlight units, and typical ranges (86R, 86G, 86B) of RGB filters 86 in LCD panel 85 (see FIGS. 2B, 2C and 2E). The inventors have found that while white light spectrum 80B-1 is optimized with respect to the ratio between its blue section (80B-B) and its yellow section (80B-Y), it is deficient with respect to the relative position of the yellow region (80B-Y) and G and R ranges 86G, 86R, respectively (corresponding, for example, to B, G, R denoted in FIGS. 2C and 2E). Indeed, much of the illumination energy in yellow region 80B-Y is filtered out and thus wasted in the operation of the display and moreover, color cross talk (part of the yellow orange might go to the green filter and some of the green-yellow to the red filter) which degrades the color gamut. The inventors have further found that using film(s) 130 with red-fluorescent RBF compound(s) 115 (layer(s) 134) shifts 132A at least some of the illumination energy in yellow region 80B-Y into red region 86R which is passed by the R (red) filter in LCD panel 85, and is therefore not wasted. Using film(s) 130 thus increases the energy efficiency of display 140 and possibly improves its color gamut.

Figure 5B:
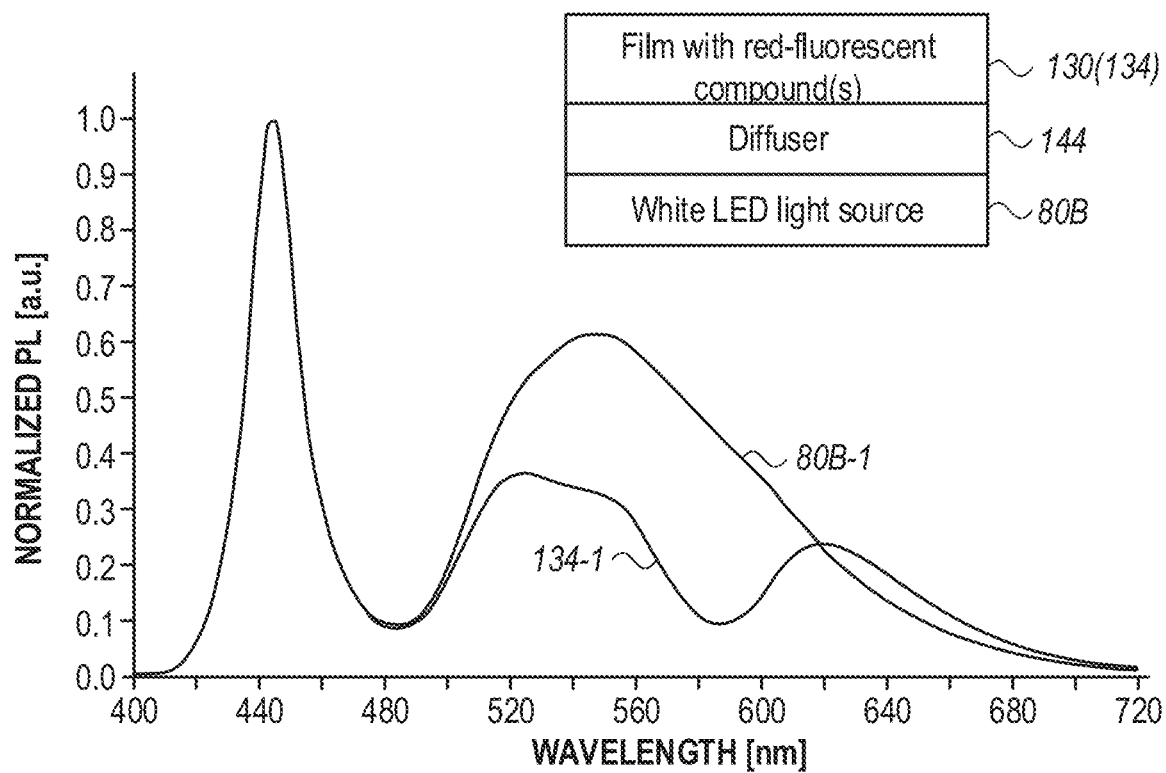
FIG. 5B illustrates an example for the improvement in an RGB spectrum provided by backlight unit using the film(s), according to some embodiments of the invention.

FIG. 5B illustrates an example for the improvement in RGB spectrum 84B provided by backlight unit 84 using film(s) 130, according to some embodiments of the invention. In this specific non-limiting example, films 130 were produced by UV curing process 300. White light spectrum 80B-1 is somewhat different from the one illustrated in FIG. 5A due to the difference in white light source 80B, yet also exhibits a peak in the yellow region. In contrast, emission spectrum 134-1 of film 130 (made of layer(s) 134—specifically—one to three layers with JK32 (0.02-0.3 mg/ml for each layer, spectra shown without LCD color filter effects)) in backlight unit 142 splits the yellow peak of white light spectrum 80B-1 into a green and a red peak, each within the range of the corresponding G and R filters, thereby increasing the efficiency, reducing the color cross talk and improving the gamut of display 140, e.g., by providing a more saturated (narrower FWHM, full width at half maximum) red and at longer red wavelength. In the example, the characteristics of the green and red peaks of emission spectrum 134-1 of film 130 were 618±5 nm peak with FWHM of ca. 60 nm for the red peak and 518±5 nm peak with FWHM of ca. 50 nm for the green peak; with the quantum yield of film 130 being between 70-90% and the lifetime at device level being between 20,000-50,000 hours for multiple repeats.

Some embodiments comprise any type of color conversion film 130, which may comprise color conversion elements other than RBF compounds 115, such as organic (non-rhodamine-based) or inorganic fluorescent compounds, quantum dots etc.—configured to provide polarize fluorescent radiation as disclosed above. Such films 130 may be used to RGB spectra 84B by providing shifts 132A of yellow illumination 80B-Y into the red region of corresponding R color filters 86 in respective displays 140.

In some embodiments, films 130 may be configured to provide green enhancement, using only or mostly green-fluorescent compounds.

Green Enhancement

Figure 5C:
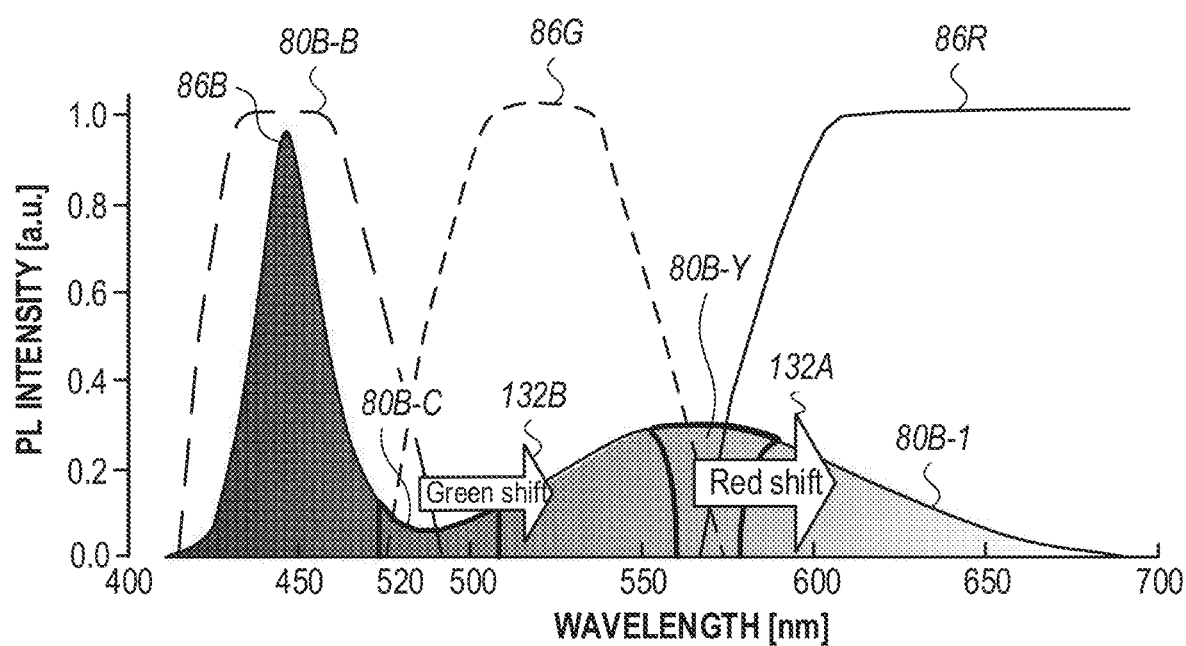
FIG. 5C is a high level schematic illustration of green (G) and red (R) enhancement in devices with white illumination, according to some embodiments of the invention.

FIG. 5C is a high level schematic illustration of green (G) and red (R) enhancement in devices with white illumination, according to some embodiments of the invention. FIG. 5C schematically illustrates a typical white light spectrum 80B-1 (of white illumination source 80B), optimized to provide RGB illumination 84A in prior art backlight units, and typical ranges (86R, 86G, 86B) of RGB filters 86 in LCD panel 85 (see FIGS. 2B, 2C and 2E). In addition to red enhancement illustrated and disclosed in FIGS. 5A and 5B, the inventors have further found that further enhancement may be achieved by shifting at least some of a cyan component 80B-C in white illumination 80B into the green region (and possibly at partly further into the red region), as typically much of the illumination energy in cyan region 80B-C is filtered out by RGB filters 86 and thus wasted in the operation of the display and moreover, color cross talk (part of the greenish cyan might go to the green filter and some of the bluish cyan to the blue filter) degrades the color gamut. The inventors have further found that using film(s) 130 with green-fluorescent RBF compound(s) 115 (layer(s) 132) shifts 132B at least some of the illumination energy in cyan region 80B-C into green region 86G which is passed by G (green) filter 86 in LCD panel 85, and is therefore not wasted. Using film(s) 130 thus increases the energy efficiency of display 140 and possibly improves its color gamut.

Certain embodiments comprise LCD 140 comprising backlight unit 142 configured to provide white illumination 80B and LCD panel 85 receiving illumination from backlight unit 142 and comprising, sequentially with respect to the received illumination: polarizing film 83B, liquid crystal layer 85E, analyzer film 87B, color conversion film 130 (possibly patterned), RGB color filter layer 86, and protective layer 85J, possibly with additional analyzer film 87 between RGB color filter layer 86 and protective layer 85J. Color conversion film 130 may comprise rhodamine-based fluorescent (RBF) compounds 115 selected to absorb illumination from backlight unit 142 and have an R emission peak and a G emission peak. In any of the embodiments, assistant dyes 117 may be further integrated in the color conversion film 130 and/or in a separate layer. Green enhancement in white LED applications may improve the efficiency and/or intensity of green and/or red filters 86.

Integration of Color Conversion and Color Filters

As illustrated e.g., in FIG. 2P, certain embodiments comprise LCD 140 comprising backlight unit 142 configured to provide illumination 80 and LCD panel 85 receiving illumination from backlight unit 142 and comprising, sequentially with respect to the received illumination: polarizing film 83B, liquid crystal layer 85E, analyzer film 87B, integrated RGB color filter layer 186 which is integrated with color conversion film 130 (possibly patterned), and protective layer 85J, possibly with additional analyzer film 87 between integrated RGB color filter layer 186 and protective layer 85J. Integrated RGB color filter layer 186 may comprise rhodamine-based fluorescent (RBF) compounds 115 selected to absorb illumination from backlight unit 142 and have an R emission peak and a G emission peak.

Integration of color filters 86 with color conversion layer 130 may simplify the design of display 140 and enhance its efficiency (e.g., reduce losses, further reducing stray light and increasing the efficiency of utilization of illumination 80). In certain embodiments, illumination 80 may comprise blue illumination 80A and integrated RGB color filter layer 186 may comprise RBF compounds 115 having the R emission peak and the G emission peak. In certain embodiments, illumination 80 may comprise white illumination 80B and integrated RGB color filter layer 186 may comprise RBF compounds 115 having the R emission peak and/or the G emission peak configured to provide red and/or green color enhancement, respectively. In certain embodiments, illumination 80 may comprise blue and green illumination 80C and integrated RGB color filter layer 186 may comprise RBF compounds 115 having the R emission peak and/or the G emission peak configured to provide red color conversion and possibly red and/or green color enhancement, respectively. In any of the embodiments, assistant dyes 117 may be further integrated in integrated RGB color filter layer 186 and/or possibly used as separate color conversion elements 117.

In certain embodiments, the efficiency of illumination may be determined by a large number of parameters, such as spectrum overlap between illumination 80 from backlight unit 142 and absorption ranges of color conversion and assistant dyes 115, 117 respectively, transmission and reflection parameters in the spectral range of optical elements in LCD panel 85 (e.g., optical elements 136 and optionally 137 illustrated in FIG. 2J), quantum yields of the dyes and recycling efficiency of the backscattered fluorescent light; and spectrum overlap between the modified spectrum and color filters 86, e.g., spectrum overlap between the emission spectra of color conversion and assistant dyes 115, 117 respectively, and color filters 86, residual illumination 80 after color conversion, and spatial considerations such as angular dependency of fluorescent radiation, and of optical elements in LCD panel 85. Optimization of color conversion and assistant dyes 115, 117 respectively, of dye integration in color filters 86, of spectrum shaping (see below) and of crosstalk-reducing layer 139B may be carried out with respect to individual color ranges and specified required gamut parameters.

Assistant Dyes and Spectrum Shaping

Figure 5D:
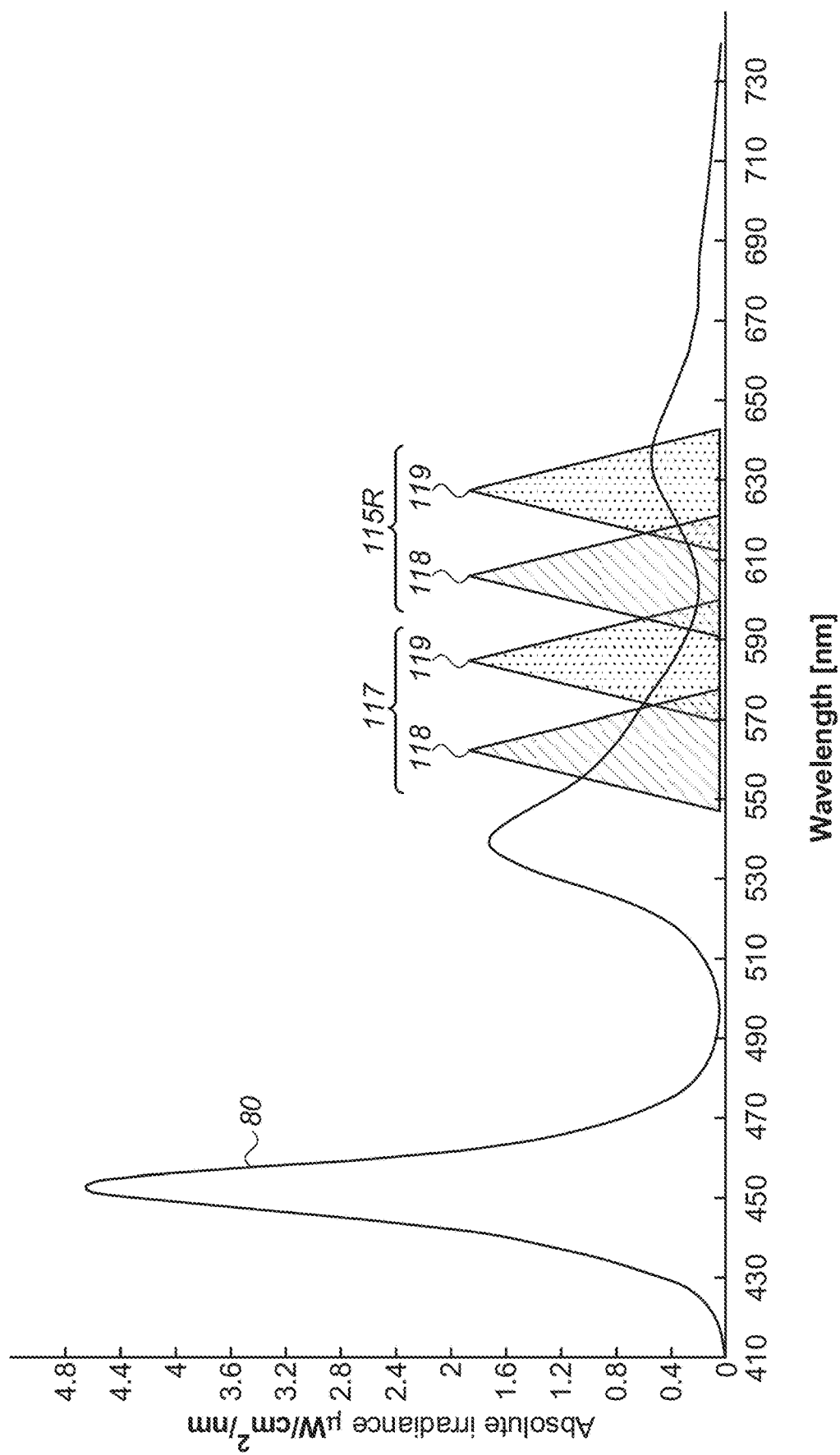
FIGS. 5D-5F are high level schematic illustrations of spectrum shaping using assistant dyes, according to some embodiments of the invention.
Figure 5E:
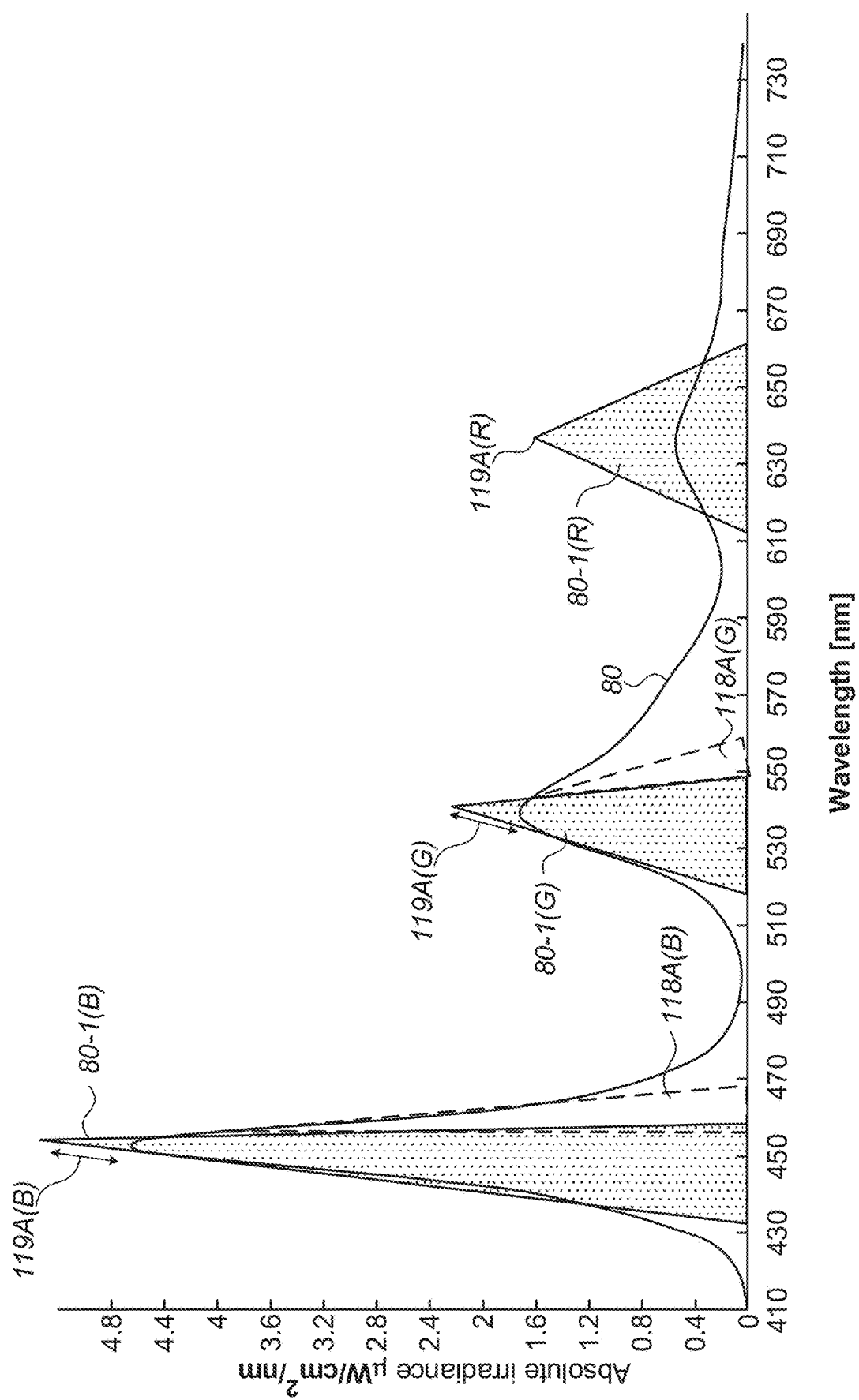
Figure 5F:
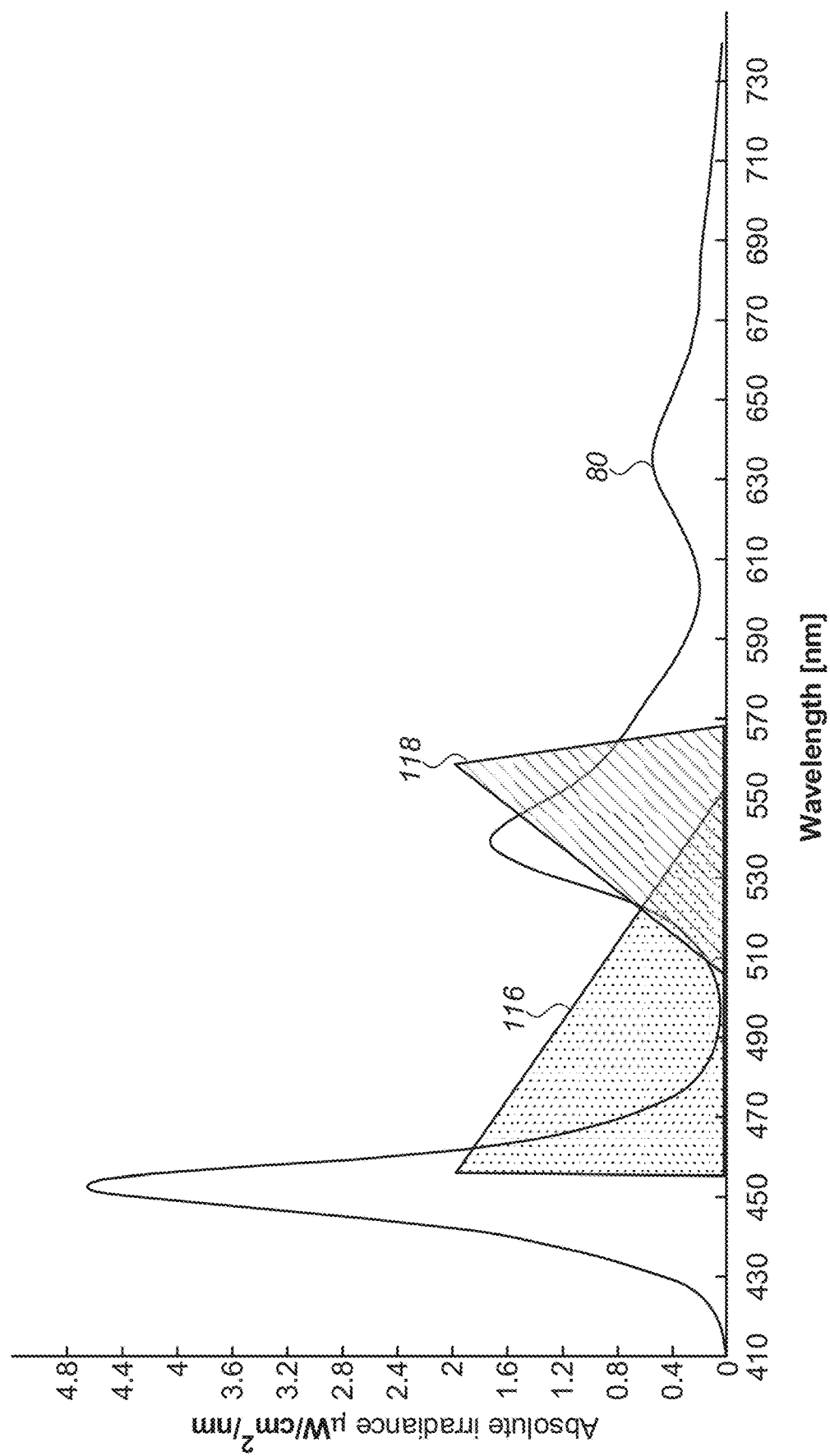

FIGS. 5D-5F are high level schematic illustrations of spectrum shaping using assistant dyes 117, according to some embodiments of the invention. One or more assistant dye(s) 117 may be used, independently and/or integrated in color conversion layer(s) 130 (and/or 132, 133, 134) and/or integrated in RGB color filters 86 and/or integrated in integrated RGB color filters 186 (having color conversion compounds 115). Assistant dyes 117 are characterized herein by their absorption curve 118 and their emission (e.g., fluorescence, possibly phosphorescence) curve 119, which are shown in FIGS. 5D-5F in a schematic, non-limiting manner as triangles. Clearly realistic curves may be used to optimize displays 140 according to the disclosed principles. It is further noted that absorption and emission curves are used herein interchangeably with the terms absorption and emission peaks, respectively, in a non-limiting manner, to refer to complementary spectral characteristics of disclosed dyes 115 and/or 117.

Certain embodiments comprise shaping spectral distribution 85 of illumination delivered to RGB filters 86 using fluorescent compound(s) having one or more absorption peaks outside a respective transmission region of one of RGB filters 86 and one or more fluorescence peaks, at least one of which being inside the respective transmission region of the RGB filter. FIG. 5D illustrates an example for the R color filter, providing certain embodiments with one assistant dye 117 having an absorption curve 118 outside the transmitted range of the R filter and an intermediate emission curve 119 which partly overlaps absorption curve 118 of RBF compound 115 (in the illustrated case, red-fluorescent RBF compound 115R) to enhance the illumination absorbed thereby. In certain embodiments, multiple assistant dyes 117 may be used, having a series of absorption and emission curves (each emission curve 119 at least partly overlapping absorption curve 118 of next assistant dye 117 in the series), which form a photon delivery chain from filtered to unfiltered regions of the spectrum.

Certain embodiments comprise LCD 140 comprising backlight unit 142 configured to provide illumination 80 and LCD panel 85 receiving illumination 80 from backlight unit 142 and comprising, sequentially with respect to the received illumination: polarizing film 83B, liquid crystal layer 85E, analyzer film 87B, color conversion film 130 (possibly patterned), RGB color filter layer 86, and protective layer 85J, possibly with additional analyzer film 87 between RGB color filter layer 86 and protective layer 85J. Color conversion film 130 may comprise a plurality of fluorescent compounds 115, 117 selected to have, when embedded in color conversion film 130, a series of absorption peaks (or curves) 118 outside a respective transmission region of one of RGB filters 86 and respective series of fluorescence (or phosphorescence) peaks (or curves) 119, one of fluorescence peaks 119 being inside the respective transmission region of RGB filter 86 (e.g., fluorescence peak of RBF compound 115) and at least one other fluorescence peak being intermediate between the fluorescence peak inside the respective transmission region and the absorption peaks, forming a photon delivery chain from filtered to unfiltered regions of the spectrum.

Certain embodiments comprise shaping a spectral distribution of illumination 80 delivered to RGB filters 86 of LCD 140 by using at least one fluorescent compound 115 in color conversion film 130, which is selected to have, when embedded in color conversion film 130, absorption peak 118 outside a respective transmission region of one of RGB filters 86 and fluorescence peak 119 inside the respective transmission region of RGB filter 86. Correspondingly, certain embodiments comprise LCD 140 comprising backlight unit 142 configured to provide illumination 80 and LCD panel 85 receiving illumination 80 from backlight unit 142 and comprising, sequentially with respect to the received illumination: polarizing film 83B, liquid crystal layer 85E, analyzer film 87B, color conversion film 130 (possibly patterned), RGB color filter layer 86, and protective layer 85J, possibly with additional analyzer film 87 between RGB color filter layer 86 and protective layer 85J. Color conversion film 130 comprises at least one fluorescent compound 115 selected to have, when embedded in color conversion film 130, absorption peak 118 outside a respective transmission region of one of RGB filters 86 and fluorescence peak 119 inside the respective transmission region of RGB filter 86.

Certain embodiments comprise shaping a spectral distribution of illumination delivered to RGB filters 86 of LCD 140 by using at least one fluorescent compound 115 and/or at least one assistant dye 117 in color conversion film 130, selected to have, when embedded in color conversion film 130, absorption curve 118 and fluorescence curve 119 selected to re-shape a spectral region of illumination 80 within a respective transmission region of at least one of RGB filters 86 to decrease FWHM (full width at half maximum) of the illumination in the respective transmission region. Correspondingly, certain embodiments comprise LCD 140 comprising backlight unit 142 configured to provide illumination 80 and LCD panel 85 receiving illumination 80 from backlight unit 142 and comprising, sequentially with respect to the received illumination: polarizing film 83B, liquid crystal layer 85E, analyzer film 87B, color conversion film 130 (possibly patterned), RGB color filter layer 86, and protective layer 85J, possibly with additional analyzer film 87 between RGB color filter layer 86 and protective layer 85J. Color conversion film 130 comprises at least one fluorescent compound 115 and/or at least one assistant dye 117 having, when embedded in color conversion film 130, absorption curve 118 and fluorescence curve 119—selected to re-shape a spectral region of illumination 80 within a respective transmission region of at least one of RGB filters 86 to decrease FWHM of the illumination in the respective transmission region.

As illustrates e.g., in FIG. 5E, modified illumination 80-1 may comprise components 80-1(B), 80-1(G), 80-1(R) in the transmission regions of B, G, R color filters 86, respectively, which are shaped according to requirements by one or more fluorescent compound(s) 115 and/or assistant dye(s) 117, e.g., by removal of spectral sections by absorption (e.g., any of sections 118A(B), 118A(G), possibly also a section in the red section (not shown), respectively) and/or by enhancement of spectral sections by emission (e.g., any of sections 119A(B), 119A(G), 119A(R), respectively)—as disclosed above.

In certain embodiments, LCD 140 may utilize quantum dot technology, e.g., with color conversion film 130 being based on quantum dots. Similar ideas of assistant dyes and green and red enhancement may be applied to quantum-dots-based display.

In certain embodiments, LCD 140 may utilize color conversion films 130 having asymmetric emission spectrum 116. Color conversion film 130 may further comprise one or more fluorescent compound(s) 115 and/or assistant dye(s) 117 selected to reduce a level of asymmetry in an emission spectrum of color conversion film 130. For example, as illustrated schematically in FIG. 5F, absorption spectrum 118 of assistant dye 117 may be selected to be reversely asymmetric, to reduce the level of asymmetry with spectral regions of RGB color filter(s) 86, e.g., B color filter 86 as illustrated in the non-limiting example.

In any of the disclosed embodiments, one or more fluorescent compound(s) 115 and/or one or more assistant dye(s) 117 may be used, independently, and/or integrated in color conversion layer(s) 130 (and/or layers 132, 133, 134) and/or integrated in RGB color filters 86 and/or integrated in integrated RGB color filters 186 (having color conversion compounds 115).

Figure 3D:
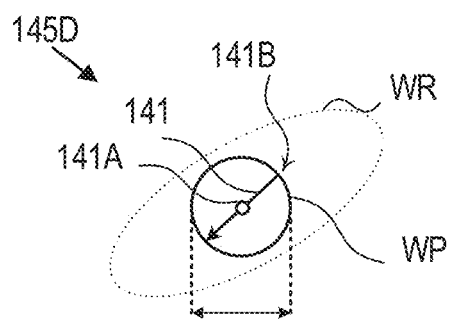
Figure 3E:
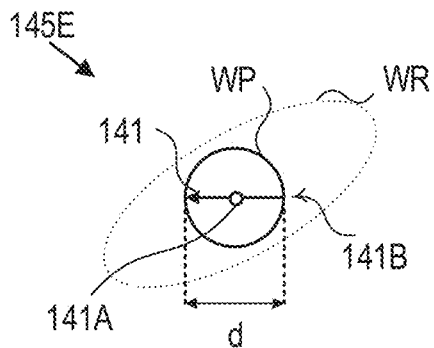

In any of the disclosed embodiments, one or more fluorescent compound(s) 115 and/or one or more assistant dye(s) 117 may be further be used to adjust the white point of LCD display 140, as illustrated e.g., in FIGS. 3C-3E.

Rhodamine-Based Fluorescent Molecules

A wide range of fluorescent organic molecules may be incorporated in films 130, such as materials of the xanthene dye family like fluorescein, rhodamine derivatives and coumarin family dyes, as well as various inorganic fluorescent materials. In the following, explicit examples of rhodamine-based derivatives, RBF compounds 115, are presented in detail, in a non-limiting manner.

Red-Fluorescent RBF Compounds

Some embodiments of the invention provide red-fluorescent RBF compounds 115 defined by the structure of formula (I):

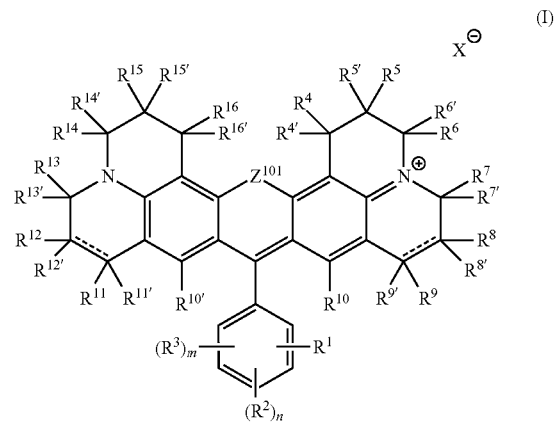

wherein
$R^1$ is halide, alkyl, haloalkyl, COOR, $NO_2$, COR, COSR, $CON(R)_2$, CO(N-heterocycle) or CN;
$R^2$ each is independently selected from H, halide, $N(R)_2$, COR, CN, $CON(R)_2$, CO(N-heterocycle), NCO, NCS, OR, SR, $SO_3H$, $SO_3M$ and COOZ;
$R^3$ each is independently selected from H, halide, $N(R)_2$, COR, CN, $CON(R)_2$, CO(N-heterocycle), NCO, NCS, OR, SR, $SO_3H$, $SO_3M$ and COOZ;
$R^4$-$R^7$, $R^{13}$-$R^{16}$, $R^{4'}$-$R^{7'}$ and $R^{13'}$-$R^{16'}$ are each independently selected from H, alkyl, alkenyl, alkynyl, epoxide, alkylated epoxide, azide, cycloalkyl, heterocycloalkyl, aryl, benzyl, halide, $NO_2$, SR, OR, $N(R)_2$, COR, CN, $CON(R)_2$, CO(N-heterocycle) and COOR;
$R^8$-$R^9$, $R^{11}$-$R^{12}$, $R^{8'}$-$R^{9'}$ and $R^{11'}$-$R^{12'}$ are each independently selected from absent, H, alkyl, alkenyl, alkynyl, epoxide, alkylated epoxide, azide, cycloalkyl, heterocycloalkyl, aryl, benzyl, halide, $NO_2$, SR, OR, $N(R)_2$, COR, CN, $CON(R)_2$, CO(N-heterocycle) and COOR;
$R^{10}$ and $R^{10'}$ are each independently selected from H, alkyl, alkenyl, alkynyl, epoxide, alkylated epoxide, alkylated azide, azide, $SO_3H$, $SO_3M$, cycloalkyl, heterocycloalkyl, aryl, benzyl, halide, $NO_2$, SR, OR, $N(R)_2$, COR, CN, $CON(R)_2$, CO(N-heterocycle) and COOR;
R is H, haloalkyl, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)NH(CH_2)_qSi(halide)_3$, —$(CH_2)_pOC(O)CH=CH_2$, —$(CH_2)_pOC(O)C(CH_3)=CH_2$, —$(CH_2)_pSi(halide)_3$, alkenyl, alkynyl, alkylated epoxide, alkylated azide, azide, or —$(CH_2)_pSi(Oalkyl)_3$;
Z is alkyl, haloalkyl, alkenyl, alkynyl, alkylated epoxide, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$ or —$(CH_2)_pSi(Oalkyl)_3$;
$Z^{101}$ is O or $C(CH_3)_2$;
M is a monovalent cation;
n and m are each independently an integer between 1-4;
p and q are each independently an integer between 1-6;
r is an integer between 0-10;

X is an anion;
wherein if there is a double bond between the carbons which are substituted by $R^8$, $R^{8'}$, $R^9$ and $R^{9'}$—then $R^8$ and $R^9$ are absent or $R^8$ and $R^{9'}$ are absent or $R^{8'}$ and $R^9$ are absent or $R^{8'}$ and $R^{9'}$ are absent; and
wherein if there is a double bond between the carbons which are substituted by $R^{11}$, $R^{11'}$, $R^{12}$ and $R^{12'}$—then $R^{11}$ and $R^{12}$ are absent or $R^{11}$ and $R^{12'}$ are absent or $R^{11'}$ and $R^{12}$ are absent or $R^{11'}$ and $R^{12'}$ are absent.

Some embodiments of the invention provide red-fluorescent RBF compounds 115 defined by the structure of formula (II):

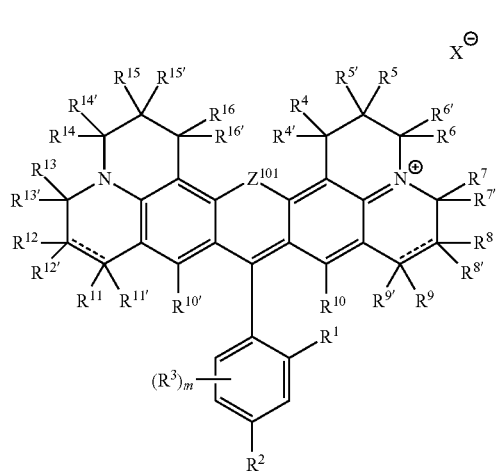

(II)

wherein
$R^1$ is halide, alkyl, haloalkyl, COOR, $NO_2$, COR, COSR, $CON(R)_2$, CO(N-heterocycle) or CN;
$R^2$ each is independently selected from H, halide, $N(R)_2$, COR, CN, $CON(R)_2$, CO(N-heterocycle), NCO, NCS, OR, SR, $SO_3H$, $SO_3M$ and COOZ;
$R^3$ each is independently selected from H, halide, $N(R)_2$, COR, CN, $CON(R)_2$, CO(N-heterocycle), NCO, NCS, OR, SR, $SO_3H$, $SO_3M$ and COOZ;
$R^4$-$R^7$, $R^{13}$-$R^{16}$, $R^{4'}$-$R^{7'}$ and $R^{13'}$-$R^{16'}$ are each independently selected from H, alkyl, alkenyl, alkynyl, epoxide, alkylated epoxide, azide, cycloalkyl, heterocycloalkyl, aryl, benzyl, halide, $NO_2$, SR, OR, $N(R)_2$, COR, CN, $CON(R)_2$, CO(N-heterocycle) and COOR;
$R^8$-$R^9$, $R^{11}$-$R^{12}$, $R^{8'}$-$R^{9'}$ and $R^{11'}$-$R^{12'}$ are each independently selected from absent, H, alkyl, alkenyl, alkynyl, epoxide, alkylated epoxide, azide, cycloalkyl, heterocycloalkyl, aryl, benzyl, halide, $NO_2$, SR, OR, $N(R)_2$, COR, CN, $CON(R)_2$, CO(N-heterocycle) and COOR;
$R^{10}$ and $R^{10'}$ are each independently selected from H, alkyl, alkenyl, alkynyl, epoxide, alkylated epoxide, alkylated azide, azide, $SO_3H$, $SO_3M$, cycloalkyl, heterocycloalkyl, aryl, benzyl, halide, $NO_2$, SR, OR, $N(R)_2$, COR, CN, $CON(R)_2$, CO(N-heterocycle) and COOR;
R is H, haloalkyl, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, $(CH_2)_pOC(O)NH(CH_2)_qSi(halide)_3$, —$(CH_2)_pOC(O)CH=CH_2$, —$(CH_2)_pOC(O)C(CH_3)=CH_2$, —$(CH_2)_pSi(halide)_3$, alkenyl, alkynyl, alkylated epoxide, alkylated azide, azide or —$(CH_2)_pSi(Oalkyl)_3$;
Z is alkyl, haloalkyl, alkenyl, alkynyl, alkylated epoxide, cycloalkyl, heterocycloalkyl, aryl, benzyl, —$(CH_2CH_2O)_rCH_2CH_2OH$, —$(CH_2)_pOC(O)NH(CH_2)_q Si(Oalkyl)_3$, —$(CH_2)_pOC(O)CH=CH_2$, —$(CH_2)_pOC(O)C(CH_3)=CH_2$, or —$(CH_2)_pSi(Oalkyl)_3$;
$Z^{101}$ is O or $C(CH_3)_2$;
M is a monovalent cation;
m is an integer between 1-4;
p and q are each independently an integer between 1-6;
r is an integer between 0-10;
X is an anion;
wherein if there is double bond between the carbons which are substituted by $R^8$, $R^{8'}$, $R^9$ and $R^{9'}$—then $R^8$ and $R^9$ are absent or $R^8$ and $R^{9'}$ are absent or $R^{8'}$ and $R^9$ are absent or $R^{8'}$ and $R^{9'}$ are absent; and
wherein if there is double bond between the carbons which are substituted by $R^{11}$, $R^{11'}$, $R^{12}$ and $R^{12'}$—then $R^{11}$ and $R^{12}$ are absent or $R^{11}$ and $R^{12'}$ are absent or $R^{11'}$ and $R^{12}$ are absent or $R^{11'}$ and $R^{12'}$ are absent.

Some embodiments of the invention provide red-fluorescent RBF compounds 115 defined by the structure of formula (III):

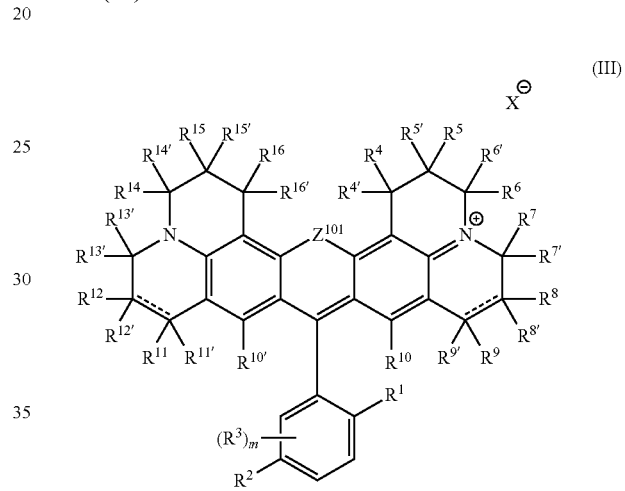

(III)

wherein
$R^1$ is halide, alkyl, haloalkyl, COOR, $NO_2$, COR, COSR, $CON(R)_2$, CO(N-heterocycle) or CN;
$R^2$ each is independently selected from H, halide, $N(R)_2$, COR, CN, $CON(R)_2$, CO(N-heterocycle), NCO, NCS, OR, SR, $SO_3H$, $SO_3M$ and COOZ;
$R^3$ each is independently selected from H, halide, $N(R)_2$, COR, CN, $CON(R)_2$, CO(N-heterocycle), NCO, NCS, OR, SR, $SO_3H$, $SO_3M$ and COOZ;
$R^4$-$R^7$, $R^{13}$-$R^{16}$, $R^{4'}$-$R^{7'}$ and $R^{13'}$-$R^{16'}$ are each independently selected from H, alkyl, alkenyl, alkynyl, epoxide, alkylated epoxide, azide, cycloalkyl, heterocycloalkyl, aryl, benzyl, halide, $NO_2$, SR, OR, $N(R)_2$, COR, CN, $CON(R)_2$, CO(N-heterocycle) and COOR;
$R^8$-$R^9$, $R^{11}$-$R^{12}$, $R^{8'}$-$R^{9'}$ and $R^{11'}$-$R^{12'}$ are each independently selected from absent, H, alkyl, alkenyl, alkynyl, epoxide, alkylated epoxide, azide, cycloalkyl, heterocycloalkyl, aryl, benzyl, halide, $NO_2$, SR, OR, $N(R)_2$, COR, CN, $CON(R)_2$, CO(N-heterocycle) and COOR;
$R^{10}$ and $R^{10'}$ are each independently selected from H, alkyl, alkenyl, alkynyl, epoxide, alkylated epoxide, alkylated azide, azide, $SO_3H$, $SO_3M$, cycloalkyl, heterocycloalkyl, aryl, benzyl, halide, $NO_2$, SR, OR, $N(R)_2$, COR, CN, $CON(R)_2$, CO(N-heterocycle) and COOR;
R is H, haloalkyl, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, $(CH_2)_pOC(O)NH(CH_2)_qSi(halide)_3$, —$(CH_2)_pOC(O)CH=CH_2$, —$(CH_2)_pOC(O)C(CH_3)$ =CH$_2$, —(CH$_2$)$_p$Si(halide)$_3$, alkenyl, alkynyl, alkylated epoxide, alkylated azide, azide or —(CH$_2$)$_p$Si(Oalkyl)$_3$;

Z is alkyl, haloalkyl, alkenyl, alkynyl, alkylated epoxide, cycloalkyl, heterocycloalkyl, aryl, benzyl, —(CH$_2$CH$_2$O)$_r$CH$_2$CH$_2$OH, —(CH$_2$)$_p$OC(O)NH(CH$_2$)$_q$Si(Oalkyl)$_3$, —(CH$_2$)$_p$OC(O)CH=CH$_2$, —(CH$_2$)$_p$OC(O)C(CH$_3$)=CH$_2$, or —(CH$_2$)$_p$Si(Oalkyl)$_3$;

Z$^{101}$ is O or C(CH$_3$)$_2$;

M is a monovalent cation;

m is an integer between 1-4;

p and q are each independently an integer between 1-6;

r is an integer between 0-10;

X is an anion;

wherein if there is double bond between the carbons which are substituted by R$^8$, R$^{8'}$, R$^9$ and R$^{9'}$—then R$^8$ and R$^9$ are absent or R$^8$ and R$^{9'}$ are absent or R$^{8'}$ and R$^9$ are absent or R$^{8'}$ and R$^{9'}$ are absent; and wherein if there is double bond between the carbons which are substituted by R$^{11}$, R$^{11'}$, R$^{12}$ and R$^{12'}$—then R$^{11}$ and R$^{12}$ are absent or R$^{11}$ and R$^{12'}$ are absent or R$^{11'}$ and R$^{12}$ are absent or R$^{11'}$ and R$^{12'}$ are absent.

Some embodiments of the invention provide red-fluorescent RBF compounds 115 defined by the structure of formula (IV):

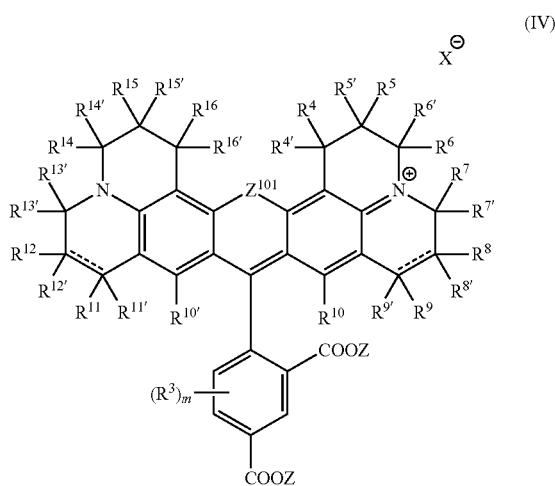

(IV)

wherein

R$^3$ each is independently selected from H, halide, N(R)$_2$, COR, CN, CON(R)$_2$, CO(N-heterocycle), NCO, NCS, OR, SR, SO$_3$H, SO$_3$M and COOZ;

R$^4$-R$^7$, R$^{13}$-R$^{16}$, R$^{4'}$-R$^{7'}$ and R$^{13'}$-R$^{16'}$ are each independently selected from H, alkyl, alkenyl, alkynyl, epoxide, alkylated epoxide, azide, cycloalkyl, heterocycloalkyl, aryl, benzyl, halide, NO$_2$, SR, OR, N(R)$_2$, COR, CN, CON(R)$_2$, CO(N-heterocycle) and COOR;

R$^8$-R$^9$, R$^{11}$-R$^{12}$, R$^{8'}$-R$^{9'}$ and R$^{11'}$-R$^{12'}$ are each independently selected from absent, H, alkyl, alkenyl, alkynyl, epoxide, alkylated epoxide, azide, cycloalkyl, heterocycloalkyl, aryl, benzyl, halide, NO$_2$, SR, OR, N(R)$_2$, COR, CN, CON(R)$_2$, CO(N-heterocycle) and COOR;

R$^{10}$ and R$^{10'}$ are each independently selected from H, alkyl, alkenyl, alkynyl, epoxide, alkylated epoxide, alkylated azide, azide, SO$_3$H, SO$_3$M, cycloalkyl, heterocycloalkyl, aryl, benzyl, halide, NO$_2$, SR, OR, N(R)$_2$, COR, CN, CON(R)$_2$, CO(N-heterocycle) and COOR;

R is H, haloalkyl, alkyl, cycloalkyl, heterocycloalkyl, aryl, benzyl, —(CH$_2$CH$_2$O)$_r$CH$_2$CH$_2$OH, —(CH$_2$)$_p$OC(O)NH(CH$_2$)$_q$Si(Oalkyl)$_3$, (CH$_2$)$_p$OC(O)NH(CH$_2$)$_q$Si(halide)$_3$, —(CH$_2$)$_p$OC(O)CH=CH$_2$, —(CH$_2$)$_p$OC(O)C(CH$_3$)=CH$_2$, —(CH$_2$)$_p$Si(halide)$_3$, alkenyl, alkynyl, alkylated epoxide, alkylated azide, azide or —(CH$_2$)$_p$Si(Oalkyl)$_3$;

Z is alkyl, haloalkyl, alkenyl, alkynyl, alkylated epoxide, cycloalkyl, heterocycloalkyl, aryl, benzyl, —(CH$_2$CH$_2$O)$_r$CH$_2$CH$_2$OOH, —(CH$_2$)$_p$OC(O)NH(CH$_2$)$_q$Si(Oalkyl)$_3$, —(CH$_2$)$_p$OC(O)CH=CH$_2$, —(CH$_2$)$_p$OC(O)C(CH$_3$)=CH$_2$, or —(CH$_2$)$_p$Si(Oalkyl)$_3$;

Z$^{101}$ is O or C(CH$_3$)$_2$;

M is a monovalent cation;

m is an integer between 1-4;

p and q are each independently an integer between 1-6;

r is an integer between 0-10;

X is an anion;

wherein if there is double bond between the carbons which are substituted by R$^8$, R$^{8'}$, R$^9$ and R$^{9'}$—then R$^8$ and R$^9$ are absent or R$^8$ and R$^{9'}$ are absent or R$^{8'}$ and R$^9$ are absent or R$^{8'}$ and R$^{9'}$ are absent; and wherein if there is double bond between the carbons which are substituted by R$^{11}$, R$^{11'}$, R$^{12}$ and R$^{12'}$—then R$^{11}$ and R$^{12}$ are absent or R$^{11}$ and R$^{12'}$ are absent or R$^{11'}$ and R$^{12}$ are absent or R$^{11'}$ and R$^{12'}$ are absent.

Some embodiments of the invention provide red-fluorescent RBF compounds 115 defined by the structure of formula (V):

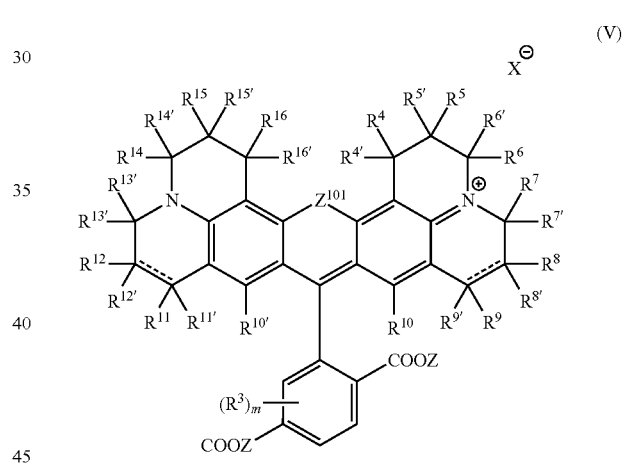

(V)

wherein

R$^3$ each is independently selected from H, halide, N(R)$_2$, COR, CN, CON(R)$_2$, CO(N-heterocycle), NCO, NCS, OR, SR, SO$_3$H, SO$_3$M and COOZ;

R$^4$-R$^7$, R$^{13}$-R$^{16}$, R$^{4'}$-R$^{7'}$ and R$^{13'}$-R$^{16'}$ are each independently selected from H, alkyl, alkenyl, alkynyl, epoxide, alkylated epoxide, azide, cycloalkyl, heterocycloalkyl, aryl, benzyl, halide, NO$_2$, SR, OR, N(R)$_2$, COR, CN, CON(R)$_2$, CO(N-heterocycle) and COOR;

R$^8$-R$^9$, R$^{11}$-R$^{12}$, R$^{8'}$-R$^{9'}$ and R$^{11'}$-R$^{12'}$ are each independently selected from absent, H, alkyl, alkenyl, alkynyl, epoxide, alkylated epoxide, azide, cycloalkyl, heterocycloalkyl, aryl, benzyl, halide, NO$_2$, SR, OR, N(R)$_2$, COR, CN, CON(R)$_2$, CO(N-heterocycle) and COOR;

R$^{10}$ and R$^{10'}$ are each independently selected from H, alkyl, alkenyl, alkynyl, epoxide, alkylated epoxide, alkylated azide, azide, SO$_3$H, SO$_3$M, cycloalkyl, heterocycloalkyl, aryl, benzyl, halide, NO$_2$, SR, OR, N(R)$_2$, COR, CN, CON(R)$_2$, CO(N-heterocycle) and COOR;

R is H, haloalkyl, alkyl, cycloalkyl, heterocycloalkyl, aryl, benzyl, —(CH$_2$CH$_2$O)$_r$CH$_2$CH$_2$OH, —(CH$_2$)$_p$OC(O)NH $(CH_2)_qSi(Oalkyl)_3$, $(CH_2)_pOC(O)NH(CH_2)_qSi(halide)_3$, $—(CH_2)_pOC(O)CH=CH_2$, $—(CH_2)_POC(O)C(CH_3)=CH_2$, $—(CH_2)_pSi(halide)_3$, alkenyl, alkynyl, alkylated epoxide, alkylated azide, azide or $—(CH_2)_qSi(Oalkyl)_3$; Z is alkyl, haloalkyl, alkenyl, alkynyl, alkylated epoxide, cycloalkyl, heterocycloalkyl, aryl, benzyl, $—(CH_2CH_2O)_rCH_2CH_2OH$, $—(CH_2)_pOC(O)NH(CH_2)_qSi(Oalkyl)_3$, $—(CH_2)_pOC(O)CH=CH_2$, $—(CH_2)_pOC(O)C(CH_3)=CH_2$, or $—(CH_2)_pSi(Oalkyl)_3$;

$Z^{101}$ is O or $C(CH_3)_2$;

m is an integer between 1-4;

p and q are each independently an integer between 1-6;

r is an integer between 0-10;

M is a monovalent cation;

X is an anion;

wherein if there is double bond between the carbons which are substituted by $R^8$, $R^{8'}$, $R^9$ and $R^{9'}$—then $R^8$ and $R^9$ are absent or $R^8$ and $R^{9'}$ are absent or $R^{8'}$ and $R^9$ are absent or $R^{8'}$ and $R^{9'}$ are absent; and wherein if there is double bond between the carbons which are substituted by $R^{11}$, $R^{11'}$, $R^{12}$ and $R^{12'}$—then $R^{11}$ and $R^{12}$ are absent or $R^{11}$ and $R^{12'}$ are absent or $R^{11'}$ and $R^{12}$ are absent or $R^{11'}$ and $R^{12'}$ are absent.

Some embodiments of the invention provide red-fluorescent RBF compounds 115 defined by the structure of formula (VI):

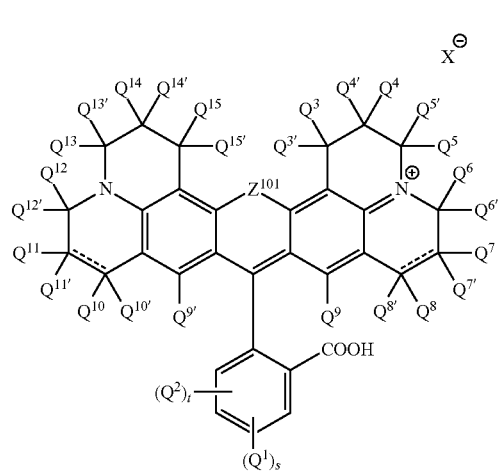

(VI)

wherein $Q^1$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^2$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^3$, $Q^{3'}$, $Q^{15}$ and $Q^{15'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-Heterocycle) and COOQ;

$Q^8$, $Q^{8'}$, $Q^{10}$ and $C^{10'}$ are each independently selected from absent, H, alkyl, cycloalkyl, heterocycloalkyl, aryl, benzyl, halide, $NO_2$, OQ, $N(Q)_2$, COQ, CN, $CON(Q)_2$, CO(N-Heterocycle) and COOQ;

$Q^4$-$Q^6$, $Q^9$, $Q^{9'}$, $Q^{12}$-$Q^{14}$, $Q^{4'}$-$Q^{6'}$ and $Q^{12'}$-$Q^{14'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

$Q^7$, $Q^{7'}$, $Q^{11}$ and $Q^{11'}$ are each independently selected from absent, H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

Q is H, alkyl, cycloalkyl, heterocycloalkyl, aryl, benzyl, $—(CH_2CH_2O)_rCH_2CH_2OH$, $—(CH_2)_pOC(O)NH(CH_2)_qSi(Oalkyl)_3$, $—(CH_2)_pOC(O)CH=CH_2$, $—(CH_2)_pOC(O)C(CH_3)=CH_2$ or $—(CH_2)_pSi(Oalkyl)_3$;

$Z^{101}$ is O or $C(CH_3)_2$;

M is a monovalent cation;

s and t are independently an integer between 1-4;

p and q are independently an integer between 1-6;

r is an integer between 0-10;

X is an anion;

wherein if there is double bond between the carbons which are substituted by $Q^7$, $Q^{7'}$, $Q^8$ and $Q^{8'}$—then $Q^7$ and $Q^8$ are absent or $Q^7$ and $Q^{8'}$ are absent or $Q^{7'}$ and $Q^8$ are absent or $Q^{7'}$ and $R^{8'}$ are absent; and wherein if there is double bond between the carbons which are substituted by $Q^{10}$, $Q^{10'}$, $Q^{11}$ and $Q^{11'}$—then $Q^{10}$ and $Q^{11}$ are absent or $Q^{10}$ and $Q^{11'}$ are absent or $Q^{10'}$ and $Q^{11}$ are absent or $Q^{10'}$ and $Q^{11'}$ are absent.

Some embodiments of the invention provide red-fluorescent RBF compounds 115 defined by the structure of formula (VII):

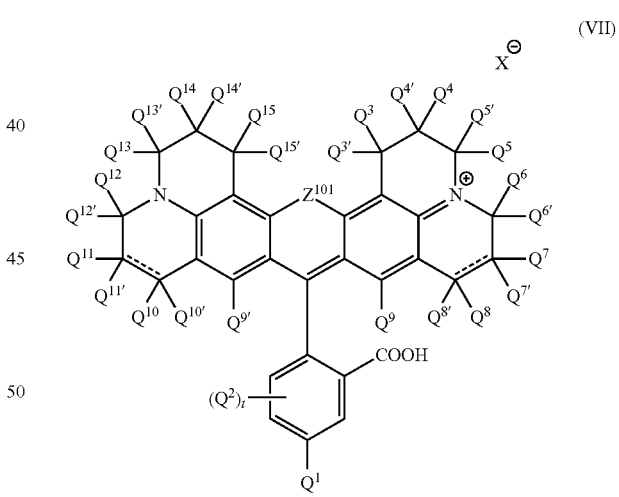

(VII)

wherein $Q^1$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^2$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ and OPO(OH)$_2$;

$Q^3$, $Q^{3'}$, $Q^{15}$ and $Q^{15'}$ are each independently selected from H, alkyl, cycloalkyl, heterocycloalkyl, aryl, benzyl, halide, NO$_2$, OQ, N(Q)$_2$, COQ, CN, CON(Q)$_2$, CO(N-Heterocycle) and COOQ;

$Q^8$, $Q^{8'}$, $Q^{10}$ and $C^{10'}$ are each independently selected from absent, H, alkyl, cycloalkyl, heterocycloalkyl, aryl, benzyl, halide, NO$_2$, OQ, N(Q)$_2$, COQ, CN, CON(Q)$_2$, CO(N-Heterocycle) and COOQ;

$Q^4$-$Q^6$, $Q^9$, $Q^{9'}$, $Q^{12}$-$Q^{14}$, $Q^{4'}$-$Q^{6'}$ and $Q^{12'}$-$Q^{14'}$ are each independently selected from H, alkyl, cycloalkyl, heterocycloalkyl, aryl, benzyl, halide, NO$_2$, OQ, N(Q)$_2$, COQ, CN, CON(Q)$_2$, CO(N-heterocycle) and COOQ;

$Q^7$, $Q^{7'}$, $Q^{11}$ and $Q^{11'}$ are each independently selected from absent, H, alkyl, cycloalkyl, heterocycloalkyl, aryl, benzyl, halide, NO$_2$, OQ, N(Q)$_2$, COQ, CN, CON(Q)$_2$, CO(N-heterocycle) and COOQ;

Q is H, alkyl, cycloalkyl, heterocycloalkyl, aryl, benzyl, —(CH$_2$CH$_2$O)$_r$CH$_2$CH$_2$OH, —(CH$_2$)$_p$OC(O)NH(CH$_2$)$_q$Si(Oalkyl)$_3$, —(CH$_2$)$_p$OC(O)CH=CH$_2$, —(CH$_2$)$_p$OC(O)C(CH$_3$)=CH$_2$ or —(CH$_2$)$_p$Si(Oalkyl)$_3$;

$Z^{101}$ is O or C(CH$_3$)$_2$;

M is a monovalent cation;

t is an integer between 1-4;

p and q are independently an integer between 1-6;

r is an integer between 0-10;

X is an anion;

wherein if there is double bond between the carbons which are substituted by $Q^7$, $Q^{7'}$, $Q^8$ and $Q^{8'}$—then $Q^7$ and $Q^8$ are absent or $Q^7$ and $Q^{8'}$ are absent or $Q^{7'}$ and $Q^8$ are absent or $Q^{7'}$ and $R^{8'}$ are absent; and wherein if there is double bond between the carbons which are substituted by $Q^{10}$, $Q^{10'}$, $Q^{11}$ and $Q^{11'}$—then $Q^{10}$ and $Q^{11}$ are absent or $Q^{10}$ and $Q^{11'}$ are absent or $Q^{10'}$ and $Q^{11}$ are absent or $Q^{10'}$ and $Q^{11'}$ are absent.

Some embodiments of the invention provide red-fluorescent RBF compounds 115 defined by the structure of formula (VIII):

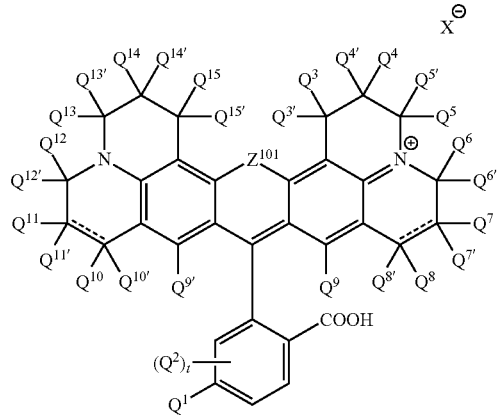

(VIII)

wherein $Q^1$ each is independently selected from H, halide, haloalkyl, tosylate, mesylate, SO$_2$NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ and OPO(OH)$_2$;

$Q^2$ each is independently selected from H, halide, haloalkyl, tosylate, mesylate, SO$_2$NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ and OPO(OH)$_2$;

$Q^3$, $Q^{3'}$, $Q^{15}$ and $Q^{15'}$ are each independently selected from H, alkyl, cycloalkyl, heterocycloalkyl, aryl, benzyl, halide, NO$_2$, OQ, N(Q)$_2$, COQ, CN, CON(Q)$_2$, CO(N-Heterocycle) and COOQ;

$Q^8$, $Q^{8'}$, $Q^{10}$ and $C^{10'}$ are each independently selected from absent, H, alkyl, cycloalkyl, heterocycloalkyl, aryl, benzyl, halide, NO$_2$, OQ, N(Q)$_2$, COQ, CN, CON(Q)$_2$, CO(N-Heterocycle) and COOQ;

$Q^4$-$Q^6$, $Q^9$, $Q^{9'}$, $Q^{12}$-$Q^{14}$, $Q^{4'}$-$Q^{6'}$ and $Q^{12'}$-$Q^{14'}$ are each independently selected from H, alkyl, cycloalkyl, heterocycloalkyl, aryl, benzyl, halide, NO$_2$, OQ, N(Q)$_2$, COQ, CN, CON(Q)$_2$, CO(N-heterocycle) and COOQ;

$Q^7$, $Q^{7'}$, $Q^{11}$ and $Q^{11'}$ are each independently selected from absent, H, alkyl, cycloalkyl, heterocycloalkyl, aryl, benzyl, halide, NO$_2$, OQ, N(Q)$_2$, COQ, CN, CON(Q)$_2$, CO(N-heterocycle) and COOQ;

Q is H, alkyl, cycloalkyl, heterocycloalkyl, aryl, benzyl, —(CH$_2$CH$_2$O)$_r$CH$_2$CH$_2$OH, —(CH$_2$)$_p$OC(O)NH(CH$_2$)$_q$Si(Oalkyl)$_3$, —(CH$_2$)$_p$OC(O)CH=CH$_2$, —(CH$_2$)$_p$OC(O)C(CH$_3$)=CH$_2$ or —(CH$_2$)$_p$Si(Oalkyl)$_3$;

$Z^{101}$ is O or C(CH$_3$)$_2$;

M is a monovalent cation;

t is an integer between 1-4;

p and q are independently an integer between 1-6;

r is an integer between 0-10;

X is an anion;

wherein if there is double bond between the carbons which are substituted by $Q^7$, $Q^{7'}$, $Q^8$ and $Q^{8'}$—then $Q^7$ and $Q^8$ are absent or $Q^7$ and $Q^{8'}$ are absent or $Q^{7'}$ and $Q^8$ are absent or $Q^{7'}$ and $R^{8'}$ are absent; and wherein if there is double bond between the carbons which are substituted by $Q^{10}$, $Q^{10'}$, $Q^{11}$ and $Q^{11'}$—then $Q^{10}$ and $Q^{11}$ are absent or $Q^{10}$ and $Q^{11'}$ are absent or $Q^{10'}$ and $Q^{11}$ are absent or $Q^{10'}$ and $Q^{11'}$ are absent.

Some embodiments of the invention provide red-fluorescent RBF compounds 115 defined by the structure of formula (IX):

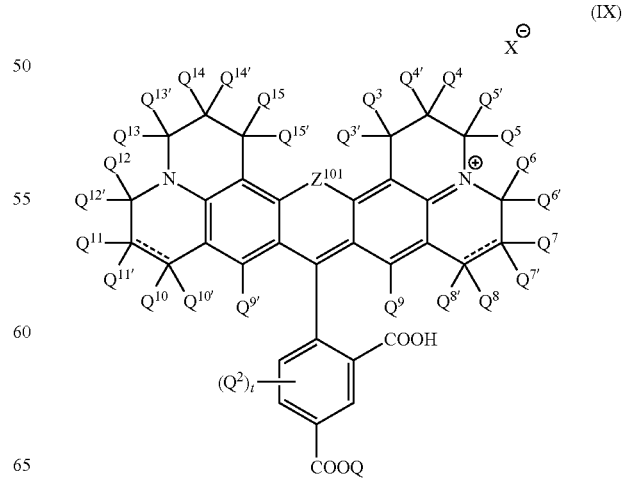

(IX)

wherein $Q^2$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^3$, $Q^{3'}$, $Q^{15}$ and $Q^{15'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-Heterocycle) and COOQ;

$Q^8$, $Q^{8'}$, $Q^{10}$ and $C^{10'}$ are each independently selected from absent, H, alkyl, cycloalkyl, heterocycloalkyl, aryl, benzyl, halide, $NO_2$, OQ, $N(Q)_2$, COQ, CN, $CON(Q)_2$, CO(N-Heterocycle) and COOQ;

$Q^4$-$Q^6$, $Q^9$, $Q^{9'}$, $Q^{12}$-$Q^{14}$, $Q^{4'}$-$Q^{6'}$ and $Q^{12'}$-$Q^{14'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

$Q^7$, $Q^{7'}$, $Q^{11}$ and $Q^{11'}$ are each independently selected from absent, H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

Q is H, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$ or —$(CH_2)_pSi(Oalkyl)_3$;

$Z^{101}$ is O or $C(CH_3)_2$;

M is a monovalent cation;

t is an integer between 1-4;

p and q are independently an integer between 1-6;

r is an integer between 0-10;

X is an anion;

wherein if there is double bond between the carbons which are substituted by $Q^7$, $Q^{7'}$, $Q^8$ and $Q^{8'}$—then $Q^7$ and $Q^8$ are absent or $Q^7$ and $Q^{8'}$ are absent or $Q^{7'}$ and $Q^8$ are absent or $Q^{7'}$ and $R^{8'}$ are absent; and wherein if there is double bond between the carbons which are substituted by $Q^{10}$, $Q^{10'}$, $Q^{11}$ and $Q^{11'}$—then $Q^{10}$ and $Q^{11}$ are absent or $Q^{10}$ and $Q^{11'}$ are absent or $Q^{10'}$ and $Q^{11}$ are absent or $Q^{10'}$ and $Q^{11'}$ are absent.

Some embodiments of the invention provide red-fluorescent RBF compounds 115 defined by the structure of formula (X):

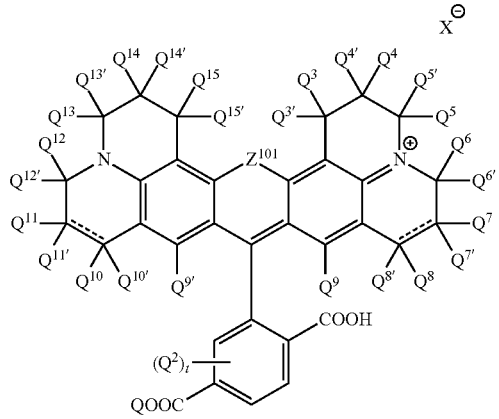

(X)

wherein $Q^2$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^3$, $Q^{3'}$, $Q^{15}$ and $Q^{15'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-Heterocycle) and COOQ;

$Q^8$, $Q^{8'}$, $Q^{10}$ and $C^{10'}$ are each independently selected from absent, H, alkyl, cycloalkyl, heterocycloalkyl, aryl, benzyl, halide, $NO_2$, OQ, $N(Q)_2$, COQ, CN, $CON(Q)_2$, CO(N-Heterocycle) and COOQ;

$Q^4$-$Q^6$, $Q^9$, $Q^{9'}$, $Q^{12}$-$Q^{14}$, $Q^{4'}$-$Q^{6'}$ and $Q^{12'}$-$Q^{14'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

$Q^7$, $Q^{7'}$, $Q^{11}$ and $Q^{11'}$ are each independently selected from absent, H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

Q is H, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$ or —$(CH_2)_pSi(Oalkyl)_3$;

$Z^{101}$ is O or $C(CH_3)_2$;

M is a monovalent cation;

t is an integer between 1-4;

p and q are independently an integer between 1-6;

r is an integer between 0-10;

X is an anion;

wherein if there is double bond between the carbons which are substituted by $Q^7$, $Q^{7'}$, $Q^8$ and $Q^{8'}$—then $Q^7$ and $Q^8$ are absent or $Q^7$ and $Q^{8'}$ are absent or $Q^{7'}$ and $Q^8$ are absent or $Q^{7'}$ and $R^{8'}$ are absent; and wherein if there is double bond between the carbons which are substituted by $Q^{10}$, $Q^{10'}$, $Q^{11}$ and $Q^{11'}$—then $Q^{10}$ and $Q^{11}$ are absent or $Q^{10}$ and $Q^{11'}$ are absent or $Q^{10'}$ and $Q^{11}$ are absent or $Q^{10'}$ and $Q^{11'}$ are absent.

Specific, non-limiting, examples of red-fluorescent RBF compounds 115 of the invention include compounds represented by the structures below denoted as ES61, JK32 (shown as JK-32A and/or JK-32B), RS56 (shown as RS56A and/or RS56B), RS106, RS130, ES118 and ES144.

33
34
ES61
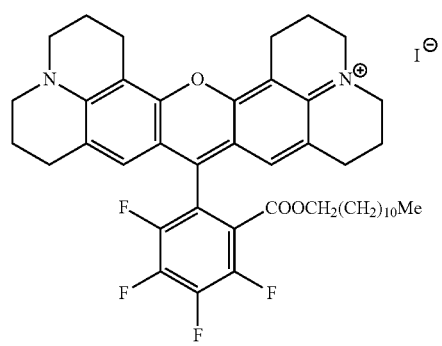
JK-32A
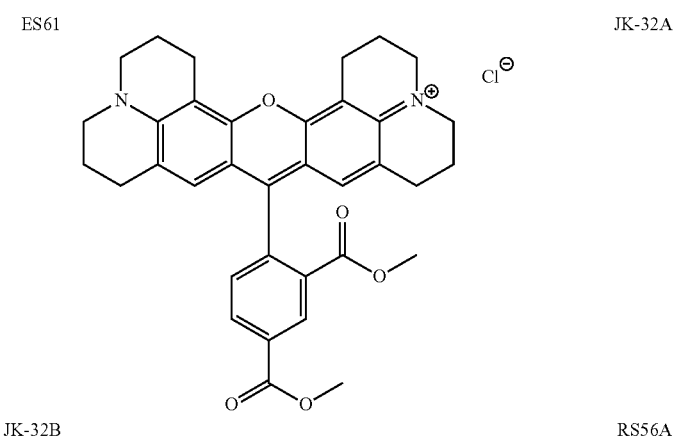
JK-32B
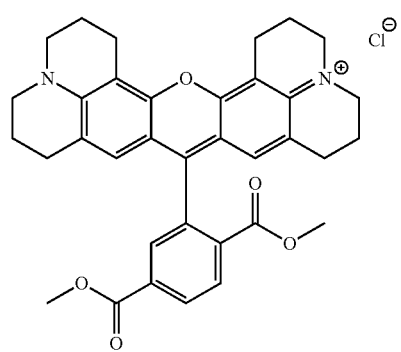
RS56A
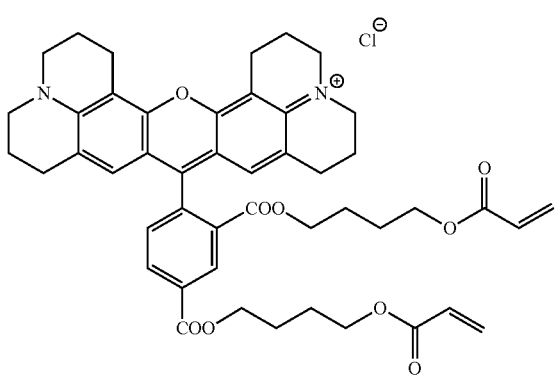
RS56B
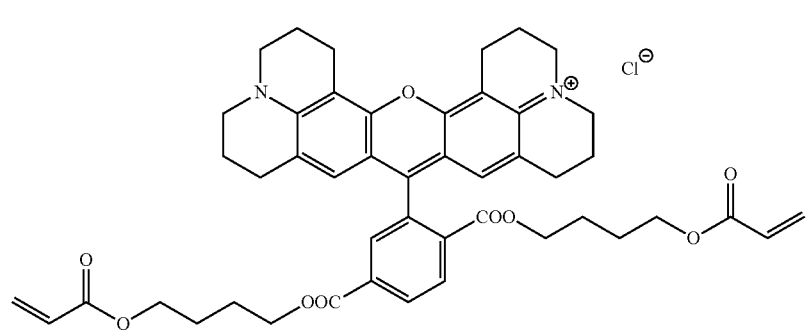
RS106
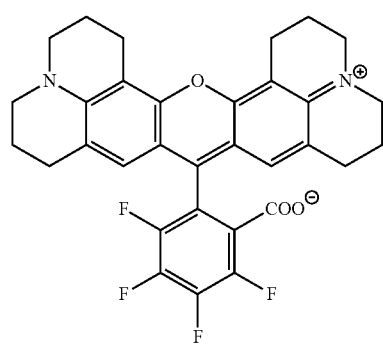
RS130
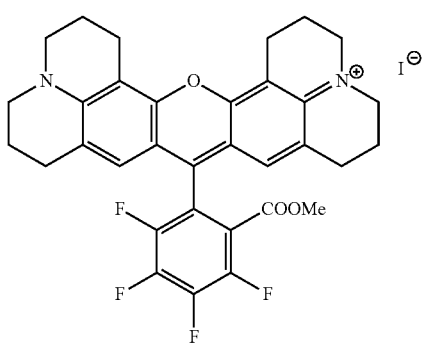

-continued
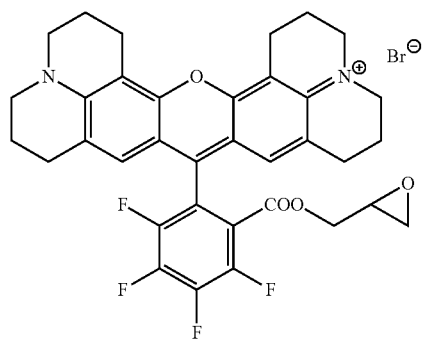
ES118
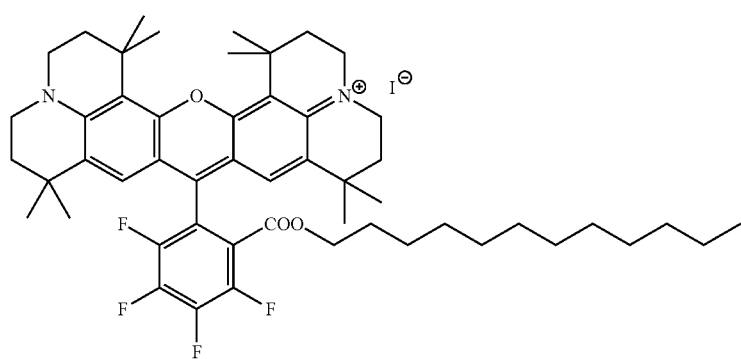
ES144
Some embodiments of red-fluorescent RBF compounds are presented in more detail in U.S. patent application Ser. No. 15/252,492 and are considered likewise part of the present disclosure. Non-limiting examples are provided in the following variants, numbered 1-11, 9a, 10a, ha, 20 and 23-26.
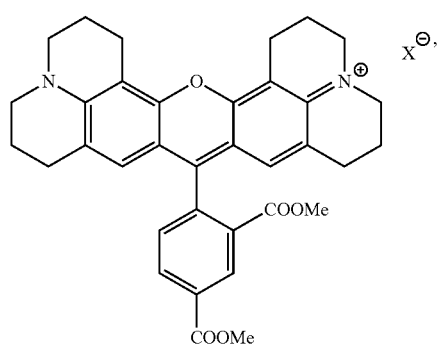
1
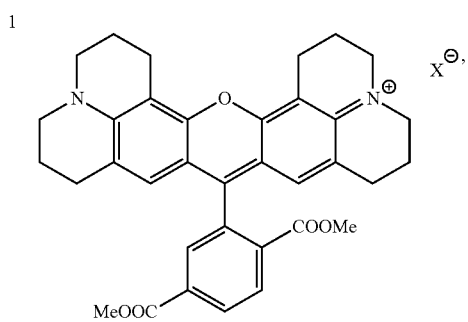
2
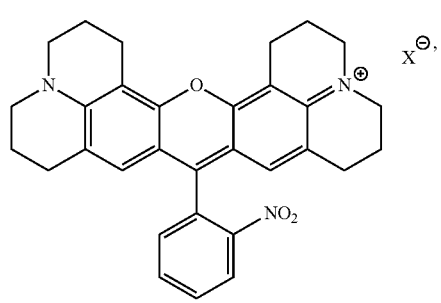
3
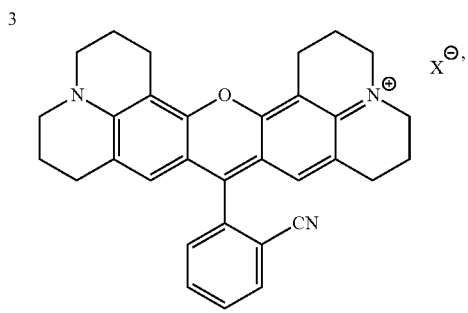
4

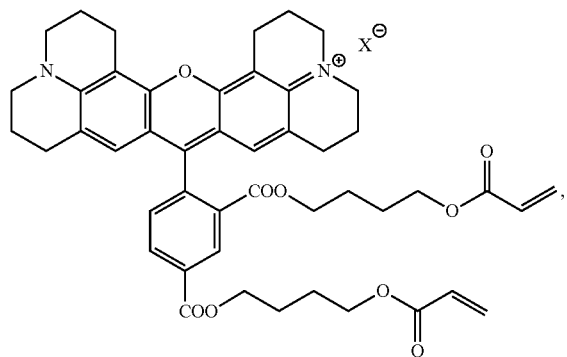
5
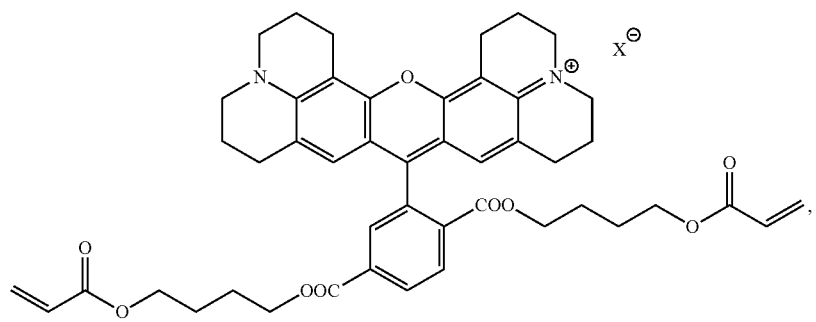
6
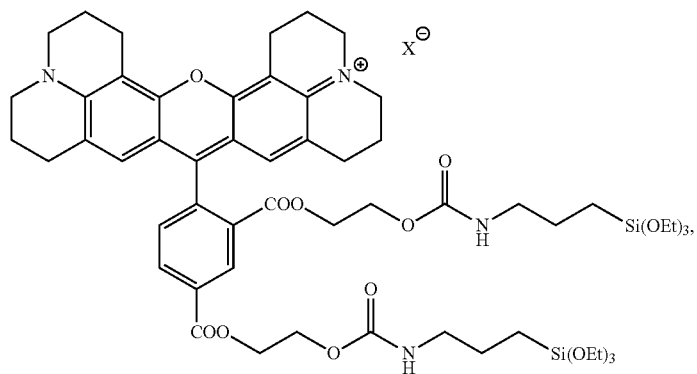
7
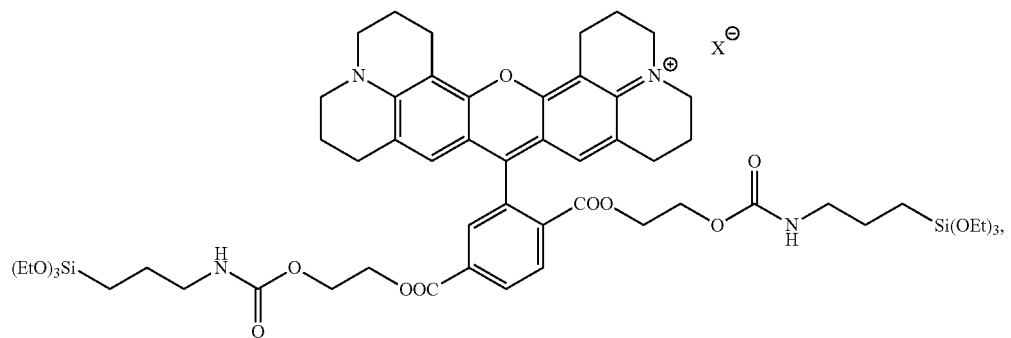
8

-continued
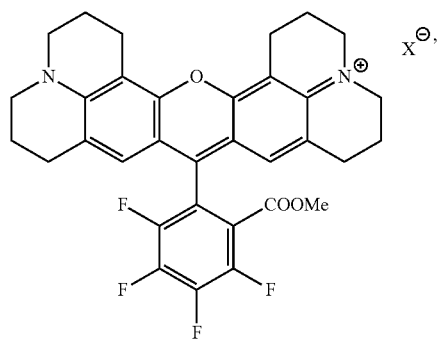
9
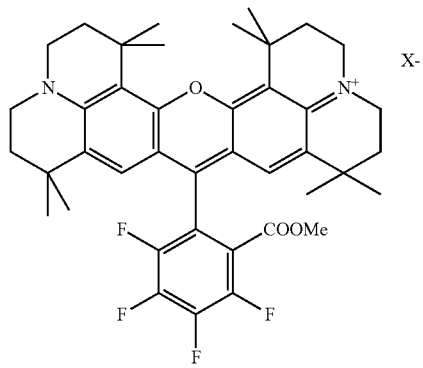
10
or
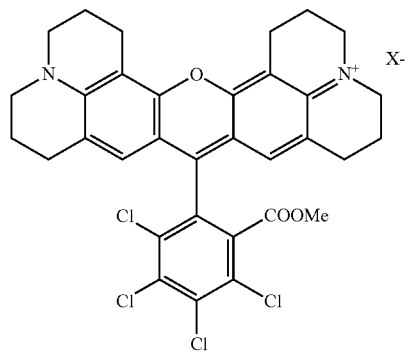
11
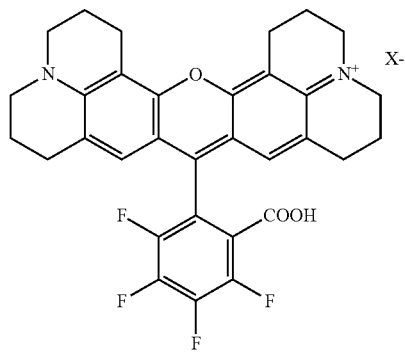
9a
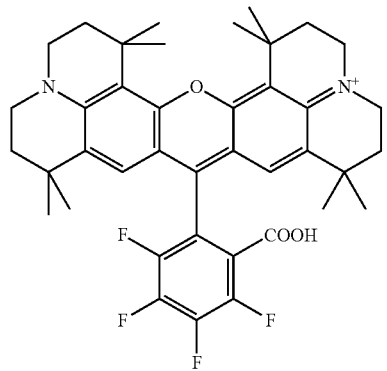
10a
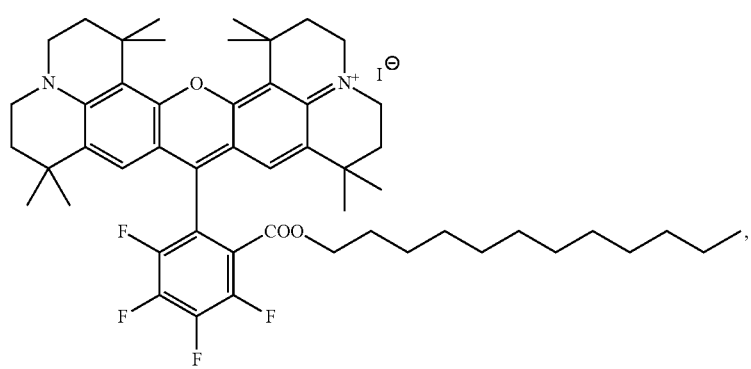
11a
20

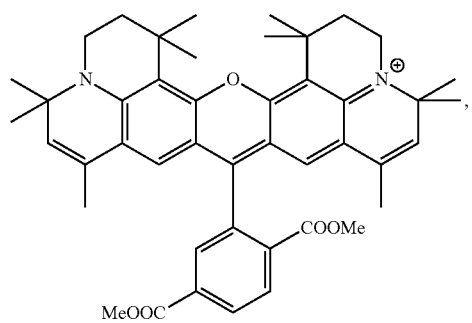

23

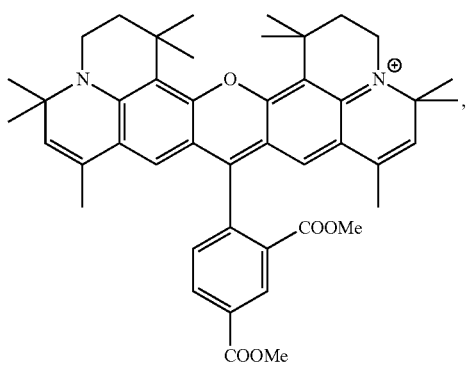

24

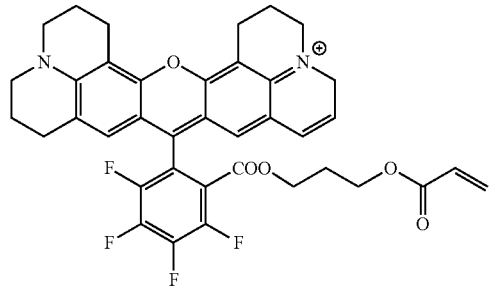

25 or

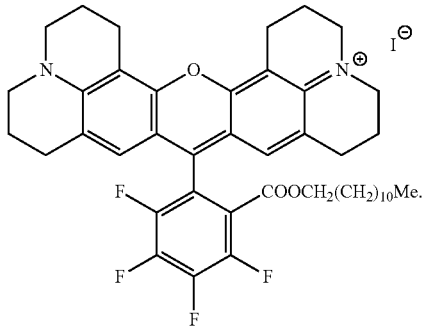

26

Green-Fluorescent RBF Compounds

Some embodiments of the invention provide green-fluorescent RBF compounds 115 defined by the structure of formula (XI):

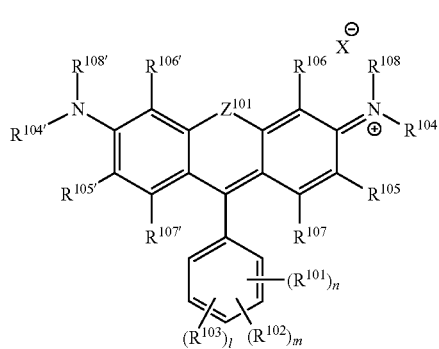

(XI)

wherein $R^{101}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^1$ or halide;

$R^{102}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^{101}$ or halide;

$R^{103}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^{101}$ or halide;

$R^{104}$, $R^{104'}$, $R^{108}$ and $R^{108'}$ are each independently selected from H, alkyl, haloalkyl, heterocycloalkyl, cycloalkyl, aryl and benzyl;

$R^{105}$ and $R^{105'}$ are each independently selected from H, Z', $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide and halide;

$R^{106}$, $R^{106'}$, $R^{107}$ and $R^{107'}$ are each independently selected from H, $Q^{101}$, $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide and halide;

$R^{104}$ and $R^{105}$, $R^{104'}$ and $R^{105'}$, $R^{104}$ and $R^{108}$ or $R^{104'}$ and $R^{108'}$ may form together an N-heterocyclic ring wherein said ring is optionally substituted;

$Q^{101}$ and $Q^{102}$ are each independently selected from H, alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$, —$(CH_2)_pSi(Oalkyl)_3$, —$(CH_2)_pOC(O)NH(CH_2)_qSi(halide)_3$, —$(CH_2)_pSi(halide)_3$, —$OC(O)N(H)Q^{104}$, —$OC(S)N(H)Q^{104}$, —$N(H)C(O)N(Q^{103})_2$ and —$N(H)C(S)N(Q^{103})_2$;

$Z^{101}$ is O or $C(CH_3)_2$;

Z' is selected from alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$, —$(CH_2)_pSi(Oalkyl)_3$, —$(CH_2)_pOC(O)NH(CH_2)_qSi(halide)_3$, —$(CH_2)_pSi(halide)_3$, —$OC(O)N(H)Q^{104}$, —$OC(S)N(H)Q^{104}$, —$N(H)C(O)N(Q^{103})_2$ and —$N(H)C(S)N(Q^{103})_2$;

$Q^{103}$ and $Q^{104}$ are each independently selected from H, alkyl, haloalkyl, heterocycloalkyl, cycloalkyl, aryl and benzyl;

M is a monovalent cation;

n, m and l are independently an integer between 1-5;

p and q are independently an integer between 1-6; and

X is an anion.

Some embodiments of the invention provide green-fluorescent RBF compounds 115 defined by the structure of formula (XII):

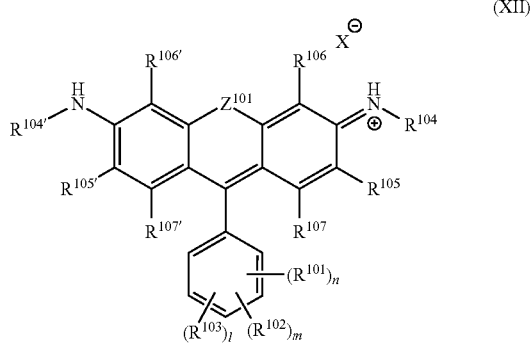

(XII)

wherein
$R^{101}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^1$ or halide;
$R^{102}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^{101}$ or halide;
$R^{103}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^{101}$ or halide;
$R^{104}$ are $R^{104'}$ are each independently selected from H, alkyl, haloalkyl, heterocycloalkyl, cycloalkyl, aryl and benzyl;
$R^{105}$ and $R^{105'}$ are each independently selected from H, Z', $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide and halide;
$R^{106}$, $R^{106'}$, $R^{107}$ and $R^{107'}$ are each independently selected from H, $Q^{101}$, $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide and halide;
$R^{104}$ and $R^{105}$ or $R^{104'}$ and $R^{105'}$ may form together a N-heterocyclic ring wherein said ring is optionally substituted;
$Q^{101}$ and $Q^{102}$ are each independently selected from H, alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$, —$(CH_2)_pSi(Oalkyl)_3$, —$(CH_2)_pOC(O)NH(CH_2)_qSi(halide)_3$, —$(CH_2)_pSi(halide)_3$, —$OC(O)N(H)Q^{104}$, —$OC(S)N(H)Q^{104}$, —$N(H)C(O)N(Q^{103})_2$ and —$N(H)C(S)N(Q^{103})_2$;
$Z^{101}$ is O or $C(CH_3)_2$;
Z' is selected from alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$, —$(CH_2)_pSi(Oalkyl)_3$, —$(CH_2)_pOC(O)NH(CH_2)_qSi(halide)_3$, —$(CH_2)_pSi(halide)_3$, —$OC(O)N(H)Q^{104}$, —$OC(S)N(H)Q^{104}$, —$N(H)C(O)N(Q^{103})_2$ and —$N(H)C(S)N(Q^{103})_2$;
$Q^{103}$ and $Q^{104}$ are each independently selected from H, alkyl, haloalkyl, heterocycloalkyl, cycloalkyl, aryl and benzyl;
M is a monovalent cation;
n, m and l are independently an integer between 1-5;
p and q are independently an integer between 1-6; and
X is an anion.

Some embodiments of the invention provide green-fluorescent RBF compounds 115 defined by the structure of formula (XIII):

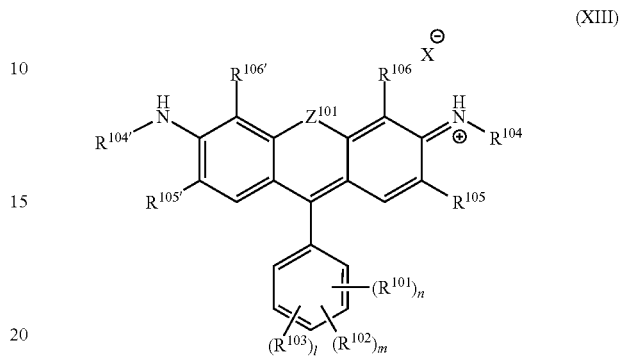

(XIII)

wherein
$R^{101}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^1$ or halide;
$R^{102}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^{101}$ or halide;
$R^{103}$ each is independently H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^{101}$ or halide;
$R^{104}$ are $R^{104'}$ are each independently selected from H, alkyl, haloalkyl, heterocycloalkyl, cycloalkyl, aryl and benzyl;
$R^{105}$ and $R^{105'}$ are each independently selected from H, Z', $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide and halide;
$R^{106}$ and $R^{106'}$ are each independently selected from H, $Q^{101}$, $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide and halide;
$R^{104}$ and $R^{105}$ or $R^{104'}$ and $R^{105'}$ may form together a N-heterocyclic ring wherein said ring is optionally substituted;
$Q^{101}$ and $Q^{102}$ are each independently selected from H, alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$, —$(CH_2)_pSi(Oalkyl)_3$, —$(CH_2)_pOC(O)NH(CH_2)_qSi(halide)_3$, —$(CH_2)_pSi(halide)_3$, —$OC(O)N(H)Q^{104}$, —$OC(S)N(H)Q^{104}$, —$N(H)C(O)N(Q^{103})_2$ and —$N(H)C(S)N(Q^{103})_2$;
$Z^{101}$ is O or $C(CH_3)_2$;
Z' is selected from alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pOC(O)C(CH_3)=CH_2$, —$(CH_2)_pSi(Oalkyl)_3$, —$(CH_2)_pOC(O)NH(CH_2)_qSi(halide)_3$, —$(CH_2)_pSi(halide)_3$, —$OC(O)N(H)Q^{104}$, —$OC(S)N(H)Q^{104}$, —$N(H)C(O)N(Q^{103})_2$ and —$N(H)C(S)N(Q^{103})_2$;
$Q^{103}$ and $Q^{104}$ are each independently selected from H, alkyl, haloalkyl, heterocycloalkyl, cycloalkyl, aryl and benzyl;

M is a monovalent cation;
n, m and l are independently an integer between 1-5;
p and q are independently an integer between 1-6; and
X is an anion.

Some embodiments of the invention provide green-fluorescent RBF compounds 115 defined by the structure of formula (XIV):

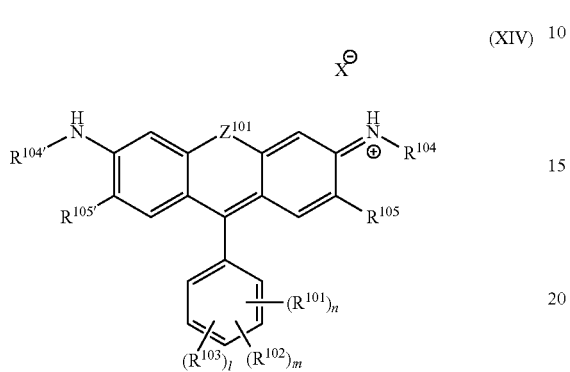

(XIV)

wherein
$R^{101}$ each is independently H, $Q^{101}$, $OQ^{101}$, $C(O)Q^{101}$, $NQ^{101}Q^{102}$, $NO_2$, CN, $SQ^{101}$, $-NQ^{101}Q^{102}CONQ^{103}Q^{104}$, NCO, NCS, $-OC(O)OQ^1$ or halide;
$R^{102}$ each is independently H, $Q^{101}$, $OQ^{101}$, $C(O)Q^{101}$, $NQ^{101}Q^{102}$, $NO_2$, CN, $SQ^{101}$, $-NQ^{101}Q^{102}CONQ^{103}Q^{104}$, NCO, NCS, $-OC(O)OQ^{101}$ or halide;
$R^{103}$ each is independently H, $Q^{101}$, $OQ^{101}$, $C(O)Q^{101}$, $NQ^{101}Q^{102}$, $NO_2$, CN, $SQ^{101}$, $-NQ^{101}Q^{102}CONQ^{103}Q^{104}$, NCO, NCS, $-OC(O)OQ^{101}$ or halide;
$R^{104}$ are $R^{104'}$ are each independently selected from H, alkyl, haloalkyl, heterocycloalkyl, cycloalkyl, aryl and benzyl;
$R^{105}$ and $R^{105'}$ are each independently selected from H, Z', $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, $-NQ^{101}Q^{102}CONQ^{103}Q^{104}$, NCO, NCS, alkenyl, alkynyl, epoxide, alkylated epoxide, alkylated azide, azide and halide;
$R^{104}$ and $R^{105}$ or $R^{104'}$ and $R^{105'}$ may form together a N-heterocyclic ring wherein said ring is optionally substituted;
$Q^{101}$ and $Q^{102}$ are each independently selected from H, alkyl, haloalkyl, heterocycloalkyl, cycloalkyl, aryl, benzyl, $-(CH_2)_pOC(O)NH(CH_2)_qSi(Oalkyl)_3$, $-(CH_2)_pOC(O)CH=CH_2$, $-(CH_2)_pOC(O)C(CH_3)=CH_2$, $-(CH_2)_pSi(Oalkyl)_3$, $-(CH_2)_pOC(O)NH(CH_2)_qSi(halide)_3$, $-(CH_2)_pSi(halide)_3$, $-OC(O)N(H)Q^{104}$, $-OC(S)N(H)Q^{104}$, $-N(H)C(O)N(Q^{103})_2$ and $-N(H)C(S)N(Q^{103})_2$;
$Z^{101}$ is O or $C(CH_3)_2$;
Z' is selected from alkyl, haloalkyl, heterocycloalkyl, cycloalkyl, aryl, benzyl, $-(CH_2)_pOC(O)NH(CH_2)_qSi(Oalkyl)_3$, $-(CH_2)_pOC(O)CH=CH_2$, $-(CH_2)_pOC(O)C(CH_3)=CH_2$, $-(CH_2)_pSi(Oalkyl)_3$, $-(CH_2)_pOC(O)NH(CH_2)_qSi(halide)_3$, $-(CH_2)_pSi(halide)_3$, $-OC(O)N(H)Q^{104}$, $-OC(S)N(H)Q^{104}$, $-N(H)C(O)N(Q^{103})_2$ and $-N(H)C(S)N(Q^{103})_2$;
$Q^{103}$ and $Q^{104}$ are each independently selected from H, alkyl, haloalkyl, heterocycloalkyl, cycloalkyl, aryl and benzyl;
M is a monovalent cation;
n, m and l are independently an integer between 1-5;
p and q are independently an integer between 1-6; and
X is an anion.

Some embodiments of the invention provide green-fluorescent RBF compounds 115 defined by the structure of formula (XV):

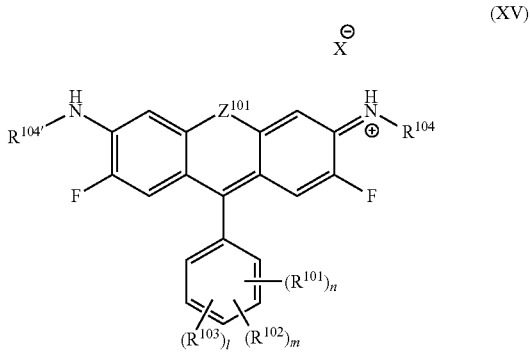

(XV)

wherein
$R^{101}$ each is independently H, $Q^{101}$, $OQ^{101}$, $C(O)Q^{101}$, $NQ^{101}Q^{102}$, $NO_2$, CN, $SQ^{101}$, $-NQ^{101}Q^{102}CONQ^{103}Q^{104}$, NCO, NCS, $-OC(O)OQ^1$ or halide;
$R^{102}$ each is independently H, $Q^{101}$, $OQ^{101}$, $C(O)Q^{101}$, $NQ^{101}Q^{102}$, $NO_2$, CN, $SQ^{101}$, $-NQ^{101}Q^{102}CONQ^{103}Q^{104}$, NCO, NCS, $-OC(O)OQ^{101}$ or halide;
$R^{103}$ each is independently H, $Q^{101}$, $OQ^{101}$, $C(O)Q^{101}$, $NQ^{101}Q^{102}$, $NO_2$, CN, $SQ^{101}$, $-NQ^{101}Q^{102}CONQ^{103}Q^{104}$, NCO, NCS, $-OC(O)OQ^{101}$ or halide;
$R^{104}$ are $R^{104'}$ are each independently selected from H, alkyl, haloalkyl, heterocycloalkyl, cycloalkyl, aryl and benzyl;
$Q^{101}$ and $Q^{102}$ are each independently selected from H, alkyl, haloalkyl, heterocycloalkyl, cycloalkyl, aryl, benzyl, $-(CH_2)_pOC(O)NH(CH_2)_qSi(Oalkyl)_3$, $-(CH_2)_pOC(O)CH=CH_2$, $-(CH_2)_pOC(O)C(CH_3)=CH_2$, $-(CH_2)_pSi(Oalkyl)_3$, $-(CH_2)_pOC(O)NH(CH_2)_qSi(halide)_3$, $-(CH_2)_pSi(halide)_3$, $-OC(O)N(H)Q^{104}$, $-OC(S)N(H)Q^{104}$, $-N(H)C(O)N(Q^{103})_2$ and $-N(H)C(S)N(Q^{103})_2$;
$Z^{101}$ is O or $C(CH_3)_2$;
$Q^{103}$ and $Q^{104}$ are each independently selected from H, alkyl, haloalkyl, heterocycloalkyl, cycloalkyl, aryl and benzyl;
M is a monovalent cation;
n, m and l are independently an integer between 1-5;
p and q are independently an integer between 1-6; and
X is an anion.

Some embodiments of the invention provide green-fluorescent RBF compounds 115 defined by the structure of formula (XVI):

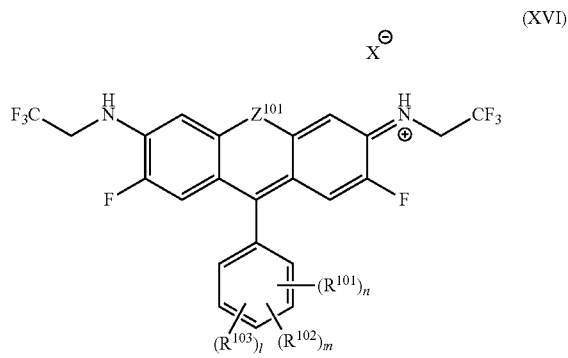

(XVI)

wherein
R[101] each is independently H, Q[101], OQ[101], C(O)Q[101], NQ[101]Q[102], NO$_2$, CN, SQ[101], —NQ[101]Q[102]CONQ[103]Q[104], NCO, NCS, —OC(O)OQ[1] or halide;
R[102] each is independently H, Q[101], OQ[101], C(O)Q[101], NQ[101]Q[102], NO$_2$, CN, SQ[101], —NQ[101]Q[102]CONQ[103]Q[104], NCO, NCS, —OC(O)OQ[101] or halide;
R[103] each is independently H, Q[101], OQ[101], C(O)Q[101], NQ[101]Q[102], NO$_2$, CN, SQ[101], —NQ[101]Q[102]CONQ[103]Q[104], NCO, NCS, —OC(O)OQ[101] or halide;
Q[101] and Q[102] are each independently selected from H, alkyl, haloalkyl, heterocycloalkyl, cycloalkyl, aryl, benzyl, —(CH$_2$)$_p$OC(O)NH(CH$_2$)$_q$Si(Oalkyl)$_3$, —(CH$_2$)$_p$OC(O)CH=CH$_2$, —(CH$_2$)$_p$OC(O)C(CH$_3$)=CH$_2$, —(CH$_2$)$_p$Si(Oalkyl)$_3$, —(CH$_2$)$_p$OC(O)NH(CH$_2$)$_q$Si(halide)$_3$, —(CH$_2$)$_p$Si(halide)$_3$, —OC(O)N(H)Q[104], —OC(S)N(H)Q[104], —N(H)C(O)N(Q[103])$_2$ and —N(H)C(S)N(Q[103])$_2$;
Z[101] is O or C(CH$_3$)$_2$;
Q[103] is each independently selected from H, alkyl, haloalkyl, heterocycloalkyl, cycloalkyl, aryl and benzyl;
M is a monovalent cation;
n, m and l are independently an integer between 1-5;
p and q are independently an integer between 1-6; and
X is an anion.

Specific, non-limiting, examples of green-fluorescent RBF compounds 115 of the invention include compounds represented by the structures below, denoted as JK71 and RS285.

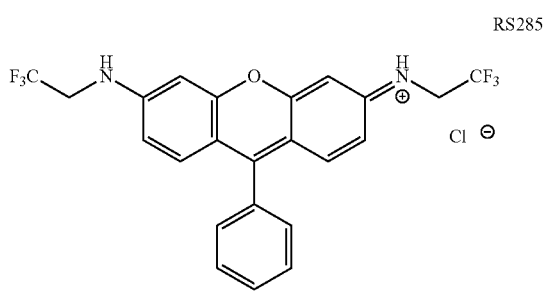

JK-71

(Z)-N-(2,7-difluoro-9-phenyl-6-((2,2,2-trifluoro-ethyl)amino)-3H-xanthen-3-ylidene)-2,2,2-trifluoro-ethan-1-aminium methanesulfonate

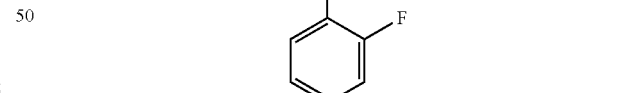

RS285

Some embodiments of green-fluorescent RBF compounds are presented in more detail in U.S. patent application Ser. No. 15/252,597 and are considered likewise part of the present disclosure. Non-limiting examples are provided in the following variants, numbered 12-19 and 21-22.

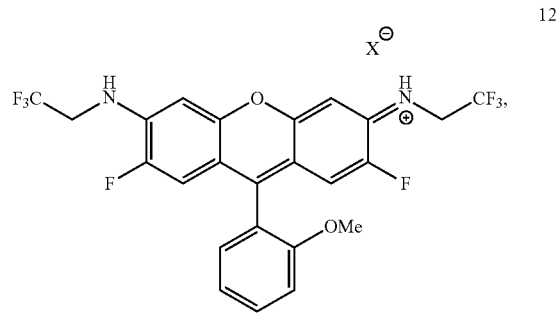

12

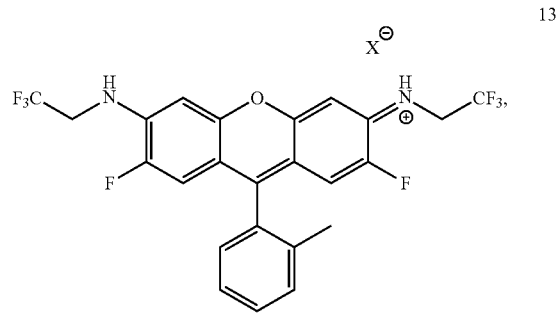

13

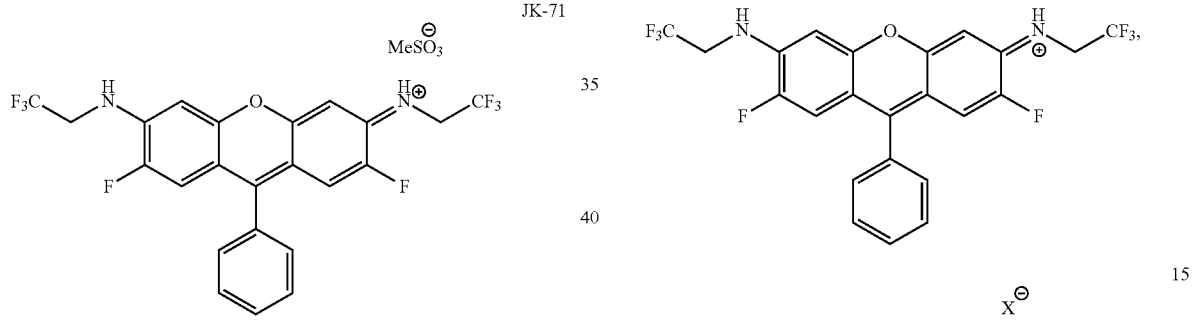

14

15

16

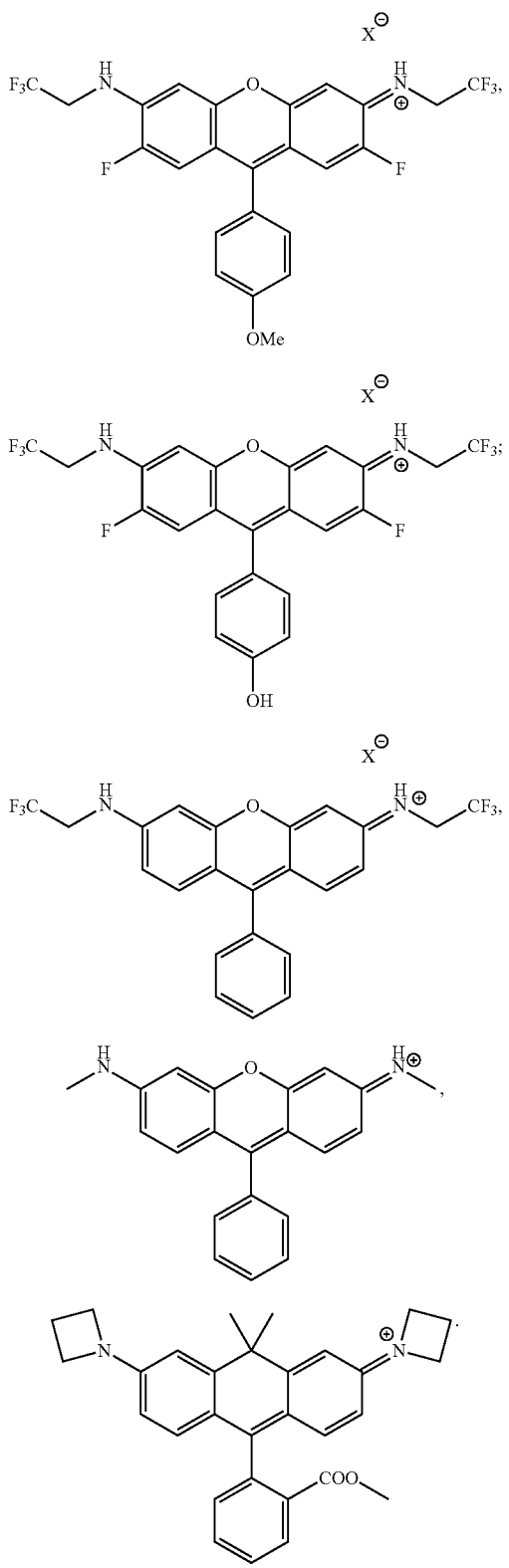

Definitions for RBF Compounds

An "alkyl" group refers, in some embodiments, to a saturated aliphatic hydrocarbon, including straight-chain or branched-chain. In some embodiments, alkyl is linear or branched. In another embodiment, alkyl is optionally substituted linear or branched. In another embodiment, alkyl is methyl. In another embodiment alkyl is ethyl. In some embodiments, the alkyl group has 1-20 carbons. In another embodiment, the alkyl group has 1-8 carbons. In another embodiment, the alkyl group has 1-7 carbons. In another embodiment, the alkyl group has 1-6 carbons. In another embodiment, non-limiting examples of alkyl groups include methyl, ethyl, propyl, isobutyl, butyl, pentyl or hexyl. In another embodiment, the alkyl group has 1-4 carbons. In another embodiment, the alkyl group may be optionally substituted by one or more groups selected from halide, hydroxy, alkoxy, carboxylic acid, aldehyde, carbonyl, amido, cyano, nitro, amino, alkenyl, alkynyl, aryl. azide, epoxide, ester, acyl chloride and thiol.

A "cycloalkyl" group refers, in some embodiments, to a ring structure comprising carbon atoms as ring atoms, which are saturated, substituted or unsubstituted. In another embodiment, the cycloalkyl is a 3-12 membered ring. In another embodiment, the cycloalkyl is a 6 membered ring. In another embodiment, the cycloalkyl is a 5-7 membered ring. In another embodiment, the cycloalkyl is a 3-8 membered ring. In another embodiment, the cycloalkyl group may be unsubstituted or substituted by a halogen, alkyl, haloalkyl, hydroxyl, alkoxy, carbonyl, amido, alkylamido, dialkylamido, cyano, nitro, $CO_2H$, amino, alkylamino, dialkylamino, carboxyl, thio and/or thioalkyl. In another embodiment, the cycloalkyl ring may be fused to another saturated or unsaturated 3-8 membered ring. In another embodiment, the cycloalkyl ring is an unsaturated ring. Non limiting examples of a cycloalkyl group comprise cyclohexyl, cyclohexenyl, cyclopropyl, cyclopropenyl, cyclopentyl, cyclopentenyl, cyclobutyl, cyclobutenyl, cycloctyl, cyclooctadienyl (COD), cyclooctaene (COE) etc.

A "heterocycloalkyl" group refers in some embodiments, to a ring structure of a cycloalkyl as described herein comprising in addition to carbon atoms, sulfur, oxygen, nitrogen or any combination thereof, as part of the ring. In some embodiments, non-limiting examples of heterocycloalkyl include pyrrolidine, pyrrole, tetrahydrofuran, furan, thiolane, thiophene, imidazole, pyrazole, pyrazolidine, oxazolidine, oxazole, isoxazole, thiazole, isothiazole, thiazolidine, dioxolane, dithiolane, triazole, furazan, oxadiazole, thiadiazole, dithiazole, tetrazole, piperidine, oxane, thiane, pyridine, pyran, thiopyran, piperazine, morpholine, thiomorpholine, dioxane, dithiane, diazine, oxazine, thiazine, dioxine, triazine, and trioxane.

As used herein, the term "aryl" refers to any aromatic ring that is directly bonded to another group and can be either substituted or unsubstituted. The aryl group can be a sole substituent, or the aryl group can be a component of a larger substituent, such as in an arylalkyl, arylamino, arylamido, etc. Exemplary aryl groups include, without limitation, phenyl, tolyl, xylyl, furanyl, naphthyl, pyridinyl, pyrimidinyl, pyridazinyl, pyrazinyl, triazinyl, thiazolyl, oxazolyl, isooxazolyl, pyrazolyl, imidazolyl, thiophene-yl, pyrrolyl, phenylmethyl, phenylethyl, phenylamino, phenylamido, etc. Substitutions include but are not limited to: F, Cl, Br, I, $C_1$-$C_5$ linear or branched alkyl, $C_1$-$C_5$ linear or branched haloalkyl, $C_1$-$C_5$ linear or branched alkoxy, $C_1$-$C_5$ linear or branched haloalkoxy, $CF_3$, CN, $NO_2$, —$CH_2CN$, $NH_2$, NH-alkyl, $N(alkyl)_2$, hydroxyl, —$OC(O)CF_3$, —$OCH_2Ph$, —NHCO-alkyl, COOH, —C(O)Ph, C(O)O-alkyl, C(O)H, or - or —$C(O)NH_2$.

N-heterocycle refers to in some embodiments, to a ring structure comprising in addition to carbon atoms, a nitrogen atom, as part of the ring. In another embodiment, the N-heterocycle is a 3-12 membered ring. In another embodiment, the N-heterocycle is a 6 membered ring. In another embodiment, the N-heterocycle is a 5-7 membered ring. In another embodiment, the N-heterocycle is a 3-8 membered ring. In another embodiment, the N-heterocycle group may be unsubstituted or substituted by a halogen, alkyl, haloalkyl, hydroxyl, alkoxy, carbonyl, amido, alkylamido, dialkylamido, cyano, nitro, $CO_2H$, amino, alkylamino, dialkylamino, carboxyl, thio and/or thioalkyl. In another embodiment, the heterocycle ring may be fused to another saturated or unsaturated cycloalkyl or heterocyclic 3-8 membered ring. In another embodiment, the N-heterocyclic ring is a saturated ring. In another embodiment, the N-heterocyclic ring is an unsaturated ring. Non limiting examples of N-heterocycle comprise pyridine, piperidine, morpholine, piperazine, pyrrolidine, pyrrole, imidazole, pyrazole, pyrazolidine, triazole, tetrazole, piperazine, diazine, or triazine.

In some embodiments, the term "halide" used herein refers to any substituent of the halogen group (group 17). In another embodiment, halide is fluoride, chloride, bromide or iodide. In another embodiment, halide is fluoride. In another embodiment, halide is chloride. In another embodiment, halide is bromide. In another embodiment, halide is iodide.

In some embodiments, haloalkyl is partially halogenated. In another embodiment haloalkyl is perhalogenated (completely halogenated, no C—H bonds). In another embodiment, haloalkyl refers to alkyl, alkenyl, alkynyl or cycloalkyl substituted with one or more halide atoms. In another embodiment, haloalkyl is $CH_2CF_3$. In another embodiment. haloalkyl is $CH_2CCl_3$. In another embodiment, haloalkyl is $CH_2CBr_3$. In another embodiment, haloalkyl is $CH_2CI_3$. In another embodiment, haloalkyl is $CF_2CF_3$. In another embodiment, haloalkyl is $CH_2CH_2CF_3$. In another embodiment, haloalkyl is $CH_2CF_2CF_3$. In another embodiment, haloalkyl is $CF_2CF_2CF_3$.

In some embodiments, the term "alkenyl" used herein refers to any alkyl group wherein at least one carbon-carbon double bond (C=C) is found. In another embodiment, the carbon-carbon double bond is found in one terminal of the alkenyl group. In another embodiment, the carbon-carbon double bond is found in the middle of the alkenyl group. In another embodiment, more than one carbon-carbon double bond is found in the alkenyl group. In another embodiment, three carbon-carbon double bonds are found in the alkenyl group. In another embodiment, four carbon-carbon double bonds are found in the alkenyl group. In another embodiment, five carbon-carbon double bonds are found in the alkenyl group. In another embodiment, the alkenyl group comprises a conjugated system of adjacent alternating single and double carbon-carbon bonds. In another embodiment, the alkenyl group is a cycloalkenyl, wherein "cycloalkenyl" refers to a cycloalkyl comprising at least one double bond.

In some embodiments, the term "alkynyl" used herein refers to any alkyl group wherein at least one carbon-carbon triple bond (C≡C) is found. In another embodiment, the carbon-carbon triple bond is found in one terminal of the alkynyl group. In another embodiment, the carbon-carbon triple bond is found in the middle of the alkynyl group. In another embodiment, more than one carbon-carbon triple bond is found in the alkynyl group. In another embodiment, three carbon-carbon triple bonds are found in the alkynyl group. In another embodiment, four carbon-carbon triple bonds are found in the alkynyl group. In another embodiment, five carbon-carbon triple bonds are found in the alkynyl group. In another embodiment, the alkynyl group comprises a conjugated system. In another embodiment, the conjugated system is of adjacent alternating single and triple carbon-carbon bonds. In another embodiment, the conjugated system is of adjacent alternating double and triple carbon-carbon bonds. In another embodiment, the alkynyl group is a cycloalkynyl, wherein "cycloalkynyl" refers to a cycloalkyl comprising at least one triple bond.

In some embodiments, the term "alkylated azide" used herein refers to any alkylated substituent comprising an azide group (—$N_3$). In another embodiment, the azide is in one terminal of the alkyl. In another embodiment, the alkyl is a cycloalkyl. In another embodiment, the alkyl is an alkenyl. In another embodiment, the alkyl is an alkynyl. In another embodiment, the epoxide is monoalkylated.

In some embodiments, the term "alkylated epoxide" used herein refers to any alkylated substituent comprising an epoxide group (a 3 membered ring consisting of oxygen and two carbon atoms). In another embodiment, the epoxide group is in the middle of the alkyl. In another embodiment, the epoxide group is in one terminal of the alkyl. In another embodiment, the alkyl is a cycloalkyl. In another embodiment, the alkyl is an alkenyl. In another embodiment, the alkyl is an alkynyl. In another embodiment, the epoxide is monoalkylated. In another embodiment, the epoxide is dialkylated. In another embodiment, the epoxide is trialkylated. In another embodiment, the epoxide is tetraalkylated.

In some embodiments, M is a monovalent cation. In another embodiment, non-limiting examples of M include alkali metal cations, $NH_4^+$, $N(Q^3)_4^+$, and $P(Q^3)_4^+$. In another embodiment, M is $Li^+$. In another embodiment, M is $Na^+$. In another embodiment, M is $K^+$. In another embodiment, M is $Rb^+$. In another embodiment, M is $Cs^+$. In another embodiment, non-limiting examples of the quarternary ammonium cation, $N(Q^3)_4^+$, include tetrametylammonium, tetraethylammonium, tetrabutylammonium, tetraoctylammonium, trimethyloctylammonium and cetyltrimethylammonium. In another embodiment, non-limiting examples of the quarternary phosphonium cation, $P(Q^3)_4^+$, include tetraphenylphosphonium, dimethyldiphenylphosphonium, tetrabutylphosphonium, methyltriphenoxyphosphonium and tetramethylphosphonium.

In some embodiments, $Z^{101}$ is O or $C(CH_3)_2$. In another embodiment, $Z^{101}$ is O. In another embodiment, $Z^{101}$ is $C(CH_3)_2$.

In some embodiments, Z is alkyl, haloalkyl, alkenyl, alkynyl, alkylated epoxide, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$, —$(CH_2)_pSi(Oalkyl)_3$, —$(CH_2)_pOC(O)C(CH_3)=CH_2$, wherein p is an integer between 1-6, q is an integer between 1-6, r is an integer between 0-10 and alkyl, haloalkyl, alkenyl, alkynyl, alkylated epoxide, cycloalkyl, heterocycloalkyl and aryl are as defined herein above. In another embodiment, Z is an alkyl. In another embodiment, Z is an alkenyl. In another embodiment, Z is an alkynyl. In another embodiment, Z is a haloalkyl. In another embodiment, Z is an alkylated epoxide. In another embodiment, Z is a cycloalkyl. In another embodiment, Z is a heterocycloalkyl. In another embodiment, Z is an aryl. In another embodiment, Z is a benzyl. In another embodiment, Z is —$(CH_2)_pOC(O)NH(CH_2)_qSi(Oalkyl)_3$. In another embodiment, Z is —$(CH_2)_2OC(O)NH(CH_2)_3Si(OEt)_3$. In another embodiment, Z is —$(CH_2)_pOC(O)CH=CH_2$. In another embodiment, Z is —$(CH_2)_4OC(O)CH=CH_2$. In another embodiment, Z is —$(CH_2)_pSi(Oalkyl)_3$. In another embodiment, Z is an —$(CH_2)_pOC(O)C(CH_3)=CH_2$.

In one embodiment, R is H, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)$ $CH=CH_2$, $-(CH_2)_p Si(Oalkyl)_3$, haloalkyl, $-(CH_2)_p OC(O)NH(CH_2)_q Si(halide)_3$, $-(CH_2)_p OC(O)C(CH_3)=CH_2$, $-(CH_2)_p Si(halide)_3$, alkenyl, alkynyl, alkylated epoxide, alkylated azide or azide wherein p is an integer between 1-6, q is an integer between 1-6 r is an integer between 0-10 and alkyl, haloalkyl, alkenyl, alkynyl, alkylated epoxide, alkylated azide, cycloalkyl, heterocycloalkyl, aryl and halide are as defined herein above. In another embodiment, R is H. In another embodiment, R is an alkyl. In another embodiment, R is a cycloalkyl. In another embodiment, R is a heterocycloalkyl. In another embodiment, R is an aryl. In another embodiment, R is a benzyl. In another embodiment, R is $-(CH_2)_p OC(O)NH(CH_2)_q Si(Oalkyl)_3$. In another embodiment, R is $-(CH_2)_2 OC(O)NH(CH_2)_3 Si(OEt)_3$. In another embodiment, R is $-(CH_2)_p OC(O)CH=CH_2$. In another embodiment, R is $-(CH_2)_4 OC(O)CH=CH_2$. In another embodiment, R is $-(CH_2)_p Si(Oalkyl)_3$. In another embodiment, R is haloalkyl. In another embodiment, R is $-(CH_2)_p OC(O)NH(CH_2)_q Si(halide)_3$. In another embodiment, R is $-(CH_2)_p OC(O)C(CH_3)=CH_2$. In another embodiment, R is, $-(CH_2)_p Si(halide)_3$. In another embodiment, R is alkenyl. In another embodiment, R is alkynyl. In another embodiment, R is alkylated epoxide. In another embodiment, R is an alkylated azide. In another embodiment, R is an azide.

In some embodiments, Q is H, alkyl, cycloalkyl, heterocycloalkyl, aryl, benzyl, $-(CH_2CH_2O)_r CH_2CH_2OH$, $-(CH_2)_p OC(O)NH(CH_2)_q Si(Oalkyl)_3$, $-(CH_2)_p OC(O)CH=CH_2$, $-(CH_2)_p OC(O)C(CH_3)=CH_2$ or $-(CH_2)_p Si(Oalkyl)_3$; wherein p is an integer between 1-6, q is an integer between 1-6, r is an integer between 0-10 and alkyl, cycloalkyl, heterocycloalkyl, aryl and halide are as defined herein above. In another embodiment, Q is an H. In another embodiment, Q is an alkyl. In another embodiment, Q is a cycloalkyl. In another embodiment, Q is a heterocycloalkyl. In another embodiment, Q is an aryl. In another embodiment, Q is a benzyl. In another embodiment, Q is $-(CH_2)_p OC(O)NH(CH_2)_q Si(Oalkyl)_3$. In another embodiment, Q is $-(CH_2)_2 OC(O)NH(CH_2)_3 Si(OEt)_3$. In another embodiment, Q is $-(CH_2)_p OC(O)CH=CH_2$. In another embodiment, Q is $-(CH_2)_4 OC(O)CH=CH_2$. In another embodiment, Q is $-(CH_2)_p OC(O)C(CH_3)=CH_2$. In another embodiment, Q is $-(CH_2)_p Si(Oalkyl)_3$.

In some embodiments, $R^1$, is halide, alkyl, haloalkyl, COOZ, $NO_2$, COR, COSR, $CON(R)_2$, or CN, wherein halide, alkyl, haloalkyl, Z and R are as defined herein above. In another embodiment, $R^1$ is halide. In another embodiment, $R^1$ is alkyl. In another embodiment, $R^1$ is haloalkyl. In another embodiment, $R^1$ is COOZ. In another embodiment, $R^1$ is $NO_2$. In another embodiment, $R^1$ is COR. In another embodiment, $R^1$ is COSR. In another embodiment, $R^1$ is $CON(R)_2$. In another embodiment, $R^1$ is CO(N-heterocycle). In another embodiment, $R^1$ is CN.

In some embodiments, $R^2$ is H, halide, $N(R)_2$, COR, CN, $CON(R)_2$, CO(N-heterocycle), NCO, NCS, OR, SR, $SO_3H$, $SO_3M$ or COOZ, wherein halide, R, N-heterocycle and M are as defined herein above. In another embodiment, $R^2$ is H. In another embodiment, $R^2$ is halide. In another embodiment, $R^2$ is $N(R)_2$. In another embodiment, $R^2$ is COR. In another embodiment, $R^2$ is CN. In another embodiment, $R^2$ is $CON(R)_2$. In another embodiment, $R^2$ is CO(N-heterocycle). In another embodiment, $R^2$ is NCO. In another embodiment, $R^2$ is NCS. In another embodiment, $R^2$ is OR. In another embodiment, $R^2$ is SR. In another embodiment, $R^2$ is $SO_3H$. In another embodiment, $R^2$ is $SO_3M$. In another embodiment, $R^2$ is COOZ.

In some embodiments, $R^3$ is H, halide, $N(R)_2$, COR, CN, $CON(R)_2$, CO(N-Heterocycle), NCO, NCS, OR, SR, $SO_3H$, $SO_3M$ or COOZ, wherein halide, R, N-heterocycle and M are as defined herein above. In another embodiment, $R^3$ is H. In another embodiment, $R^3$ is halide. In another embodiment, $R^3$ is $N(R)_2$. In another embodiment, $R^3$ is COR. In another embodiment, $R^3$ is CN. In another embodiment, $R^3$ is $CON(R)_2$. In another embodiment, $R^3$ is CO(N-heterocycle). In another embodiment, $R^3$ is NCO. In another embodiment, $R^3$ is NCS. In another embodiment, $R^3$ is OR. In another embodiment, $R^3$ is SR. In another embodiment, $R^3$ is $SO_3H$. In another embodiment, $R^3$ is $SO_3M$. In another embodiment, $R^3$ is COOZ.

In some embodiments, $R^4$, $R^{4'}$, $R^{16}$, $R^{16'}$ are each independently selected from H, alkyl, alkenyl, alkynyl, epoxide, alkylated epoxide, azide, SR, cycloalkyl, heterocycloalkyl, aryl, benzyl, halide, $N(R)_2$, $NO_2$, COR, CN, $CON(R)_2$, CO(N-heterocycle) and COOR, wherein alkyl, alkenyl, alkynyl, epoxide, alkylated epoxide, R, cycloalkyl, heterocycloalkyl, aryl, halide and N-heterocycle are as defined herein above. In another embodiment, $R^4$, $R^{4'}$, $R^{16}$ and/or $R^{16'}$ is H. In another embodiment, $R^4$, $R^{4'}$, $R^{16}$ and/or $R^{16'}$ is alkyl. In another embodiment, $R^4$, $R^{4'}$, $R^{16}$ and/or $R^{16'}$ is alkenyl. In another embodiment, $R^4$, $R^{4'}$, $R^{16}$ and/or $R^{16'}$ is alkynyl. In another embodiment, $R^4$, $R^{4'}$, $R^{16}$ and/or $R^{16'}$ is epoxide. In another embodiment, $R^4$, $R^{4'}$, $R^{16}$ and/or $R^{16'}$ is alkylated epoxide. In another embodiment, $R^4$, $R^{4'}$, $R^{16}$ and/or $R^{16'}$ is azide. In another embodiment, $R^4$, $R^{4'}$, $R^{16}$ and/or $R^{16'}$ is SR. In another embodiment, $R^4$, $R^{4'}$, $R^{16}$ and/or $R^{16'}$ is cycloalkyl. In another embodiment, $R^4$, $R^{4'}$, $R^{16}$ and/or $R^{16'}$ is heterocycloalkyl. In another embodiment, $R^4$, $R^{4'}$, $R^{16}$ and/or $R^{16}$ is aryl. In another embodiment, $R^4$, $R^{4'}$, $R^{16}$ and/or $R^{16'}$ is benzyl. In another embodiment, $R^4$, $R^{4'}$, $R^{16}$ and/or $R^{16'}$ is halide. In another embodiment, $R^4$, $R^{4'}$, $R^{16}$ and/or $R^{16'}$ is $N(R)_2$. In another embodiment, $R^4$, $R^{4'}$, $R^{16}$ or $R^{16'}$ is $NO_2$. In another embodiment, $R^4$, $R^{4'}$, $R^{16}$ and/or $R^{16'}$ is COR. In another embodiment, $R^4$, $R^{4'}$, $R^9$, $R^{9'}$, $R^{11}$, $R^{11'}$, $R^{16}$ and/or $R^{16'}$ is CN. In another embodiment, $R^4$, $R^{4'}$, $R^{16}$ and/or $R^{16'}$ is $CON(R)_2$. In another embodiment, $R^4$, $R^{4'}$, $R^{16}$ and/or $R^{16'}$ is CO(N-heterocycle). In another embodiment, $R^4$, $R^{4'}$, $R^{16}$ and/or $R^{16'}$ is COOR.

In some embodiments, $R^5$, $R^{5'}$, $R^{15}$, $R^{15'}$ are each independently selected from H, alkyl, alkenyl, alkynyl, epoxide, alkylated epoxide, azide, SR, cycloalkyl, heterocycloalkyl, aryl, benzyl, halide, $N(R)_2$, $NO_2$, COR, CN, $CON(R)_2$, CO(N-heterocycle) and COOR, wherein alkyl, alkenyl, alkynyl, epoxide, alkylated epoxide, R, cycloalkyl, heterocycloalkyl, aryl, halide and N-heterocycle are as defined herein above. In another embodiment, $R^5$, $R^{5'}$, $R^{15}$ and/or $R^{15'}$ is H. In another embodiment, $R^5$, $R^{5'}$, $R^{15}$ and/or $R^{15'}$ is alkyl. In another embodiment, $R^5$, $R^{5'}$, $R^{15}$ and/or $R^{15'}$ is alkenyl. In another embodiment, $R^5$, $R^{5'}$, $R^8$, $R^{8'}$, $R^{12}$, $R^{12'}$, $R^{15}$ and/or $R^{15'}$ is alkynyl. In another embodiment, $R^5$, $R^{5'}$, $R^{15}$ and/or $R^{15'}$ is epoxide. In another embodiment, $R^5$, $R^{5'}$, $R^{15}$ and/or $R^{15'}$ is alkylated epoxide. In another embodiment, $R^5$, $R^{5'}$, $R^{15}$ and/or $R^{15'}$ is azide. In another embodiment, $R^5$, $R^{5'}$, $R^{15}$ and/or $R^{15'}$ is SR. In another embodiment, $R^5$, $R^{5'}$, $R^{15}$ and/or $R^{15'}$ is cycloalkyl. In another embodiment, $R^5$, $R^{5'}$, $R^{15}$ and/or $R^{15'}$ is heterocycloalkyl. In another embodiment, $R^5$, $R^{5'}$, $R^8$, $R^{8'}$, $R^{12}$, $R^{12'}$, $R^{15}$ and/or $R^{15'}$ is aryl. In another embodiment, $R^5$, $R^{5'}$, $R^{15}$ and/or $R^{15'}$ is benzyl. In another embodiment, $R^5$, $R^{5'}$, $R^{15}$ and/or $R^{15'}$ is halide. In another embodiment, $R^5$, $R^{5'}$, $R^{15}$ and/or $R^{15'}$ is $N(R)_2$. In another embodiment, $R^5$, $R^{5'}$, $R^{15}$ and/or $R^{15'}$ is $NO_2$. In another embodiment, $R^5$, $R^{5'}$, $R^8$, $R^{8'}$, $R^{12}$, $R^{12'}$, $R^{15}$ and/or $R^{15'}$ is COR. In another embodiment, $R^5$, $R^{5'}$, $R^{15}$ and/or $R^{15'}$ is CN. In another embodiment, $R^5$, $R^{5'}$, $R^{15}$ and/or $R^{15'}$ is CON(R)$_2$. In another embodiment, R$^5$, R$^{5'}$, R$^{15}$ and/or R$^{15'}$ is CO(N-heterocycle). In another embodiment, R$^5$, R$^{5'}$, R$^{15}$ and/or R$^{15'}$ is COOR.

In some embodiments, R$^6$, R$^{6'}$, R$^7$, R$^{7'}$, R$^{13}$, R$^{13'}$, R$^{14}$, R$^{14'}$ are each independently selected from is H, alkyl, alkenyl, alkynyl, epoxide, alkylated epoxide, azide, SR, cycloalkyl, heterocycloalkyl, aryl, benzyl, halide, N(R)$_2$, NO$_2$, COR, CN, CON(R)$_2$, CO(N-Heterocycle) and COOR, wherein alkyl, alkenyl, alkynyl, epoxide, alkylated epoxide, R, cycloalkyl, heterocycloalkyl, aryl, halide and N-heterocycle are as defined herein above. In another embodiment, R$^6$, R$^{6'}$, R$^7$, R$^{7'}$, R$^{13}$, R$^{13'}$, R$^{14}$ and/or R$^{14'}$ is H. In another embodiment, R$^6$, R$^{6'}$, R$^7$, R$^{7'}$, R$^{13}$, R$^{13'}$, R$^{14}$ and/or R$^{14'}$ is alkyl. In another embodiment, R$^6$, R$^{6'}$, R$^7$, R$^{7'}$, R$^{13}$, R$^{13'}$, R$^{14}$ and/or R$^{14'}$ is alkenyl. In another embodiment, R$^6$, R$^{6'}$, R$^7$, R$^{7'}$, R$^{13}$, R$^{13'}$, R$^{14}$ and/or R$^{14'}$ is alkynyl. In another embodiment, R$^6$, R$^{6'}$, R$^7$, R$^{7'}$, R$^{13}$, R$^{13'}$, R$^{14}$ and/or R$^{14'}$ is epoxide. In another embodiment, R$^6$, R$^{6'}$, R$^7$, R$^{7'}$, R$^{13}$, R$^{13'}$, R$^{14}$ and/or R$^{14'}$ is alkylated epoxide. In another embodiment, R$^6$, R$^{6'}$, R$^7$, R$^{7'}$, R$^{13}$, R$^{13'}$, R$^{14}$ and/or R$^{14'}$ is azide. In another embodiment, R$^6$, R$^{6'}$, R$^7$, R$^{7'}$, R$^{13}$, R$^{13'}$, R$^{14}$ and/or R$^{14'}$ is SR. In another embodiment, R$^6$, R$^{6'}$, R$^7$, R$^{7'}$, R$^{13}$, R$^{13'}$, R$^{14}$ and/or R$^{14'}$ is cycloalkyl. In another embodiment, R$^6$, R$^{6'}$, R$^7$, R$^{7'}$, R$^{13}$, R$^{13'}$, R$^{14}$ and/or R$^{14'}$ is heterocycloalkyl. In another embodiment, R$^6$, R$^{6'}$, R$^7$, R$^{7'}$, R$^{13}$, R$^{13'}$, R$^{14}$ and/or R$^{14'}$ is aryl. In another embodiment, R$^6$, R$^{6'}$, R$^7$, R$^{7'}$, R$^{13}$, R$^{13'}$, R$^{14}$ and/or R$^{14'}$ is benzyl. In another embodiment, R$^6$, R$^{6'}$, R$^7$, R$^{7'}$, R$^{13}$, R$^{13'}$, R$^{14}$ and/or R$^{14'}$ is halide. In another embodiment, R$^6$, R$^{6'}$, R$^7$, R$^{7'}$, R$^{13}$, R$^{13'}$, R$^{14}$ and/or R$^{14'}$ is N(R)$_2$. In another embodiment, R$^6$, R$^{6'}$, R$^7$, R$^{7'}$, R$^{13}$, R$^{13'}$, R$^{14}$ and/or R$^{14'}$ is NO$_2$. In another embodiment, R$^6$, R$^{6'}$, R$^7$, R$^{7'}$, R$^{13}$, R$^{13'}$, R$^{14}$ and/or R$^{14'}$ is COR. In another embodiment, R$^6$, R$^{6'}$, R$^7$, R$^{7'}$, R$^{13}$, R$^{13'}$, R$^{14}$ and/or R$^{14'}$ is CN. In another embodiment, R$^6$, R$^{6'}$, R$^7$, R$^{7'}$, R$^{13}$, R$^{13'}$, R$^{14}$ and/or R$^{14'}$, is CON(R)$_2$. In another embodiment, R$^6$, R$^{6'}$, R$^7$, R$^{7'}$, R$^{13}$, R$^{13'}$, R$^{14}$ and/or R$^{14'}$ is CO(N-heterocycle). In another embodiment, R$^6$, R$^{6'}$, R$^7$, R$^{7'}$, R$^{13}$, R$^{13'}$, R$^{14}$ and/or R$^{14'}$, is COOR.

In some embodiments, R$^8$, R$^{8'}$, R$^9$, R$^{9'}$, R$^{11}$, R$^{11'}$, R$^{12}$ and/or R$^{12'}$ are each independently selected from absent, H, alkyl, alkenyl, alkynyl, epoxide, alkylated epoxide, azide, SR, cycloalkyl, heterocycloalkyl, aryl, benzyl, halide, N(R)$_2$, NO$_2$, COR, CN, CON(R)$_2$, CO(N-heterocycle) and COOR, wherein alkyl, alkenyl, alkynyl, epoxide, alkylated epoxide, R, cycloalkyl, heterocycloalkyl, aryl, halide and N-heterocycle are as defined herein above. In another embodiment, R$^8$, R$^{8'}$, R$^9$, R$^{9'}$, R$^{11}$, R$^{11'}$, R$^{12}$ and/or R$^{12'}$ are absent. In another embodiment, R$^8$, R$^{8'}$, R$^9$, R$^{9'}$, R$^{11}$, R$^{11'}$, R$^{12}$ and/or R$^{12'}$ are H. In another embodiment, R$^8$, R$^{8'}$, R$^9$, R$^{9'}$, R$^{11}$, R$^{11'}$, R$^{12}$ and/or R$^{12'}$ are alkyl. In another embodiment, R$^8$, R$^{8'}$, R$^9$, R$^{9'}$, R$^{11}$, R$^{11'}$, R$^{12}$ and/or R$^{12'}$ are alkenyl. In another embodiment, R$^8$, R$^{8'}$, R$^9$, R$^{9'}$, R$^{11}$, R$^{11'}$, R$^{12}$ and/or R$^{12'}$ are alkynyl. In another embodiment, R$^8$, R$^{8'}$, R$^9$, R$^{9'}$, R$^{11}$, R$^{11'}$, R$^{12}$ and/or R$^{12'}$ are epoxide. In another embodiment, R$^8$, R$^{8'}$, R$^9$, R$^{9'}$, R$^{11}$, R$^{11'}$, R$^{12}$ and/or R$^{12'}$ are alkylated epoxide. In another embodiment, R$^8$, R$^{8'}$, R$^9$, R$^{9'}$, R$^{11}$, R$^{11'}$, R$^{12}$ and/or R$^{12'}$ are azide. In another embodiment, R$^8$, R$^{8'}$, R$^9$, R$^{9'}$, R$^{11}$, R$^{11'}$, R$^{12}$ and/or R$^{12'}$ are SR. In another embodiment, R$^8$, R$^{8'}$, R$^9$, R$^{9'}$, R$^{11}$, R$^{11'}$, R$^{12}$ and/or R$^{12'}$ is cycloalkyl. In another embodiment, R$^8$, R$^{8'}$, R$^9$, R$^{9'}$, R$^{11}$, R$^{11'}$, R$^{12}$ and/or R$^{12'}$ is heterocycloalkyl. In another embodiment, R$^8$, R$^{8'}$, R$^9$, R$^{9'}$, R$^{11}$, R$^{11'}$, R$^{12}$ and/or R$^{12'}$ is aryl. In another embodiment, R$^8$, R$^{8'}$, R$^9$, R$^{9'}$, R$^{11}$, R$^{11'}$, R$^{12}$ and/or R$^{12'}$ is benzyl. In another embodiment, R$^8$, R$^{8'}$, R$^9$, R$^{9'}$, R$^{11}$, R$^{11'}$, R$^{12}$ and/or R$^{12'}$ is halide. In another embodiment, R$^8$, R$^{8'}$, R$^9$, R$^{9'}$, R$^{11}$, R$^{11'}$, R$^{12}$ and/or R$^{12'}$ is N(R)$_2$. In another embodiment, R$^8$, R$^{8'}$, R$^9$, R$^{9'}$, R$^{11}$, R$^{11'}$, R$^{12}$ and/or R$^{12'}$ is NO$_2$. In another embodiment, R$^8$, R$^{8'}$, R$^9$, R$^{9'}$, R$^{11}$, R$^{11'}$, R$^{12}$ and/or R$^{12'}$ is COR. In another embodiment, R$^8$, R$^{8'}$, R$^9$, R$^{9'}$, R$^{11}$, R$^{11'}$, R$^{12}$ and/or R$^{12'}$ is CN. In another embodiment, R$^8$, R$^{8'}$, R$^9$, R$^{9'}$, R$^{11}$, R$^{11'}$, R$^{12}$ and/or R$^{12'}$ is CON(R)$_2$. In another embodiment, R$^8$, R$^{8'}$, R$^9$, R$^{9'}$, R$^{11}$, R$^{11'}$, R$^{12}$ and/or R$^{12'}$ is CO(N-heterocycle). In another embodiment, R$^8$, R$^{8'}$, R$^9$, R$^{9'}$, R$^{11}$, R$^{11'}$, R$^{12}$ and/or R$^{12'}$ is COOR.

In some embodiments, R$^{10}$ is H, alkyl, alkenyl, alkynyl, epoxide, alkylated epoxide, alkylated azide, azide, SO$_3$H, SO$_3$M, SR, cycloalkyl, heterocycloalkyl, aryl, benzyl, halide, N(R)$_2$, NO$_2$, COR, CN, CON(R)$_2$, CO(N-heterocycle) or COOR, wherein alkyl, alkenyl, alkynyl, alkylated epoxide, alkylated azide, R, cycloalkyl, heterocycloalkyl, aryl, halide, M and N-heterocycle are as defined herein above. In another embodiment, R$^{10}$ is H. In another embodiment, R$^{10}$ is alkyl. In another embodiment, R$^{10}$ is alkenyl. In another embodiment, R$^{10}$ is alkynyl. In another embodiment, R$^{10}$ is epoxide. In another embodiment, R$^{10}$ is alkylated epoxide. In another embodiment, R$^{10}$ is alkylated azide. In another embodiment, R$^{10}$ is azide. In another embodiment, R$^{10}$ is SO$_3$H. In another embodiment, R$^{10}$ is SO$_3$M. In another embodiment, R$^{10}$ is SR. In another embodiment, R$^{10}$ is cycloalkyl. In another embodiment, R$^{10}$ is alkyl. In another embodiment, R$^{10}$ is heterocycloalkyl. In another embodiment, R$^{10}$ is aryl. In another embodiment, R$^{10}$ is benzyl. In another embodiment, R$^{10}$ is halide. In another embodiment, R$^{10}$ is N(R)$_2$. In another embodiment, R$^{10}$ is NO$_2$. In another embodiment, R$^{10}$ is COR. In another embodiment, R$^{10}$, is CN. In another embodiment, R$^{10}$, is CON(R)$_2$. In another embodiment, R$^{10}$ is CO(N-heterocycle). In another embodiment, R$^{10}$, is COOR.

In one embodiment, R$^{10'}$ is H, alkyl, alkenyl, alkynyl, epoxide, alkylated epoxide, alkylated azide, azide, SO$_3$H, SO$_3$M, SR cycloalkyl, heterocycloalkyl, aryl, benzyl, halide, N(R)$_2$, NO$_2$, COR, CN, CON(R)$_2$, CO(N-heterocycle) or COOR, wherein alkyl, alkenyl, alkynyl, alkylated epoxide, alkylated azide, R, cycloalkyl, heterocycloalkyl, aryl, halide, M and N-heterocycle are as defined herein above. In another embodiment, R$^{10'}$ is H. In another embodiment, R$^{10'}$ is alkyl. In another embodiment, R$^{10'}$ is cycloalkyl. In another embodiment, R$^{10'}$ is alkyl. In another embodiment, R$^{10'}$ is alkenyl. In another embodiment, R$^{10'}$ is alkynyl. In another embodiment, R$^{10'}$ is epoxide. In another embodiment, R$^{10'}$ is alkylated epoxide. In another embodiment, R$^{10'}$ is alkylated azide. In another embodiment, R$^{10'}$ is azide. In another embodiment, R$^{10'}$ is SO$_3$H. In another embodiment, R$^{10'}$ is SO$_3$M. In another embodiment, R$^{10'}$ is SR. In another embodiment, R$^{10'}$ is heterocycloalkyl. In another embodiment, R$^{10'}$ is aryl. In another embodiment, R$^{10'}$ is benzyl. In another embodiment, R$^{10'}$ is halide. In another embodiment, R$^{10'}$ is N(R)$_2$. In another embodiment, R$^{10'}$ is NO$_2$. In another embodiment, R$^{10'}$ is COR. In another embodiment, R$^{10'}$, is CN. In another embodiment, R$^{10'}$, is CON(R)$_2$. In another embodiment, R$^{10'}$ is CO(N-heterocycle). In another embodiment, R$^{10'}$, is COOR.

In some embodiments, Q$^1$ is halide, haloalkyl, tosylate, mesylate, SO$_2$NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-Heterocycle), NO, NO$_2$, N(Q)$_2$, SO$_3$H, SO$_3$M, SO$_2$Q, SO$_2$M, SOQ, PO(OH)$_2$ or OPO(OH)$_2$, wherein halide, haloalkyl, Q, N-heterocycle and M are as defined herein above. In another embodiment, Q$^1$ is halide. In another embodiment, Q$^1$ is halogenated alkyl. In another embodiment, Q$^1$ is tosylate. In another embodiment, Q$^1$ is mesylate. In another embodiment, Q$^1$ is SO$_2$NHQ. In another embodiment, Q$^1$ is triflate. In another embodiment, Q$^1$ is isocyante. In another embodiment, Q$^1$ is cyanate. In another embodiment, $Q^1$ is thiocyanate. In another embodiment, $Q^1$ is isothiocyanate. In another embodiment, $Q^1$ is COQ. In another embodiment, $Q^1$ is COCl. In another embodiment, $Q^1$ is COOCOQ. In another embodiment, $Q^1$ is COOQ. In another embodiment, $Q^1$ is OCOQ. In another embodiment, $Q^1$ is OCONHQ. In another embodiment, $Q^1$ is NHCOOQ. In another embodiment, $Q^1$ is NHCONHQ. In another embodiment $Q^1$ is OCOOQ. In another embodiment, $Q^1$ is CN. In another embodiment, $Q^1$ is $CON(Q)_2$. In another embodiment, $Q^1$ is CO(N-heterocycle). In another embodiment, $Q^1$ is NO. In another embodiment, $Q^1$ is $NO_2$. In another embodiment, $Q^1$ is $N(Q)_2$. In another embodiment, $Q^1$ is $SO_3H$. In another embodiment, $Q^1$ is $SO_3M$. In another embodiment, $Q^1$ is $SO_2Q$. In another embodiment, $Q^1$ is $SO_2M$. In another embodiment, $Q^1$ is SOQ. In another embodiment, $Q^1$ is $PO(OH)_2$. In another embodiment, $Q^1$ is $OPO(OH)_2$.

In some embodiments, $Q^2$ is halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-Heterocycle), NO, $NO_2$, $N(Q)_2$, $SO_3H$, $SO_3M$, $SO_2Q$, $SO_2M$, SOQ, $PO(OH)_2$ or $OPO(OH)_2$, wherein halide, haloalkyl, Q, N-heterocycle and M are as defined herein above. In another embodiment, $Q^2$ is halide. In another embodiment, $Q^2$ is halogenated alkyl. In another embodiment, $Q^2$ is tosylate. In another embodiment, $Q^2$ is mesylate. In another embodiment, $Q^2$ is $SO_2NHQ$. In another embodiment, $Q^2$ is triflate. In another embodiment, $Q^2$ is isocyante. In another embodiment, $Q^2$ is cyanate. In another embodiment, $Q^2$ is thiocyanate. In another embodiment, $Q^2$ is isothiocyanate. In another embodiment, $Q^2$ is COQ. In another embodiment, $Q^2$ is COCl. In another embodiment, $Q^2$ is COOCOQ. In another embodiment, $Q^2$ is COOQ. In another embodiment, $Q^2$ is OCOQ. In another embodiment, $Q^2$ is OCONHQ. In another embodiment, $Q^2$ is NHCOOQ. In another embodiment, $Q^2$ is NHCONHQ. In another embodiment $Q^2$ is OCOOQ. In another embodiment, $Q^2$ is CN. In another embodiment, $Q^2$ is $CON(Q)_2$. In another embodiment, $Q^2$ is CO(N-Heterocycle). In another embodiment, $Q^2$ is NO. In another embodiment, $Q^2$ is $NO_2$. In another embodiment, $Q^2$ is $N(Q)_2$. In another embodiment, $Q^2$ is $SO_3H$. In another embodiment, $Q^2$ is $SO_3M$. In another embodiment, $Q^2$ is $SO_2Q$. In another embodiment, $Q^2$ is $SO_2M$. In another embodiment, $Q^2$ is SOQ. In another embodiment, $Q^2$ is $PO(OH)_2$. In another embodiment, $Q^2$ is $OPO(OH)_2$.

In some embodiments, $Q^3$, $Q^{3'}$, $Q^{15}$ and/or $Q^{15'}$ are each independently selected from H, alkyl, cycloalkyl, heterocycloalkyl, aryl, benzyl, halide, $N(Q)_2$, $NO_2$, COR, CN, $CON(Q)_2$, CO(N-heterocycle) and COOQ, wherein alkyl, cycloalkyl, heterocycloalkyl, aryl, halide, Q and N-heterocycle are as defined herein above. In another embodiment, $Q^3$, $Q^{3'}$, $Q^{15}$ and/or $Q^{15'}$ is H. In another embodiment, $Q^3$, $Q^{3'}$, $Q^{15}$ and/or $Q^{15'}$ is alkyl. In another embodiment, $Q^3$, $Q^{3'}$, $Q^{15}$ and/or $Q^{15'}$ is cycloalkyl. In another embodiment, $Q^3$, $Q^{3'}$, $Q^{15}$ and/or $Q^{15'}$ is alkyl. In another embodiment, $Q^3$, $Q^{3'}$, $Q^{15}$ and/or $Q^{15'}$ is heterocycloalkyl. In another embodiment, $Q^3$, $Q^{3'}$, $Q^{15}$ and/or $Q^{15'}$ is aryl. In another embodiment, $Q^3$, $Q^{3'}$, $Q^{15}$ and/or $Q^{15'}$ is benzyl. In another embodiment, $Q^3$, $Q^{3'}$, $Q^{15}$ and/or $Q^{15'}$ is halide. In another embodiment, $Q^3$, $Q^{3'}$, $Q^{15}$ and/or $Q^{15'}$ is $N(Q)_2$. In another embodiment, $Q^3$, $Q^{3'}$, $Q^{15}$ and/or $Q^{15'}$ is $NO_2$. In another embodiment, $Q^3$, $Q^{3'}$, $Q^{15}$ and/or $Q^{15'}$ is COQ. In another embodiment, $Q^3$, $Q^{3'}$, $Q^{15}$ and/or $Q^{15'}$ is CN. In another embodiment, $Q^3$, $Q^{3'}$, $Q^{15}$ and/or $Q^{15'}$, is $CON(Q)_2$. In another embodiment, $Q^3$, $Q^{3'}$, $Q^{15}$ and/or $Q^{15'}$ is CO(N-heterocycle). In another embodiment, $Q^3$, $Q^{3'}$, $Q^{15}$ and/or $Q^{15'}$, is COOQ.

In some embodiments, $Q^4$, $Q^{4'}$, $Q^{14}$, and/or $Q^{14'}$ are each independently selected from H, alkyl, cycloalkyl, heterocycloalkyl, aryl, benzyl, halide, $N(Q)_2$, $NO_2$, COR, CN, $CON(Q)_2$, CO(N-heterocycle) and COOQ, wherein alkyl, cycloalkyl, heterocycloalkyl, aryl, halide, Q and N-heterocycle are as defined herein above. In another embodiment, $Q^4$, $Q^{4'}$, $Q^{14}$ and/or $Q^{14'}$ is H. In another embodiment, $Q^4$, $Q^{4'}$, $Q^{14}$ and/or $Q^{14'}$ is alkyl. In another embodiment, $Q^4$, $Q^{4'}$, $Q^{14}$ and/or $Q^{14'}$ is cycloalkyl. In another embodiment, $Q^4$, $Q^{4'}$, $Q^{14}$ and/or $Q^{14'}$ is alkyl. In another embodiment, $Q^4$, $Q^{4'}$, $Q^{14}$ and/or $Q^{14'}$ is heterocycloalkyl. In another embodiment, $Q^4$, $Q^{4'}$, $Q^{14}$ and/or $Q^{14'}$ is aryl. In another embodiment, $Q^4$, $Q^{4'}$, $Q^{14}$ and/or $Q^{14'}$ is benzyl. In another embodiment, $Q^4$, $Q^{4'}$, $Q^{14}$ and/or $Q^{14'}$ is halide. In another embodiment, $Q^4$, $Q^{4'}$, $Q^{14}$ and/or $Q^{14'}$ is $N(Q)_2$. In another embodiment, $Q^4$, $Q^{4'}$, $Q^{14}$ and/or $Q^{14'}$ is $NO_2$. In another embodiment, $Q^4$ is COQ. In another embodiment, $Q^4$, $Q^{4'}$, $Q^{14}$ and/or $Q^{14'}$ is CN. In another embodiment, $Q^4$, $Q^{4'}$, $Q^{14}$ and/or $Q^{14'}$ is $CON(Q)_2$. In another embodiment, $Q^4$, $Q^{4'}$, $Q^{14}$ and/or $Q^{14'}$ is CO(N-heterocycle). In another embodiment, $Q^4$, $Q^{4'}$, $Q^{14}$ and/or $Q^{14'}$ is COOQ.

In some embodiments, $Q^5$, $Q^{5'}$, $Q^6$, $Q^{6'}$, $Q^{12}$, $Q^{12'}$, $Q^{13}$ and/or $Q^{13'}$ are each independently selected from H, alkyl, cycloalkyl, heterocycloalkyl, aryl, benzyl, halide, $N(Q)_2$, $NO_2$, COR, CN, $CON(Q)_2$, CO(N-heterocycle) and COOQ, wherein alkyl, cycloalkyl, heterocycloalkyl, aryl, halide, Q and N-heterocycle are as defined herein above. In another embodiment, $Q^5$, $Q^{5'}$, $Q^6$, $Q^{6'}$, $Q^{12}$, $Q^{12'}$, $Q^{13}$ and/or $Q^{13'}$ is H. In another embodiment, $Q^5$, $Q^{5'}$, $Q^6$, $Q^{6'}$, $Q^{12}$, $Q^{12'}$, $Q^{13}$ and/or $Q^{13'}$ is alkyl. In another embodiment, $Q^5$, $Q^{5'}$, $Q^6$, $Q^{6'}$, $Q^{12}$, $Q^{12'}$, $Q^{13}$ and/or $Q^{13'}$ is cycloalkyl. In another embodiment, $Q^5$, $Q^{5'}$, $Q^6$, $Q^{6'}$, $Q^{12}$, $Q^{12'}$, $Q^{13}$ and/or $Q^{13'}$ is alkyl. In another embodiment, $Q^5$, $Q^{5'}$, $Q^6$, $Q^{6'}$, $Q^{12}$, $Q^{12'}$ $Q^{13}$ and/or $Q^{13'}$ is heterocycloalkyl. In another embodiment, $Q^5$, $Q^{5'}$, $Q^6$, $Q^{6'}$, $Q^{12}$, $Q^{12'}$, $Q^{13}$ and/or $Q^{13'}$ is aryl. In another embodiment, $Q^5$, $Q^{5'}$, $Q^6$, $Q^{6'}$, $Q^{12}$, $Q^{12'}$, $Q^{13}$ and/or $Q^{13'}$ is benzyl. In another embodiment, $Q^5$, $Q^{5'}$, $Q^6$, $Q^{6'}$, $Q^{12}$, $Q^{12'}$, $Q^{13}$ and/or $Q^{13'}$ is halide. In another embodiment, $Q^5$, $Q^{5'}$, $Q^6$, $Q^{6'}$, $Q^{12}$, $Q^{12'}$, $Q^{13}$ and/or $Q^{13'}$ is $N(Q)_2$. In another embodiment, $Q^5$, $Q^{5'}$, $Q^6$, $Q^{6'}$, $Q^{12}$, $Q^{12'}$, $Q^{13}$ and/or $Q^{13'}$ is $NO_2$. In another embodiment, $Q^5$, $Q^{5'}$, $Q^6$, $Q^{6'}$, $Q^{12}$, $Q^{12'}$, $Q^{13}$ and/or $Q^{13'}$ is COQ. In another embodiment, $Q^5$, $Q^{5'}$, $Q^6$, $Q^{6'}$, $Q^{12}$, $Q^{12'}$, $Q^{13}$ and/or $Q^{13'}$ is CN. In another embodiment, $Q^5$, $Q^{5'}$, $Q^6$, $Q^{6'}$, $Q^{12}$, $Q^{12'}$, $Q^{13}$ and/or $Q^{13'}$ is $CON(Q)_2$. In another embodiment, $Q^5$, $Q^{5'}$, $Q^6$, $Q^{6'}$, $Q^{12}$, $Q^{12'}$, $Q^{13}$ and/or $Q^{13'}$ is CO(N-heterocycle). In another embodiment, $Q^5$, $Q^{5'}$, $Q^6$, $Q^{6'}$, $Q^{12}$, $Q^{12'}$, $Q^{13}$ and/or $Q^{13'}$ is COOQ.

In some embodiments, $Q^7$, $Q^{7'}$, $Q^{11}$, and/or $Q^{11'}$ are each independently selected from absent, H, alkyl, cycloalkyl, heterocycloalkyl, aryl, benzyl, halide, $N(Q)_2$, $NO_2$, COR, CN, $CON(Q)_2$, CO(N-heterocycle) and COOQ, wherein alkyl, cycloalkyl, heterocycloalkyl, aryl, halide, Q and N-heterocycle are as defined herein above. In another embodiment, $Q^7$, $Q^{7'}$, $Q^{11}$, and/or $Q^{11'}$ is absent. In another embodiment, $Q^7$, $Q^{7'}$, $Q^{11}$, and/or $Q^{11'}$ is H. In another embodiment, $Q^7$, $Q^{7'}$, $Q^{11}$, and/or $Q^{11'}$ is alkyl. In another embodiment, $Q^7$, $Q^{7'}$, $Q^{11}$, and/or $Q^{11'}$ is cycloalkyl. In another embodiment, $Q^7$, $Q^{7'}$, $Q^{11}$, and/or $Q^{11'}$ is alkyl. In another embodiment, $Q^7$, $Q^{7'}$, $Q^{11}$, and/or $Q^{11'}$ is heterocycloalkyl. In another embodiment, $Q^7$, $Q^{7'}$, $Q^{11}$, and/or $Q^{11'}$ is aryl. In another embodiment, $Q^7$, $Q^{7'}$, $Q^{11}$, and/or $Q^{11'}$ is benzyl. In another embodiment, $Q^7$, $Q^{7'}$, $Q^{11}$, and/or $Q^{11'}$ is halide. In another embodiment, $Q^7$, $Q^{7'}$, $Q^{11}$, and/or $Q^{11'}$ is $N(Q)_2$. In another embodiment, $Q^7$, $Q^{7'}$, $Q^{11}$, and/or $Q^{11'}$ is NO$_2$. In another embodiment, Q$^7$, Q$^{7'}$, Q$^{11}$, and/or Q$^{11'}$ is COQ. In another embodiment, Q$^7$, Q$^{7'}$, Q$^{11}$, and/or Q$^{11'}$ is CN. In another embodiment, Q$^7$, Q$^{7'}$, Q$^{11}$, and/or Q$^{11'}$ is CON(Q)$_2$. In another embodiment, Q$^7$, Q$^{7'}$, Q$^{11}$, and/or Q$^{11'}$ is CO(N-heterocycle). In another embodiment, Q$^7$, Q$^{7'}$, Q$^{11}$, and/or Q$^{11'}$ is COOQ.

In some embodiments, Q$^8$, Q$^{8'}$, Q$^{10}$ and/or Q$^{10'}$ are each independently selected from absent, H, alkyl, cycloalkyl, heterocycloalkyl, aryl, benzyl, halide, N(Q)$_2$, NO$_2$, COR, CN, CON(Q)$_2$, CO(N-heterocycle) and COOQ, wherein alkyl, cycloalkyl, heterocycloalkyl, aryl, halide, Q and N-heterocycle are as defined herein above. In another embodiment, Q$^8$, Q$^{8'}$, Q$^{10}$ and/or Q$^{10'}$ is absent. In another embodiment, Q$^8$, Q$^{8'}$, Q$^{10}$ and/or Q$^{10'}$ is H. In another embodiment, Q$^8$, Q$^{8'}$, Q$^{10}$ and/or Q$^{10'}$ is alkyl. In another embodiment, Q$^8$, Q$^{8'}$, Q$^{10}$ and/or Q$^{10'}$ is cycloalkyl. In another embodiment, Q$^8$, Q$^{8'}$, Q$^{10}$ and/or Q$^{10'}$ is alkyl. In another embodiment, Q$^8$, Q$^{8'}$, Q$^{10}$ and/or Q$^{10'}$ is heterocycloalkyl. In another embodiment, Q$^8$, Q$^{8'}$, Q$^{10}$ and/or Q$^{10'}$ is aryl. In another embodiment, Q$^8$, Q$^{8'}$, Q$^{10}$ and/or Q$^{10'}$ is benzyl. In another embodiment, Q$^8$, Q$^{8'}$, Q$^{10}$ and/or Q$^{10'}$ is halide. In another embodiment, Q$^8$, Q$^{8'}$, Q$^{10}$ and/or Q$^{10'}$ is N(Q)$_2$. In another embodiment, Q$^8$, Q$^{8'}$, Q$^{10}$ and/or Q$^{10'}$ is NO$_2$. In another embodiment, Q$^8$, Q$^{8'}$, Q$^{10}$ and/or Q$^{10'}$ is COQ. In another embodiment, Q$^8$, Q$^{8'}$, Q$^{10}$ and/or Q$^{10'}$ is CN. In another embodiment, Q$^8$, Q$^{8'}$, Q$^{10}$ and/or Q$^{10'}$ is CON(Q)$_2$. In another embodiment, Q$^8$, Q$^{8'}$, Q$^{10}$ and/or Q$^{10'}$ is CO(N-heterocycle). In another embodiment, Q$^8$, Q$^{8'}$, Q$^{10}$ and/or Q$^{10'}$, is COOQ.

In some embodiments, Q$^9$ is H, alkyl, cycloalkyl, heterocycloalkyl, aryl, benzyl, halide, N(Q)$_2$, NO$_2$, COR, CN, CON(Q)$_2$, CO(N-Heterocycle) or COOQ, wherein alkyl, cycloalkyl, heterocycloalkyl, aryl, halide, Q and N-heterocycle are as defined herein above. In another embodiment, Q$^9$ is H. In another embodiment, Q$^9$ is alkyl. In another embodiment, Q$^9$ is cycloalkyl. In another embodiment, Q$^9$ is alkyl. In another embodiment, Q$^9$ is heterocycloalkyl. In another embodiment, Q$^9$ is aryl. In another embodiment, Q$^9$ is benzyl. In another embodiment, Q$^9$ is halide. In another embodiment, Q$^9$ is N(Q)$_2$. In another embodiment, Q$^9$ is NO$_2$. In another embodiment, Q$^9$ is COQ. In another embodiment, Q$^9$, is CN. In another embodiment, Q$^9$, is CON(Q)$_2$. In another embodiment, Q$^9$ is CO(N-heterocycle). In another embodiment, Q$^9$ is COOQ.

In some embodiments, Q$^{9'}$ is H, alkyl, cycloalkyl, heterocycloalkyl, aryl, benzyl, halide, N(Q)$_2$, NO$_2$, COR, CN, CON(Q)$_2$, CO(N-heterocycle), COOQ, wherein alkyl, cycloalkyl, heterocycloalkyl, aryl, halide, Q and N-heterocycle are as defined herein above. In another embodiment, Q$^9$ is H. In another embodiment, Q$^9$ is alkyl. In another embodiment, Q$^{9'}$ is cycloalkyl. In another embodiment, Q$^{9'}$ is alkyl. In another embodiment, Q$^{9'}$ is heterocycloalkyl. In another embodiment, Q$^{9'}$ is aryl. In another embodiment, Q$^{9'}$ is benzyl. In another embodiment, Q$^{9'}$ is halide. In another embodiment, Q$^{9'}$ is N(Q)$_2$. In another embodiment, Q$^{9'}$ is NO$_2$. In another embodiment, Q$^{9'}$ is COQ. In another embodiment, Q$^{9'}$ is CN. In another embodiment, Q$^{9'}$, is CON(Q)$_2$. In another embodiment, Q$^{9'}$ is CO(N-heterocycle). In another embodiment, Q$^{9'}$ is COOQ.

In some embodiments, Q$^{103}$ is H, alkyl, haloalkyl, heterocycloalkyl, cycloalkyl, aryl or benzyl, wherein alkyl, haloalkyl, heterocycloalkyl, cycloalkyl and aryl are as defined herein above. In another embodiment, Q$^{103}$ is H. In another embodiment, Q$^{103}$ is alkyl. In another embodiment, Q$^{103}$ is fluorinated alkyl. In another embodiment, Q$^{103}$ is heterocycloalkyl. In another embodiment Q$^{103}$ is cycloalkyl. In another embodiment, Q$^{103}$ is aryl. In another embodiment, Q$^{103}$ is benzyl.

In some embodiments, Q$^{104}$ is H, alkyl, haloalkyl, heterocycloalkyl, cycloalkyl, aryl or benzyl, wherein alkyl, haloalkyl, heterocycloalkyl, cycloalkyl and aryl are as defined herein above. In another embodiment, Q$^{04}$ is H. In another embodiment, Q$^4$ is alkyl. In another embodiment, Q$^{104}$ is fluorinated alkyl. In another embodiment, Q$^{104}$ is heterocycloalkyl. In another embodiment Q$^{104}$ is cycloalkyl. In another embodiment, Q$^{104}$ is aryl. In another embodiment, Q$^{104}$ is benzyl.

In some embodiments, Q$^{101}$ is H, alkyl, haloalkyl, heterocycloalkyl, cycloalkyl, aryl, benzyl, —(CH$_2$)$_p$OC(O)NH(CH$_2$)$_q$Si(Oalkyl)$_3$, —(CH$_2$)$_p$OC(O)CH=CH$_2$, —(CH$_2$)$_p$Si(Oalkyl)$_3$, —(CH$_2$)$_p$OC(O)NH(CH$_2$)$_q$Si(halide)$_3$, —(CH$_2$)$_p$OC(O)C(CH$_3$)=CH$_2$, —(CH$_2$)$_p$Si(halide)$_3$, —OC(O)N(H)Q$^{104}$, —OC(S)N(H)Q$^{104}$, —N(H)C(O)N(Q$^{103}$)$_2$ or —N(H)C(S)N(Q$^{103}$)$_2$, wherein p and q are independently an integer between 1-6 and alkyl, haloalkyl, heterocycloalkyl, cycloalkyl, aryl, Q$^{104}$, and Q$^{104}$ are as defined herein above. In another embodiment, Q$^{101}$ is H. In another embodiment, Q$^{101}$ is alkyl. In another embodiment, Q$^{101}$ is haloalkyl. In another embodiment, Q$^{101}$ is heterocycloalkyl. In another embodiment, Q$^{101}$ is cycloalkyl. In another embodiment, Q$^{101}$ is aryl. In another embodiment, Q$^{101}$ is benzyl. In another embodiment, Q$^{101}$ is —(CH$_2$)$_p$OC(O)NH(CH$_2$)$_q$Si(Oalkyl)$_3$. In another embodiment, Q$^{101}$ is —(CH$_2$)$_p$OC(O)CH=CH$_2$. In another embodiment, Q$^{101}$ is —(CH$_2$)$_p$Si(Oalkyl)$_3$. In another embodiment, Q$^{101}$ is —(CH$_2$)$_p$OC(O)NH(CH$_2$)$_q$Si(halide)$_3$. In another embodiment, Q$^{101}$ is —(CH$_2$)$_p$OC(O)C(CH$_3$)=CH$_2$. In another embodiment, Q$^{101}$ is —(CH$_2$)$_p$Si(halide)$_3$. In another embodiment, Q$^{101}$ is —OC(O)N(H)Q$^{104}$. In another embodiment, Q$^{101}$ is —OC(S)N(H)Q$^{4104}$. In another embodiment, Q$^{101}$ is N(H)C(O)N(Q$^{103}$)$_2$. In another embodiment, Q$^{101}$ is —N(H)C(S)N(Q$^{103}$)$_2$.

In some embodiments, Q$^{102}$ is H, alkyl, haloalkyl, heterocycloalkyl, cycloalkyl, aryl, benzyl, —(CH$_2$)$_p$OC(O)NH(CH$_2$)$_q$Si(Oalkyl)$_3$, —(CH$_2$)$_p$OC(O)CH=CH$_2$, —(CH$_2$)$_p$Si(Oalkyl)$_3$, —(CH$_2$)$_p$OC(O)NH(CH$_2$)$_q$Si(halide)$_3$, —(CH$_2$)$_p$OC(O)C(CH$_3$)=CH$_2$, —(CH$_2$)$_p$Si(halide)$_3$, —OC(O)N(H)Q$^{104}$, —OC(S)N(H)Q$^{104}$, —N(H)C(O)N(Q$^{103}$)$_2$ or —N(H)C(S)N(Q$^{103}$)$_2$ wherein p and q are independently an integer between 1-6 and alkyl, haloalkyl, heterocycloalkyl, cycloalkyl, aryl, Q$^{104}$, and Q$^{104}$ are as defined herein above. In another embodiment, Q$^{102}$ is H. In another embodiment, Q$^{102}$ is alkyl. In another embodiment, Q$^{102}$ is haloalkyl. In another embodiment, Q$^{102}$ is heterocycloalkyl. In another embodiment, Q$^{102}$ is cycloalkyl. In another embodiment, Q$^{102}$ is aryl. In another embodiment, Q$^{102}$ is benzyl. In another embodiment, Q$^{102}$ is —(CH$_2$)$_p$OC(O)NH(CH$_2$)$_q$Si(Oalkyl)$_3$. In another embodiment, Q$^{162}$ is —(CH$_2$)$_p$OC(O)CH=CH$_2$. In another embodiment, Q$^{102}$ is —(CH$_2$)$_p$Si(Oalkyl)$_3$. In another embodiment, Q$^{102}$ is —(CH$_2$)$_p$OC(O)NH(CH$_2$)$_q$Si(halide)$_3$. In another embodiment, Q$^{102}$ is —(CH$_2$)$_p$OC(O)C(CH$_3$)=CH$_2$. In another embodiment, Q$^{102}$ is —(CH$_2$)$_p$Si(halide)$_3$. In another embodiment, Q$^{102}$ is —OC(O)N(H)Q$^{104}$. In another embodiment, Q$^{102}$ is —OC(S)N(H)Q$^{104}$. In another embodiment, Q$^{102}$ is N(H)C(O)N(Q$^{103}$)$_2$. In another embodiment, Q$^{102}$ is —N(H)C(S)N(Q$^{103}$)$_2$.

In some embodiments, R$^{101}$ is H, Q$^{101}$, OQ$^{101}$, C(O)Q$^{101}$, NQ$^{101}$Q$^{102}$, NO$_2$, CN, SQ$^{101}$, —NQ$^{101}$Q$^{102}$CONQ$^{103}$Q$^{104}$, NCO, NCS, —OC(O)OQ$^{101}$ or halide, wherein Q$^{101}$, Q$^{102}$ Q$^{103}$ and Q$^{104}$ are as defined herein above. In another embodiment, R$^{101}$ is H. In another embodiment, R$^{101}$ is $Q^{101}$. In another embodiment, $R^{101}$ is $OQ^{101}$. In another embodiment, $R^{101}$ is $C(O)Q^{101}$. In another embodiment, $R^{101}$ is $NQ^{101}Q^{102}$. In another embodiment, $R^{101}$ is $NO_2$. In another embodiment, $R^{101}$ is CN. In another embodiment, $R^{101}$ is $SQ^{101}$. In another embodiment $R^{101}$ is —$NQ^{101}Q^{102}CONQ^{103}Q^{104}$. In another embodiment, $R^{101}$ is NCO. In another embodiment, $R^{101}$ is NCS. In another embodiment, $R^{101}$ is —$OC(O)OQ^{101}$. In another embodiment, $R^{101}$ is halide.

In some embodiments, $R^{102}$ is H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^{101}$ or halide, wherein $Q^{101}$, $Q^{102}$ $Q^{103}$ and $Q^{104}$ are as defined herein above. In another embodiment, $R^{102}$ is H. In another embodiment, $R^{102}$ is $Q^{101}$. In another embodiment, $R^{102}$ is $OQ^{101}$. In another embodiment, $R^{102}$ is $C(O)Q^{101}$. In another embodiment, $R^{102}$ is $NQ^{101}Q^{102}$. In another embodiment, $R^{102}$ is $NO_2$. In another embodiment, $R^{102}$ is CN. In another embodiment, $R^{102}$ is $SQ^{101}$. In another embodiment $R^{102}$ is —$NQ^{101}Q^{102}CONQ^{103}Q^{104}$. In another embodiment, $R^{102}$ is NCO. In another embodiment, $R^{102}$ is NCS. In another embodiment, $R^{102}$ is —$OC(O)OQ^{101}$. In another embodiment, $R^{102}$ is halide.

In some embodiments, $R^{103}$ is H, $Q^{101}$, $OQ^{101}$, $C(O)Q^{101}$, $NQ^{101}Q^{102}$, $NO_2$, CN, $SQ^{101}$, —$NQ^{101}Q^{102}CONQ^{103}Q^{104}$, NCO, NCS, —$OC(O)OQ^{101}$ or halide, wherein $Q^{101}$, $Q^{102}$ $Q^{103}$ and $Q^{104}$ are as defined herein above. In another embodiment, $R^{103}$ is H. In another embodiment, $R^{103}$ is $Q^{101}$. In another embodiment, $R^{103}$ is $OQ^{101}$. In another embodiment, $R^{103}$ is $C(O)Q^{101}$. In another embodiment, $R^{103}$ is $NQ^{101}Q^{102}$. In another embodiment, $R^{103}$ is $NO_2$. In another embodiment, $R^{103}$ is CN. In another embodiment, $R^{103}$ is $SQ^{101}$. In another embodiment $R^{103}$ is —$NQ^{101}Q^{102}CONQ^{103}Q^{104}$. In another embodiment, $R^{103}$ is NCO. In another embodiment, $R^{103}$ is NCS. In another embodiment, $R^{103}$ is —$OC(O)OQ^{101}$. In another embodiment, $R^{103}$ is halide.

In some embodiments, $R^{104}$ is H, alkyl, haloalkyl, heterocycloalkyl, cycloalkyl, aryl or benzyl, wherein alkyl, haloalkyl, heterocycloalkyl, cycloalkyl, aryl are as defined herein above. In another embodiment, $R^{104}$ is H. In another embodiment, $R^{104}$ is alkyl. In another embodiment, $R^{104}$ is haloalkyl. In another embodiment, $R^{104}$ is heterocycloalkyl. In another embodiment, $R^{104}$ is cycloalkyl. In another embodiment, $R^{104}$ is aryl. In another embodiment, $R^{104}$ is benzyl.

In some embodiments, $R^{104'}$ is H, alkyl, haloalkyl, heterocycloalkyl, cycloalkyl, aryl or benzyl wherein alkyl, haloalkyl, heterocycloalkyl, cycloalkyl, aryl are as defined herein above. In another embodiment, $R^{104'}$ is H. In another embodiment, $R^{104'}$ is alky. In another embodiment, $R^{104'}$ is haloalkyl. In another embodiment, $R^{104'}$ is heterocycloalkyl. In another embodiment, $R^{104'}$ is cycloalkyl. In another embodiment, $R^{104'}$ is aryl. In another embodiment, $R^{104'}$ is benzyl.

In some embodiments, Z' is selected from alkyl, haloalkyl, heterocycloalkyl, cycloalkyl, aryl, benzyl, —$(CH_2)_pOC(O)NH(CH_2)_qSi(Oalkyl)_3$, —$(CH_2)_pOC(O)CH=CH_2$, —$(CH_2)_pSi(Oalkyl)_3$, —$(CH_2)_pOC(O)NH(CH_2)_qSi(halide)_3$, —$(CH_2)_pOC(O)C(CH_3)=CH_2$, —$(CH_2)_pSi(halide)_3$, —$OC(O)N(H)Q^{104}$, —$OC(S)N(H)Q^{104}$, —$N(H)C(O)N(Q^{103})_2$ and —$N(H)C(S)N(Q^{103})_2$, wherein p and q are independently an integer between 1-6 and alkyl, haloalkyl, heterocycloalkyl, cycloalkyl, aryl, halide, $Q^{103}$ and $Q^{104}$ are as defined herein above. In another embodiment, Z' is alkyl. In another embodiment, Z' is haloalkyl. In another embodiment, Z' is heterocycloalkyl. In another embodiment, Z' is cycloalkyl. In another embodiment, Z' is aryl. In another embodiment, Z' is benzyl. In another embodiment, Z' is —$(CH_2)_pOC(O)NH(CH_2)_qSi(Oalkyl)_3$. In another embodiment, Z' is —$(CH_2)_pOC(O)CH=CH_2$. In another embodiment, Z' is —$(CH_2)_pSi(Oalkyl)_3$. In another embodiment, Z' is —$(CH_2)_pOC(O)NH(CH_2)_qSi(halide)_3$. In another embodiment, Z' is —$(CH_2)_pOC(O)C(CH_3)=CH_2$. In another embodiment, Z' is —$(CH_2)_pSi(halide)_3$. In another embodiment, Z' is —$OC(O)N(H)Q^{104}$. In another embodiment, Z' is —$OC(S)N(H)Q^{104}$. In another embodiment, Z' is —$N(H)C(O)N(Q^{103})_2$. In another embodiment, Z' is —$N(H)C(S)N(Q^{103})_2$.

In some embodiments, $R^{105}$ is H, Z', $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide or halide, wherein Z', $Q^{101}$, $Q^{102}$, $Q^{103}$, $Q^{104}$, M, alkenyl, alkynyl, epoxide, alkylated epoxide, alkylated azide and halide are as defined herein above. In another embodiment, $R^{105}$ is H. In another embodiment, $R^{105}$ is Z'. In another embodiment, $R^{105}$ is $OQ^{101}$. In another embodiment, $R^{105}$ is $C(O)Q^{101}$. In another embodiment, $R^{105}$ is $COOQ^{101}$. In another embodiment, $R^{105}$ is $CON(Q^{101})_2$. In another embodiment, $R^{105}$ is $NQ^{101}Q^{102}$. In another embodiment, $R^{105}$ is $NO_2$. In another embodiment, $R^{105}$ is CN. In another embodiment, $R^{105}$ is $SO_3^-$. In another embodiment, $R^{105}$ is $SO_3M$. In another embodiment, $R^{105}$ is $SO_3H$. In another embodiment, $R^{105}$ is $SQ^{101}$. In another embodiment, $R^{105}$ is, —$NQ^{101}Q^{102}CONQ^{103}Q^{104}$. In another embodiment, $R^{105}$ is NCO. In another embodiment, $R^{105}$ is NCS. In another embodiment, $R^{105}$ is alkenyl. In another embodiment, $R^{105}$ is alkynyl. In another embodiment, $R^{105}$ is epoxide. In another embodiment, $R^{105}$ is alkylated epoxide. In another embodiment, $R^{105}$ is alkylated azide. In another embodiment, $R^{105}$ is azide. In another embodiment, $R^{105}$ is halide.

In some embodiments, $R^{105'}$ is H, Z', $OQ^{101}$, $C(O)Q^{101}$, $COOQ^{11}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide or halide, wherein Z', $Q^{101}$, $Q^{102}$, $Q^{103}$, $Q^{104}$, M, alkenyl, alkynyl, alkylated epoxide, alkylated azide and halide are as defined herein above. In another embodiment, $R^{105'}$ is H. In another embodiment, $R^{105'}$ is Z'. In another embodiment, $R^{105'}$ is $OQ^{101}$. In another embodiment, $R^{105'}$ is $C(O)Q^{101}$. In another embodiment, $R^{105'}$ is $COOQ^{101}$. In another embodiment, $R^{105'}$ is $CON(Q^{101})_2$. In another embodiment, $R^{105'}$ is $NQ^{101}Q^{102}$. In another embodiment, $R^{105'}$ is $NO_2$. In another embodiment, $R^{105'}$ is CN. In another embodiment, $R^{105'}$ is $SO_3^-$. In another embodiment, $R^{105'}$ is $SO_3M$. In another embodiment, $R^{105'}$ is $SO_3H$. In another embodiment, $R^{105'}$ is $SQ^{101}$. In another embodiment, $R^{105'}$ is, —$NQ^{101}Q^{102}CONQ^{103}Q^{104}$. In another embodiment, $R^{105'}$ is NCO. In another embodiment, $R^{105'}$ is NCS. In another embodiment, $R^{105'}$ is alkenyl. In another embodiment, $R^{105'}$ is alkynyl. In another embodiment, $R^{105'}$ is epoxide. In another embodiment, $R^{105'}$ is alkylated epoxide. In another embodiment, $R^{105'}$ is alkylated azide. In another embodiment, $R^{105'}$ is azide. In another embodiment, $R^{105'}$ is halide.

In some embodiments, $R^{106}$ is H, $Q^{101}$, $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, —$NQ^{101}Q^{102}CONQ^{103}Q^{104}$, NCO, NCS, alkenyl, alkynyl, epoxide, alkylated epoxide, alkylated azide, azide or halide, wherein $Q^{101}$, $Q^{102}$, $Q^{103}$, $Q^{104}$, M, alkenyl, alkynyl, alkylated epoxide, alkylated azide and halide are as defined herein above. In another embodiment, $R^{106}$ is H. In another embodiment, $R^{106}$ is $Q^{101}$. In another embodiment, $R^{106}$ is $OQ^{101}$. In another embodiment, $R^{106}$ is $C(O)Q^{101}$. In another embodiment, $R^{106}$ is $COOQ^{101}$. In another embodiment, $R^{106}$ is $CON(Q^{101})_2$. In another embodiment, $R^{106}$ is $NQ^{101}Q^{102}$. In another embodiment, $R^{106}$ is $NO_2$. In another embodiment, $R^{106}$ is CN. In another embodiment, $R^{106}$ is $SO_3^-$. In another embodiment, $R^{106}$ is $SO_3M$. In another embodiment, $R^{106}$ is $SO_3H$. In another embodiment, $R^{106}$ is $SQ^{101}$. In another embodiment, $R^{106}$ is, $-NQ^{101}Q^{102}CONQ^{103}Q^{104}$. In another embodiment, $R^{106}$ is NCO. In another embodiment, $R^{106}$ is NCS. In another embodiment, $R^{106}$ is alkenyl. In another embodiment, $R^{106}$ is alkynyl. In another embodiment, $R^{106}$ is epoxide. In another embodiment, $R^{106}$ is alkylated epoxide. In another embodiment, $R^{106}$ is alkylated azide. In another embodiment, $R^{106}$ is azide. In another embodiment, $R^{106}$ is halide.

In some embodiments, $R^{106'}$ of is H, $Q^{101}$, $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, $-NQ^{101}Q^{102}CONQ^{103}Q^{104}$, NCO, NCS, alkenyl, alkynyl, epoxide, alkylated epoxide, alkylated azide, azide or halide, wherein $Q^{101}$, $Q^{102}$, $Q^{103}$, $Q^{104}$, M, alkenyl, alkynyl, alkylated epoxide, alkylated azide and halide are as defined herein above. In another embodiment, $R^{106'}$ is H. In another embodiment, $R^{106'}$ is $Q^{101}$. In another embodiment, $R^{106'}$ is $OQ^{101}$. In another embodiment, $R^{106'}$ is $C(O)Q^{101}$. In another embodiment, $R^{106'}$ is $COOQ^{101}$. In another embodiment, $R^{106'}$ is $CON(Q^{101})_2$. In another embodiment, $R^{106'}$ is $NQ^{101}Q^{102}$. In another embodiment, $R^{106'}$ is $NO_2$. In another embodiment, $R^{106'}$ is CN. In another embodiment, $R^{106'}$ is $SO_3^-$. In another embodiment, $R^{106'}$ is $SO_3M$. In another embodiment, $R^{106'}$ is $SO_3H$. In another embodiment, $R^{106'}$ is $SQ^{101}$. In another embodiment, $R^{106'}$ is, $-NQ^{101}Q^{102}CONQ^{103}Q^{104}$. In another embodiment, $R^{106'}$ is NCO. In another embodiment, $R^{106'}$ is NCS. In another embodiment, $R^{106'}$ is alkenyl. In another embodiment, $R^{106'}$ is alkynyl. In another embodiment, $R^{106'}$ is epoxide. In another embodiment, $R^{106'}$ is alkylated epoxide. In another embodiment, $R^{106'}$ is alkylated azide. In another embodiment, $R^{106'}$ is azide. In another embodiment, $R^{106'}$ is halide.

In some embodiments, $R^{107}$ is H, $Q^{101}$, $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, $-NQ^{101}Q^{102}CONQ^{103}Q^{104}$, NCO, NCS, alkenyl, alkynyl, epoxide, alkylated epoxide, alkylated azide, azide or halide, wherein $Q^{101}$, $Q^{102}$, $Q^{103}$, $Q^{104}$, M, alkenyl, alkynyl, alkylated epoxide, alkylated azide and halide are as defined herein above. In another embodiment, $R^{107}$ is H. In another embodiment, $R^{107}$ is $Q^{101}$. In another embodiment, $R^{107}$ is $OQ^{101}$. In another embodiment, $R^{107}$ is $C(O)Q^{101}$. In another embodiment, $R^{107}$ is $COOQ^{101}$. In another embodiment, $R^{107}$ is $CON(Q^{101})_2$. In another embodiment, $R^{107}$ is $NQ^{101}Q^{102}$. In another embodiment, $R^{107}$ is $NO_2$. In another embodiment, $R^{107}$ is CN. In another embodiment, $R^{107}$ is $SO_3^-$. In another embodiment, $R^{107}$ is $SO_3M$. In another embodiment, $R^{107}$ is $SO_3H$. In another embodiment, $R^{107}$ is $SQ^{101}$. In another embodiment, $R^{107}$ is, $-NQ^{101}Q^{102}CONQ^{103}Q^{104}$. In another embodiment, $R^{107}$ is NCO. In another embodiment, $R^{107}$ is NCS. In another embodiment, $R^{107}$ is alkenyl. In another embodiment, $R^{107}$ is alkynyl. In another embodiment, $R^{107}$ is epoxide. In another embodiment, $R^{107}$ is alkylated epoxide. In another embodiment, $R^{107}$ is alkylated azide. In another embodiment, $R^{107}$ is azide. In another embodiment, $R^{107}$ is halide.

In some embodiments, $R^{107'}$ is H, $Q^{101}$, $OQ^{101}$, $C(O)Q^{101}$, $COOQ^{101}$, $CON(Q^{101})_2$, $NQ^{101}Q^{102}$, $NO_2$, CN, $SO_3^-$, $SO_3M$, $SO_3H$, $SQ^{101}$, $-NQ^{101}Q^{102}CONQ^{103}Q^{104}$, NCO, NCS, alkenyl, alkynyl, epoxide, alkylated epoxide, alkylated azide, azide or halide, wherein $Q^{101}$, $Q^{102}$, $Q^{103}$, $Q^{104}$, M, alkenyl, alkynyl, alkylated epoxide, alkylated azide and halide are as defined herein above. In another embodiment, $R^{107'}$ is H. In another embodiment, $R^{107'}$ is $Q^{101}$. In another embodiment, $R^{107'}$ is $OQ^{101}$. In another embodiment, $R^{107'}$ is $C(O)Q^{101}$. In another embodiment, $R^{106}$ is $COOQ^{101}$. In another embodiment, $R^{107'}$ is $CON(Q^{101})_2$. In another embodiment, $R^{106}$ is $NQ^{101}Q^{102}$. In another embodiment, $R^{107'}$ is $NO_2$. In another embodiment, $R^{107'}$ is CN. In another embodiment, $R^{107'}$ is $SO_3^-$. In another embodiment, $R^{107'}$ is $SO_3M$. In another embodiment, $R^{107'}$ is $SO_3H$. In another embodiment, $R^{107'}$ is $SQ^{101}$. In another embodiment, $R^{107'}$ is, $-NQ^{101}Q^{102}CONQ^{103}Q^{104}$. In another embodiment, $R^{107'}$ is NCO. In another embodiment, $R^{107'}$ is NCS. In another embodiment, $R^{107'}$ is alkenyl. In another embodiment, $R^{107'}$ is alkynyl. In another embodiment, $R^{107'}$ is epoxide. In another embodiment, $R^{107'}$ is alkylated epoxide. In another embodiment, $R^{107'}$ is alkylated azide. In another embodiment, $R^{107'}$ is azide. In another embodiment, $R^{107'}$ is halide.

In some embodiments, $R^{108}$ is H, alkyl, haloalkyl, heterocycloalkyl, cycloalkyl, aryl or benzyl, wherein alkyl, haloalkyl, heterocycloalkyl, cycloalkyl and aryl are as defined herein above. In another embodiment, $R^{108}$ is H. In another embodiment, $R^{108}$ is alkyl. In another embodiment, $R^{108}$ is fluorinated alkyl. In another embodiment, $R^{108}$ is heterocycloalkyl. In another embodiment, $R^{108}$ is cycloalkyl. In another embodiment, $R^{108}$ is aryl. In another embodiment, $R^{108}$ is benzyl.

In some embodiments, $R^{108'}$ is H, alkyl, haloalkyl, heterocycloalkyl, cycloalkyl, aryl or benzyl, wherein alkyl, haloalkyl, heterocycloalkyl, cycloalkyl and aryl are as defined herein above. In another embodiment, $R^{108'}$ is H. In another embodiment, $R^{108'}$ is alkyl. In another embodiment, $R^{108'}$ is fluorinated alkyl. In another embodiment, $R^{108'}$ is heterocycloalkyl. In another embodiment, $R^{108'}$ is cycloalkyl. In another embodiment, $R^{108'}$ is aryl. In another embodiment, $R^{108'}$ is benzyl.

In some embodiments, $R^{104}$ and $R^{105}$ form together a N-heterocyclic ring wherein said ring is optionally substituted. In another embodiment, the N-heterocyclic ring is substituted by one or more groups selected from halide, hydroxy, alkoxy, carboxylic acid, aldehyde, carbonyl, amido, cyano, nitro, amino, alkenyl, alkynyl, aryl, azide, epoxide, ester, acyl chloride and thiol.

In some embodiments, $R^{104'}$ and $R^{105'}$ form together a N-heterocyclic ring wherein said ring is optionally substituted. In another embodiment, the N-heterocyclic ring is substituted by one or more groups selected from halide, hydroxy, alkoxy, carboxylic acid, aldehyde, carbonyl, amido, cyano, nitro, amino, alkenyl, alkynyl, aryl, azide, epoxide, ester, acyl chloride and thiol.

In some embodiments, the notion of "⚌" of a bond within structures I-X of the current invention refers to a carbon-carbon single bond ("—") or a carbon-carbon double bond ("═"). In some embodiments, each structure in structures I-X of the current invention comprise two ⚌ bonds. In another embodiment, each structure comprises two ⚌ bonds that are selected to be two single bonds, two double bonds, one single and one double bond or one double and one single bond, each represents a separate embodiment of the current invention. In another embodiment, a rhodamine based fluorescent compound of the current invention comprises two ⚌ bonds and is represented by structures Ia-Xd:

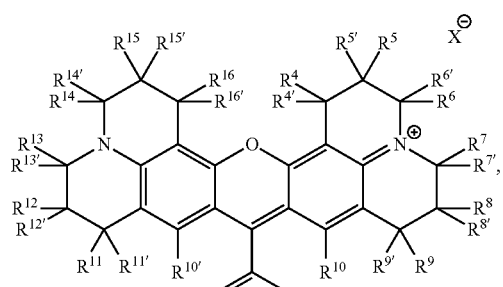
Ia
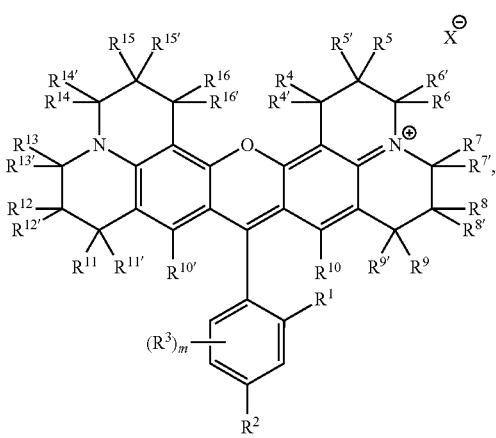
IIa
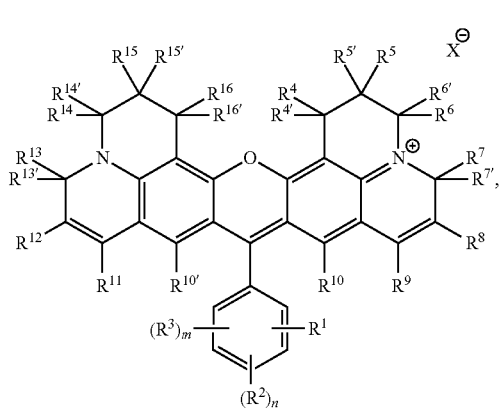
(Ib)
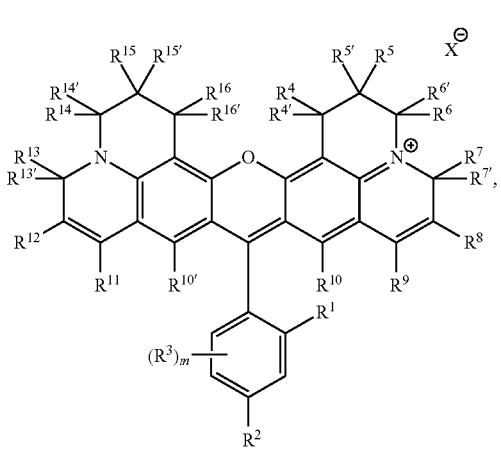
(IIb)
(Ic)
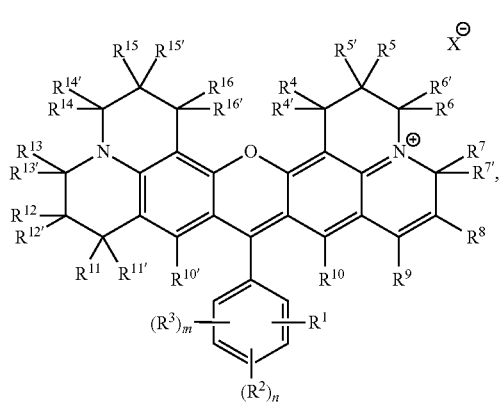
(IIc)
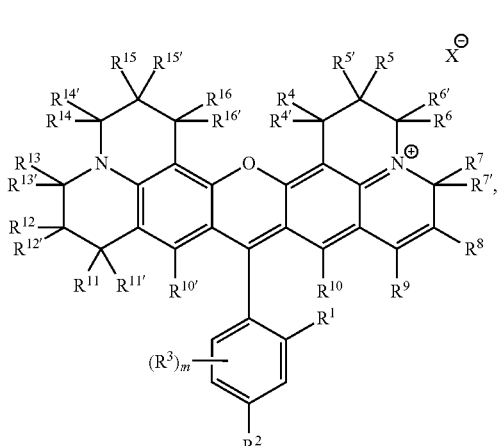
(Id)

-continued
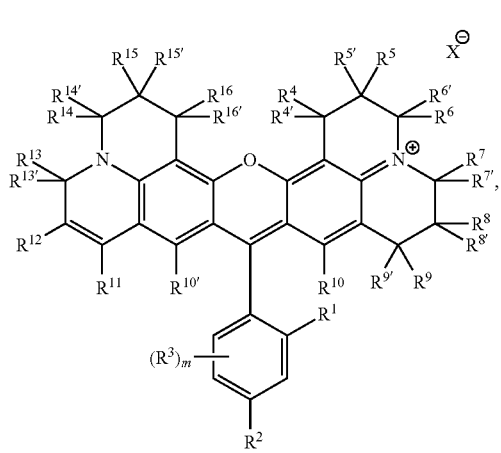
(IId)
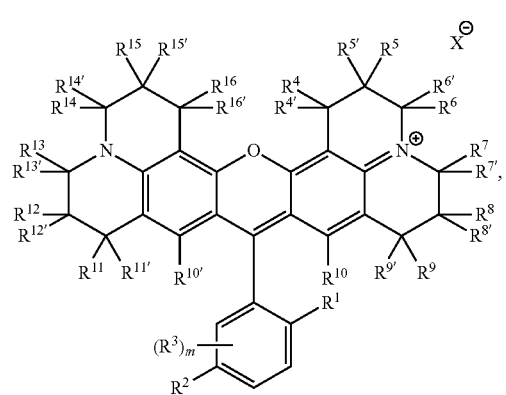
IIIa
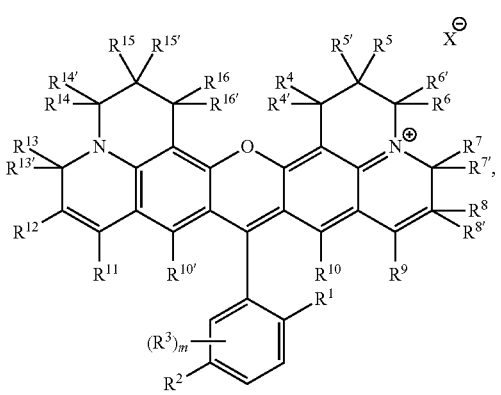
(IIIb)
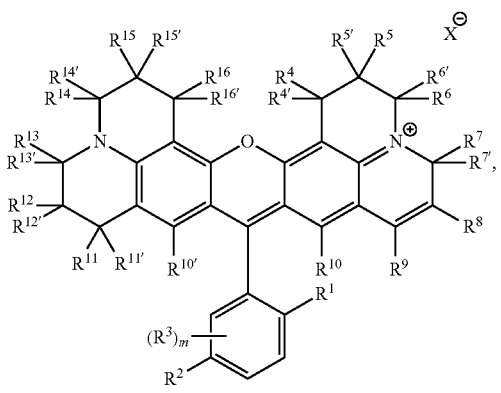
(IIIc)
-continued
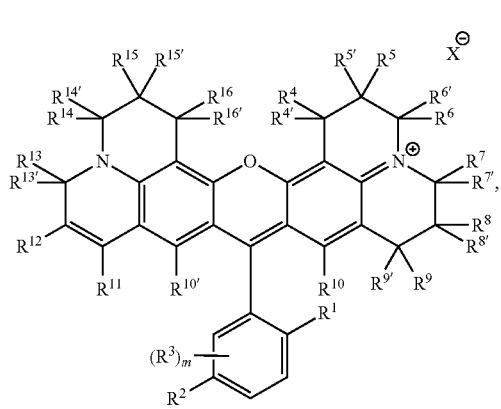
(IIId)
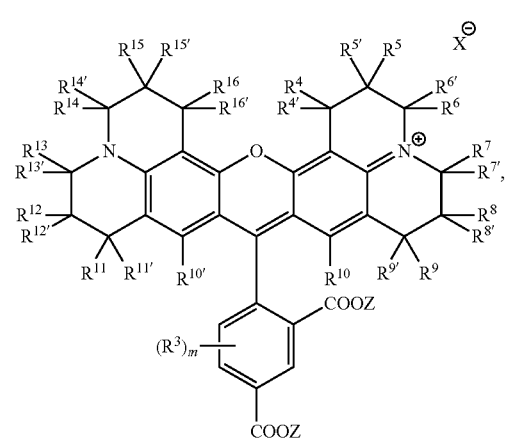
IVa
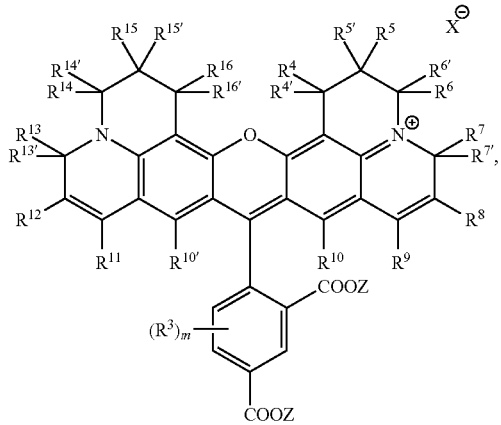
(IVb)

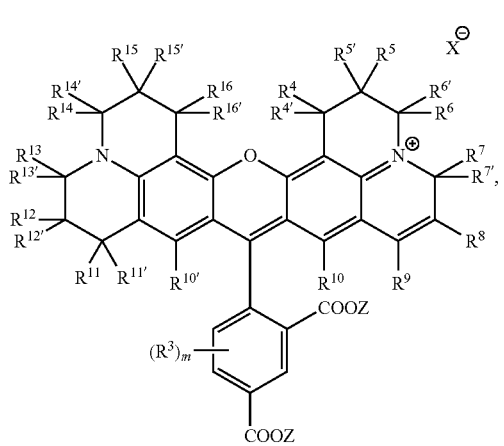
(IVc)
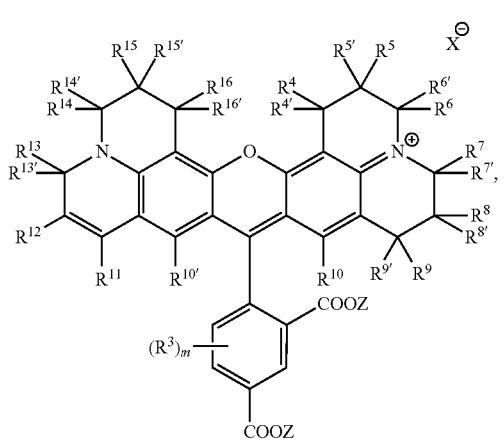
(IVd)
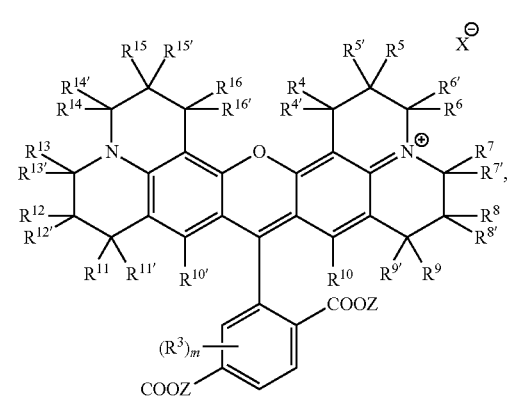
Va
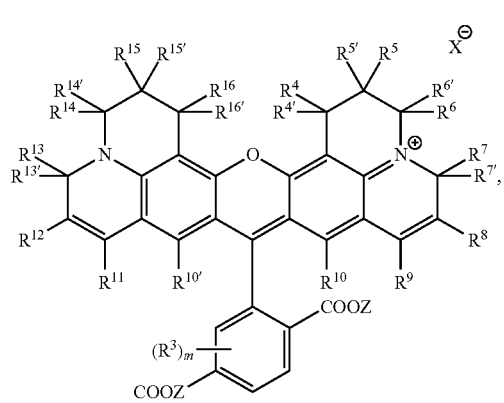
(Vb)
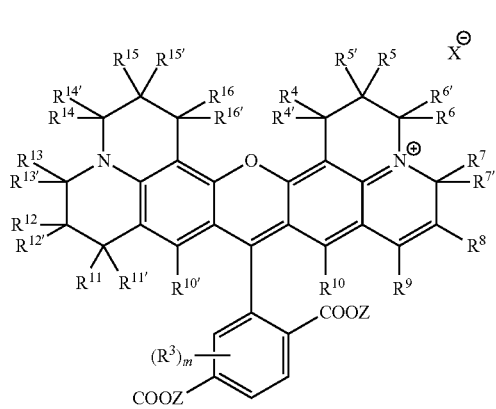
(Vc)
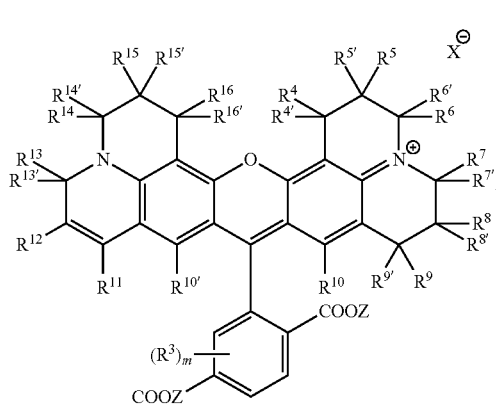
(Vd)
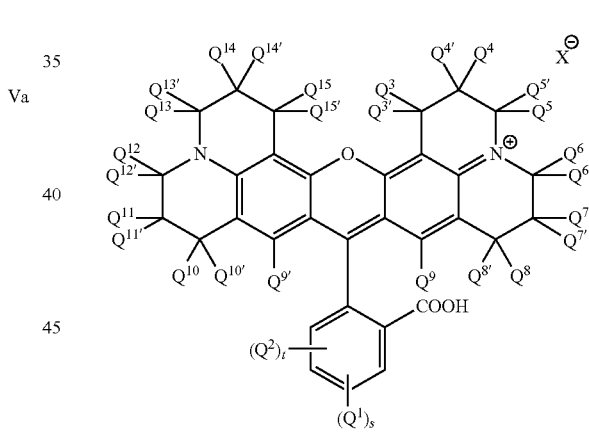
VIa
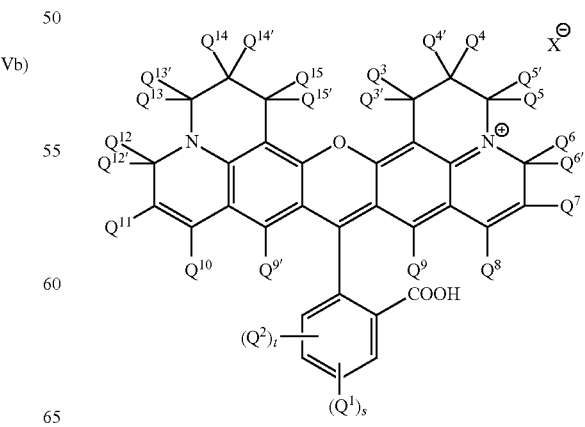
(VIb)

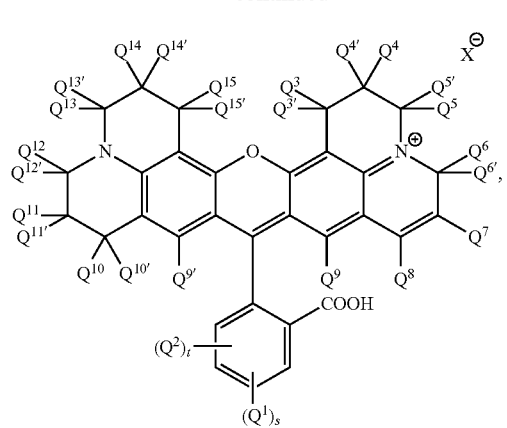
(VIc)
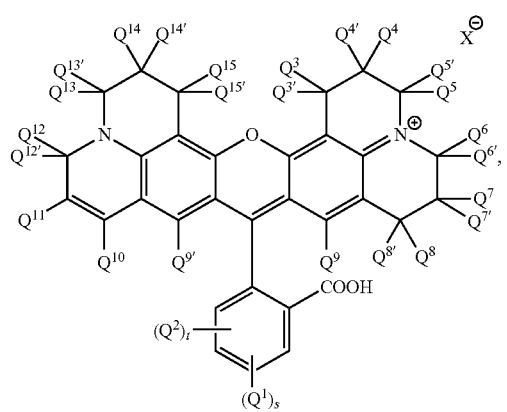
(VId)
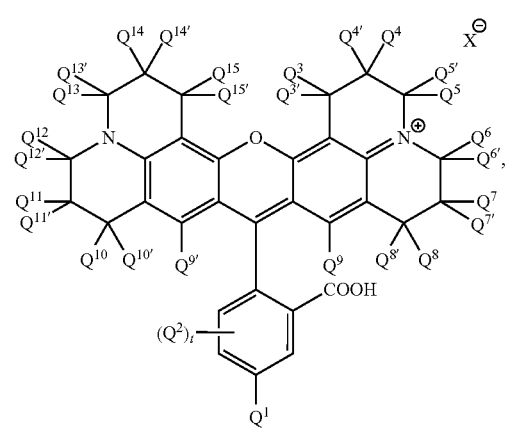
(VIIa)
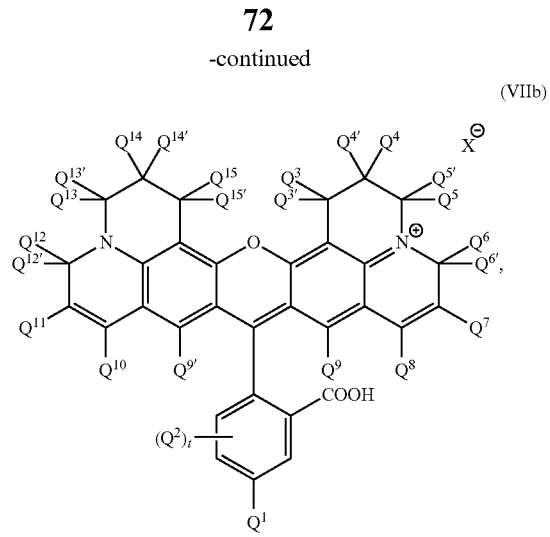
(VIIb)
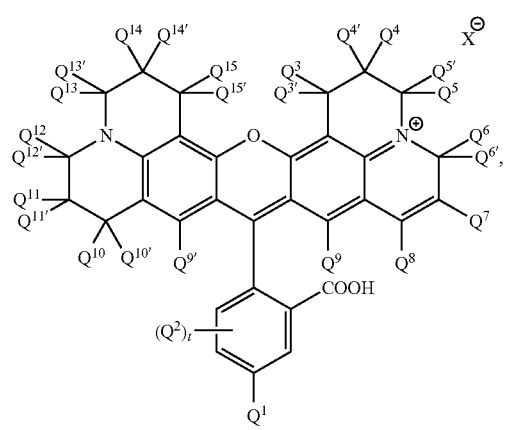
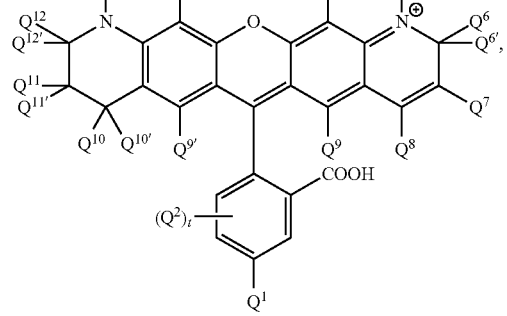
(VIIc)
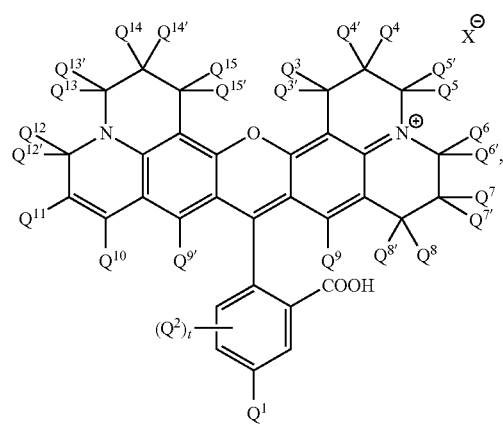
(VIId)

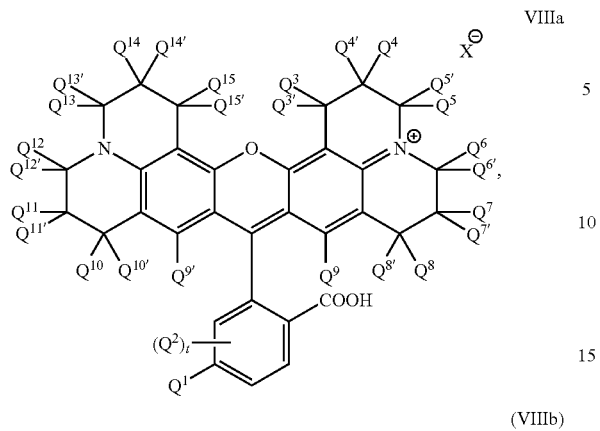
(VIIIa)
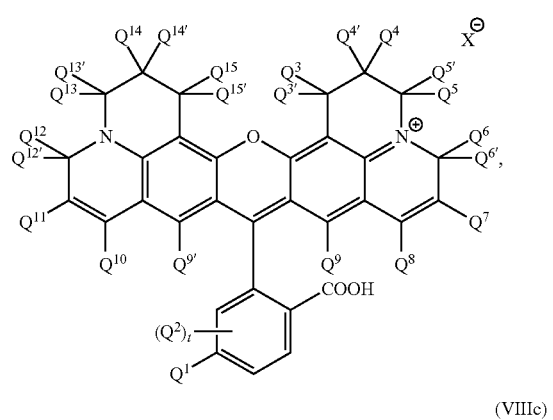
(VIIIb)
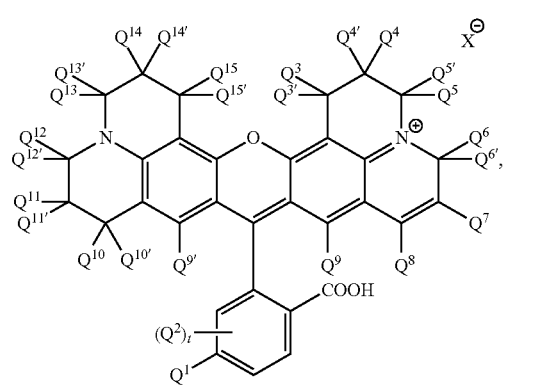
(VIIIc)
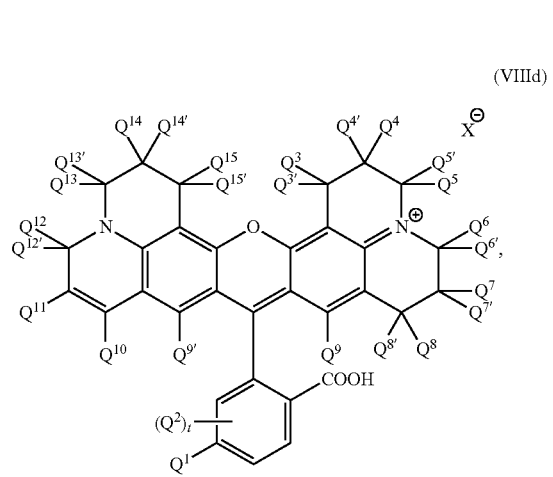
(VIIId)
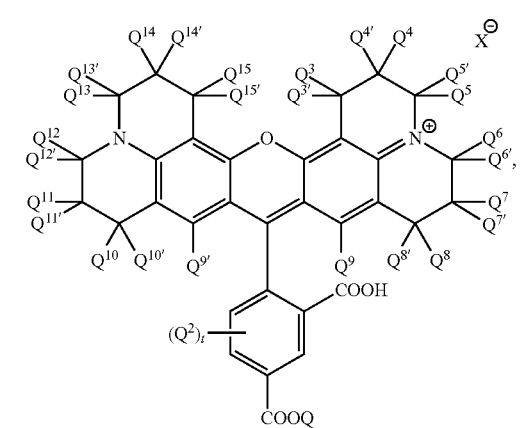
(IXa)
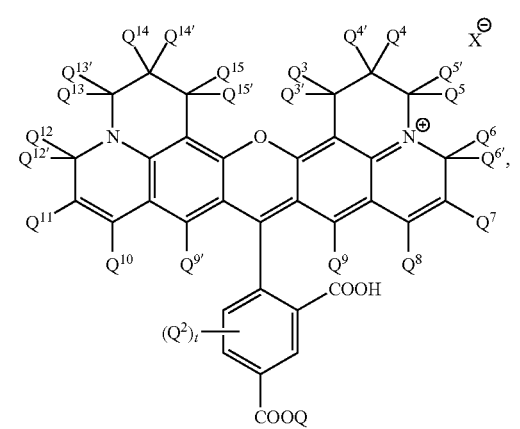
(IXb)
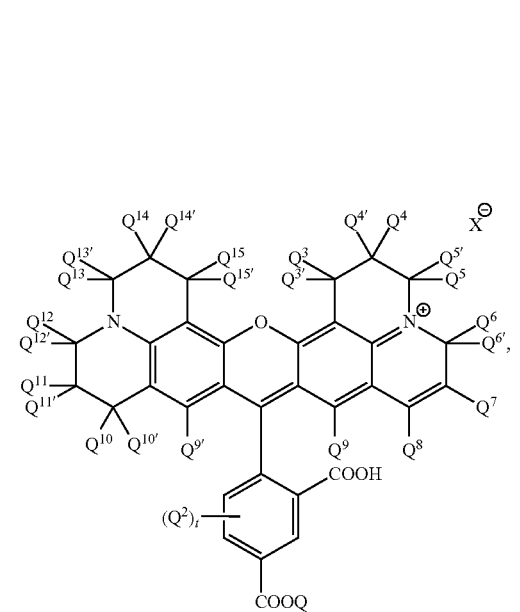
(IXc)

-continued (IXd)'

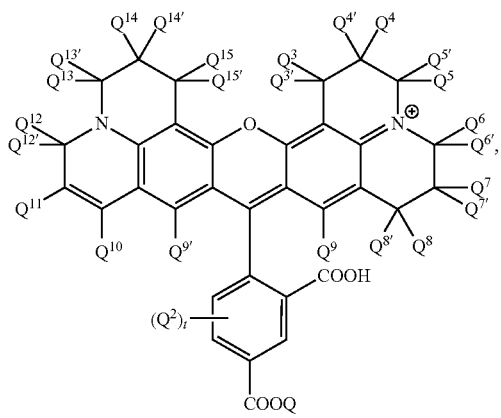

(Xa)

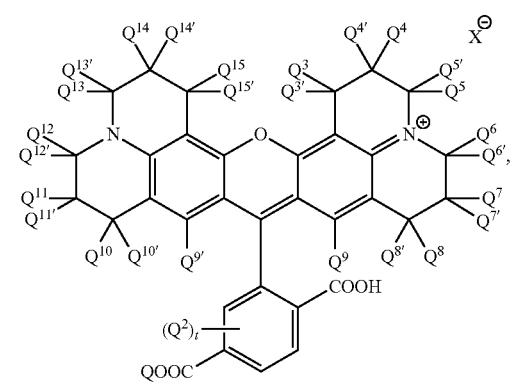

(Xb)

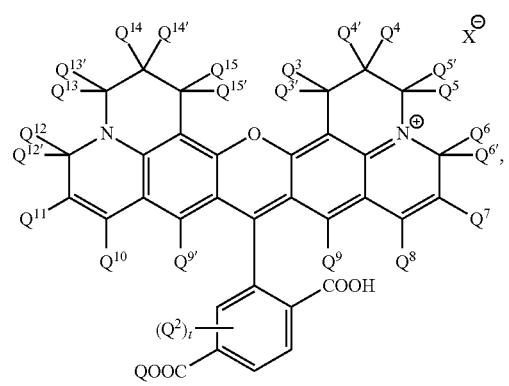

(Xc)

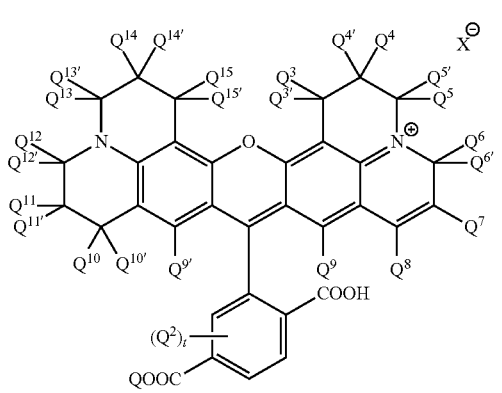

or

-continued (Xd)

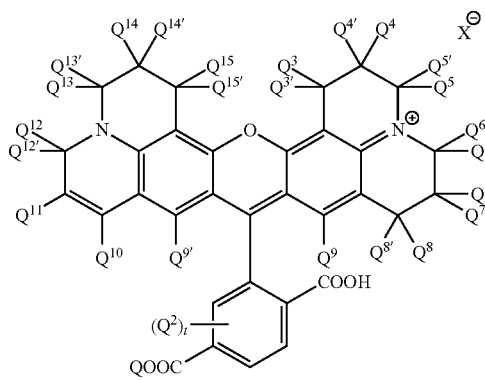

wherein $R^{1-16}$, $R^{1'-16'}$, n, m, X, Z, $Q^{1-15}$, $Q^{1'-15'}$, t, s and Q are as defined above in structures I-X.

Referring back to FIGS. 1 and 2A, some embodiments comprise color conversion films 130 for LCD's 140 having RGB color filters 86 which comprise color conversion element(s) such as RBF compound(s) 115 or other compounds 116 selected to absorb illumination from backlight source 80 of LCD 140 and have a R emission peak and/or a G emission peak (see non-limiting examples below). For example, color conversion films 130 for LCD's with backlight source 80 providing blue illumination may comprise both R and G peaks provided by corresponding RBF compounds of Formula 1 and Formula 2. In another example, color conversion films 130 for LCD's with backlight source 80 providing white illumination may comprise R peak provided by corresponding RBF compound(s) of Formula 1. Color conversion film(s) 130 may be set in either or both backlight unit 142 and LCD panel 85; and may be attached to other film(s) in LCD 140 or replace other film(s) in LCD 140, e.g. being multifunctional as both color conversion films and polarizers, diffusers, etc., as demonstrated above. Color conversion film(s) 130 may be produced by various methods, such as sol-gel and/or UV curing processes, may include respective dyes at the same or different layers, and may be protected by any of a protective film, a protective coating and/or protective components in the respective sol-gel or UV cured matrices which may convey enhanced flexibility, mechanical strength and/or less susceptibility to humidity and cracking. Color conversion film(s) 130 may comprise various color conversion elements such as organic or inorganic fluorescent molecules, quantum dots and so forth.

Sol-Gel Processes

Some embodiments of fluorescent film production 100 were developed on the basis of sol-gel technology in a different field of laser dyes. Reisfeld 2006 (Doped polymeric systems produced by sol-gel technology: optical properties and potential industrial applications, Polimery 2006, 51(2): 95-103) reviews sol-gel technology based on hydrolysis and subsequent polycondensation of precursors, such as organo-silicon alkoxides, leading to formation of amorphous and porous glass. The matrices for incorporation of organically active dopants are the glass/polymer composites, organically modified silicates (ORMOSIL) or hybrid materials zirconia-silica-polyurethane (ZSUR). However, the matrices taught by Reisfeld 2006 do not yield films with photo-stable fluorescent compounds that are necessary for color conversion films and the films do not have a wide color gamut.

Starting from Reisfeld 2006, the inventors have found that sol-gel technology may be modified and adapted for producing films of fluorescent optical compounds which may be used in displays, with surprisingly good performance with respect to emission spectra and stability of the fluorescent compounds. The inventors have found that multiple modifications to technologies discussed in Reisfeld 2006 enable using them in a completely different field of implementation and moreover, enable enhancing the stability of the fluorescent compounds and tuning their emission spectra (e.g., peak wavelengths and widths of peaks to enable wide color gamut illuminance from the display backlight) using process parameters. Hybrid sol-gel precursor formulations, formulations with rhodamine-based fluorescent compounds, films, displays and methods are provided, in which the fluorescent compounds are stabilized and tuned to modify display backlight illumination in a manner that increases the display's efficiency and widens its color gamut. Silane precursors are used with silica nanoparticles and zirconia to provide fluorescent films that may be applied in various ways in the backlight unit and/or in the LCD panel and improve the display's performance. The sol-gel precursor and film forming procedures may be optimized and adjusted to provide a high photostability of the fluorescent compounds and narrow emission peaks of the backlight unit.

FIG. 6A is a high level schematic illustration of precursors 110, formulations 120, films 130 and displays 140 according to some embodiments of the invention. FIG. 6B illustrates schematically prior art methods 90 according to Reisfeld 2006. Disclosed processes and methods 200 overarch compounds and processing steps for formulations 110, 120 and film 130 as well as integration steps of films 130 in display 140.

Hybrid sol-gel precursor formulations 110 comprise an epoxy silica ormosil solution 106 prepared from tetraethyl orthosilicate (TEOS) 102, at least one silane precursor (other than TEOS) 104 and/or methyltrimethoxysilane (MTMOS) 91B, and 3-Glycidyloxypropyl)trimethoxysilane (GLYMO) 91C; a nanoparticles powder 109 prepared from isocyanate-functionalized silica nanoparticles 111, or non-functionalized silica nanoparticles 111, and ethylene glycol 108; and a transition metal(s) alkoxide matrix solution 103 (based on e.g., zirconia, titania or other transition metal(s) alkoxides). The ratios (wt/vol/vol (mg/ml/ml)) of nanoparticles powder/ epoxy silica ormosil solution/transition metal(s) alkoxide matrix solution may be in the range 15-25/1-3/1, with each of the components possibly deviating by up to 50% from the stated proportions. Additional variants 107 are provided below. FIG. 6A presents non-limiting examples of process 200.

In a non-limiting example, the epoxy silica ormosil solution and the transition metal(s) alkoxide matrix solution may be mixed at ratio of between 1:1 and 3:1 (e.g., 2:1) followed by the addition of the nanoparticles powder at a concentration of 5-10 mg/1 ml mixed (e.g., epoxy silica ormosil solution and zirconia) solution—resulting in ratios (wt/vol/vol (mg/ml/ml)) of nanoparticles powder/epoxy silica ormosil solution/transition metal(s) alkoxide matrix solution of 15-30/2/1 in the non-limiting example, wherein any of the components may deviate by up to ±50% from the stated proportions. The solution may then be mixed (e.g., for one hour) and then filtered (e.g., using a syringe with a lam filter). The fluorophore may then be added to form formulation 120 from precursor 110, and the mixing may be continued for another hour. Formulation 120 may then be evaporated and heated (e.g., in a non-limiting example, using a rotovap under pressure of 60-100 mbar and temperature of 40-60° C.) to achieve increased photo-stability as found by the inventors and explained below.

Epoxy Silica Ormosil Solution

Specifically, compared to process 90 of Reisfeld 2006, the inventors have found that replacing TMOS 91A by TEOS 102 and using additional different silane precursor(s) 104 provide epoxy silica ormosil solution 106 which enables association of rhodamine-based fluorescent (RBF) compounds 115 in resulting films 130 which are usable in displays 140, which prior art ESOR 92 does not enable. In particular, the inventors have used various silane precursors 104 to enhance stability of, and provide emission spectrum tunability to RBF compounds 115 in produced film 130, as shown in detail below.

For example, silane precursors 104 may comprise any of MTMOS (methyltrimethoxysilane), PhTMOS, a TMOS with fluorine substituents, e.g., $F_1$TMOS (trimethoxy(3,3,3-trifluoropropyl)silane), $F_0$TEOS (Fluorotriethoxysilane) or $F_2$TMOS (tridecafluoro-1,1,2,2-tetrahydrooctyl)trimethoxysilane, 1,2-bis(triethoxysilyl) ethane, trimethoxy(propyl) silane, octadecyltrimethoxysilane, fluorotriethoxysilane, and ammonium(propyl)trimethoxysilane. The first four options are illustrated below:

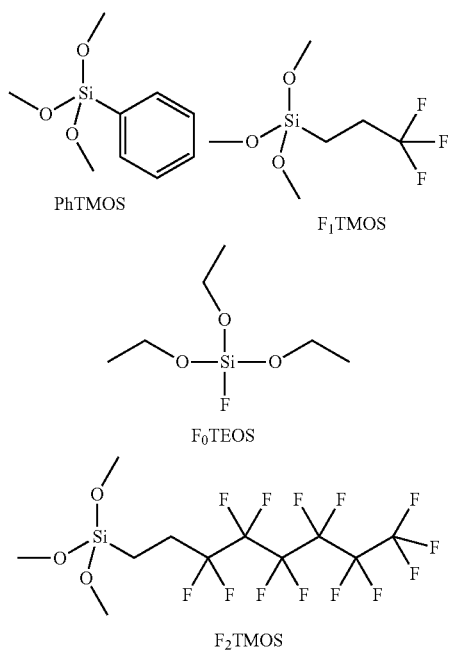

In certain embodiments, Silane precursors 104 may comprise any alkoxysilane, with $R^1$, $R^2$, $R^3$ typically consisting of methyl or ethyl groups (e.g., $R^4$—OSi(Me)$_3$), and $R^4$ may consist of a branched or unbranched carbon chain, possibly with any number of halogen substituents, as illustrated below.

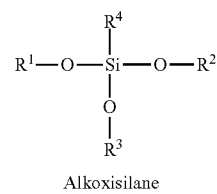

Alkoxisilane

In certain embodiments, silane precursors 104 may comprise any of: tetraalkoxysilane (e.g., tetraethoxysilane), alkyltrialkoxysilane, aryltrialkoxysilane, haloalkyltrialkoxysilane, heterocycloalkyltrialkoxysilane, N-heterocycletrialkoxysilane, (3-Glycidyloxypropyl)trialkoxysilane, haloalkyltrialkoxysilane, heterocycloalkyltrialkoxysilane, N-heterocycletrialkoxysilane, and cycloalkyltrialkoxysilane.

In certain embodiments, silane precursors 104 may be selected from any of the following structures:

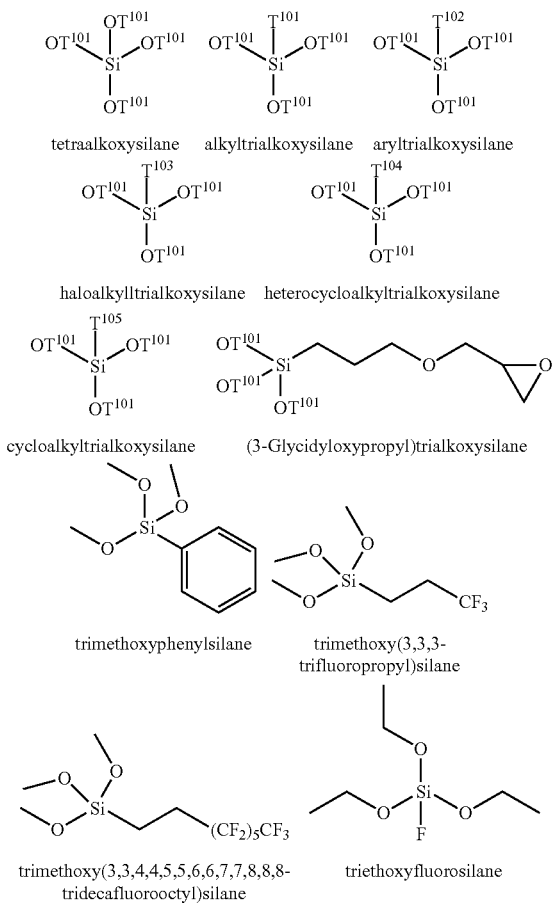

wherein T101 is an alkyl, T102 an aryl, T103 an haloalkyl, T104 an heterocycloalkyl (including a N-heterocycle) and T105 an cycloalkyl, as defined herein.

In certain embodiments, epoxy silica ormosil solution may be prepared by first mixing the TEOS and at least one silane precursor(s) under acidic conditions and then adding the GLYMO. The acidic conditions may be adjusted by adding acetic acid, and may be followed by adding water and alcohol(s) such as ethanol, propanol, 2-propanol or butanol.

The inventors have used various silane precursors 104 to provide emission spectrum tunability to film 130. In some embodiments tuning of the wavelength may be achieved by adjusting the ratio of the silane precursors 104. In some embodiments, the ratio of silane precursors is adjusted within each layer; such as a 1:1 ratio of PhTMOS and $F_1$TMOS in a single sol-gel matrix layer. In some embodiments, the ratio of the silane precursors is adjusted between layers; such as a 1:1 ratio of layers—for example one layer with PhTMOS and one layer with $F_1$TMOS one on top of each other.

Figure 8A:
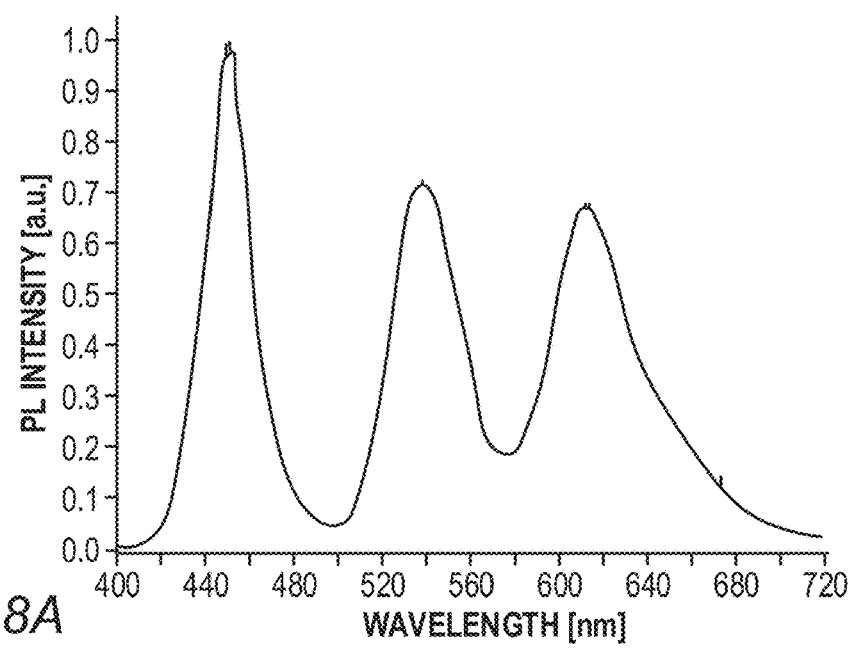
FIGS. 8A-8E illustrate examples of emission results of films produced by sol-gel processes, according to some embodiments of the invention.
Figure 8B:
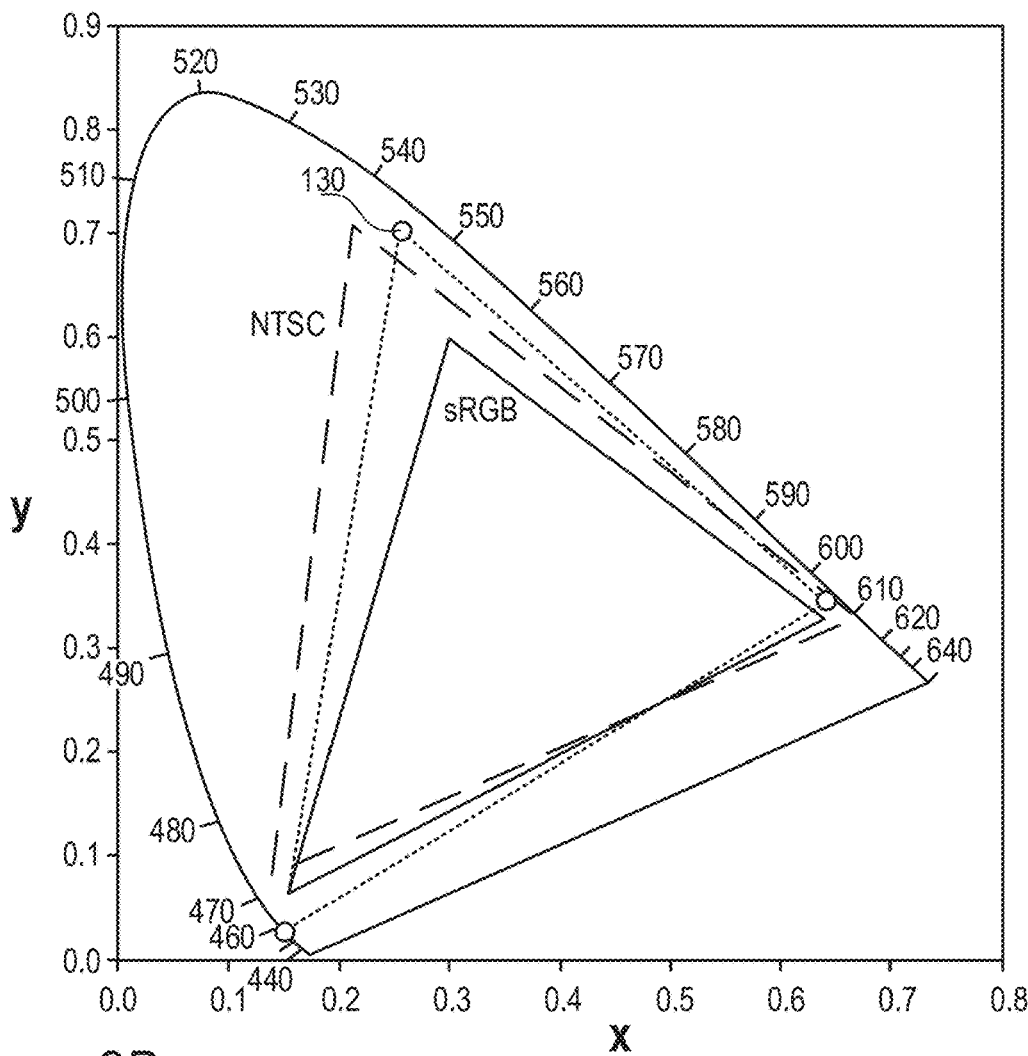
Figure 8C:
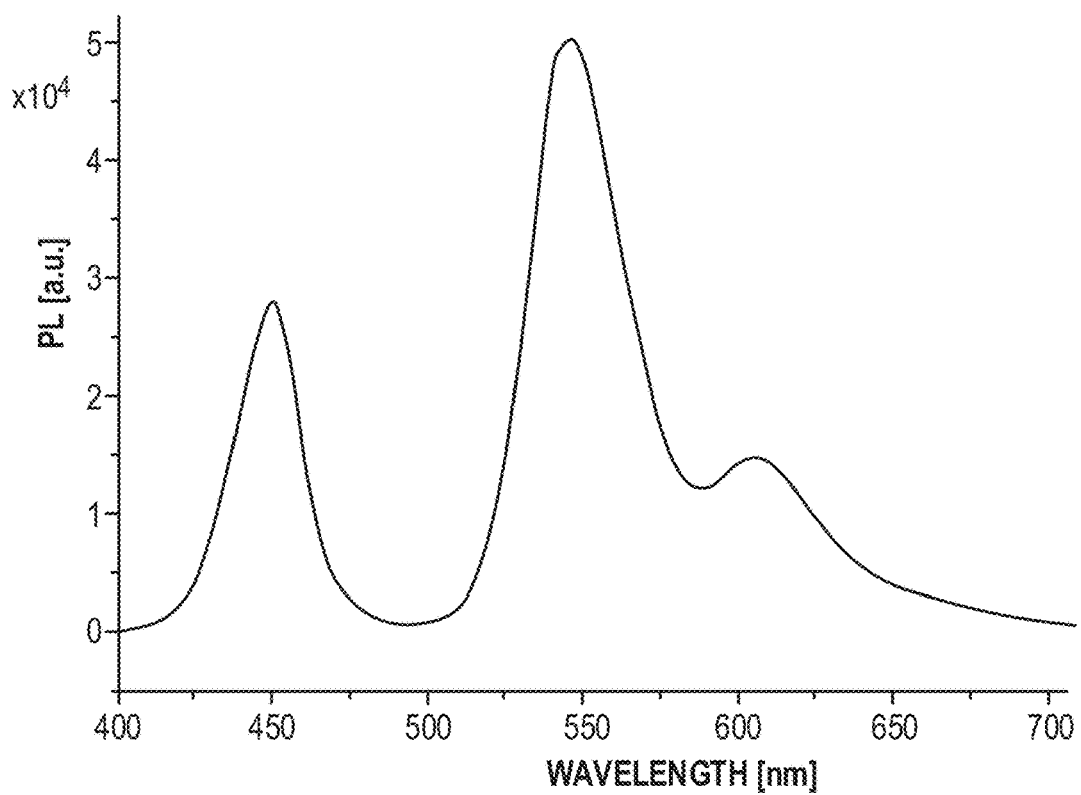
Figure 8D:
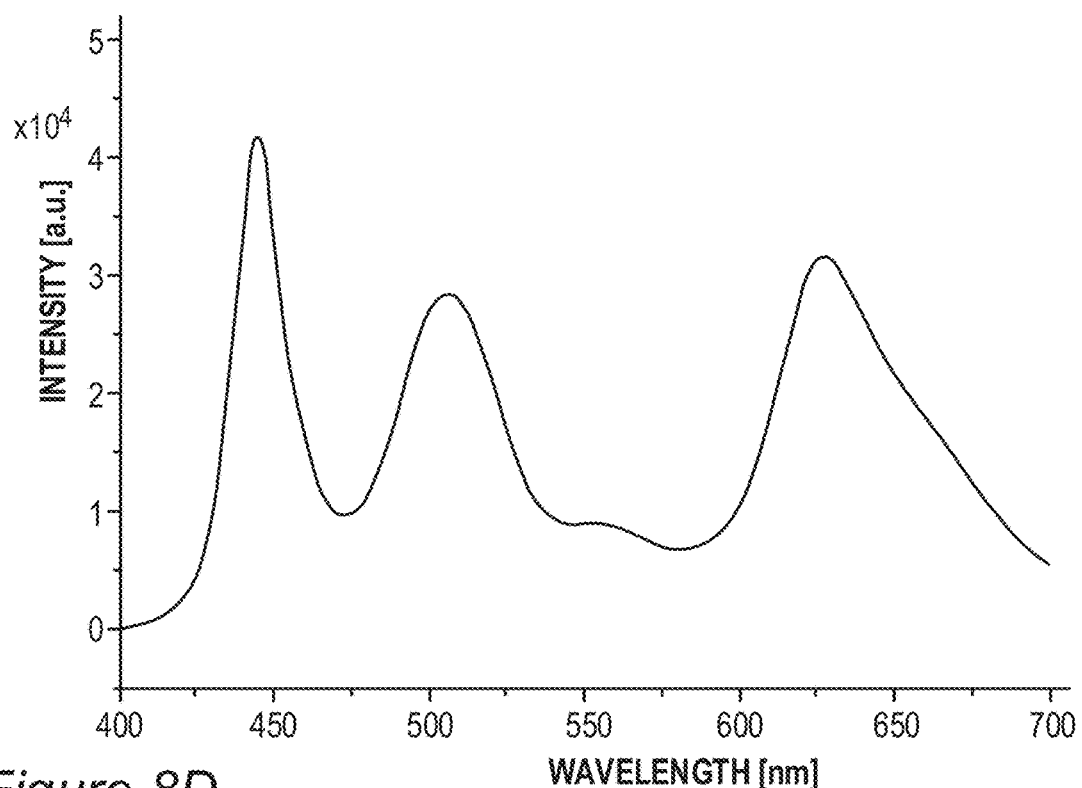
Figure 8E:
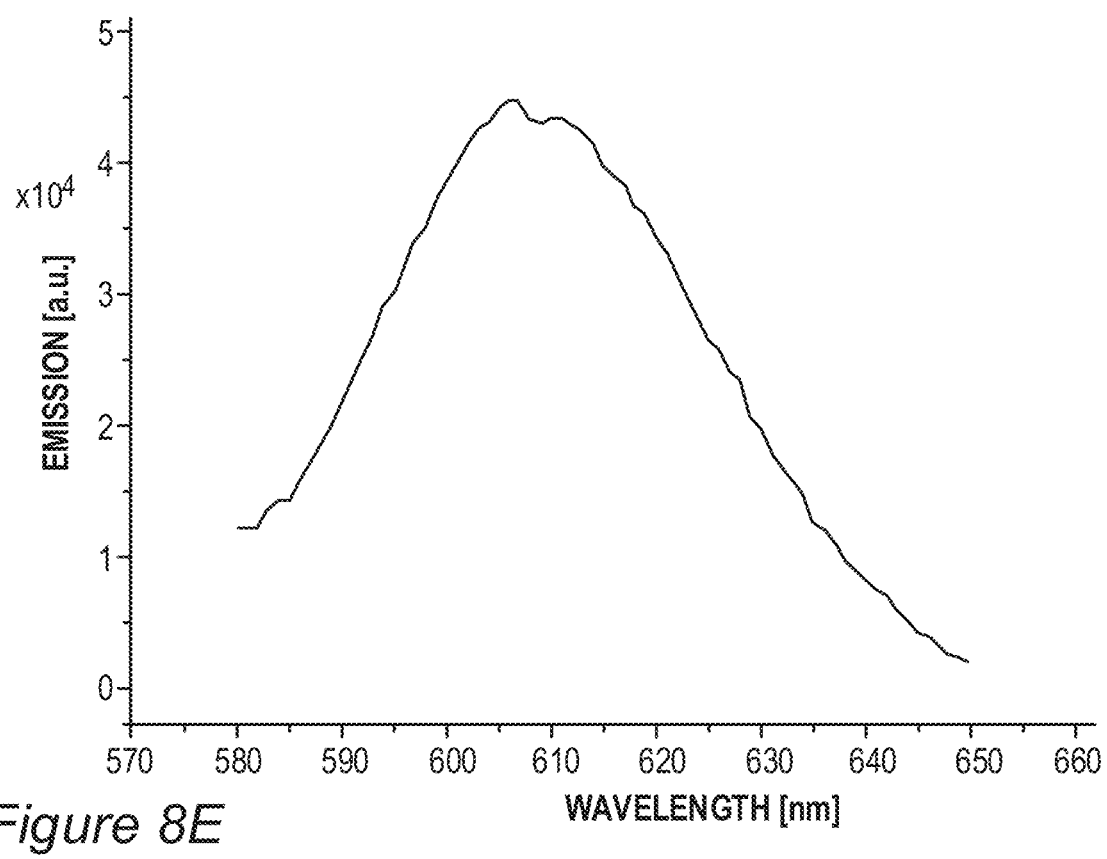
Figure 8F:
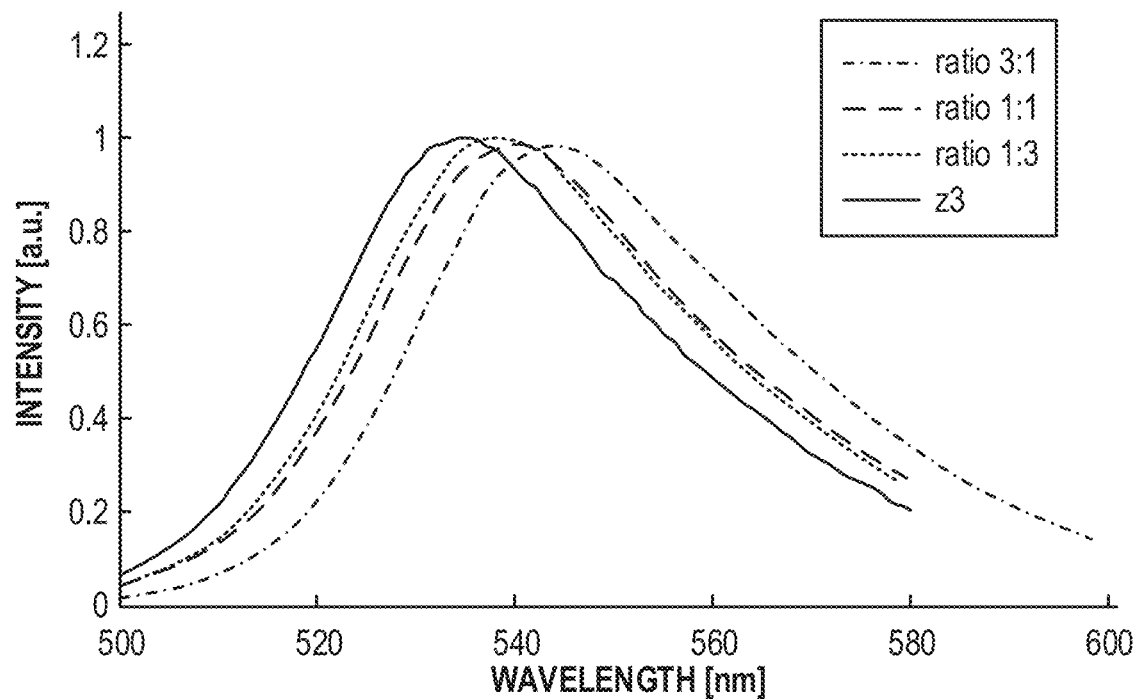
FIG. 8F illustrates the peak shifts according to the molar ratio of PhTMOS:$F_1$TMOS.

FIG. 8F, is an example of a peak shift due to the change in molar ratio of two silane precursors PhTMOS (Z3 matrix detailed below): $F_1$TMOS (Z2 matrix detailed below). As can be seen the first peak with just Z3 is at 535 nm and as Z2 is added and the ratio changes the peak shifts to higher wave lengths up to 545 nm when the ratio is 3:1. The wavelengths for each ratio can be found in rows 5-8 in Table 1 below. In this example JK71, a green RBF molecule, was used in a concentration of 0.15 mg/ml, in a single layer of ~40 μm thickness.

In certain embodiments, the volumetric ratio between TEOS:MTMOS or other silane precursor(s):GLYMO may be between 1:1:1.5-2; and the volumetric ratio between TEOS:silane precursor(s):acetic acid:alcohol:water may be between 1:1:0.01-1:1-10:4-8. In some embodiments, when the volumetric ratio is as described above the epoxy silica ormosil solution mixing time may be reduced to about five minutes. Any of the components may deviate by up to ±50% from the stated proportions.

In some embodiments (e.g., additional variants 107), ethanol and/or water are not used, to simplify the process. For example, diphenylsilanediol (DPSD) may be used to provide a water-free matrix, avoiding the first hydrolysis step in the condensation.

In some embodiments (e.g., additional variants 107), citric acid and/or ascorbic acid may replace or be added to the acetic acid.

In some embodiments, the GLYMO precursor is polymerized 107C (poly-GLYMO) before it is used in the epoxy silica ormosil solution preparation. See example below:

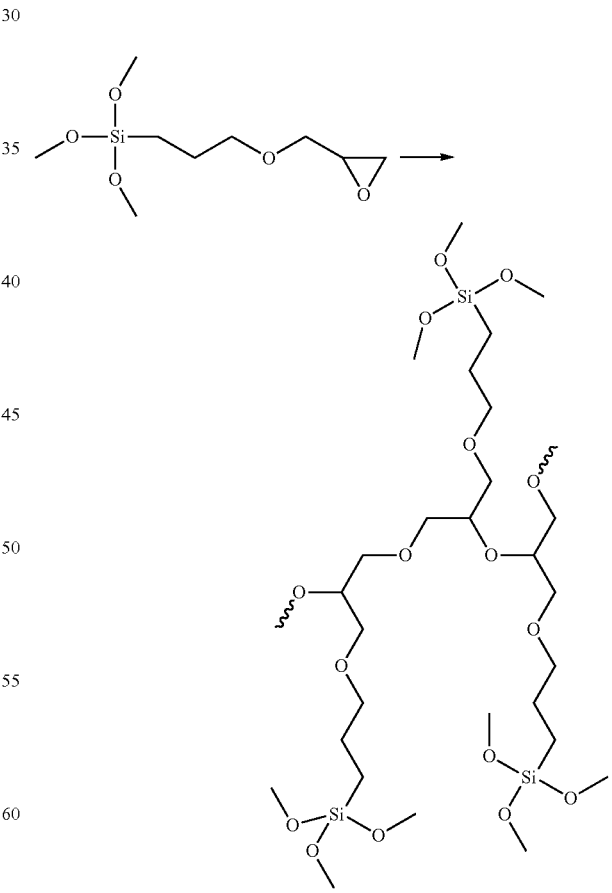

Using poly-GLYMO 107C in the preparation of the hybrid sol-gel matrix may result in an increase of the crosslinking density.

In some embodiments GLYMO is polymerized in the presence of at least one RBF compound. This may provide a polymer cage which limits the diffusion of the RBF compound and inhibits reactive molecules from reaching the RBF compound.

In some embodiments, the RBF compound has epoxide groups which enable it to covalently bind to the sol-gel's polymer back bone thus further limiting the RBF diffusion. In some embodiments, the RBF compound is ES-118 according to the following formula:

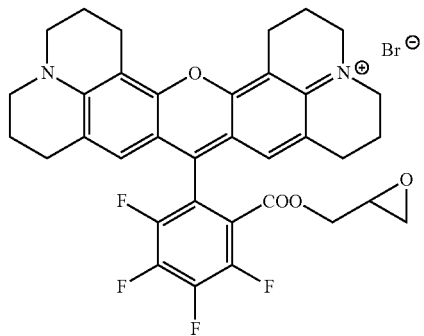

ES-118

In some embodiments (3-Glycidyloxypropyl)trimethoxysilane (Glymo CAS: 2530-83-8) was dissolved in ethanol in concentration of 1-10 mM. Then to initiate the polymerization 1-methylimidazole (CAS: 616-47-7) was added, in concentration of 0.05%-5% (w/w), the solution was then maintained under reflux for three (3) hours.

In some embodiments, the poly-glymo:TEOS ratio is about 1:1-3:1 (v/v).

Epoxy Silica Ormosil Solution Additives

There is a positive relation between the crosslinking density of a matrix and the photo-stability of the trapped fluorophore. Additives 107, described below, increase the crosslinking density of the hybrid sol-gel matrix and have additional advantages detailed below.

In some embodiments one or more additional additives 107 may be added to the epoxy silica ormosil solution. In some embodiments, the additives are added during the preparation of the epoxy silica ormosil solution and specifically following the addition of the silane precursors.

Polydimethylsiloxane Hydroxy Terminated

In some embodiments additive 107 may be polydimethylsiloxane hydroxy terminated (PDMS-hydroxy CAS: 70131-67-8) as illustrated below. PDMS is highly flexible (has a very low Tg) and highly hydrophobic. The PDMS's hydroxyl groups on both sides of the main chain allow covalent linkage to the sol-gel matrix and act as flexible crosslinkers.

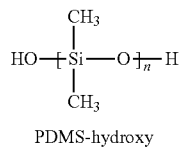

PDMS-hydroxy

In some embodiments PDMS was added in a molecular weight of 0.1-20 (kDa) and in a concentration of 5%-20% (w/w). The resulting hybrid sol-gel had a higher viscosity, enabled more uniform spreading, increased flexibility, reduction of bubbles, better resistant to thermal shock, less splintering during cutting and better resistance toward humidity compared to the hybrid sol-gel without PDMS.

Figure 6C:
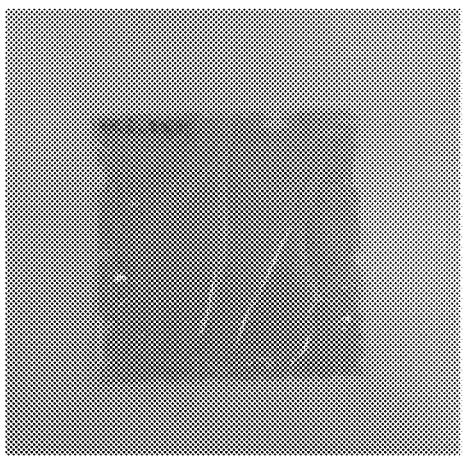
FIGS. 6C and 6D are photographs of a film on a substrate with and without pretreating of the substrate.
Figure 6D:
Figure 6E:
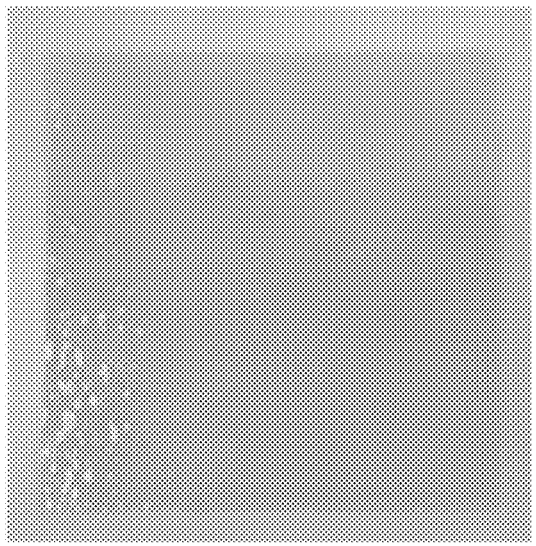
FIGS. 6E and 6F are photographs of a film with and without PDMS-hydroxyl.
Figure 6F:
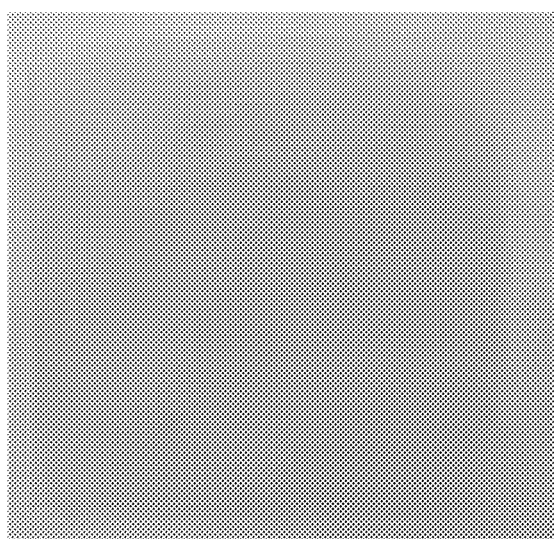

FIGS. 6E and 6F are photographs of a film with and without PDMS-hydroxyl.

FIG. 6E is a typical sol-gel film without PDMS-hydroxyl while FIG. 6F is a typical sol-gel film with PDMS-hydroxyl. As can be seen the figures demonstrate how addition of PDMS-hydroxyl prevents the bubbling effect and produces a smoother surface.

Dendritic Polyol

In some embodiments additive 107 may be a dendritic polyol. Dendritic polyols have a large number of active chemical sites and a flexible backbone. The dendritic polyols also have many hydroxyl groups which allow covalent linkage to the sol-gel matrix and act as highly functional crosslinkers.

In some embodiments, the dendritic polyol is Boltorn™ H2004 (CAS: 462113-22-0, Propanoic acid, 3-hydroxy-2-(hydroxymethyl)-2-methyl-,1,1'-[2-[[3-hydroxy-2-(hydroxymethyl)-2-methyl-1-oxopropoxy]methyl]-2-methyl-1,3-propanediyl] ester), as illustrated below:

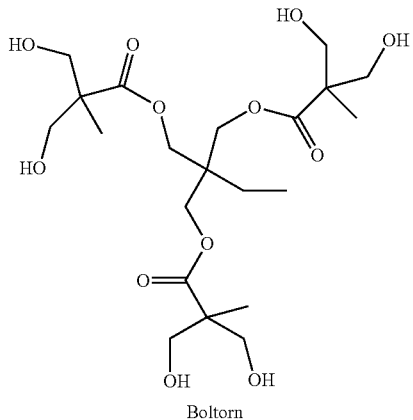 [SMILES: CCC(COC(=O)C(C)(CO)CO)(COC(=O)C(C)(CO)CO)COC(=O)C(C)(CO)CO]

Boltorn

In some embodiments Boltorn H2004 was added in a concentration of 1%-10% (w/w). The resulting hybrid sol-gel film had improved adhesion and better flexibility compared to the hybrid sol-gel without Boltorn H2004.

Dendritic polyols may also be used when preparing a matrix using UV as detailed below.

Polyvinylpyrrolidone

In some embodiments additive 107 may be Polyvinylpyrrolidone (PVP CAS: 9003-39-8) as illustrated below:

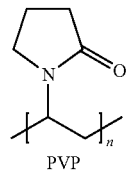

PVP

In some embodiments PVP was added in a molecular weight of 10 kDa and in a concentration of 5%-20% (w/w). The resulting hybrid sol-gel had improved adhesion and flexibility compared to the hybrid sol-gel without PVP.

In some embodiments a combination of two or more of PDMS, dendritic polyol and PVP may be used in the preparation of the epoxy silica ormosil solution.

In some embodiments, the combination is tuned to receive certain desired characteristics.

Nanoparticles Powder

Nanoparticles powder 109 is prepared from ethylene glycol 108 and isocyanate-functionalized silica nanoparticles (IC-Si NP) 111.

The inventors have found that using ethylene glycol 108 for nanoparticles powder 109 instead of polyethylene glycol (PEG) 94A for DURS 95 (as in Reisfeld 2006) enables better control of the film production and improves the mechanical properties of films better films 130, including the film being less brittle, compared to the prior art sol-gel precursors 96, as explained below.

IC-Si NP 111 are multi-functional nanoparticles which have many active sites and specifically many more then prior art 3-isocyanatopropyltriethoxysilane (ICTEOS) 94B which is not multi-functionalized. ICTEOS has a single isocyanate group and when two ICTEOS molecules bind to PEG they create diuretane silane (DURS); while IC-Si NP has many active sites which may form significantly different matrix structures.

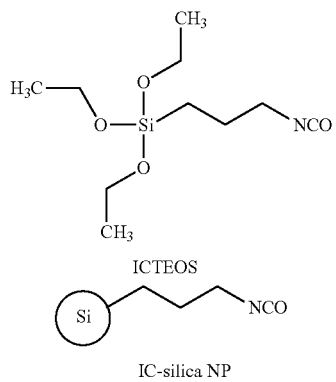

IC-Si NP have hydroxide groups on their surface which participate in the condensation step (detailed below), and accordingly increase the actual functionality of the IC-Si NP.

The inventors have found that using IC-Si NP 111 for nanoparticles powder 109 instead of prior art 3-isocyanatopropyltriethoxysilane (ICTEOS) 94B may produce films with a tighter matrix and may limit the diffusion of the RBF compound and inhibit reactive molecules from reaching the RBF compound. The matrix may also absorb residue solvents and unreacted precursors thereby protecting RBF compound from potential reactions that may occur with the residue solvents and unreacted precursors.

The isocyanate-functionalized silica nanoparticles (IC-Si NP) 111 may be comprised of (isocyanato)alkylfunctionalized silica nanoparticles and/or 3-(isocyanato)propyl-functionalized silica nanoparticles, which may be prepared from precursors (isocyanato)alkylfunctionalized trialkoxysilane and/or 3-(isocyanato)propyltrietoxysilane, respectively.

The nanoparticles powder may be prepared by mixing and refluxing the silicon (e.g. IC-Si NP) and glycolated precursors (e.g. ethylene glycol). In some embodiments, the ethylene glycol may be added in excess. In some embodiments, the reflux may be followed by cooling and filtration steps. In some embodiments, chlorobenzene ($C_6H_5Cl$) may be added to the mixture before the reflux step. In some embodiments, the chlorobenzene ($C_6H_5Cl$) may be evaporated prior to the cooling step. In an example, nanoparticles powder was prepared by refluxing 3-isocyanatopropyl functionalized nanoparticles and ethylene glycol. In one embodiment, about 50-150 mg of 3-isocyanatopropyl functionalized silica nanoparticles (with 200-400 mesh, 1.2 mmol/g loading) and 16-320 µl of ethylene glycol were refluxed in chlorobenzene for about 2-6 hours. The functionalized silica nanoparticles were then separated from the chlorobenzene by a rotary evaporator.

In some embodiments, the size of the silica nanoparticles is between about 1-500 nm. In some embodiments, the size of the silica nanoparticles is between about 1-400 nm. In some embodiments, the size of the silica nanoparticles is between about 1-100 nm. In some embodiments, the size of the silica nanoparticles is between about 50-300 nm. In some embodiments, the size of the silica nanoparticles is between about 50-200 nm. In some embodiments, the size of the silica nanoparticles is between about 100-200 nm. In some embodiments, the size of the silica nanoparticles is between about 100-160 nm. In some embodiments, the size of the silica nanoparticles is between about 110-140 nm.

Figure 6G:
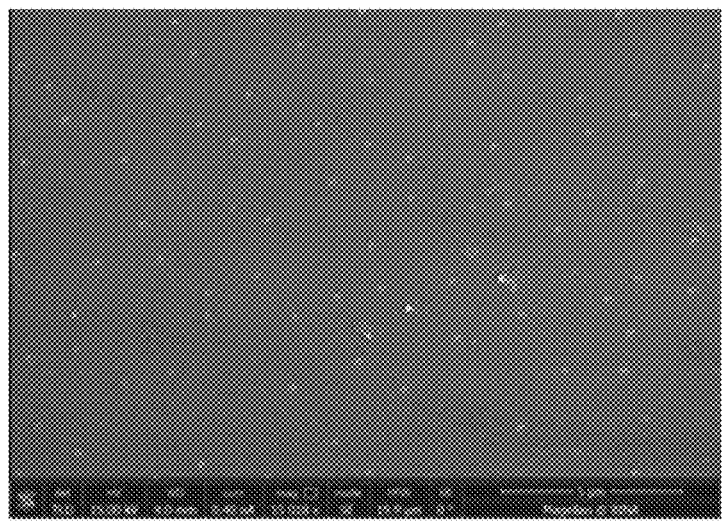
FIG. 6G is high resolution SEM image of a sol-gel film prepared with isocyanate-functionalized silica nanoparticles (IC-Si NP).

FIG. 6G is high resolution SEM image of a sol-gel film prepared with IC-Si NP which clearly shows there are nanoparticles within the sol-gel matrix.

Using IC-silica NP, as opposed to ICTEOS, increases the photostablity of the film from one day with ICTOS to three days with IC-silica NP. In this example both films were prepared using JK71 as the RBF molecule in a Z3 matrix and the measurements were done by a Fluorimeter, FluoroMax-4 Horiba, the excitation was: 452 nm, the temperature was: 70° C. and the flux 70 mW/cm.

In some embodiments, nanoparticles 111 may comprise non-functionalized silica nanoparticles. The non-functionalized silica nanoparticles 111 may be comprised of any silica nanoparticles. In some embodiments, the non-functionalized silica nanoparticles 111 may comprise standard silica gel (CAS 7631-86-9).

In some embodiments, the non-functionalized nanoparticles 111 may replace the functionalized nanoparticles in both Z2 and Z3 matrix using the same concentration by weight of the particles per volume of the solution.

Figure 3F:
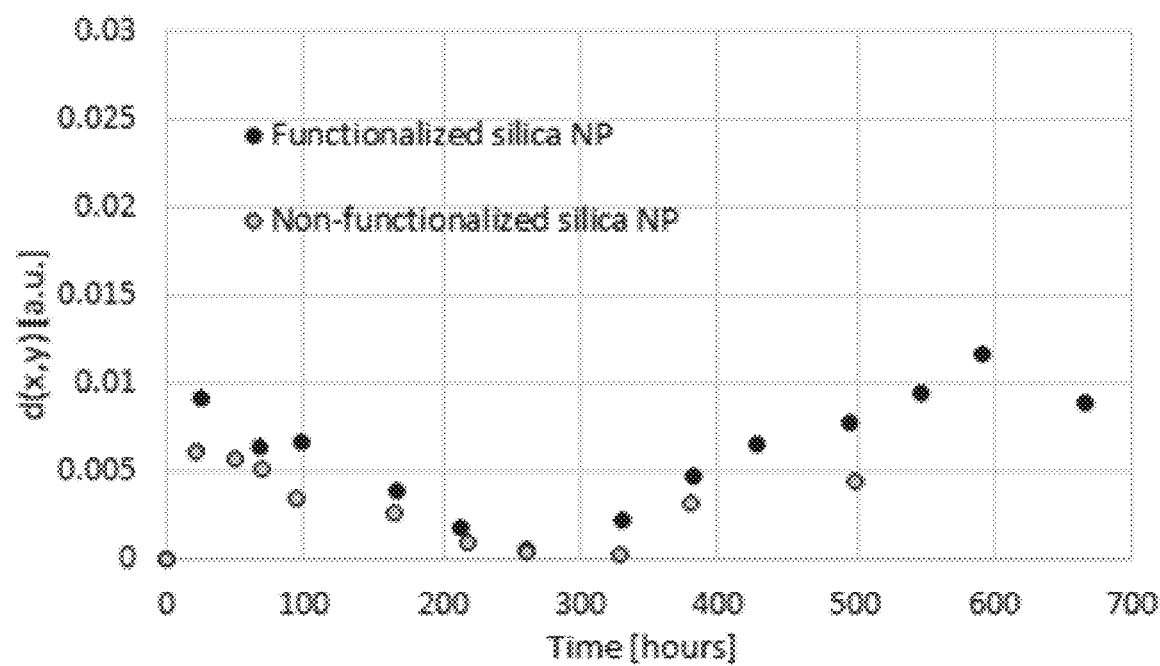

FIG. 3F shows a photo-stability comparison between a device with functionalized silica NP and non-functionalized silica NP. The photo-stability or degradation in terms of the distance on color diagram 145A (in FIG. 3A) is illustrated in FIG. 3F using non-limiting experimental data of the distance from point 141A (in FIG. 3A) over the operation time (in arbitrary units, a.u., scaled to 1000) of the display. As can be seen in the figure both devices, with functionalized silica NP and non-functionalized silica NP at the same nanoparticles concentration (weight particles/volume of the solution), exhibit similar photo-stability (for full devices). Both devices were comprised of a green layer with the RBF molecule being RS285 embedded in a $Z_3$ matrix and a red layer with the RBF molecule being ES144 embedded in a $Z_2$ matrix. Both devices were prepared in the same way: reactions and coatings were conducted in a dry room under controlled relative humidity. After applicating each layer the film was cured for one hour in the oven at 80° C. and another final curing of 24 hours at 130° C. Details of acceleration: Flux—3 mW/cm² Temperature—60° C.

In some embodiments, the nanoparticles powder 109 is prepared from a mixture of functionalized and non-functionalized silica NP. In some embodiments the ratio of functionalized and non-functionalized silica NP in the mixture is 50:50. In some embodiments the ratio is 40:60. In some embodiments the ratio is 30:70. In some embodiments the ratio is 20:80. In some embodiments the ratio is 10:90. In some embodiments the ratio is 60:40. In some embodiments the ratio is 70:30. In some embodiments the ratio is 80:20. In some embodiments the ratio is 90:10. In some embodiments, the size of the functionalized NP is between about 1-400 nm and the size of the non-functionalized NP is between about 1-100 nm. In some embodiments, the size of the functionalized NP is between about 50-300 nm and the size of the non-functionalized NP is between about 50-200 nm. In some embodiments, the size of the functionalized NP is between about 100-200 nm and the size of the non-functionalized NP is between about 100-160 nm. In some embodiments, the size of the functionalized NP is between about 110-140 nm and the size of the non-functionalized NP is between about 1-400 nm. Any of the above embodiments may be combined together.

In some embodiments (e.g., additional variants 107), nanoparticles powder is not used, to simplify the process.

Transition Metal(s) Alkoxide Matrix Solution

Transition metalalkoxide matrix solution 103 may comprise alkoxides of one or more transition metals. For example, a zirconia ($ZrO_2$) matrix solution may be prepared from zirconium tetraalkoxide, e.g., $Zr(OPr)_4$ and/or zirconium, mixed with alcohol (e.g., propanol) under acidic conditions (e.g., in the presence of acetic acid, citric acid and/or ascorbic acid). Various transition metals alkoxides may be used in place or in addition to zirconia.

In certain embodiments, the epoxy silica ormosil solution may be mixed with the zirconia matrix solution at a 2:1 volumetric ratio, and the nanoparticles powder may then be added to the mixture to provide, after mixing (e.g., for 1-5 hours) and filtering, hybrid sol-gel precursor formulations. The zirconia matrix solution may be configured to catalyze the epoxy polymerization of the epoxy silica ormosil solution. In some embodiments, the zirconia matrix solution may be added to the epoxy silica ormosil solution after e.g., 15, 30, 45 minutes. The subsequent mixing time may be decreased down to about 10 minutes.

In some embodiments, other metal oxide matrix may be used instead or in addition to zirconia matrix during the sol-gel process, such as titania using titanium isopropoxide or boron oxide using boric acid. Zirconia and/or alkoxides from transition metals such as boron alkoxide 103 may be used in preparing sol-gel precursor 110.

Formulation

Formulations 120 comprise hybrid sol-gel precursor formulations 110 and at least one RBF compound 115 such as red-fluorescent RBF compound(s) and green-fluorescent RBF compound(s) which may be configured to emit the R and G components of the required RGB illumination, provided by the display's backlight unit (red-fluorescent RBF compounds emit radiation with an emission peak in the red region while green-fluorescent RBF compounds emit radiation with an emission peak in the green region). It is emphasized that formulations 120 are very different from prior art laser dye formulation 97 as laser dye usage as gain medium is very different from the operation of fluorescent films in the backlight unit, e.g., concerning stability, emission spectra and additional performance requirement as well as operation conditions.

Stages of methods 200—namely preparing hybrid sol-gel precursor formulation 110 (stage 210), mixing in RBF compound(s) 115 to form formulation 120 (stage 220), forming film 130 (stage 230) and optionally evaporating alcohols prior to film formation (stage 225)—are shown schematically and explained in more detail below.

The mixture of the hybrid sol-gel precursor formulation and the RBF compound(s) may be stirred and then evaporated and heated (e.g., in a non-limiting example, stirred for between about 20 minutes and about three hours, evaporated at about 60-100 mbar and heated to 40-60° C.) to increase the photo-stability of the RBF compound(s) (see additional process details below). Process parameters may be adjusted to avoid damage to the fluorescent dyes, control parameters of the sol-gel process and optimize the productivity in the process.

The evaporation of alcohols from the sol-gel prior to the coating of the substrate may form a denser matrix which provides a tight packaging for the RBF compound. The tighter packaging may result in higher photostablity as can be seen in FIG. 7C. FIG. 7C is a graph showing the normalized intensity, with and without an evaporation step, of a film of Z1 formulation (detailed below) with RS130 as the RBF molecule. As can be seen the stability of the layer with evaporation (dark color line) is almost twice that of the layer without evaporation (light color line). Details of the measurement are: Fluorimeter, FluoroMax-4 Horiba, Excitation: 540 nm; Detail of acceleration: Excitation: 452 nm; Temperature: 70° C.; Flux: 70 mW/cm$^2$.

The concentration of the RBF compound(s) may be adjusted to determine the final peak emission intensity excited by the chosen backlight unit and may range e.g., between 0.005-0.5 mg/ml. It is noted that multiple fluorescent molecules having different emission peaks may be used in a single formulation 120. The processes may be optimized to achieve required relations between the RBF compound(s) and the other components of the film, e.g., to achieve any of supramolecular encapsulation of the RBF compound(s) in the sol-gel matrix, covalent embedding of the RBF compound(s) in the sol-gel matrix (e.g., via siloxane bonds), and/or incorporation of the RBF compound(s) in the sol-gel matrix.

Silane precursors 104 may be selected according to the used RBF compound. For example, the inventors have found that PhTMOS may be used to stabilize red-fluorescent RBF compounds. In another example, the inventors have found that TMOS with fluorine substituents may be used to stabilize red-fluorescent RBF compounds. Modifying and adjusting parameters of the substituents was found to enable the control of the photostability and emission characteristics of the fluorescent compounds. In yet another example, the inventors have found that $F_1$TMOS may be used to stabilize green-fluorescent RBF compounds. These and more findings are presented below in detail.

Optimizing the Silane Precursors in the Epoxy Silica Ormosil Solution to Stabilize and Tune the Fluorescent Molecules Films 130 prepared from formulation 120 may comprise epoxy silica ormosil solution 106 prepared from TEOS 102, at least one silane precursor 104 (and/or MTMOS 91B), and GLYMO 91C; nanoparticles powder 109 prepared from isocyanate-functionalized silica nanoparticles 111, or non-functionalized silica nanoparticles 111, and ethylene glycol 108; a transition metal(s) alkoxide matrix solution 103; and at least one RBF compound 115, selected to emit green and/or red light and being supramolecularly encapsulated and/or covalently embedded within film 130. Silane precursors 104 may comprise any of MTMOS, PhTMOS, a TMOS with fluorine substituents, $F_1$TMOS, $F_2$TMOS (tridecafluoro-1,1,2,2-tetrahydrooctyl)trimethoxysilane, 1,2-bis(triethoxysilyl)ethane, trimethoxy(propyl) silane, octadecyltrimethoxysilane, fluorotriethoxysilane, and ammonium(propyl)trimethoxysilane. For example, for film 130 and/or film layer 134 with red-fluorescent RBF compound, silane precursor 104 may comprise PhTMOS and/or a TMOS with fluorine substituents. In another example, for film 130 and/or film layer 132 with green-fluorescent RBF compound, silane precursor 104 may comprise $F_1TMOS$.

Examples are provided below for four matrix compositions ($Z_1$, $Z_2$, $Z_3$, $Z_4$) for mixtures of epoxy silica ormosil solution and zirconia matrix solution having the components $Zr(PrO)_4$:GLYMO:TEOS:silane precursor at n=0.011: 0.022:0.013:0.021 (moles), with the silane precursor being MTMOS in $Z_1$, PhTMOS in $Z_2$, $F_1TMOS$ in $Z_3$, and $F_2TMOS$ in $Z_4$, as illustrated below.

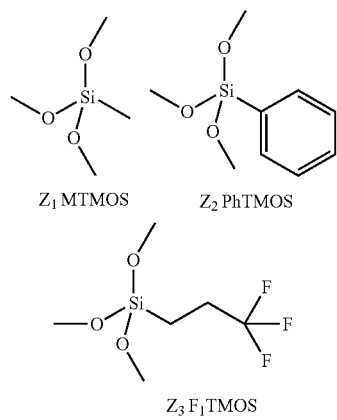

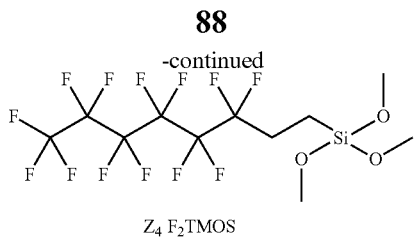

$Z_4$ $F_2TMOS$

These matrices were mixed with several dyes and tested, as corresponding films 130, for quantum yield and lifetime, as presented in detail below, with the results presented in Table 1. All but the rows marked by the asterisk employed evaporation of alcohols prior to film formation (stage 225). The lifetime was defined as a reduction to 80% of the initial emission intensity (measured by a fluorimeter) or up to 3 nm change in wavelength peak position. The lifetime was measured in accelerated procedures and is shown as a relative value (factor) relative to the reference sample $Z_1$ (MTMOS) in the first line. RBF compounds ES-61 and RS-130 are red-fluorescent, RBF compound JK-71 is green-fluorescent, and their structures are provided above. The emission peak wavelengths in lines 1-4 and 9 vary according to the concentration of the fluorophore and the thickness of the sol-gel layer. The data was measured with a blue light flux of 100 mW/cm² and temperature of 60° C. for the green RBF compounds and with a white light flux of 20 mW/cm² and temperature of 60° C. for the red RBF compounds.

TABLE 1

Optimization of the silane precursors

| # | Matrix (silane precursor) | Fluorescent compound (see above) | FWHM (full width at half maximum, nm) | Emission peak wavelength (nm) | Quantum yield | Lifetime multiplier (factor) |
|---|---|---|---|---|---|---|
| 1 | $Z_1$ (MTMOS)* | Green (JK-71) | 35-40 | 535-550 | 55-75 | Reference |
| 2 | $Z_3$ ($F_1TMOS$) | Green (JK-71) | | 525-540 | 80-90 | ×3 |
| 3 | $Z_1$ (MTMOS)* | Red (ES-61) | 40-45 | 625-635 | 70-75 | ×3 |
| 4 | $Z_2$ (PhTMOS) | Red (ES-61) | | 625-635 | 70-75 | ×8 |
| 5 | $Z_3$ ($F_1TMOS$) | Green (JK-71) | 42 | 535 | | |
| 6 | 1:3 $Z_2$:$Z_3$ | Green (JK-71) | | 538 | | |
| 7 | 1:1 $Z_2$:$Z_3$ | Green (JK-71) | | 540 | | |
| 8 | 3:1 $Z_2$:$Z_3$ | Green (JK-71) | | 545 | | |
| 9 | $Z_3$ with JK-71 + $Z_2$ with ES-61 denoted EC-154 | | Green 30-35 Red 45-50 | 535-543 633-642 | | |

| # | Matrix (silane precursor) | Fluorescent compound (see above) | Approx. concentration in the film (mg/mL) | Film thickness (μm) | Emission peak wavelength (nm) | Quantum yield | Lifetime multiplier (factor) |
|---|---|---|---|---|---|---|---|
| 10 | $Z_1$ (MTMOS)* | Red (RS-130) | 0.06 | 10 | | 70% | ×3 |
| 11 | $Z_1$ (MTMOS) | Red (RS-130) | 0.06 | 10 | | 73% | ×8 |
| 12 | $Z_2$ (PhTMOS) | Red (RS-130) | 0.03 | 10 | | 72% | ×9 |
| 13 | $Z_2$ (PhTMOS) | Red (ES-61) | 0.06 | 10 | | 72% | ×16 |
| 14 | $Z_2$ (PhTMOS) | Green (JK-71) | 0.075 | | 538 | 85% | ×1 |
| 15 | $Z_3$ ($F_1TMOS$) | Green (JK-71) | 0.15 | 80 | 535 | 88% | ×3 |
| 16 | $Z_4$ ($F_2TMOS$) | Green (JK-71) | 0.15 | | 522 | 80% | ×3 |
| 17 | $Z_2$ (PhTMOS) | Red (RS-130) | 0.03 | | 623 | 72% | ×9 |
| 18 | $Z_3$ ($F_1TMOS$) | Red (RS-130) | 0.06 | | 618 | 67% | ×4 |
| 19 | $Z_4$ ($F_2TMOS$) | Red (RS-130) | 0.06 | | 616 | 73% | ×10 |

*No evaporation of alcohols prior to film formation

Table 1 demonstrates the capabilities of the disclosed technology to increase the lifetime of RBF compound(s) in film 130 multiple times over (eight fold—line 4 vs. line 1, fivefold—line 13 vs. line 10), reach high quantum yields (above 80%—lines 2, 14 15), tune the emission peak wavelength of the RBF compound(s) significantly (lines 5-8, 14-16, 17-19) and provide tuned multi-layered films 130 (line 9). Specifically, intercalating the red fluorescent compound(s) in the $Z_2$ matrix resulted in increased photo-stability, intercalating the green fluorescent compound(s) in the $Z_3$ matrix resulted in increased photo-stability and improved the quantum yield (QY) compare to the $Z_1$ matrix. When combining the precursor of $Z_2$ and $Z_3$ together, changing the PhTMOS:$F_1$TMOS ratio can provide tuning of the green wavelength (lines 5-8). FIG. 7C illustrates the peak shift according to the change in ratio of PhTMOS:$F_1$TMOS.

The inventors have also found that the length of the carbon chain of the silane precursor(s) may contribute to the stability of the red-fluorescent RBF compounds; in certain embodiments, the carbon chain may consist of 8, 9, 10, 12 or more carbon atoms, possibly with corresponding fluorine atoms as hydrogen substituents. In certain embodiments, some or all the fluorine atoms may be replaced by another halogen such as chlorine. Moreover, the inventors have found that modifying the length and hydrophobic\hydrophilic degree of the chain may be used to further tune and adjust the emission peak (beyond the data exemplified above), according to desired requirements.

Figure 7A:
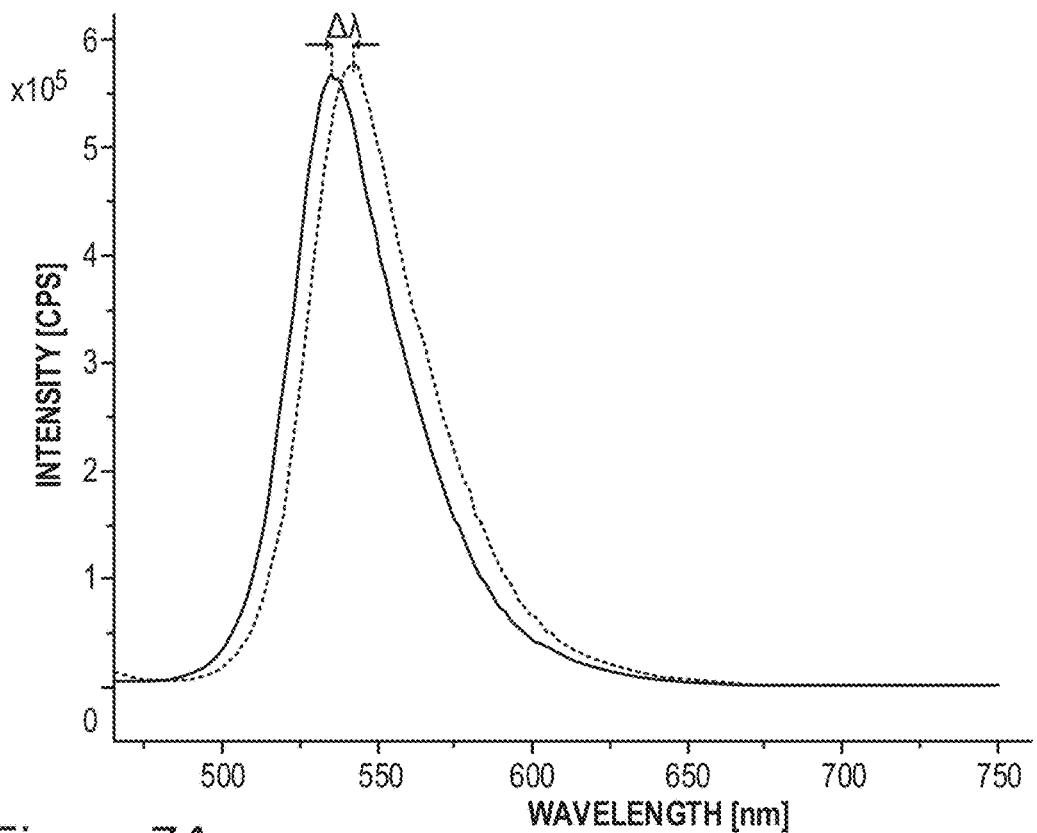
FIGS. 7A and 7B are examples for illustrations of characteristics of formulations and films, according to some embodiments of the invention.
Figure 7B:
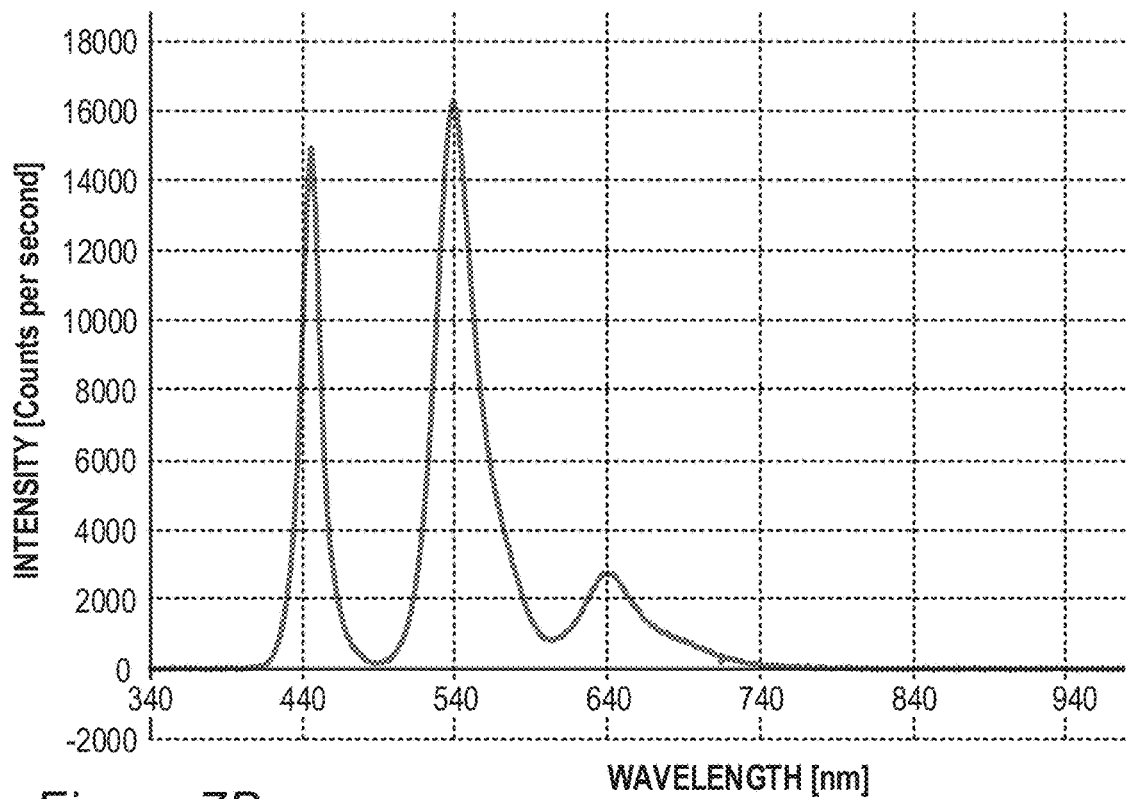
Figure 7C:
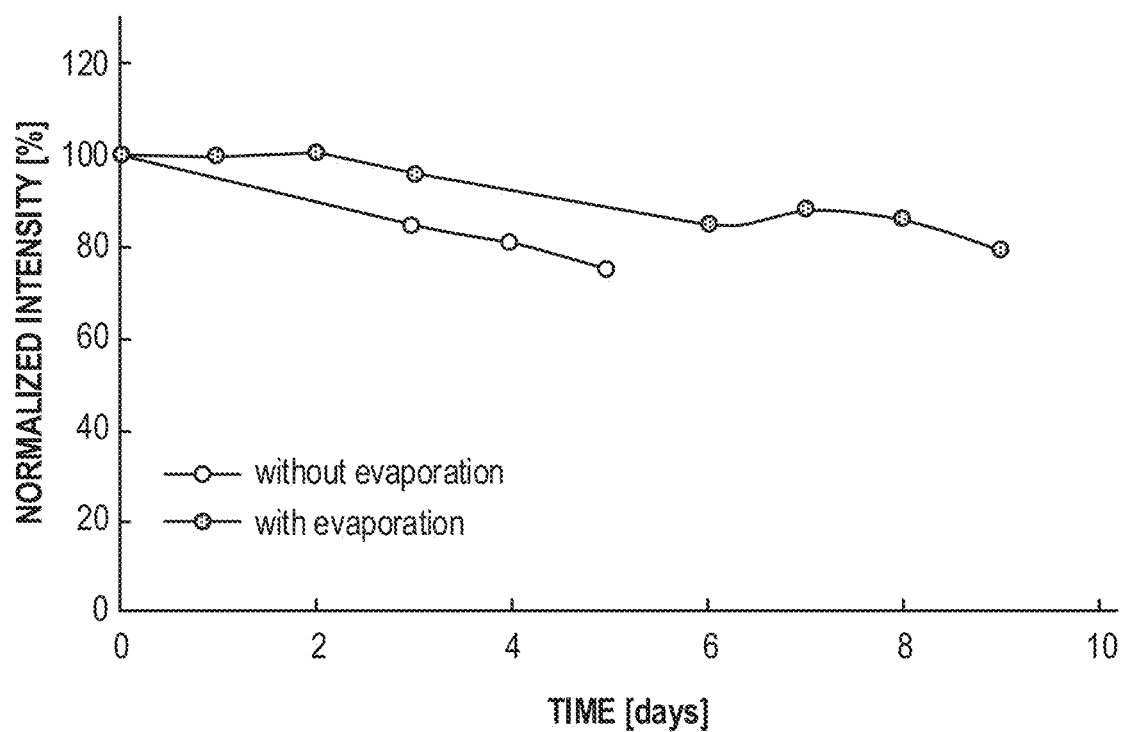
FIG. 7C illustrates the normalized intensity with and without an evaporation step.

FIGS. 7A and 7B are examples for illustrations of characteristics of formulations and films according to some embodiments of the invention. FIG. 7A exemplifies the tuning of the emission spectrum (tuning of the emission peak is indicated by Δλ) by adjusting formulation 120, the illustrated cases correspond to line 15 (JK-71 in Z3 with peak at 535 nm) and line 8 (JK-71 in Z2 with peak at 543 nm—dotted line) in Table 1. FIG. 7B exemplifies the implementation of formulation 120 with two fluorescent compounds and different respective precursors indicated in line 9 in Table 1 ($Z_3$ with JK-71+$Z_2$ with ES-61) providing two different emission peaks.

In certain embodiments, silane precursors 104 may comprise, in addition or in place of silane precursor 104 disclosed above, at least one of: 1,2-bis(triethoxysilyl)ethane, trimethoxy(propyl) silane, octadecyltrimethoxysilane, fluorotriethoxysilane, ammonium(propyl)trimethoxysilane (illustrated below) and any further varieties of any of disclosed silane precursor 104.

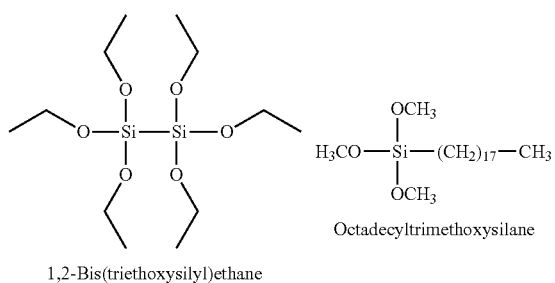

1,2-Bis(triethoxysilyl)ethane

Octadecyltrimethoxysilane

-continued

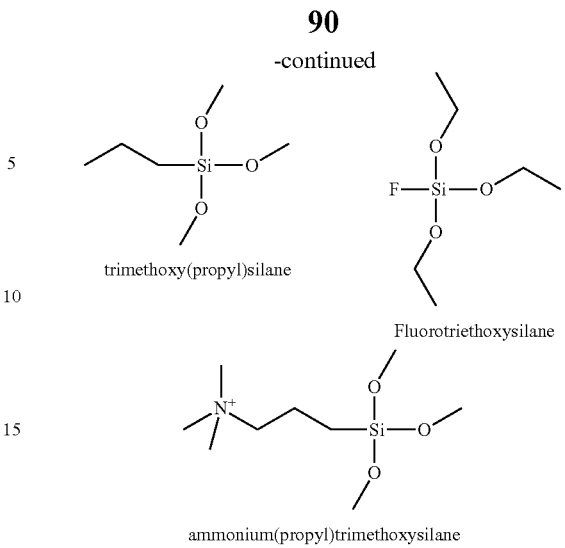

trimethoxy(propyl)silane

Fluorotriethoxysilane ammonium(propyl)trimethoxysilane

Film Preparation

Films 130 may be prepared from formulations 120 using a transparent substrate (e.g., glass, polyethylene terephthalate (PET), polycarbonate, poly-methyl-methacrylate (PMMA) etc.) or as stand-alone films (after solidification), and be used as color-conversion films in backlight units of displays. The substrate may be scrubbed to increase the surface roughness or be laminated to provide diffuser properties—in order to increase scattering or diffusing of blue light from the backlight unit.

In some embodiments, the surface of the substrate may be treated prior to applying the film. Treating the surface may improve the adhesion of the film and may prevent delamination and cracks at extreme conditions.

In some embodiments, the surface is treated by covalently binding aminosilanes. In one embodiment, the aminosilane is (aminoprpyl)triethoxysilane (APTES). The aminosilanes and APTES provide an anchoring active site for alkoxy condensation within the sol-gel reaction thus covalently binding the sol-gel matrix to the substrate and resulting in a strong adhesion between the film and the substrate.

FIGS. 6C-6D are photographs of a film on a substrate with and without surface treatment. The film in both figures is a single film comprising RS285 in Z3 and ES144 in Z2 in the same film. FIG. 6C is a photograph without pretreatment of the substrate and FIG. 6D is a photograph with pretreatment of the substrate with APTES.

In non-limiting examples, 0.1%-10% v/v of APTES were mixed with toluene. The mixture was then poured in to a bath. The substrate was dried with hot air and then placed in the bath with the mixture. The bath was then hermetically sealed (to prevent moisture absorbance) and the substrate was soaked for 3 hours. The substrate was then removed from the bath, washed with toluene and dried before coating.

Spreading formulation 120 may be carried out by any of manual coating (blade or spiral bar), automatic coting (blade or spiral bar), spin coating, deep coating, spray coating or molding; and the coatings may be applied on either side or both sides of the transparent substrate. Multiple layers of formulation 120 may be applied consecutively to film 130 (film thickness may range between 10-100 μm).

Concerning the drying, or curing process of formulation 120, it may be a two-step process comprising an initial short term curing at a high reaction rate for determining the formation of the sol-gel matrix and a long term curing at a lower reaction rate for determining the completion of the reaction (the temperature and duration of this step may be set to determine and adjust the reaction results). The initial short term curing (drying) maybe carried out by a hot plate, an oven, a drier and/or an IR (infrared) lamp. In a non-limiting example, film 130 on glass may be placed on top of a hot plate or in an oven and undergo the following heating profile: constant temperature (e.g., 60-100° C. for 1-3 hours) followed by step-wise temperature increase increments (e.g., 3-5 steps of 20-40° C. increase during 15-90 minutes each). In another non-limiting example, films may be cured by a drier or an IR lamp, e.g., being set on a conveyor (moving e.g., in 0.1-5 m/min) and heated to temperatures between 60-100° C. The curing may be configured to avoid film annealing and provide a required mesh size, while maintaining and promoting the stability of the RBF compound(s) 115. Curing parameters may be optimized with respect to a tradeoff between photostability and brightness, which relate to the film density resulting from the curing. In case of films with multiple layers (e.g., up to twenty layers), additional curing may be carried out between layer depositions (e.g., 50-90° C. for 1-3 hours) and a final curing may be applied after deposition of the last layer (e.g., 100-200° C. for 2-72 hours). In some embodiments, lower curing temperatures may be applied for longer times, e.g., the curing may be carried out for a week in 50° C. In some embodiments, curing temperatures may be raised stepwise, possibly with variable durations, e.g., the curing may be carried out stepwise at 30° C., 60° C., 90° C., two hours at each step. Optionally a final curing stage (e.g., at 130° C.) may be applied.

For example, green-fluorescent RBF compound in $Z_3$ ($F_1$TMOS) matrix was cured under different heat transport regimes: IR only (IR intensity 10%; 25 min on the conveyor moving at 0.1 m/min) dryer only (at consecutive 15 min steps of 30° C., 50° C., 70° C., 90° C., 110° C.) and a combination of IR followed by dryer, with a final curing of 24 h in an oven at 130° C. The samples maintained their emission peaks, FWHM (full width at half maximum) and QY, and exhibited the following reduction of emission intensity after eight days with respect to the initial intensity (measured by a fluorimeter): IR only—54%, dryer only—79%, IR and dryer—73%, showing the efficiency of the latter two methods.

The process may be further adjusted in various ways, as detailed above, to yield encapsulation or bonding of the RBF compound(s) 115 in the matrix which narrows the FWHM of the emission band by adjusting the micro-environment of the fluorescent molecules. The process may be monitored and optimized using any of quantum yield measurements, fluorescent measurements, photometric measurements, photostability (lifetime) testing and others.

Concerning display properties, it is noted that emission peaks may be related to the display hue property and the FWHM may be related to the display saturation property. The adjustment of the hue and saturation properties may be carried out by corresponding adjustments in one or more components of formulation 120 and/or in the film production process described above. It is further noted that additional display properties such as intensity/lightness and brightness/LED power may be adjusted with respect to the designed film properties.

Preparation and Measurement Details—Examples

The following illustrates some experimental procedures used to derive the results presented above (see FIG. 6A for overview). These procedures do not limit the application of the disclosed invention.

In a first example, film 130 was prepared by applying ten layers of formulation 120 with green-fluorescent RBF compound at a concentration of 0.1 mg/ml in the formulation, layer by layer, onto a transparent substrate and then applying two layers of formulation 120 with red-fluorescent RBF compound at a concentration of 0.05 mg/ml in the formulation, layer by layer, onto the former, green emitting layers. The inventors later found that the multiple green-fluorescent layers may be replaced by fewer or even a single layer when evaporation of the alcohols is carried out prior to the layer application. The evaporation of alcohols prior to the layer application may result in a denser sol-gel matrix which provides tight packaging of the RBF compound and accordingly may result in higher photostablity and therefor may reduce the number of layers. A comparison of the normalized intensity in a single color layer with and without evaporation can be seen in FIG. 7C.

FIG. 8A illustrates the resulting spectrum, having a first emission peak at 617±3 nm (red) and a FWHM of around 50 nm; and a second emission peak at 540±3 nm (green) and a FWHM of around 45 nm, according to some embodiments of the invention. The quantum yield of the film was measured by a fluorimeter having an integrating sphere to be around 70-90% depending on the RBF compound and the lifetime at the device level was estimated to be in the range of 20,000 to 50,000 hours. FIG. 8B illustrates the CIE 1931 color gamut diagram for the film, compared to NTSC and sRGB standards, according to some embodiments of the invention. As seen in the diagram, the color gamut range of film 130 in display 140 is larger than the standard LCD (sRGB) gamut and is in the range of the NTSC standard gamut.

In a second example, thirteen layers of green-fluorescent formulation were applied instead of ten layers as in the first example. FIG. 8C illustrates the resulting emission spectrum, according to some embodiments of the invention. The resulting change of spectrum is illustrated by comparing FIG. 8A for the film prepared in the first example with FIG. 8C for the film prepared in the second example. The relative intensity of the peak at around 550 nm attributed to the green light is higher in FIG. 8C in comparison to the relative intensity of the corresponding peak in FIG. 8A and thus demonstrates that the white point position may be tuned as desired by changing the structure of film 130, e.g., by adjusting the number of layers and/or concentration in formulation 120 of either RBF compound.

In a third example, consecutive layers of sol-gel formulation 120 were applied directly on light source 80 (in the non-limiting example, on blue light source 80A which emits at a wavelength range of about 400-480 nm) or in close proximity thereto. In the example, both green-fluorescent and red-fluorescent RBF compounds were mixed in formulation 120 and applied as film 130 comprising ten layers to blue LED light source 80A. Correspondingly, FIG. 8D illustrates the resulting emission spectrum, having a first emission peak at 621 nm (red) and a second emission peak at 512 nm (green), both peaks exhibiting a FWHM in the range of 40-50 nm (the peak at 450 nm corresponds to the light source blue emission), according to some embodiments of the invention.

In the third example, some embodiments of used red-fluorescent RBF compounds 115 were 5- and 6-Carboxy X-rhodamine-Silylated illustrated below. The illustrated derivative of RS-130 red RBF compound is a non-limiting example. Similar covalent binding of RBF compounds 115 to the sol-gel matrix may be achieved with other RBF compounds in similar ways.

from formulation 120 and its measured emission peak was 610±5 nm with FWHM of 50±5 nm, with the emission curve illustrated in FIG. 8E.

In a forth example, some embodiments of used red-fluorescent RBF compounds 115 were 5- and 6-Carboxy X-rhodamine-Silylated, illustrated above. In the example, precursor 110 was configured to covalently bind the RBF compounds to the sol-gel matrix. Epoxy silica ormosil solution 106 was prepared under either acidic or basic conditions, the former proving to be a better alternative.

5- and 6-Carboxy X-rhodamine-Silylated

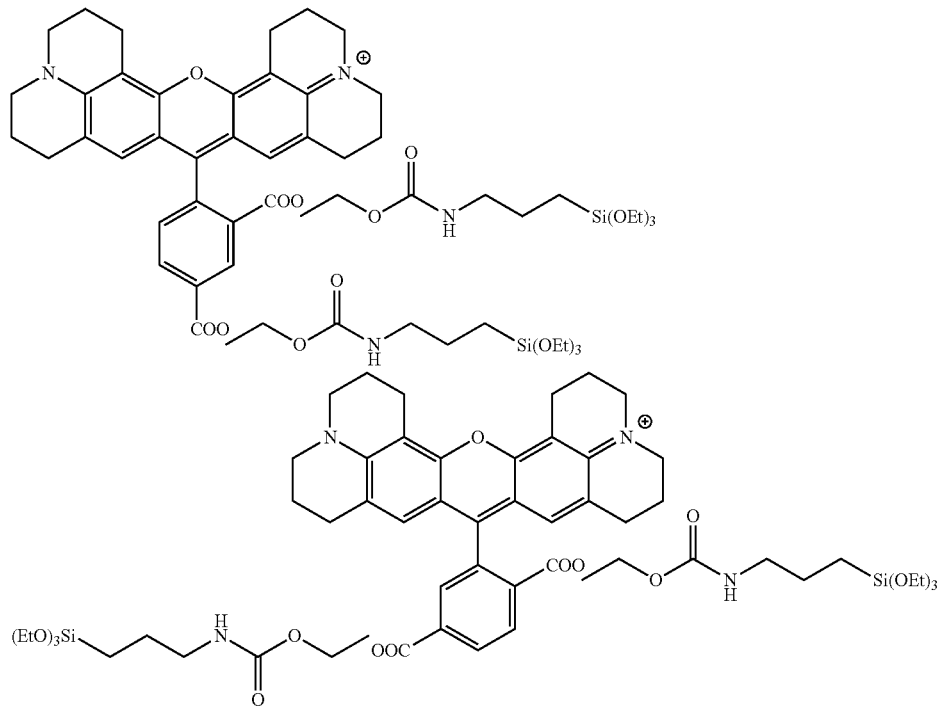

40

In the example, precursor 110 was configured to covalently bind the RBF compounds to the sol-gel matrix. Epoxy silica ormosil solution 106 was prepared by stirring over-night 3 mg of a mixture of the RBF compounds, 10 ml of ethanol and 3.6 ml of $H_2O$ to yield the epoxy silica ormosil solution. On the next day 3 ml of TEOS and 3 ml of MTMOS and 250 μl of acetic acid were added to the epoxy silica ormosil solution mixture, which was then stirred for 10-15 minutes. Finally, 4.8 ml of GLYMO were added to the mixture and stirred for two hours. Zirconia 93 (as a non-limiting example for transition metal(s) alkoxide matrix solution 103) was prepared by stirring together 10 ml of zirconium n-tetrapropoxide in propanol and 3 ml of acetic acid for 10 minutes. 3.3 ml of acetic acid in $H_2O$ (1:1 ratio) and 20 ml of isopropanol were added to the mixture and stirred for another 10 minutes. Nanoparticles powder 109 was prepared by refluxing of 90 mg of 3-isocyanato propyl functionalized silica nanoparticles and 32 μl of ethylene-glycol in chlorobenzene for two hours. The ethylene glycol functionalized nanoparticles were separated from the chlorobenzene by an evaporator. Precursor 110 was prepared by mixing the nanoparticles powder with 8 ml of the epoxy silica ormosil solution and 4 ml of $ZrO_2$ solution. The final concentration of the (red-fluorescent) RBF compounds in formulation 120 was 0.08 mg/ml. The mixture was stirred for over one hour and then filtrated. Film 130 was prepared Under acidic conditions, 4.9 mg of a mixture of the RBF compounds, 10 ml of ethanol, 3.6 ml of $H_2O$ and 125 μl of acetic acid were stirred over-night to yield the epoxy silica ormosil solution. Alternatively, under basic conditions, 9.6 mg of the RBF compounds, 10 ml of ethanol, 3.41 ml of $H_2O$ and 242 μl of ammonium hydroxide 28% were stirred over-night to yield the epoxy silica ormosil solution, and on the next day, 125 μl of acetic acid were added to counteract the ammonium hydroxide. In either case, on the next day 3 ml of TEOS and 3 ml of MTMOS and 125 μl of acetic acid were added to the epoxy silica ormosil solution mixture, which was then stirred for 10-15 minutes. Finally, 4.8 ml of GLYMO were added to the mixture and stirred for two hours. Zirconia 93 (as a non-limiting example for transition metal(s) alkoxide matrix solution 103) was prepared by stirring together 10 ml of zirconium n-tetrapropoxide in propanol and 3 ml of acetic acid for 10 minutes. 3.3 ml of acetic acid in $H_2O$ (1:1 ratio) and 20 ml of isopropanol were added to the mixture and stirred for another 10 minutes. Nanoparticles powder 109 was prepared by refluxing of 90 mg of 3-isocyanato propyl functionalized silica nanoparticles and 32 μl of ethylene-glycol in chlorobenzene for two hours. The ethylene glycol functionalized nanoparticles were separated from the chlorobenzene by an evaporator. Precursor 110 was prepared by mixing the Nanoparticles powder with 8 ml of the epoxy silica ormosil solution and 4 ml of ZrO$_2$ solution. The final concentration of the RBF compounds in formulation 120 was 0.13 mg/ml when prepared under acidic conditions and 0.46 mg/ml when prepared under basic conditions. The mixture was stirred for over one hour and then filtrated.

Cross-Linking with PMMA (Poly(Methyl Methacrylate))

Some embodiments comprise fluorescent compounds which are bond to PMMA and have Si linkers to bond the PMMA-bonded compounds to the sol-gel matrix.

The following non-limiting examples illustrate binding RBF compounds to PMMA by showing the preparation of RBF compound ES-87 and cross-linking it with PMMA and linker of Si to be bonded to the sol-gel matrix. ES-86 was prepared as a precursor by dissolving 3-bromopropanol (0.65 ml, 7.19 mmol, 1 eq) in dry DCM (dichloromethane) under N$_2$ atmosphere. NEt$_3$ (0.58 ml, 7.91 mmol, 1.1 eq) was added and the mixture was cooled to 0° C. Acryloyl chloride (1.1 ml, 7.19 mmol, 1 eq) was added dropwise and the mixture was heated to room temperature and stirred at this temperature for 2 hours. Upon completion, the mixture was quenched with 0.4 ml MeOH, diluted with DCM and was washed with saturated NaHCO$_3$. The organic layer was separated, dried with Na$_2$SO$_4$, filtered and the solvent was removed under reduced pressure. The crude product was purified by column chromatography (SiO$_2$, 10% EtOAc/n-hexane) to give the product as a colorless oil (943 mg, 68% yield).

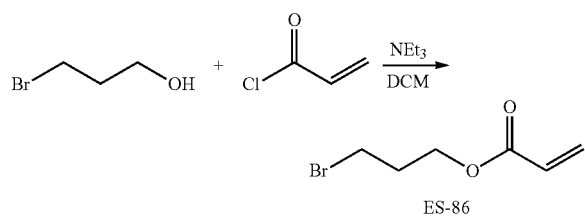

ES-87 was then prepared by dissolving RS-106 (see below, 150 mg, 0.26 mmol, 1 eq) in 3 ml dry DMF (dimethylformamide) under N$_2$ atmosphere. K$_2$CO$_3$ (55 mg, 0.4 mmol, 1.5 eq) was added and the mixture was stirred for 5 minutes before ES-86 (154 mg, 0.8 mmol, 3 eq) was added. The mixture was stirred for 3 hours at room temperature. Upon completion, the mixture was diluted with DCM and was washed with brine. The organic layer was separated, dried with Na$_2$SO$_4$, filtered and the solvents were removed under reduced pressure. The crude product was purified by column chromatography (SiO$_2$, DCM to 10% MeOH/DCM) to give the product as a blue powder (147 mg, 75% yield).

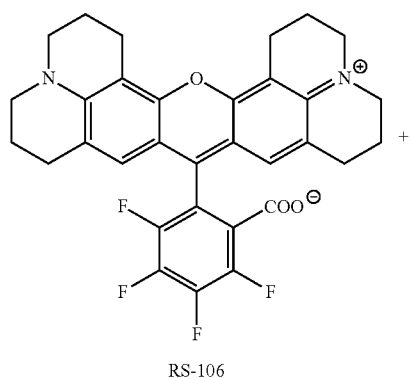

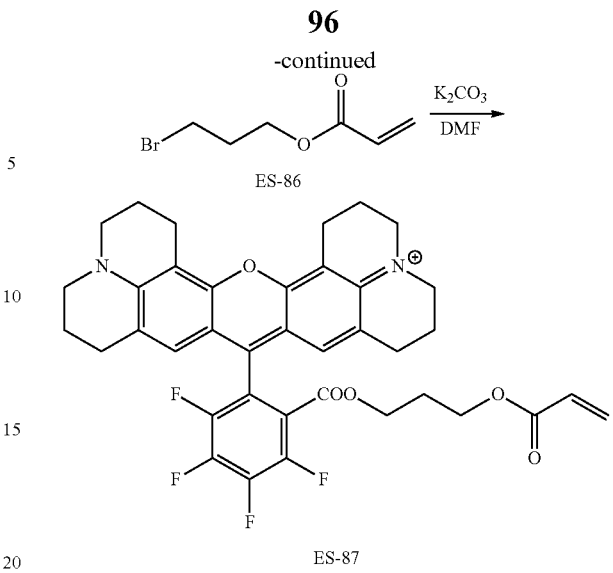

ES-87 was used to prepare cross-linked dyes as explained below in three non-limiting examples.

ES-91 was prepared by charging a 50 ml round-bottom flask with dry EtOH (9 ml) and N$_2$ was bubbled through for 20 min. Methyl methacrylate (0.3 ml, 2.8 mmol, 1 eq), ES-87 (4 mg, 0.0056 mmol, 0.002 eq) and AIBN (azobisisobutyronitrile, 10 mg, 0.056 mol, 0.02 eq) were added and N$_2$ was bubbled through for 10 minutes. The reaction mixture was heated to reflux under N$_2$ atmosphere for 24 h. Upon completion, the mixture was cooled to room temperature and was evaporated to dryness under reduced pressure. The crude product was dissolved in 3 ml of DCM and then was added dropwise to 50 ml of n-hexane. The precipitate was filtered and the purification process was repeated again to give the product as a blue powder.

ES-99 was prepared by charging a 50 ml round-bottomed flask with dry EtOH (9 ml) and N$_2$ was bubbled through for 20 min. Methyl methacrylate (0.3 ml, 2.8 mmol, 1 eq), 3-methacryloxypropyl trimethoxysilane (34 µl, 0.14 mmol, 0.05 eq), ES-87 (8 mg, 0.01 mmol, 0.002 eq) and AIBN (10 mg, 0.056 mmol, 0.02 eq) were added and N$_2$ was bubbled through for 10 minutes. The reaction mixture was heated to reflux under N$_2$ atmosphere for 24 hours. Upon completion, the mixture was cooled to room temperature and was evaporated to dryness under reduced pressure. The crude product was dissolved in 3 ml of DCM and then was added dropwise to 50 ml of n-hexane. The precipitate was filtered and the purification process was repeated again to give the product as a blue powder.

Figure 9:
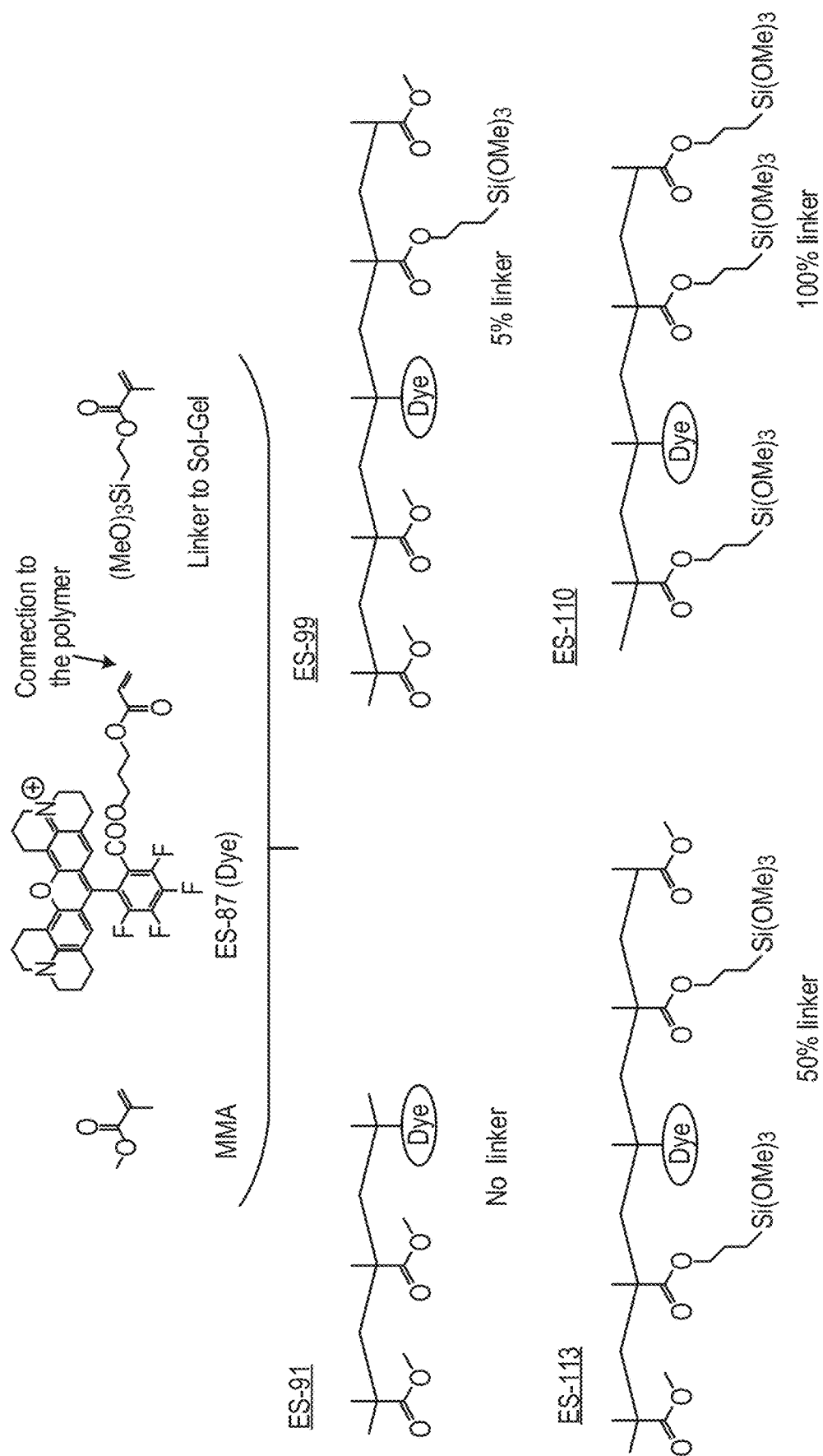
FIG. 9 schematically illustrates some embodiments of PMMA (poly-methyl-methacrylate) cross-linked dyes, according to some embodiments of the invention.
Figure 10A:
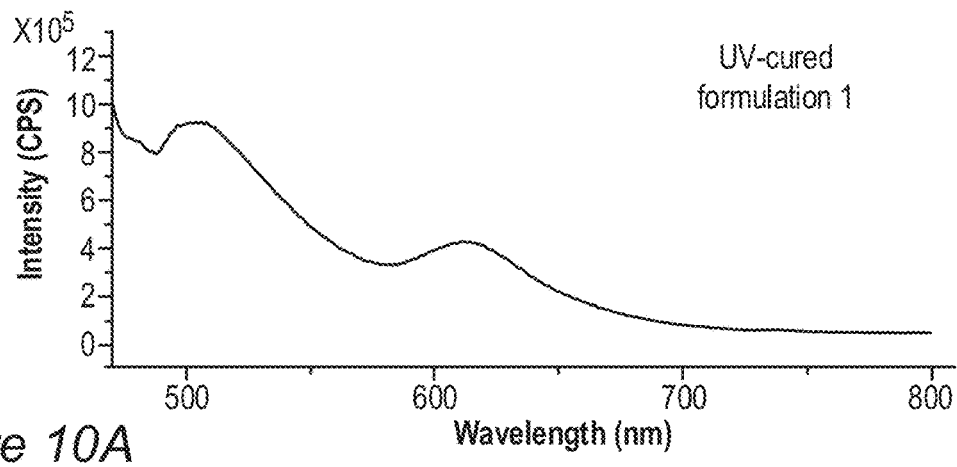
FIGS. 10A-10D, 11A-B, 12A-C, and 13A-D illustrate examples of emission results of films produced by UV curing processes, according to some embodiments of the invention.
Figure 10B:
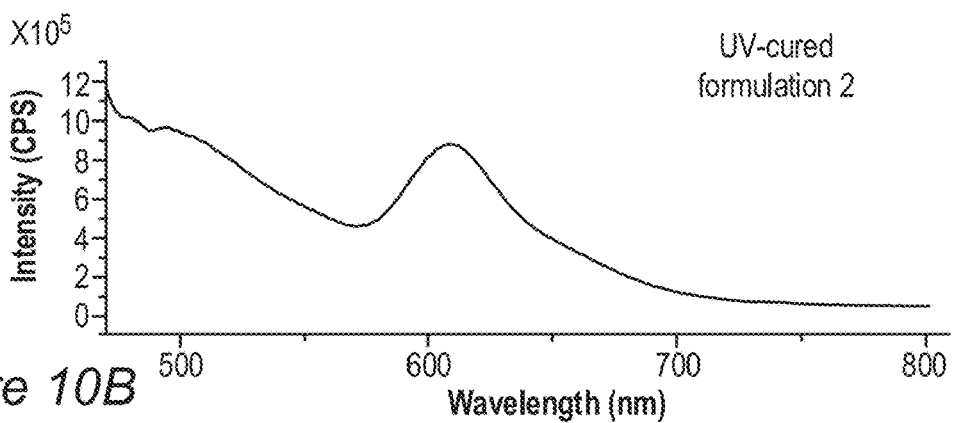
Figure 10C:
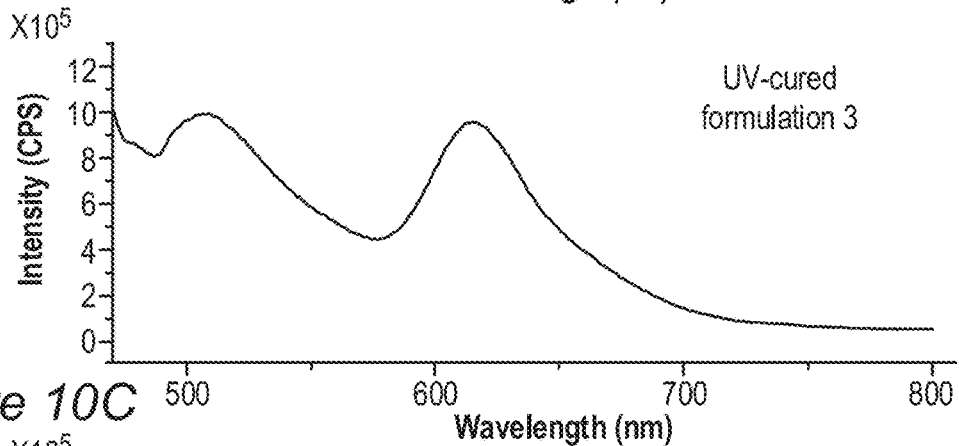
Figure 10D:
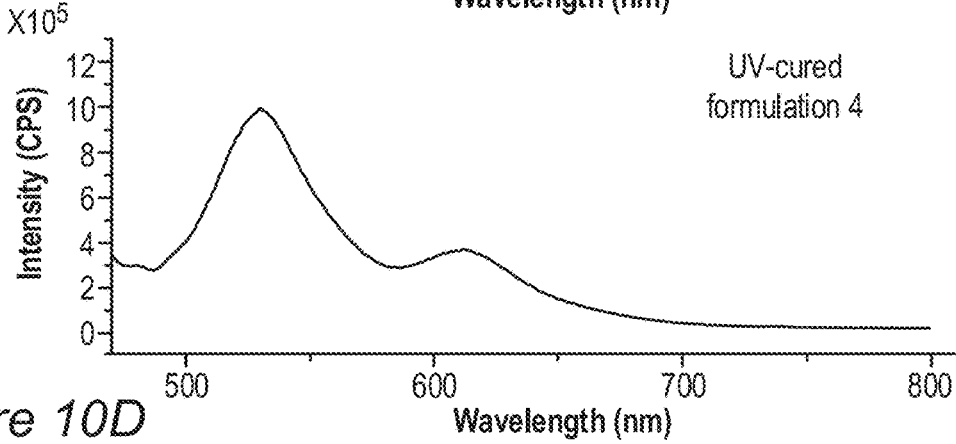

ES-113 and ES-110 were prepared similarly to ES-99, but using higher concentration of the linker 3-methacryloxypropyl trimethoxysilane, namely 50% and 100% linker respectively, compared with 5% in ES-99. FIG. 9 schematically illustrates some embodiments of PMMA cross-linked dyes, according to some embodiments of the invention.

Protective Films

Some embodiments comprise applying a protective film 131 to color conversion film 130 and/or configuring color conversion film 130 to have protective properties which prevent humidity damages and cracking. Any type of color conversion film 130 may be protected and/or enhanced as described in the following, e.g., RBF-compounds-based films 130 as well as films 130 based on other organic or inorganic fluorescent molecules and quantum-dot-based color conversion films 130.

For example, protective film 131 may be formed using zirconium-phenyl siloxane hybrid material (ZPH), a transparent, clear and flexible polymer, based on the description in Kim et al. 2014 ("Sol-gel derived transparent zirconium-phenyl siloxane hybrid for robust high refractive index led encapsulant", ACS Appl. Mater. Interfaces 2014, 6, 3115-3121), with the following modifications, found by the inventors to isolate films 130 from the surroundings, provide the film with mechanical support and prevent cracks.

ZPH is a silica based polymer gel, cured in hydrosilylation addition reaction. The polymer comprises two resin components: HZPO (a Si—H functionalized silica) and VZPO (a vinyl functionalized silica). Both components are synthesized in a sol-gel reaction separately and then mixed in the proper ratio into formulation 120 and cured to yield a semi-solid form. HZPO was mixed from 3.2 ml Methyldiethoxysilane (MDES), 6.5 g diphenylsilanediol (DPSD) and 25 mg amberlite IRC76 for 1 hour at 100° C. and then, while stirring, 673 µL zirconium propoxide (ZP) 70% in 1-propanol was added slowly and the reaction continued overnight. VZPO was mixed from 3.1 g vinyltrimethylsilane (VTMS), 4.4 g DPSD and 7.7 mg barium hydroxide monohydrate in 0.86 ml p-xylene at 80° C. and then, while stirring, ZP was added slowly, with the reaction time being four hours. ZPH was prepared by mixing VZPO and HZPO in a ratio of 1:1 mol/mol and 10 ml of a platinum catalyst was added to the viscous liquid, which was then stirred vigorously for one minute and applied on the substrate using a coating rod. Protective film 131 was inserted into the oven in 150° C. for three hours for curing.

Additional examples for protective films 131 include using polymerized MMA (methyl-methacrylate) as protection, by allowing MMA to diffuse into the sol-gel pores. Color conversion films 130 may be coated with additional MMA monomers that penetrate the sol-gel pores and then polymerize inside, thereby improving the life time of film 130. The preparation procedure may be modified to provide such polymerization conditions.

Some embodiments comprise using a trimethoxysilane derivative as coating, e.g., an R-TMOS coating with R being e.g., phenyl, methyl, $CH_2CH_2CF_3$ or other groups, with proper process adaptations which provide the coating conditions for forming protective film 131 and/or protective characteristics of film 130.

Some embodiments comprise using an epoxy silica ormosil solution layer as protective coating 131, such as an epoxy silica ormosil solution with no dye as protective layer 131 applied on cured film 130. Other protective coatings 131 of film 130 may comprise an acetic anhydride surface treatment derived from acetic acid with ending —OH groups changed to —Ac groups to enhance life time and/or chlorotrimethoxysilane protective layer 131 having endings with —OH groups modified to -trimethylsilane to enhance life time.

In certain embodiments, disclosed protective films 131 may be used in a range of applications for protecting respective films from humidity and mechanical damages. For example, disclosed protective films 131 may be used to coat various plastic films (made of e.g., PEI (polyethylenimine), acrylic polymers, polycarbonate, PET, PDMS (polydimethylsiloxane) and related siloxanes, as well as other polymers), glass and metals/metal oxide films or surfaces (e.g., of copper, silicon, silicon oxides, aluminum, titanium and other transition metals and their oxides). Protective films 131 may be configured to have corresponding good adhesion to the respective films.

In some embodiments, protective films 131 may be used to coat diffusers, polarizers, glasses or any other film that needs temperature and humidity protection (e.g., up to 85° C., 95% relative humidity).

In some embodiments, protective films 131 and/or formulations thereof may be used as fillers in porous films.

UV Curing Processes

UV curing processes may be used additionally or in place of sol-gel processes to provide the color conversion films. Formulations without and with rhodamine-based fluorescent compounds, films, displays and methods are provided, in which the fluorescent compounds are stabilized and tuned to modify display backlight illumination in a manner that increases the display's efficiency and widens its color gamut. UV cured formulations may be used to provide fluorescent films that may be applied in various ways in the backlight unit and/or in the LCD panel and improve the display's performance. The formulation, curing process and film forming procedures may be optimized and adjusted to provide a high photostability of the fluorescent compounds and narrow emission peaks of the backlight unit.

In certain embodiments, the sol-gel process may be replaced by a UV curing process, with respect to some or all layers of film 130. Similar or different RBF compounds 115 may be used in UV cured layers, such as RBF compounds disclosed above, and films 130 produced by UV curing may replace (or complement) films 130 (or layers 132 and/or 134) produced by the sol-gel processes in the configurations of backlight unit 142 and display 140 which are illustrated in FIGS. 2A-2E and the related disclosure. Other organic or inorganic fluorescent dyes as well as quantum dots may be embedded in disclosed UV cured films 130 or modifications thereof as well. Also, configurations of film 130 disclosed above in relation to display configurations, polarizing films and red enhanced films may be implemented with UV cured films 130 or layers 132, 134. In the following, examples for applicable UV processes are presented.

In some embodiments, UV curing is advantageous due to the wide range of UV curable materials, which provide an opportunity to create polymeric matrices which are compatible with the incorporated dyes, such as RBF compounds 115. In order to achieve maximal life time and QY, the structure and the crosslinking density may be optimized and the interaction between the dye and the matrix may be minimized. The use done in UV curing of highly reactive components may significantly reduce the amount of non-crosslinked material even at low UV exposure and short retention time—thereby enabling to minimize damage to the dye molecules while providing required matrices for the dye, e.g., matrices which provide high photostability, narrow FWHM (e.g., 40-60 nm) and high QY in the green and red regions (e.g., due to less occupied vibration levels), for RBF compounds 115 or other fluorescent molecules). The crosslinking degree may be optimized per dye material in order to obtain high QY (too much cross linking may degrade the QY).

Various examples are presented below for formulations 120 which are then UV cured after being applied to transparent PET (polyethylene terephthalate) substrate or diffuser films (PET coated with PMMA coating) by drawing using coating rods for providing films with widths ranging 20-100µ which are then irradiated once under "H" UV lamp at conveyor speed 2-7 m/min. Color conversion films 130 may comprise multiple layers which may be applied one on top of the other. Resulting color conversion films 130 (or protective films 131, see below) may be used as explained above by themselves or in combination with films 130 produced by sol-gel processes 200. Formulations 120 for UV cured films 130 may comprise RBF compounds 115 as described above. Life times of fluorescent dyes in UV cured matrix are different for different dyes and depend on the cured formulation and on the curing conditions. Generally, the stability of RBF compounds 115 under continued blue light excitation provides a long life time.

UV cured films 130, in particular UV cured color conversion films 130, may be prepared from formulations 120 comprising 65-70% monomers, 25-30% oligomers, and 1-5% photoinitiator; as well as color conversion elements such as RBF compounds at low concentration (e.g., 0.005-0.05%), in weight percentages of the total formulation. Following are non-limiting examples for such formulations 120, which are UV cured to yield respective films 130.

Some examples comprise formulations 120 being a mixture of the ingredients listed in Table 2, such as the five specific formulations presented as non-limiting examples. The liquid photoinitiator blend used, in a non-limiting manner, was GENOCURE* LTM liquid photoinitiator blend for UV-curable inks, coatings and adhesives, which has good absorption between 350 and 400 nm.

Formulations 1 and 2 were prepared by mixing all the ingredients, except the respective dyes, at a temperature of 50° C. and cooling the mixture to room temperature. Mixing of formulation 3 was performed without heating. Then the respective dye was added and sonication was used to dissolve the dye into formulation 120. Formulation 4 was prepared by mixing and sonication of a first part with rhodamine 110 and a second part with JK-32. Each part was prepared like formulations 1 and 2. The samples were applied to transparent PET substrate by drawing using a coating rod to 100 μm and irradiated once under H UV lamp at conveyor speed 2-5 m/min. Formulation 5 was prepared by mixing all the ingredients, except ES-61, at a temperature of 50° C. and cooling the mixture to room temperature. Then ES-61 was added and the mixture was sonicated until the dye was dissolved. The sample was applied to the back side of diffuser 144 (of backlight unit 142) by drawing using an 80 μm coating rod (indicating a nominal thickness number, the actual coating thickness depends on the chemical properties of the coating compounds such as viscosity), and irradiated once under H UV lamp at conveyor speed of 7 m/min. QY measurements were carried out using an integrating sphere coupled to a fluorimeter (the error margin was about 5%). Resulting QY's were 52% at 616 nm, 55% at 609 nm, 51% at 616 nm, 53% at 529 and 611 nm, and 71% at 624 nm for formulations 1-5, respectively. The FWHM of all formulations ranged between 40-60 nm. FIGS. 10A-10D illustrate the emission spectra of formulations 1-4, respectively, according to some embodiments of the invention.

Figure 11A:
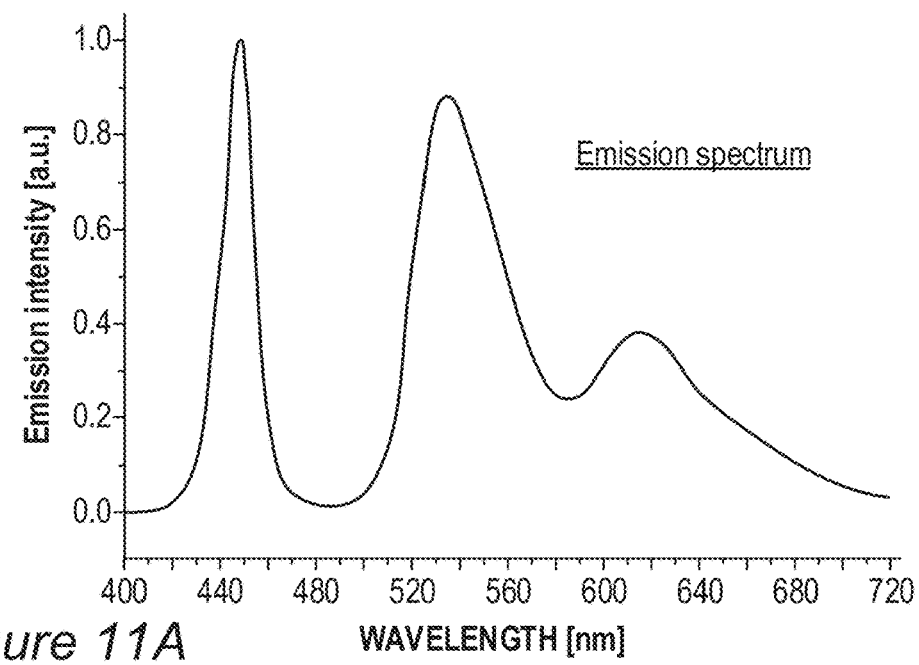
Figure 11B:
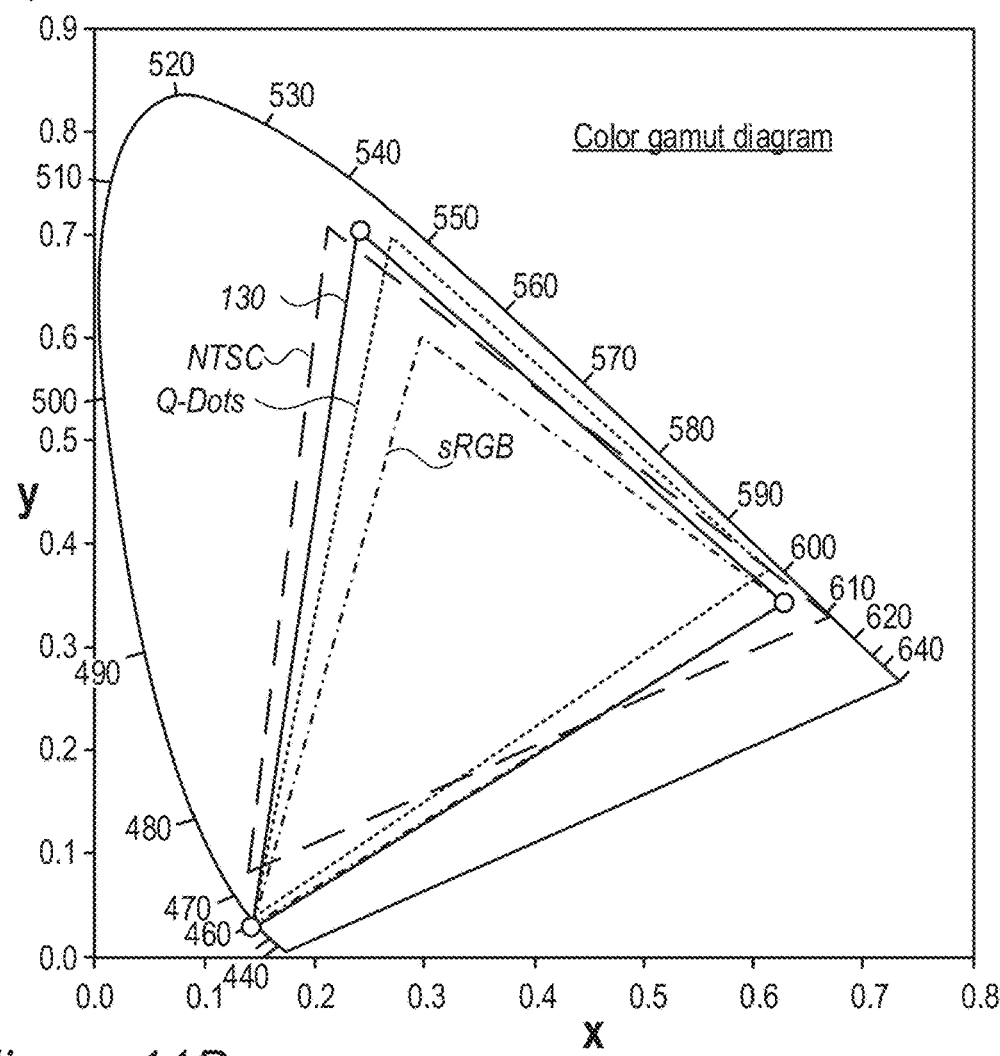

The produced films may be combined and optimized to form film 130, for example a non-limiting example of film 130 was optimized to operate with a blue backlight source 80A of about 10 mW/cm$^2$ of optical power and provided a red emission peak at 616 nm with FWHM of 60 nm and a green emission peak at 535 nm with FWHM of 45 nm, with a white point at (0.30, 0.27) CIE 1931 coordinates (white point adjustment may also be carried out as disclosed above). FIGS. 11A-11B illustrate the emission spectrum of film 130 and its color gamut with respect to sRGB, NTSC and a quantum-dots-based display, according to some embodiments of the invention. The color gamut provided by film 130 is similar to the color gamut defined by NTSC.

Formulations 1-5 are shown with red fluorescent RBF compounds and may be used as red-enhancing films 130 in

TABLE 2

UV cured formulations.

| Ingredient | Formulation number and w/w % in the formulation | | | | |
| --- | --- | --- | --- | --- | --- |
| | 1 | 2 | 3 | 4 | 5 |
| Monomers | | | | | |
| DPGDA (dipropylene glycol diacrylate) | | 17.4 | | | |
| Ditrimethylolpropane tetraacrylate | 28.3 | | | 27.6 | 28.3 |
| Dipentaerythritol hexaacrylate | 22.2 | 22.2 | 24.7 | 24.1 | 22.2 |
| Ethoxylated pentaerythritol tetraacrylate | | | 27.8 | | |
| Propoxylated (3) glyceryl acrylate | 16.1 | | 15.6 | 15.7 | 16.2 |
| TMPTA (Trimethylolpropane triacrylate) | | 27.5 | | | |
| Oligomers | | | | | |
| Polyester acrylate | | | | 27.4 | |
| Modified polyester resin diluted with dipropyleneglycol diacrylate | | 27.9 | | | |
| Aliphatic urethane hexaacrylate | 28.4 | | 26.9 | | 28.3 |
| Photoinitiators | | | | | |
| Alpha-hydroxy-cyclohexyl-phenyl-ketone | 4.9 | | | | |
| Difunctional alpha-hydroxy ketone | | 4.9 | | 5.1 | 5.1 |
| Liquid photoinitiator blend | | | 5.1 | | |
| Dyes | | | | | |
| RBF compounds JK-32 or RS56 | 0.036 | | 0.042 | 0.017 | |
| Dye rhodamine 110 | | | | 0.016 | |
| Dye rhodamine 101 inner salt | | 0.029 | | | |
| RBF compound ES-61 | | | | | 0.008 | displays with white light source 80B—as illustrated in FIGS. 5A and 5B which were discuss in detail above.

Figures 12A, 12C:
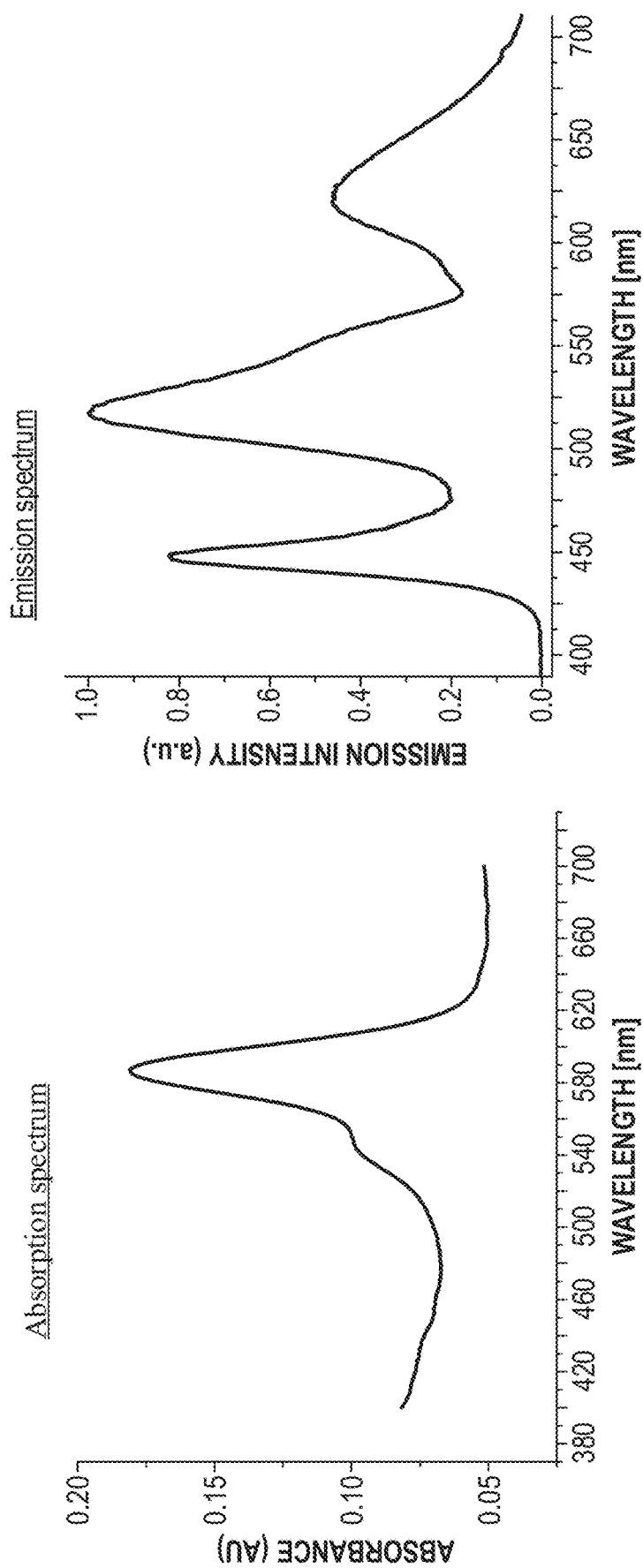

FIGS. 12A and 12C illustrate examples for absorption and emission spectra, respectively, of displays 140 with red-fluorescent RBF compound(s) films 130, according to some embodiments of the invention. Film(s) 130 may be used e.g., to red-enhance white LED displays as disclosed above under the section titled "Red enhancement" and FIGS. 5A and 5B. The absorption spectrum of film(s) 130 with red-fluorescent RBF compound(s) 115 has significant absorption in yellow region 80B-Y (550-600 nm) and the fluorescent spectrum of film(s) 130 with red-fluorescent RBF compound(s) 115, using YAG-based LEDs 80B (YAG—yttrium aluminum garnet, $Y_3Al_5O_{12}$) and measured after an LCD color display, shows the distinct peaks at the transmission regions of the RGB filters.

Figure 12B:
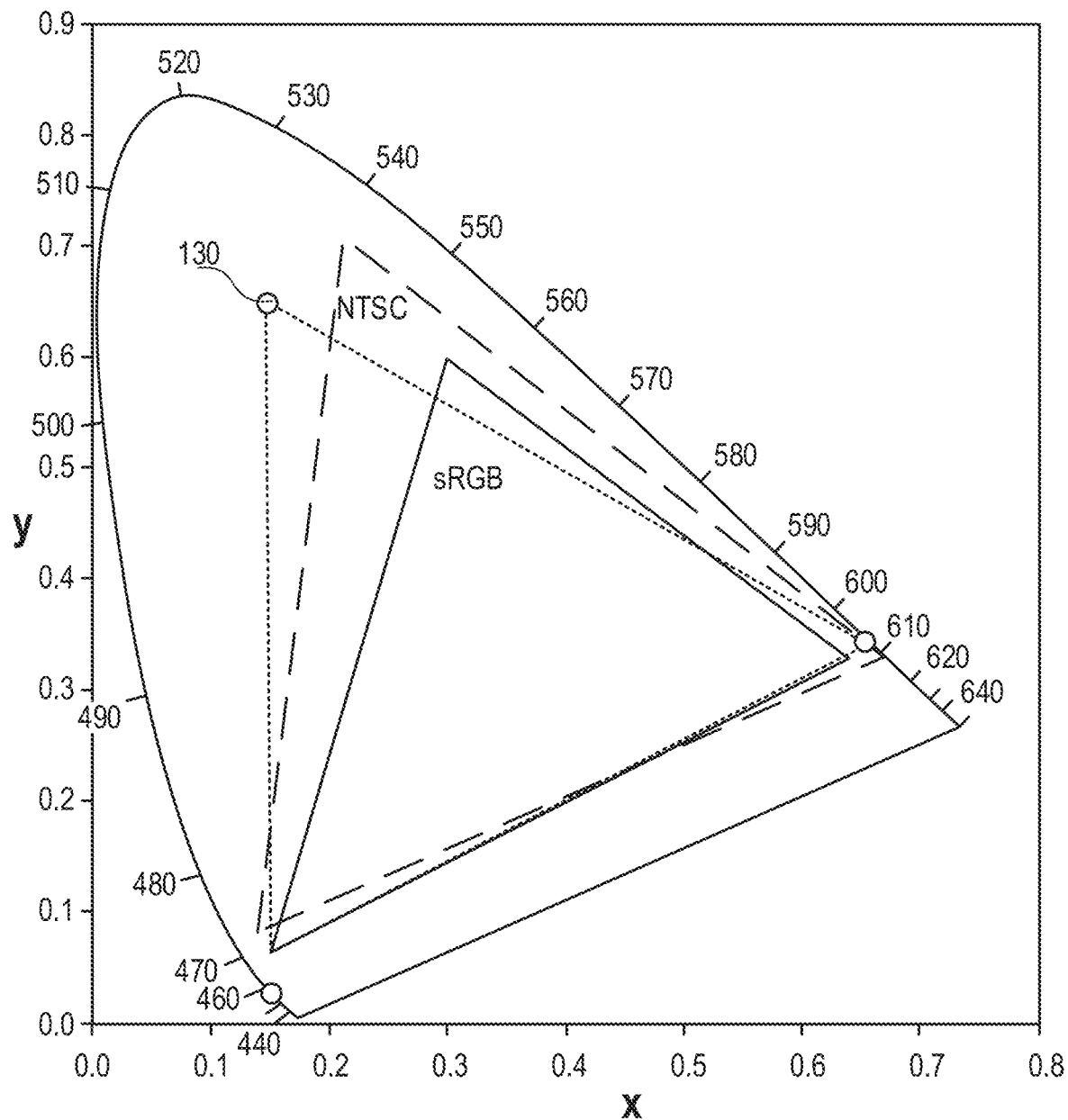
Figure 13A:
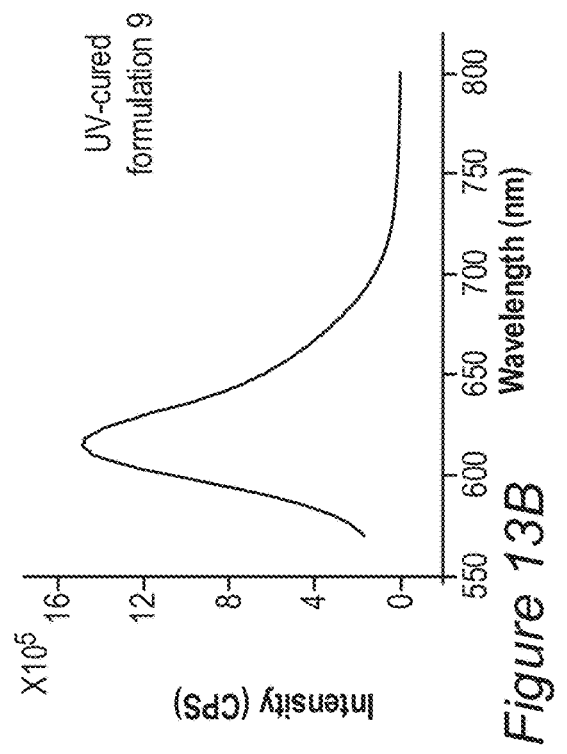
Figure 13B:
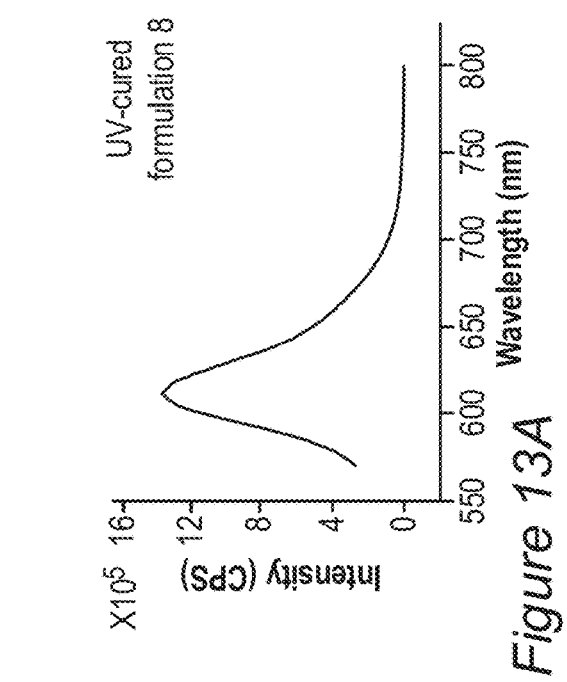
Figure 13C:
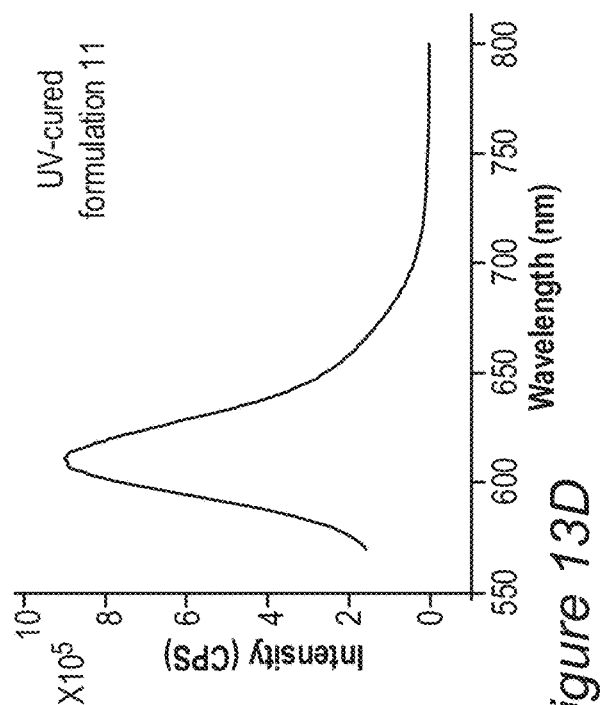
Figure 13D:
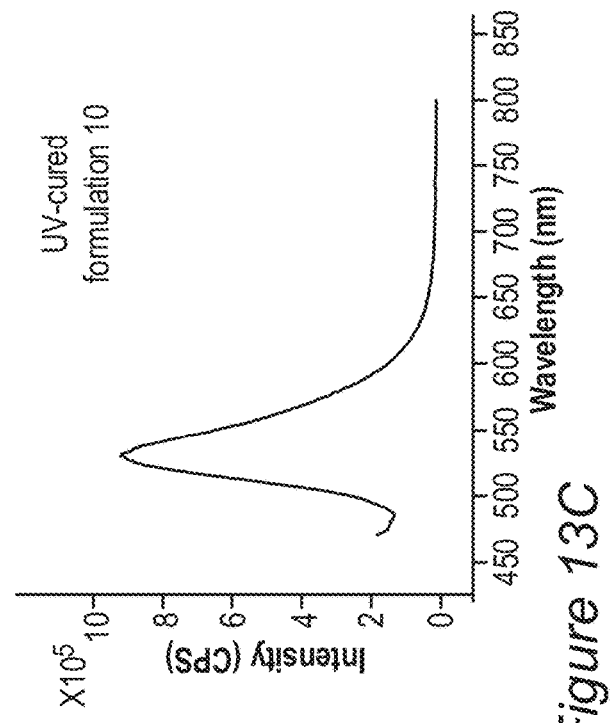

FIG. 12B illustrates an example for a color gamut diagram of displays 140 with red-fluorescent RBF compound(s) films 130, according to some embodiments of the invention. Compared to prior art gamuts such as indicated by sRGB (LCD) and NTSC ("National Television System Committee") standards, the gamut of disclosed display 140 is wider and extends into regions which are not represented by prior art displays, thereby providing better color representation. In particular is the gamut range of disclosed display 140 larger than sRGB in the green and in the red regions. Moreover, as disclosed herein, the tunability of the spectral range of RBF compound(s) 115 in films 130 by controlling the sol-gel process (e.g., by adjusting silane precursors 104) may be used to extend the color gamut even further, to the wavelength region beyond 540 nm to 530 nm or over 520 nm, providing even wider gamuts.

In some embodiments, green fluorescent RBF compounds may be added to these formulations or may be applied in separate formulations to form films added to red fluorescent films.

Some additional examples comprise formulations 120 being a mixture of the ingredients listed in Table 3, such as the five specific formulations presented as non-limiting examples.

TABLE 3

UV cured formulations.

| Ingredient | Formulation number and w/w % in the formulation | | | | | |
|---|---|---|---|---|---|---|
| | 6 | 7 | 8 | 9 | 10 | 11 |
| Monomers | | | | | | |
| DPGDA | | | 17.0 | | | |
| Ditrimethylolpropane tetraacrylate | 28.3 | | | 28.3 | 28.3 | 28.3 |
| Dipentaerythritol hexaacrylate | 22.2 | 22.2 | 22.0 | 22.2 | 22.2 | 22.2 |
| Ethoxylated pentaerythritol tetraacrylate | | 28.3 | | | | |
| Propoxylated (3) glyceryl acrylate | 16.2 | 16.2 | | 16.2 | 16.2 | 16.2 |
| TMPTA | | | 28.0 | | | |
| Oligomers | | | | | | |
| Polyester acrylate | | | | | 28.3 | 28.3 |
| Modified polyester resin diluted with dipropyleneglycol diacrylate | | | | 28.0 | | |
| Aliphatic urethane hexaacrylate | 28.3 | 28.3 | | | | 28.3 |
| Photoinitiators | | | | | | |
| Alpha-hydroxy-cyclohexyl-phenyl-ketone | 5.0 | | | | | 5.0 |
| Difunctional alpha-hydroxy ketone | | | | 5.0 | 5.0 | 5.0 |
| Liquid type 1 photoinitiator blend | | 5.0 | | | | |
| Dyes | | | | | | |
| RBF compound JK-32 | 0.03 | | 0.03 | 0.03 | | |
| RBF compound RS56 | | 0.04 | | | | |
| RBF compound JK-71 | | | | | 0.03 | |
| RBF compound RS-106 | | | | | | 0.02 |

Formulation 6 was prepared by mixing all the ingredients, except JK32, at a temperature of 50° C. and cooling the mixture to room temperature. Then JK32 was added and sonication was used to dissolve it. The samples were applied to the back side of diffuser 144 at a layer 60μ thick using a coating rod and irradiated once under H UV lamp at conveyor speed 2 m/min. Formulation 7 was prepared by mixing all the ingredients, except RS56, at a temperature of 50° C. and cooling the mixture to room temperature. Then RS56 was added and sonication was used to dissolve it. The samples were applied to a transparent PET substrate at a layer 60μ thick using an 80 μm coating rod and irradiated once under H UV lamp at conveyor speed 2 m/min. Formulations 8 and 9 were prepared by mixing all the ingredients, except JK32, at a temperature of 50° C. and cooling the mixture to room temperature. Then JK32 was added and sonication was used to dissolve it. The samples were applied to the back side of diffuser 144 at a layer 60μ thick using a coating rod and irradiated once under H UV lamp at conveyor speed 2 m/min. Formulations 10 and 11 were prepared similarly to formulations 8 and 9, with respect to JK-71 and RS-106, respectively in place of JK-32.

Film 130 made from formulation 6 had a QY of 49%, emission peak at 615 nm and a lifetime prolonging factor of ×5 (see Table 1 for comparison to films 130 prepared by sol-gel processes). Film 130 made from formulation 7 had a QY of 57%, emission peak at 616 nm and a lifetime prolonging factor of ×8. FIGS. 13A-13D illustrate the emission spectra of films 130 produced from formulations 8-11, according to some embodiments of the invention.

Formulations 6-9 and 11 are shown with red fluorescent RBF compounds and may be used as red-enhancing films 130 in displays with white light source 80B. In some embodiments, green fluorescent RBF compounds may be added to these formulations or may be applied in separate formulations to form films added to red fluorescent films.

Formulation 10 is shown with green fluorescent RBF compounds and may be used as green-enhancing films 130. In some embodiments, red fluorescent RBF compounds may be added to this formulation or may be applied in separate formulations to form films added to green fluorescent films.

Protective Films

Some embodiments comprise applying a protective film 131 to color conversion film 130 and/or configuring color conversion film 130 to have protective properties which prevent humidity damages and cracking. Any type of color conversion film 130 may be protected and/or enhanced as described in the following, e.g., RBF-compounds-based films 130 as well as films 130 based on other organic or inorganic fluorescent molecules and quantum-dot-based color conversion films 130.

For example, UV cured protective film 131 may be formed using a mixture of 3,4-epoxycyclohexylmethyl 3,4-epoxycyclohexanecarboxylate, triarylsulfonium hexafluoroantimonate salts, mixed-50 wt % in propylene carbonate, polyether modified polydimethylsiloxane and 3-ethyloxetane-3-methanol, which is UV cured on a conveyor.

In another example, UV cured protective film 131 may be formed by mixing 76.8% 3,4-epoxycyclohexylmethyl 3,4-epoxycyclohexanecarboxylate, 19.2% trimethylolpropane (TMP) oxetane (TMPO), 3.8% triarylsulfonium hexafluoroantimonate salts, mixed-50 wt % in propylene carbonate and 0.2% polyether-modified polydimethylsiloxane (in this order) and stirring the mixture at room temperature. The sample was applied to a sol-gel layer (e.g., color conversion film 130 produced by a sol-gel process disclosed above) by drawing using a coating rod to form a 50 μm layer and then irradiated once under H UV lamp at conveyor speed 7 m/min. The sol-gel layer was cleaned with ethanol and air dried before coating.

Spectrum Enhancement and Shaping

Figures 14D, 14E, 14F:
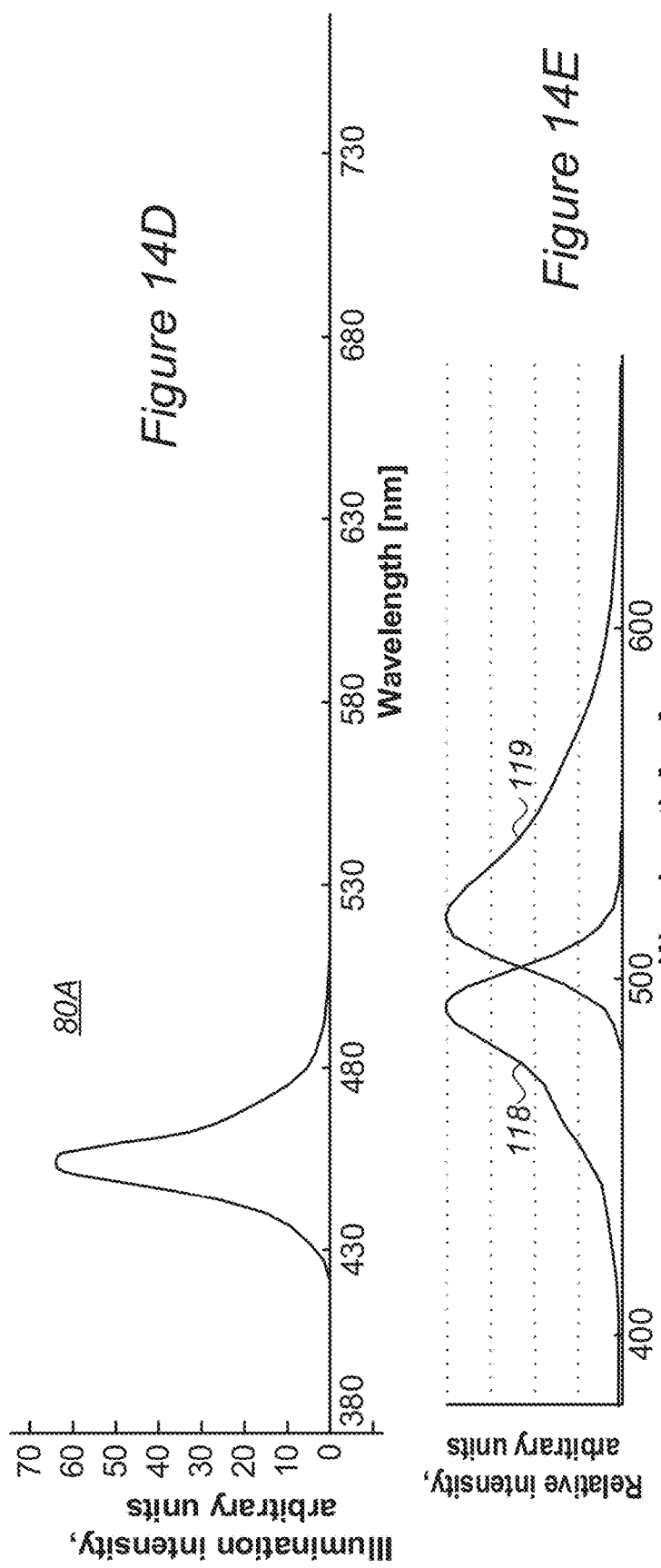
Figure 14G:
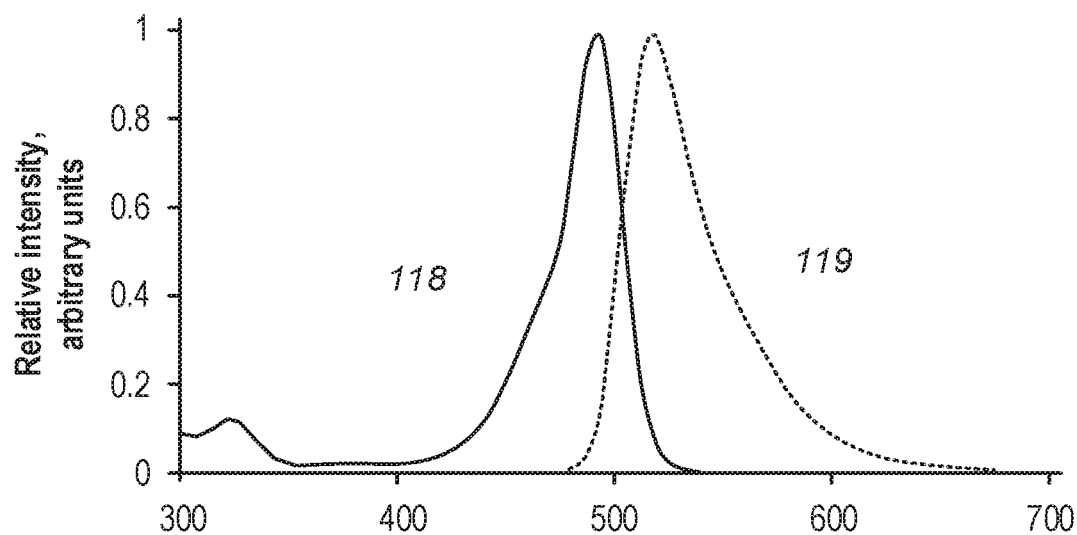
Figure 14H:
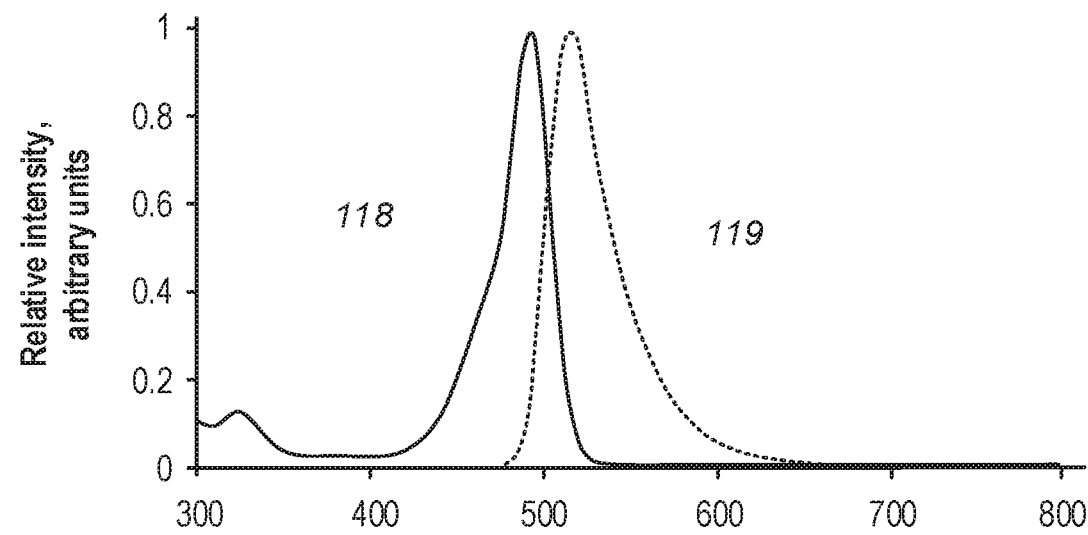
Figure 14I:
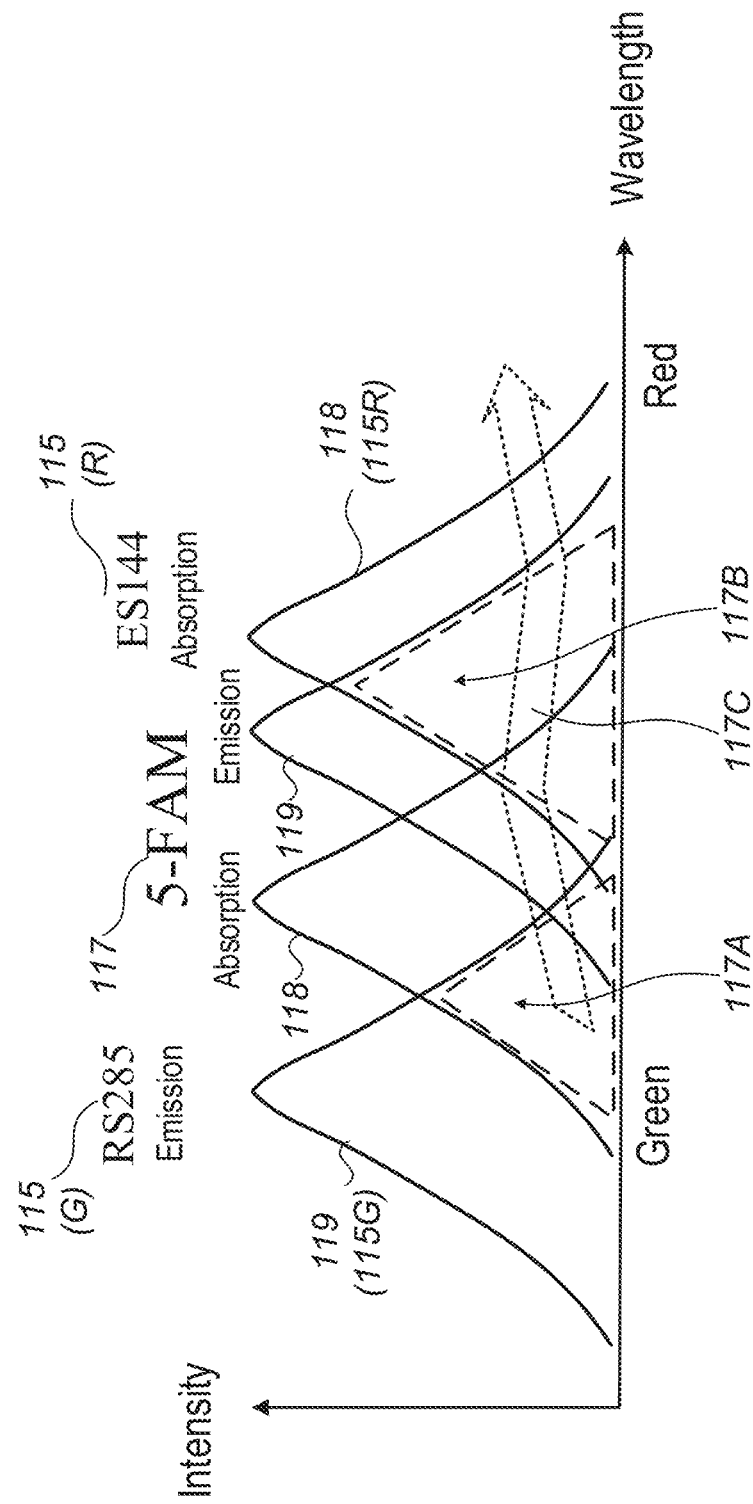

FIGS. 14A-14I illustrate schematically examples for illumination and absorption spectra, according to some embodiments of the invention. FIG. 14A illustrates white illumination spectrum 80B while FIGS. 14B and 14C illustrate, respectively, absorption spectra 118 of red-fluorescent RBF compound 115 listed above as RS285 and of green-fluorescent RBF compound 115 listed above as ES144. It is noted that in case of blue illumination spectrum 80A, phosphorous compound(s) (see above) may be selected to enhance the correspondence between the resulting illumination spectrum and absorption spectra 118 of RBF and assistant dyes 115, 117 (see also FIG. 2O above for spatial adjustment of illumination to red filter 86 only). FIGS. 14G and 14H illustrate absorption spectra 118 and emission spectra 119 of two non-limiting examples for assistant dyes 117—5-FAM and 5-Carboxyfluorescein (respectively). FIG. 14I illustrates schematically fluorescence enhancement by assistant dyes 117.

FIG. 14D illustrates blue illumination spectrum 80A. FIG. 14E illustrates schematically absorption and emission spectra 118, 119, respectively, of assistant dye 117 (e.g., 5-FAM, see below) and FIG. 14F illustrates schematically absorption curve 118 of red-fluorescent RBF compound 115 listed above as RS285. FIGS. 14D-14F illustrates the disclosed method of diverting illumination from unused spectral regions into illumination that passes through color filters 86, using one or more assistant dyes 117 which absorb unused illumination and emit usable illumination (or illumination which is further absorbed and emitted in a spectral range that is transmitted through color filter 86). It is noted that assistant dyes 117 may be selected to provide required absorption and emission spectra while maintaining good integrability in color conversion film 130 and long photostability. For example, HPTS; pyranine (8-Hydroxypyrene-1,3,6-Trisulfonic Acid, Trisodium Salt), may be used as assistant dye 117, having an absorption peak at shorter wavelengths than 5-FAM (e.g., at ca. 450 nm vs. 490 nm), with a similar emission peak at 520-530 nm (depending on embedding conditions).

FIG. 14I illustrates schematically fluorescence enhancement by assistant dyes 117, according to some embodiments of the invention. Assistant dyes 117 may be configured and used to transfer radiation from the green region of the spectrum to the red region of the spectrum by absorbing emitted green radiation and emitting the absorbed radiation in the absorption region of the red-fluorescent dye, the transfer is illustrated schematically in FIG. 14I by arrow 117C from overlap region 117A through overlap region 117B to the red emission region.

For example, relating as a non-limiting example to 5-FAM and 5-Carboxyfluorescein presented in FIGS. 14G and 14H, respectively, the inventors estimate their effective quantum yield at ca. 90%, with high absorption coefficients of ca. 100,000/mol/L/gr. Taking RS285 and ES144 as non-limiting examples for green-fluorescent and red-fluorescent RBF compounds 115(G), 115(R), respectively, the inventors estimate an overlap area 117A (illustrated schematically as a broken-line triangle in FIG. 14I) between the emission of green dye (for example RS285) 115(G) with absorbance 118 of 5-FAM 117 as being around 10-30%; and overlap area 117B (illustrated schematically as a broken-line triangle in FIG. 14I) between emission 119 of 5-FAM 117 and absorbance 118 (115R) of red dye (for example ES144) 115(R) over 80%. Using these estimations, the extent of radiation 117C (illustrated schematically as an arrow from green to red) transferred from the green region to the red region of the spectrum is at least 10-30% (of the 5-FAM absorbance) times 90% (of the 5-FAM quantum yield) times 80% (of the overlap between 5-FAM emission and red dye absorption)—resulting between 7 and 20%. Moreover, the FWHM of the green fluorescence 115(G) (e.g., by RS285) becomes narrower by estimated 5-20 nm. The inventors estimate that the intensity of the red fluorescence 115(R) (e.g., by ES144) may be increased by 10-30% compared to not using assisting dyes 117. Hence, advantageously, assisting dyes 117 improve the device performance with respect to the color gamut, efficiency and/or intensity.

It is noted that 5-FAM and 5-Carboxyfluorescein may be used as assistant dyes 117 in the green region, and compounds such as red rhiodamines (e.g., rhodamine 12, rhodamine 101 from Atto-tec®, perylene dye F300 from Lumogen® etc.) may be used as assistant dyes 117 in the red region.

Figure 14J:
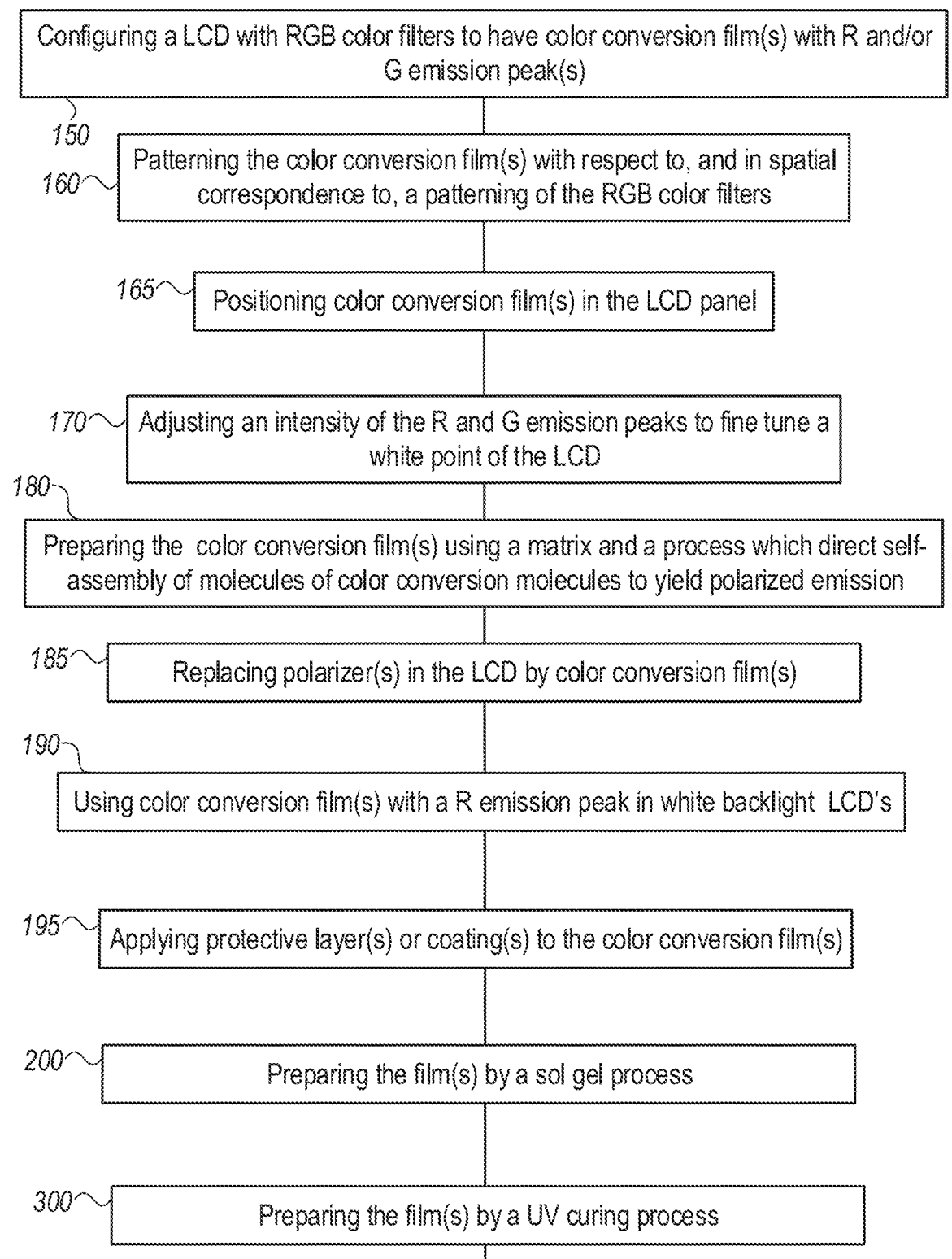
FIG. 14J is a high level flowchart illustrating methods, according to some embodiments of the invention.

FIG. 14J is a high level flowchart illustrating a method 105, according to some embodiments of the invention. The stages of method 105 may be carried out with respect to various aspects of precursors 110, formulations 120, films 130 and displays 140 described above, which may optionally be configured to implement method 105, irrespective of the order of the stages.

In some embodiments, method 105 comprises configuring a LCD with RGB color filters to have at least one color conversion film prepared to have a R emission peak and/or a G emission peak (stage 150), patterning the at least one color conversion film with respect to a patterning of the RGB color filters to yield a spatial correspondence between film regions with R and G emission peaks and respective R and G color filter (stage 160), and positioning the color conversion film in an LCD panel of the LCD (stage 165).

In some embodiments, method 105 comprises configuring a LCD with RGB color filters to have at least one color conversion film prepared to have a R emission peak and a G emission peak (stage 150), and adjusting an intensity of the R and G emission peaks of the at least one color conversion film to fine tune a white point of the LCD to be at a center of an expected line of deterioration of the intensity within given LCD specifications (stage 170).

In some embodiments, method 105 comprises configuring a LCD with RGB color filters to have at least one color conversion film prepared to have a R emission peak and a G emission peak (stage 150), preparing the at least one color conversion film using a matrix and a process which direct self-assembly of molecules of color conversion molecules of the at least one color conversion film to yield polarization of at least part of illumination emitted by the color conversion film (stage 180), and replacing at least one polarizer in the LCD by the at least one color conversion film (stage 185).

In some embodiments, method 105 comprises configuring a LCD with RGB color filters and white backlight illumination to have at least one color conversion film prepared to have a R emission peak (stage 190).

In some embodiments, method 105 further comprises applying a protective layer to the color conversion film (stage 195). For example, method 105 may further comprise any of: preparing the protective layer by a sol-gel process with at least one of: zirconium-phenyl siloxane hybrid material (ZPH), methyl methacrylate (MMA), trimethoxysilane derivative and an epoxy silica ormosil solution; preparing the protective layer by an acetic anhydride surface treatment and/or a trimethylsilane surface treatment; and/or preparing the protective layer by a UV curing process using a mixture of 3,4-epoxycyclohexylmethyl 3,4-epoxycyclohexanecarboxylate and triarylsulfonium hexafluoroantimonate salts, mixed in propylene carbonate.

The at least one color conversion film may comprise at least one RBF compound defined by Formula 1 and/or Formula 2.

In method 105, the at least one color conversion film may be prepared by at least one corresponding sol-gel process (stage and method 200) and/or UV curing process (stage and method 300), which are presented in more detail below.

FIG. 14J is further a high-level flowchart illustrating a method 200 which may be part of method 105, according to some embodiments of the invention. The stages of method 200 may be carried out with respect to various aspects of precursors 110, formulations 120, films 130 and displays 140 described above, which may optionally be configured to implement method 200. Method 200 may comprise stages for producing, preparing and/or using precursors 110, formulations 120, films 130 and displays 140, such as any of the following stages, irrespective of their order.

Method 200 may comprise preparing a hybrid sol-gel precursor formulation from: an epoxy silica ormosil solution prepared from TEOS, at least one MTMOS or TMOS derivative, and GLYMO; a nanoparticles powder prepared from isocyanate-functionalized silica nanoparticles, or non-functionlized silica nano particles, and ethylene glycol; and a metal(s) alkoxide matrix solution (stage 210), mixing the prepared hybrid sol-gel precursor with at least one RBF compound (stage 220); and spreading the mixture and drying the spread mixture to form a film (stage 230).

Method 200 may comprise comprising evaporating alcohols from the mixture prior to spreading 230 (stage 225). The inventors have found that using ethylene glycol 108 in the preparation of nanoparticles powder 109 and evaporating 225 the alcohols prior to spreading improves film properties, and, for example, enables reducing the number of required green-fluorescent RBF layers 132 due to the increased viscosity of formulation 120. Possibly, the number of required green-fluorescent RBF layers 132 may be reduced to one by substantial or complete evaporation of the alcohols in formulation 120 prior to spreading 230 (as detailed above).

Preparing 210 of the hybrid sol-gel precursor formulation may be carried out under acidic conditions (stage 212), mixing 220 may comprise adjusting types and amounts of the TMOS derivatives to tune emission wavelengths of the fluorophores (stage 215), spreading and drying 230 may be carried out respectively by bar coating and by at least one of convective heating, evaporating and infrared radiation (stage 240).

As explained above, the RBF compound may be a red-fluorescent RBF compound and the TMOS derivative(s) may comprise for example PhTMOS and/or a TMOS with fluorine substituents; and/or the RBF compound may be a green-fluorescent RBF compound and the TMOS derivative(s) may comprise PhTMOS and/or $F_1$TMOS with the PhTMOS:$F_1$TMOS ratio being adjusted to tune emission properties of the green-fluorescent RBF compound. Other TMOS derivatives may comprise $F_2$TMOS (tridecafluoro-1,1,2,2-tetrahydrooctyl)trimethoxysilane, 1,2-bis(triethoxysilyl)ethane, trimethoxy(propyl) silane, octadecyltrimethoxysilane, fluorotriethoxysilane, and ammonium (propyl)trimethoxysilane.

Method 200 may comprise forming the film from at least one red fluorescent RBF compound and/or from at least one green fluorescent RBF compound (stage 250). The RBF compound(s) may be supramoleculary encapsulated and/or covalently embedded in one or more layers. As non-limiting examples, method 200 may comprise forming the film from at least one red fluorescent RBF compound to enhance a red illumination component in displays using a white light source (stage 280), such as a white-LED-based display. Alternatively, or complementarily films may be formed to have both red and green fluorescent RBF compounds and be used for enhancing red and green illumination components in displays using a blue light source (blue LEDs).

Method 200 may comprise associating the film with any of the diffuser, prism film(s) and polarizer film(s) in a display backlight unit (stage 260), e.g. attaching one or more films onto any of the elements in the display backlight unit or possibly replacing one or more of these elements by the formed film(s). For example, method 200 may comprise configuring the film to exhibit polarization properties (stage 270) and using the polarizing film to enhance or replace polarizer film(s) in the display backlight unit.

FIG. 14J is further a high level flowchart illustrating a method 300 which may be part of method 105, according to some embodiments of the invention. The stages of method 300 may be carried out with respect to various aspects of formulations 120, films 130 and displays 140 described above, which may optionally be configured to implement method 300. Method 300 may comprise stages for producing, preparing and/or using formulations 120, films 130 and displays 140, such as any of the following stages, irrespective of their order.

Method 300 may comprise preparing a formulation from 65-70% monomers, 25-30% oligomers, 1-5% photointiator and at least one RBF compound (stage 310), in weight percentages of the total formulation, spreading the formulation to form a film (stage 330), and UV curing the formulation (stage 340). Method 300 may comprise any of: selecting the monomers from: dipropylene glycol diacrylate, ditrimethylolpropane tetraacrylate, dipentaerythritol hexaacrylate, ethoxylated pentaerythritol tetraacrylate, propoxylated (3) glyceryl acrylate and trimethylolpropane triacrylate; selecting the oligomers from: polyester acrylate, modified polyester resin diluted with dipropyleneglycol diacrylate and aliphatic urethane hexaacrylate; and selecting the photointiator from: alpha-hydroxy-cyclohexyl-phenyl-ketone and alpha-hydroxy ketone (possibly difunctional).

Method 300 may further comprise configuring the formulation and the film to yield a color conversion film and determining UV curing parameters to avoid damage to the color conversion elements, such as RBF compound(s) (stage 345). Method 300 may further comprise forming the color conversion film with at least one red fluorescent RBF compound and with at least one green fluorescent RBF compound (stage 350).

In some embodiments, method 300 may comprise configuring the color conversion film to exhibit polarization properties (stage 370), e.g., by directing self-assembly of molecules of the RBF compound(s) into at least partial alignment. Method 300 may further comprise associating the color conversion film with any of: a diffuser, a prism film and a polarizer film in a display backlight unit (stage 360).

In some embodiments, method 300 may comprise forming the color conversion film with at least one red fluorescent RBF compound to enhance a red illumination component in a white-LED-based display (stage 380) by shifting some of the yellow region in the emission spectrum of the white light source into the red region, namely into the R transmission region of the R color filter, to reduce illumination losses in the LCD panel while maintaining the balance between B and R+G regions in the RGB illumination (stage 382).

Method 105 may comprise enhancing a green component of illumination delivered to RGB filters of a LCD by using at least one green-fluorescent RBF compound selected to have an absorption peak outside a transmission region of a green one of the RGB filters and a fluorescence peak inside the transmission region of the green filter (stage 390), for example, by shifting some of the cyan region in the emission spectrum of the light source into the G transmission region of the G color filter (stage 392). Green enhancement may be carried out in addition to red enhancement, namely enhancing a red component of illumination delivered to RGB filters of a LCD by using at least one red-fluorescent RBF compound selected to have an absorption peak outside a transmission region of a red one of the RGB filters and a fluorescence peak inside the transmission region of the red filter (stages 380, 382).

Method 105 may comprise integrating color conversion RBF compounds in RGB color filters of a LCD panel, wherein the RBF compounds are selected to absorb illumination from a backlight unit and have at least one of an R emission peak and a G emission peak—corresponding to transmission peaks of the RGB color filters (stage 400).

Method 105 may comprise shaping a spectral distribution of illumination delivered to RGB filters of a LCD by using at least one fluorescent compound in a color conversion film, wherein the at least one fluorescent compound is selected to have, when embedded in the color conversion film, an absorption peak outside a respective transmission region of one of the RGB filters and a fluorescence peak inside the respective transmission region of the RGB filter (stage 410).

Method 105 may comprise shaping a spectral distribution of illumination delivered to RGB filters of a LCD by using a plurality of fluorescent compounds in a color conversion film, wherein the fluorescent compounds are selected to have, when embedded in the color conversion film, a series of absorption peaks outside a respective transmission region of one of the RGB filters and series of fluorescence peaks, at least one of the fluorescence peaks being inside the respective transmission region of the RGB filter and at least one other fluorescence peak being intermediate between the fluorescence peak inside the respective transmission region and the absorption peaks, forming a photon delivery chain from filtered to unfiltered regions of the spectrum.

Method 105 may comprise shaping a spectral distribution of illumination delivered to RGB filters of a LCD by using at least one fluorescent compound in a color conversion film, wherein the at least one fluorescent compound is selected to have, when embedded in the color conversion film, an absorption curve and a fluorescence curve, at least one which selected to re-shape a spectral region of the illumination within a respective transmission region of one of the RGB filters to decrease FWHM (full width at half maximum) of the illumination in the respective transmission region. For example, method 105 may comprise reducing illumination curve asymmetry using spectrum shaping dyes (stage 414).

EXAMPLES

Example 1

Synthesis of Compounds 1 and 2

Step 1:

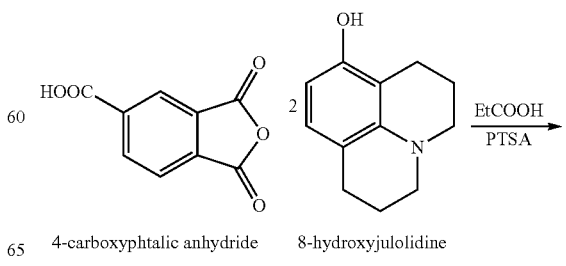

4-carboxyphtalic anhydride    8-hydroxyjulolidine

-continued

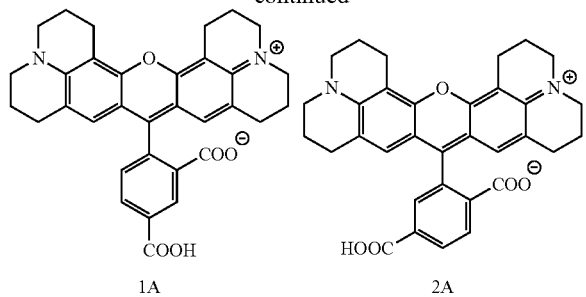

1A    2A

-continued

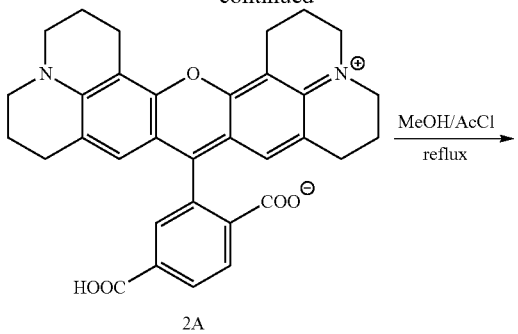

2A

This process is based on L. J. Marnett et al. (Org. Lett. 2008, 10, 4799-4801). 8-hydroxyjulolidine (3.0 gr, 15.8 mmol), 4-carboxyphthalic anhydride (1.52 gr, 7.9 mmol) and p-toluene sulfonic acid monohydrate (PTSA) (0.06 gr, 0.3 mmol) were dissolved in propionic acid (126 ml) under nitrogen atmosphere. The reaction was heated to reflux overnight. After cooling to room temperature, the solvent was removed under reduced pressure. The crude product, was further purified using flash chromatography (CHCl$_3$: MeOH 3:1). The product, (a mixture of 1A and 2A) was obtained as a dark purple solid (yield 65%).

UV-Vis absorption: 568 nm (in EtOH)

Fluorescence emission: 591 nm (in EtOH)

FWHM=40 nm

In order to isolate 1A and 2A, their mixture was further purified using flash chromatography. The 2A isomer was isolated with chloroform/methanol gradients (using CHCl$_3$: MeOH gradients of 5:1; then 4:1 and 3:1). After 2A was isolated, the gradient was elevated to CHCl$_3$:MeOH 1:1 to isolate the 1A compound.

Step 2:

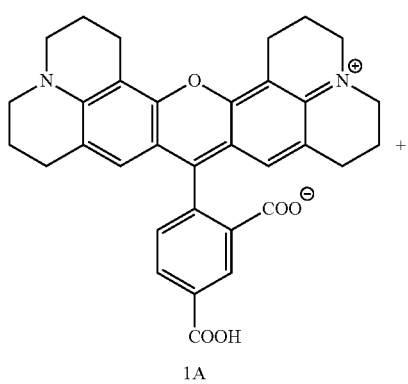

1A

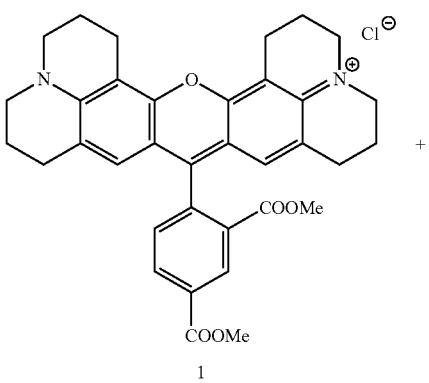

1

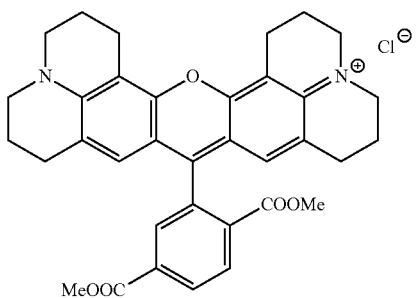

2

This process is based on J. A. Ross et al. (Synth. Commun. 2006, 36, 1745-1750). The 6-carboxy-X rhodamine (1A) isomer (0.075 gr., 0.14 mmol) was dissolved in dry methanol (15 ml) under nitrogen atmosphere. Then acetyl chloride (1.3 ml, 18.2 mmol) was added dropwise at room temperature, and the reaction was heated to reflux for two days. Additional portion of acetyl chloride (0.75 ml, 10.5 mmol) was added and the reaction was heated for another day. The desirable product (1) was obtained by cooling the reaction to room temperature and removal of the solvent under reduced pressure (quantitative yield).

$^1$H NMR (400 MHz, DMSO-d6): δ 8.35-8.31 [m, 2H], 7.85 [d, J=1.6 Hz, 1H], 6.53 [s, 2H], 3.89 [s, 3H], 3.61 [s,

3H], 3.51 [t, J=5.6 Hz, 4H], 3.46 [t, J=5.6 Hz, 4H], 3.00-2.97 [m, 4H], 2.60 [t, J=5.6 Hz, 4H], 2.02-1.96 [m, 4H], 1.84-1.80 [m, 4H].

Calculated Mass: 563.4, [M-H]-563.4.

Figure 15A:
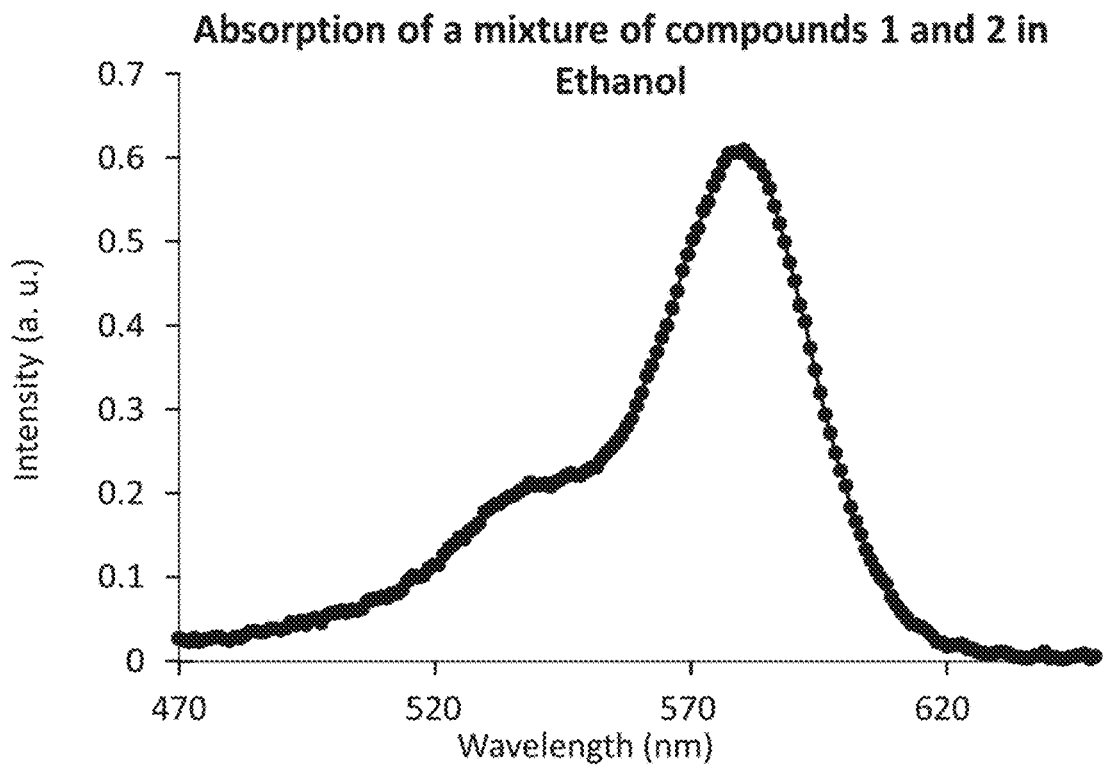
FIGS. 15A-15B depict absorption and emission spectra of a mixture of compounds 1 and 2 in ethanol.

UV-Vis absorption of is: 581 nm (in ethanol) (See FIG. 15A).

Figure 15B:
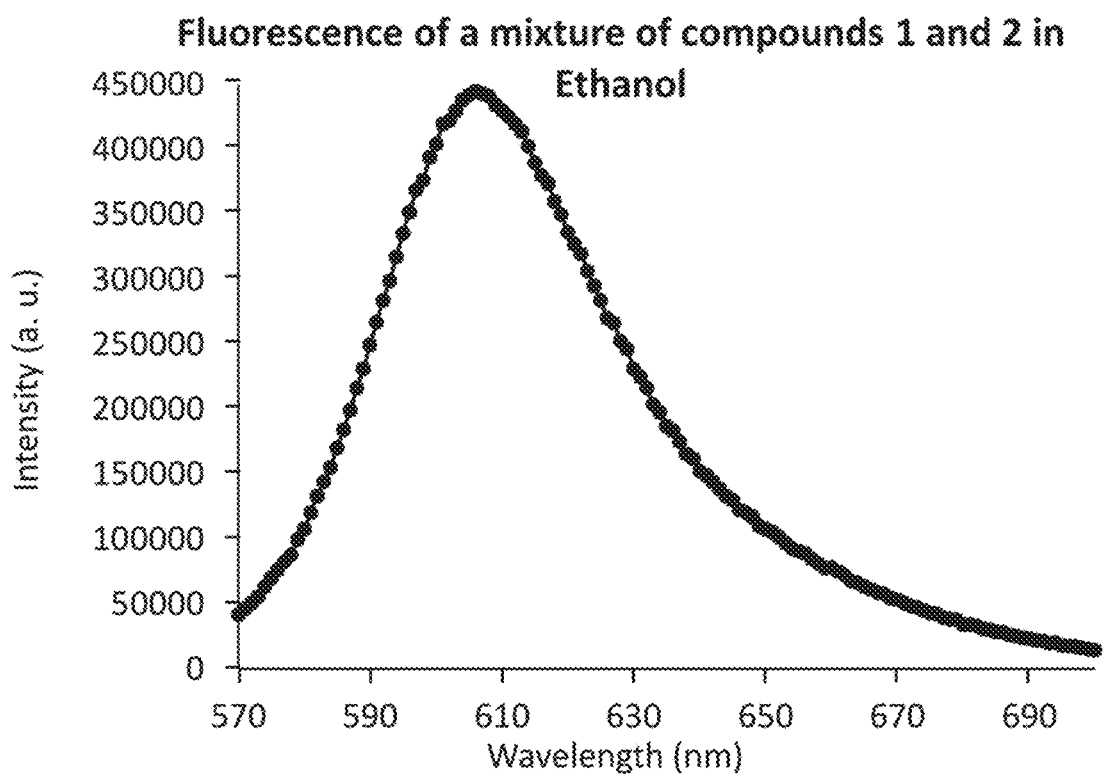

Fluorescence emission: 605 nm (in ethanol) (See FIG. 15B).

The 5-carboxy-X-rhodamine (2A) isomer (0.136 gr., 0.25 mmol) was dissolved in dry methanol (30 ml) under nitrogen atmosphere. Then acetyl chloride (2.35 ml, 33 mmol) was added dropwise at room temperature, and the reaction was heated to reflux for two days. Additional portion of acetyl chloride (1.5 ml, 21 mmol) was added and the reaction was heated for another day. The desirable product (2) was obtained by cooling the reaction to room temperature and removal of the solvent under reduced pressure (quantitative yield).

$^1$H NMR (400 MHz, DMSO-d6): δ 8.71 [d, J=2.0 Hz, 1H], 8.36 [dd, J=8.0 Hz, J=2.0 Hz, 1H], 7.54 [d, J=8.0 Hz, 1H], 6.54 [s, 2H], 3.96 [s, 3H], 3.62 [s, 3H], 3.51 [t, J=4.8 Hz, 4H], 3.46 [t, J=5.6 Hz, 4H] 3.00-2.96 [m, 4H], 2.60 [t, J=5.8 Hz, 4H], 2.02-1.97 [m, 4H], 1.84-1.79 [m, 4H].

Calculated Mass: 563.4, [M-H]-563.4.

Figure 16A:
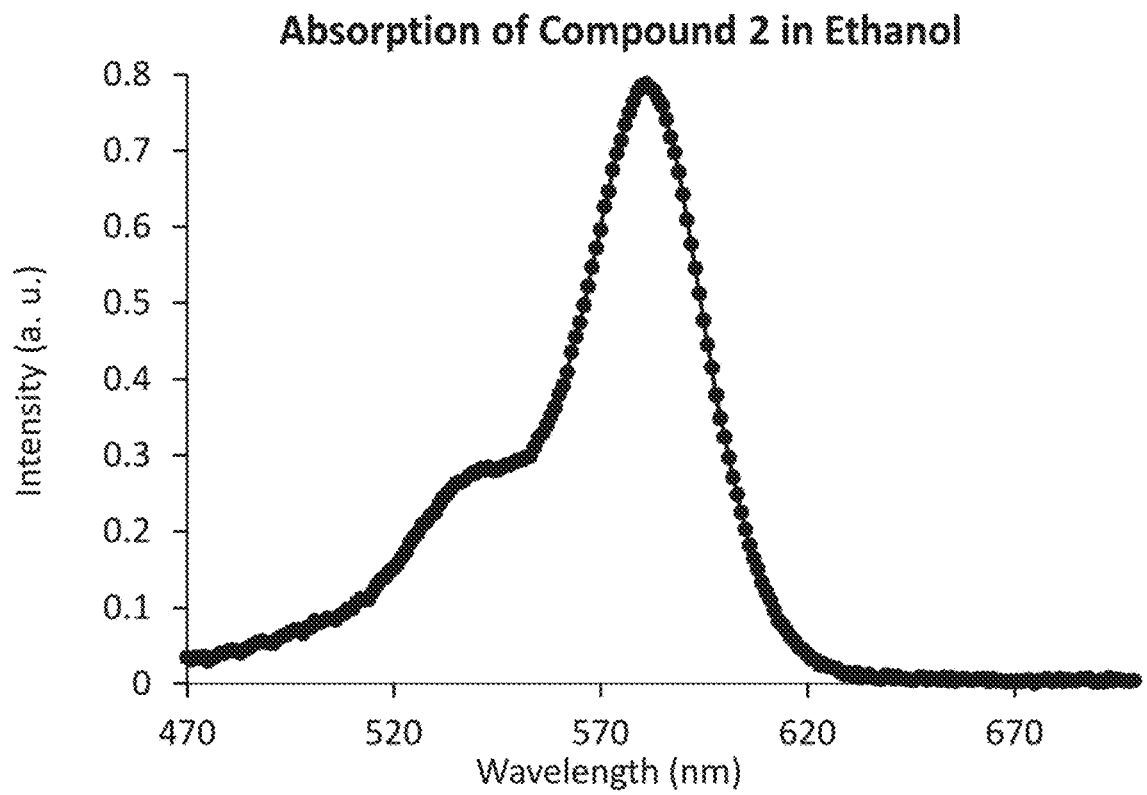
FIGS. 16A-16B depict absorption and emission spectra of compound 2 in ethanol.

UV-Vis absorption: 579 nm (in ethanol) (See FIG. 16A).

Figure 16B:
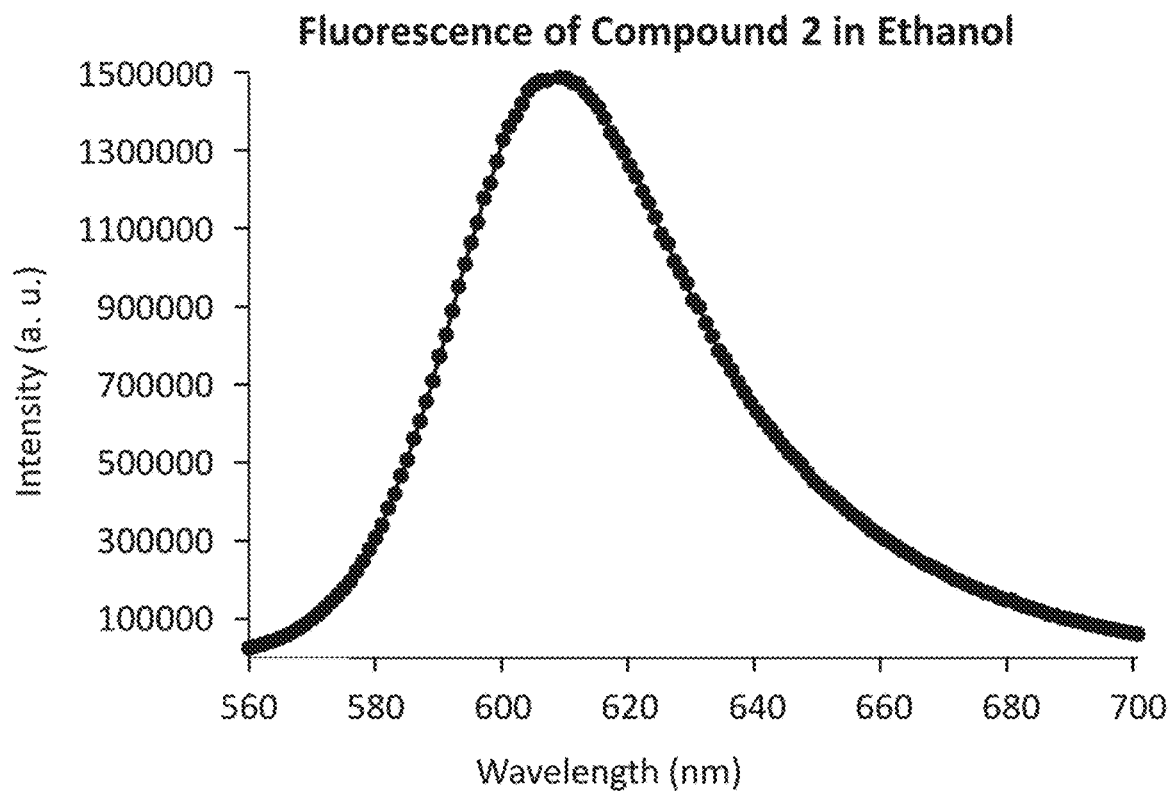

Fluorescence emission: 608 nm (in ethanol) (See FIG. 16B).

FWHM=45 nm.

Example 2

Synthesis of Compound 3

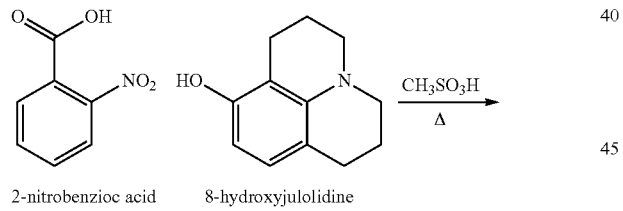

2-nitrobenzioc acid    8-hydroxyjulolidine

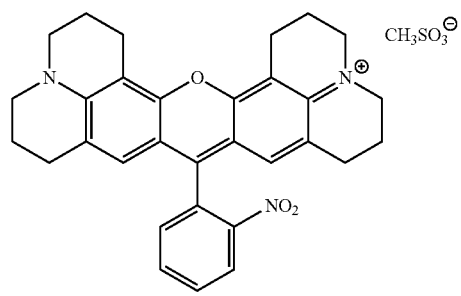

3

To a stirred solution of 8-hydroxyjulolidine (0.91 gr., 4.8 mmol) in methansulfonic acid (2 ml), 2-nitrobenzoic acid (0.4 gr., 2.4 mmol), was added. The reaction mixture was heated to 180° C. for two days. The solution was then cooled to room temperature, diluted with chloroform and washed with water. The chloroform was removed under reduced pressure to obtain he crude product. The product had a fluorescence peak at 585 nm, FWHM ~40 nm.

Example 3

Synthesis of Compound 4

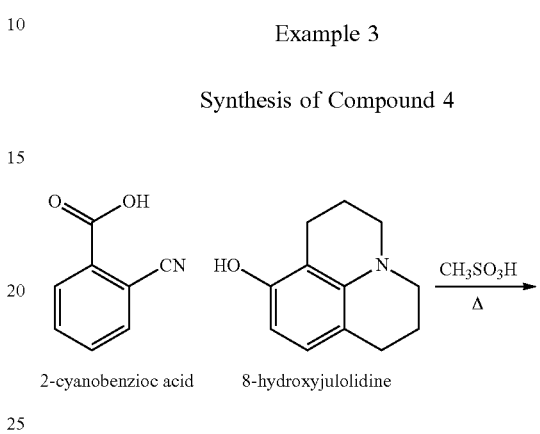

2-cyanobenzioc acid    8-hydroxyjulolidine

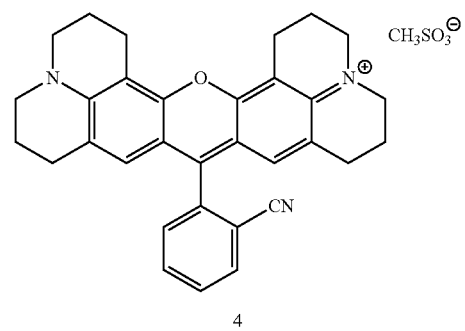

4

To a stirred solution of 8-hydroxyjulolidine (0.51 gr., 2.8 mmol) in methansulfonic acid (3 ml), 2-cyanobenzoic acid (0.2 gr., 1.4 mmol), was added. The reaction mixture was heated to 140° C. overnight. The solution was then cooled to room temperature, diluted with chloroform, washed with water and concentrated under reduced pressure. Purification by flash chromatography (SiO$_2$, MeOH:CHCl$_3$ 1:11) to yield compound 4 as a dark purple solid (0.124 g, 19%).

$^1$H NMR (400 MHz, DMSO-d6): δ 7.94 [d, J=7.5 Hz, 1H], 7.73-7.63 [m, 2H], 7.19 [d, J=7.6 Hz, 1H], 6.04 [s, 2H], 3.18 [t, J=5.3 Hz, 4H], 3.13 [t, J=5.5 Hz, 4H], 2.82 [t, J=6.4 Hz, 4H], 1.97-1.90 [m, 8H], 1.79-1.73 [m, 4H].

Figure 17A:
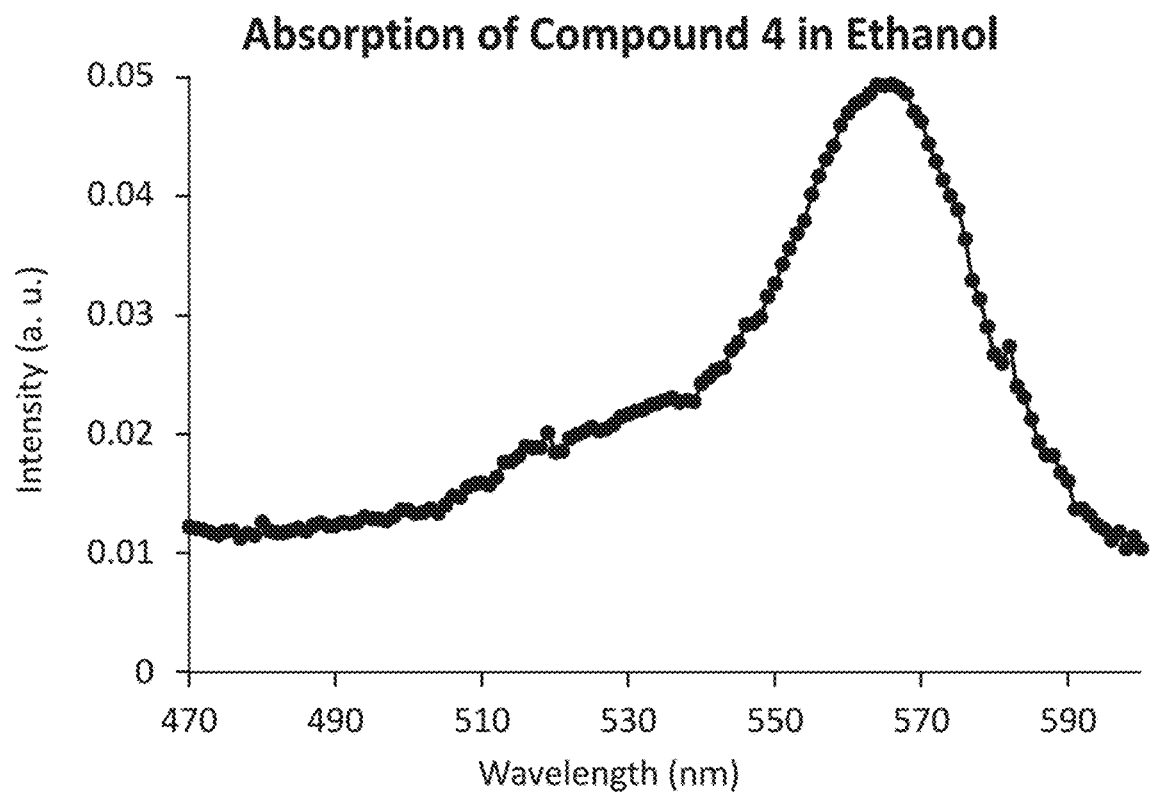
FIGS. 17A-17B depict absorption and emission spectra of compound 4 in ethanol.

UV-Vis absorption of Compound 4 is: 564 nm (in ethanol) (see FIG. 17A).

Figure 17B:
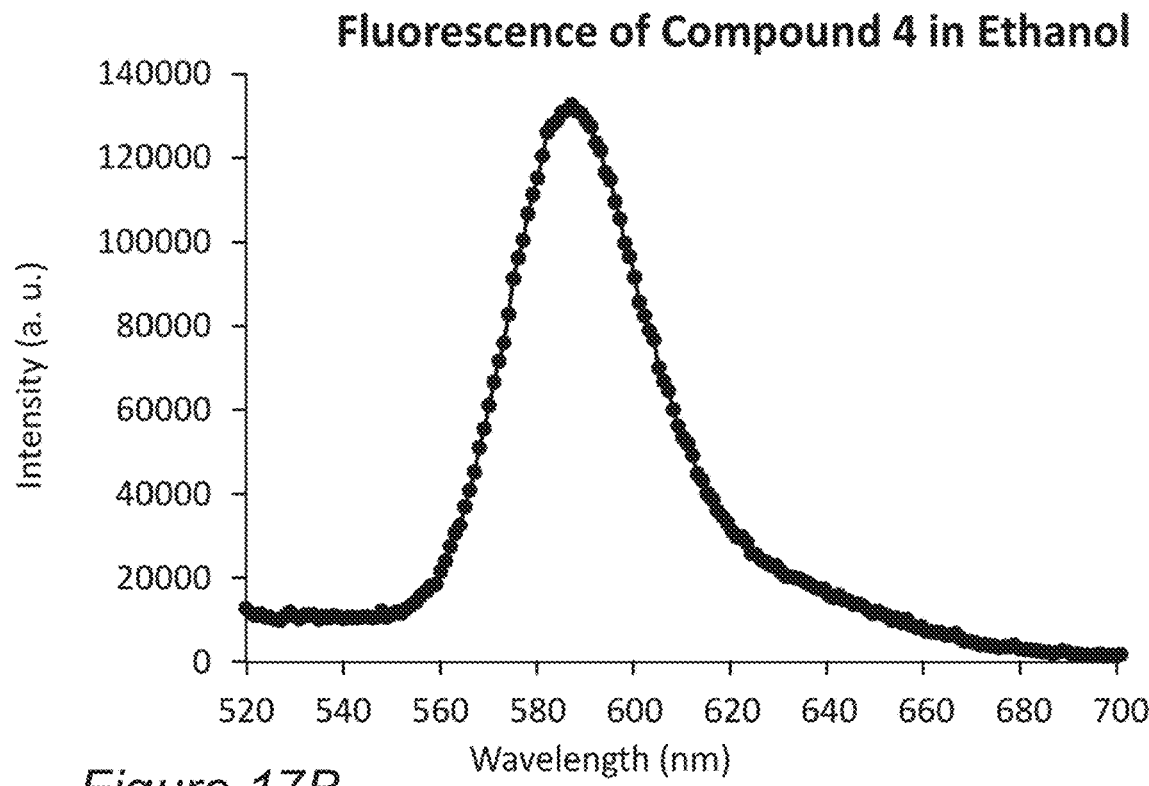

Fluorescence emission: 587 nm (in ethanol) (See FIG. 17B).

FWHM=36 nm.

Example 4

Synthesis of Compounds 5 and 6

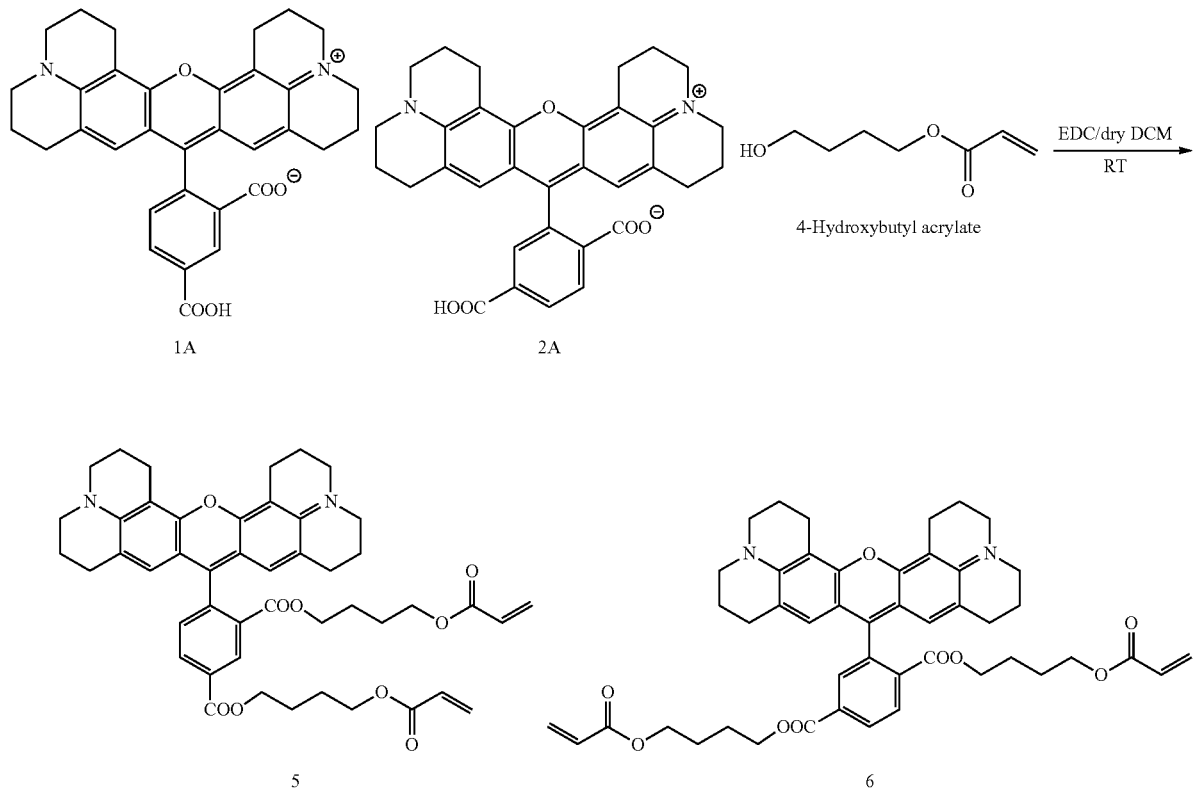

A mixture of 1A and 2A (0.4 gr, 0.75 mmol), 4-hydroxybutyl acrylate (0.23 ml, 1.60 mmol), 1-(3-dimethylaminopropyl)-3-ethylcarbodiimide hydrochloride (0.32 gr, 1.60 mmol) and 4-(dimethylamino)pyridine (0.04 gr, 0.3 mmol) were dissolved in dichloromethane (4.0 ml) under nitrogen atmosphere at room temperature for 24 hours. After reaction completion, the solvent was removed under reduced pressure to obtain the crude product which was further purified by column chromatography (CHCl3:MeOH 7:1). The product, (a mixture of 5 and 6) was obtained as dark purple solid (yield 38%).

UV-Vis absorption: 583 nm (in EtOH) (See FIG. 18A).
Fluorescence emission: 608 nm (in EtOH) (See FIG. 18B).
FWHM=40 nm.
Quantum yield: 61% (in ethanol).

Example 7

Synthesis of Compounds 7 and 8

Step I:

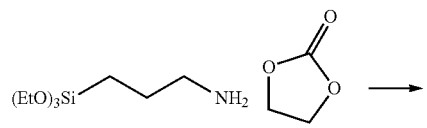

-continued

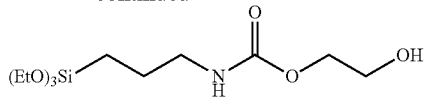

3-aminopropyltriethoxysilane ethylene carbonate
2-hydroxyethyl (3-(triethoxysilyl)propyl)carbamate Ethylene carbonate (1.88 gr, 21.3 mmol) was added dropwise to 3-aminopropyltriethoxysilane (5.0 ml, 21.3 mmol) under nitrogen atmosphere. The solution was stirred at room temperature over night to obtain the product (2-hydroxyethyl (3-(triethoxysilyl)propyl)carbamate) as colorless oily liquid (quantitative yield).

1H NMR (400 MHz, CDCl3): δ 4.15-4.12 [m, 2H], 3.78 [q, J=7.0 Hz, 6H], 3.74-3.72 [m, 2H], 3.13 [t, J=6.8 Hz, 2H], 1.62-1.54 [m, 2H], 1.20 [t, J=7.0 Hz, 9H], 0.60-0.56 [m, 2H].

Step II:

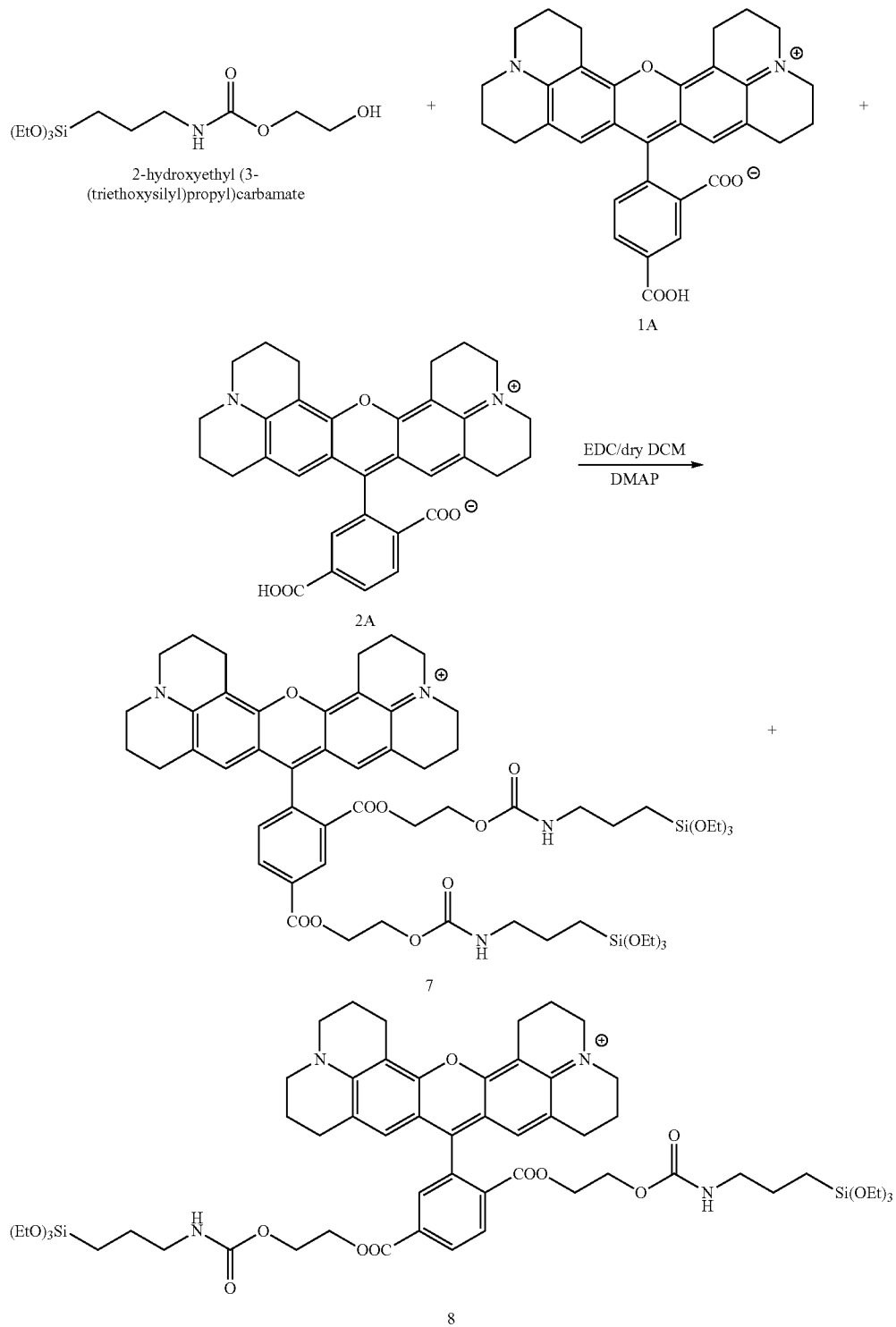

1A and 2A (0.20 gr, 0.37 mmol), 2-hydroxyethyl (3-(triethoxysilyl)propyl)carbamate, from step I (0.26 gr, 0.81 mmol), 1-(3-dimethylaminopropyl)-3-ethylcarbodiimide hydrochloride (0.16 gr, 0.81 mmol), 4-(dimethylamino)pyridine (0.02 gr, 0.01 mmol) were dissolved in dry dichloromethane (2.0 ml) under nitrogen atmosphere at room temperature for 24 hours. Then, the solvent was removed under reduced pressure to obtain the crude product, which was further purified by column chromatography (DCM: EtOH 4:1). The product, a mixture of 7 and 8 was obtained as a dark purple solid (yield 26%).

Figure 19A:
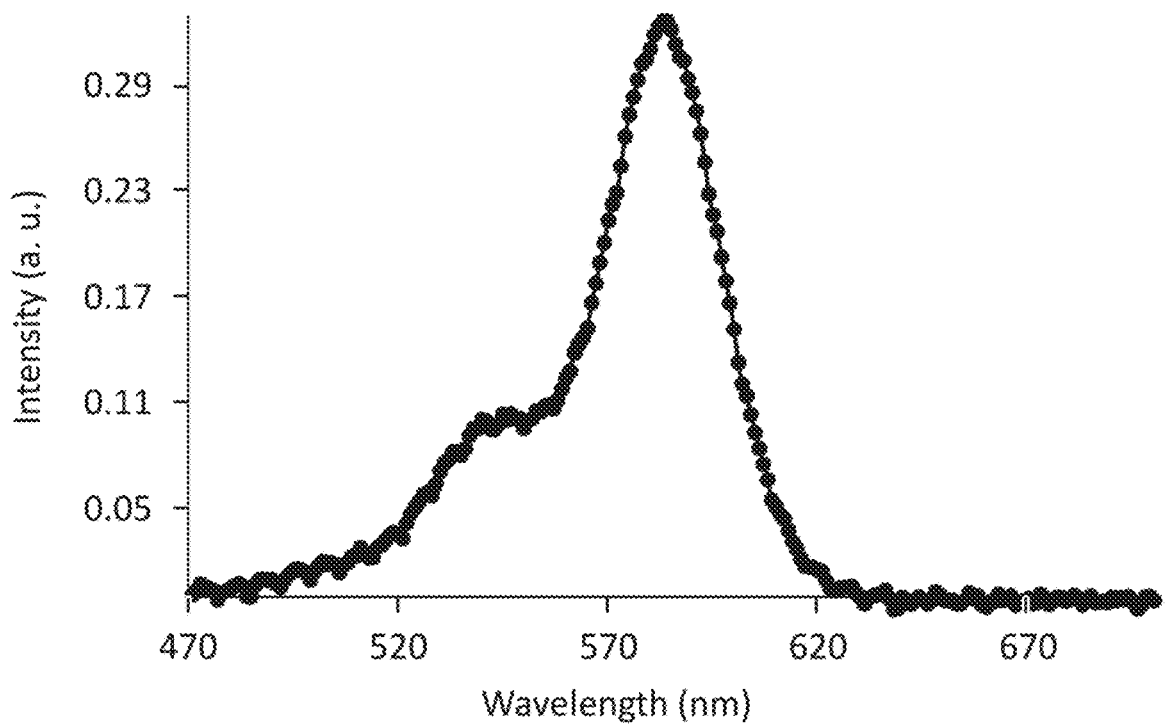
FIGS. 19A-19B depict absorption and emission spectra of a mixture of compounds 7 and 8 in ethanol.

UV-Vis absorption: 583 nm (in EtOH) (See FIG. 19A).

Figure 19B:
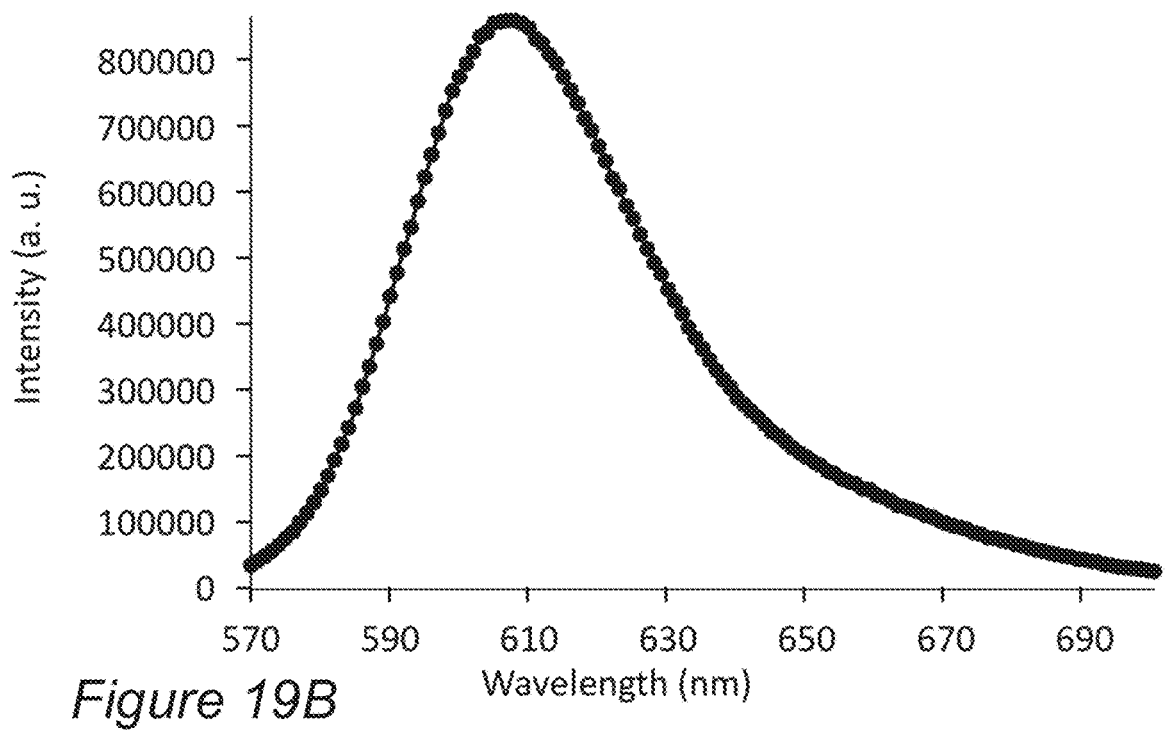

Fluorescence emission: 608 nm (in EtOH) (See FIG. 19B).

FWHM=41 nm.

Quantum yield: 50% (in ethanol).

Example 8

Synthesis of Compound 9 (X=Cl)

Step 1:

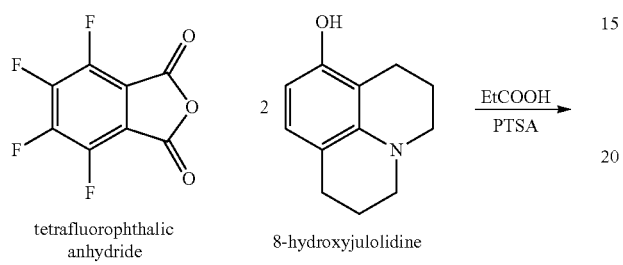

tetrafluorophthalic anhydride 8-hydroxyjulolidine

Step 2:

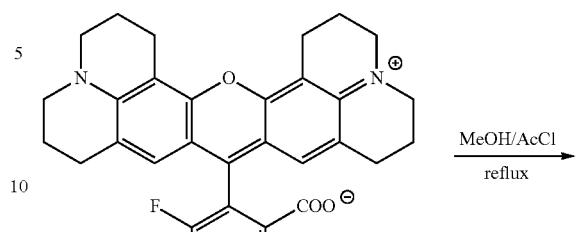

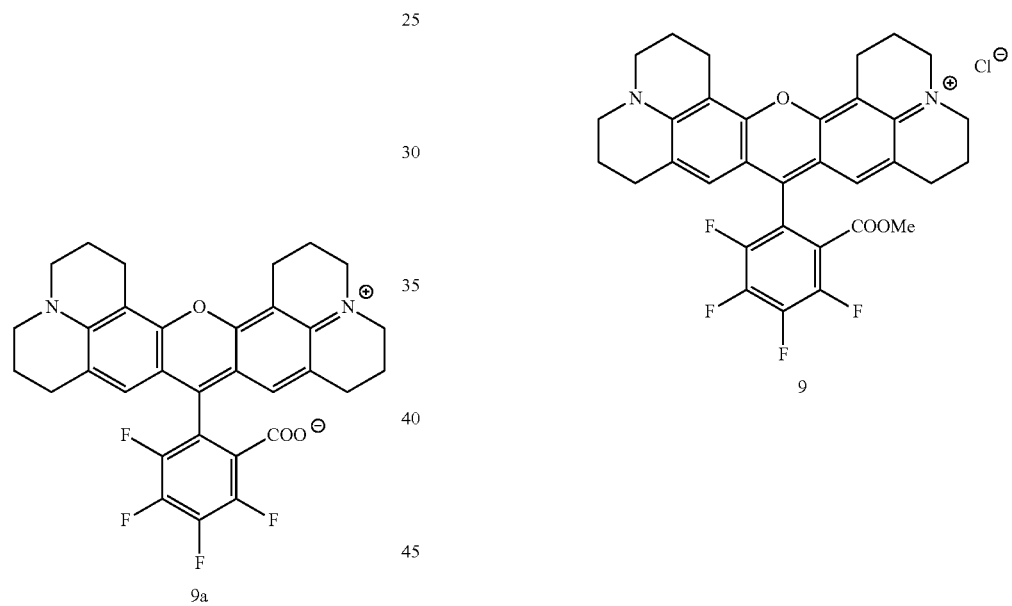

8-Hydroxyjulolidine (0.8 gr, 4.2 mmol), tetrafluorophthalic anhydride (0.614 gr, 2.8 mmol) and p-toluene sulfonic acid monohydrate (0.06 gr, 0.3 mmol) were dissolved in propionic acid (1.0 ml) under nitrogen atmosphere. The reaction was heated to reflux overnight. After cooling to room temperature, the solvent was removed under reduced pressure. The crude product was further purified using flash chromatography (DCM:MeOH 9:1). The pure product was obtained as dark purple solid (yield 33%).

UV-Vis absorption: 590 nm (in EtOH) (See FIG. 20A).

Fluorescence emission: 613 nm (in EtOH) (See FIG. 20B).

FWHM=30 nm.

$^1$H NMR (400 MHz, CDCl3): δ 6.98 [s, 2H], 3.49-3.37 [m, 6H], 3.23-3.14 [m, 2H], 2.96-2.69 [m, 8H], 2.10-2.01 [m, 4H], 1.98-1.86 [m, 4H].

19F NMR: δ −138.95, −140.50, −153.29, −159.22.

9A (0.219 gr, 0.39 mmol) was dissolved in methanol (55.0 ml) under nitrogen atmosphere. Acetyl chloride (1.8 ml, 2.5 mmol) was added dropwise at room temperature and the solution was heated to reflux. The solution was kept at reflux for 7 days in which fresh portions of acetyl chloride (0.35 ml, 5.0 mmol) were added twice a day. Then the solvent was removed under reduced pressure and the crude product was further purified using flash chromatography (DCM:MeOH 8:1). The pure product was obtained as dark purple solid (yield 51%).

UV-Vis absorption: 600 nm (in EtOH) (See FIG. 21A).

Fluorescence emission: 622 nm (in EtOH) (See FIG. 21B).

FWHM=38 nm.

$^1$H NMR (400 MHz, CDCl3): δ 7.49-7.43 [m, 2H], 7.13-7.06 [m, 2H], 6.95 [s, 2H], 3.54 [s, 3H], 3.54-3.48 [m, 8H], 2.95 [t, J=6.20 Hz, 4H], 2.70-2.66 [m, 4H], 2.26 [s, 3H], 2.01-1.96 [m, 4H], 1.89-1.83 [m, 4H].

19F NMR: δ −136.26, −137.60, −149.06, −153.19.

Example 9

Synthesis of Compound 9 (X=I)

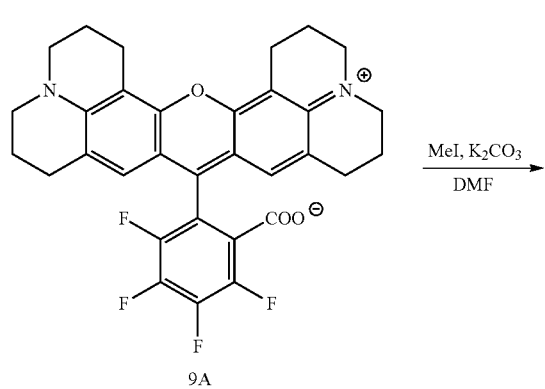

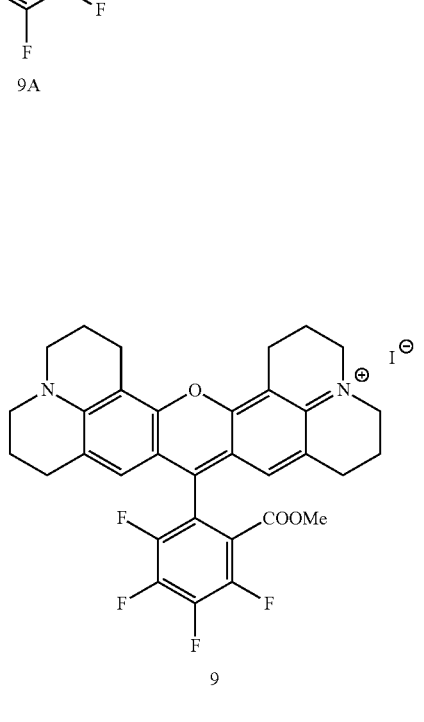

Compound 9a (0.20 gr, 0.35 mmol) was dissolved in dry DMF (3.0 ml) under nitrogen atmosphere. Potassium carbonate (0.15 gr, 1.06 mmol) was added followed by MeI (66 µl, 1.06 mmol). The mixture was stirred for one hour at room temperature. Upon completion, the mixture was diluted with DCM and washed with brine. The organic layer was separated, dried with sodium sulfate, and the solvent was evaporated under reduced pressure. The crude was purified by column chromatography (10% MeOH/DCM) to give a dark blue solid (71% yield).

$^1$H NMR (400 MHz, CDCl3): δ 6.93 [s, 2H], 3.54-3.49 [m, 8H], 3.54 [s, 3H], 2.96 [t, J=6.04 Hz, 4H], 2.71-2.66 [m, 4H], 2.02-1.96 [m, 4H], 1.89-1.83 [m, 4H].

$^{19}$F NMR: δ −136.22, −137.60, −149.06, −153.19.

UV-Vis absorption: 597 nm (in EtOH).

Fluorescence emission: 623 nm (in EtOH).

FWHM=36 nm.

Quantum yield: 78% (in ethanol).

Example 10

Synthesis of Compound 10

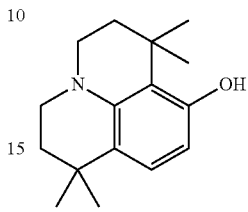
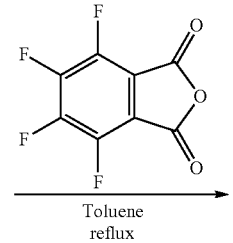
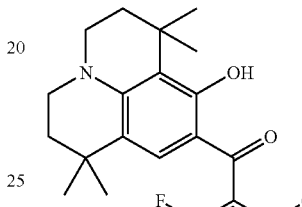
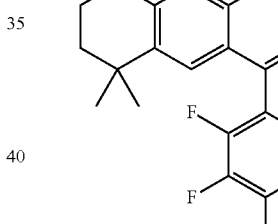
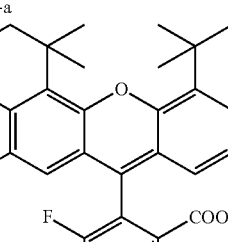

1,1,7,7-Tetramethyl-8-hydroxyjulolidine (0.30 gr, 1.22 mmol) and tetrafluorophthalic anhydride (0.27 gr, 1.23 mmol) were added to toluene (4.0 ml) and heated to reflux under nitrogen atmosphere for 5 hours. After cooling to room temperature, DCM (50 ml) and SiO$_2$ (0.25 gr) were added. The mixture was stirred for 5 minutes, then was filtered and evaporated to dryness, to give a brown solid (~0.50 gr). The solid was dissolved in 1,2-dichloroethane (13.0 ml) and POCl$_3$ (0.4 ml, 4.28 mmol) was added. The mixture was stirred at room temperature under nitrogen atmosphere for 15 minutes, then 1,1,7,7-Tetramethyl-8-hydroxyjulolidine (0.26 gr, 1.07 mmol) was added. The mixture was heated to 65° C. and stirred for 4 hours. After cooling the crude mixture to room temperature, water (43.0 ml) with sodium bicarbonate (1.0 gr) was added and stirred for one hour. The organic layer was separated, dried with sodium sulfate, filtered and then evaporated to dryness under reduced pressure. The crude was purified by column chromatography (100% EtOAc, then 5% MeOH/DCM to 15% MeOH/DCM) to give a dark blue solid (120 mg, 17% yield).

120 mg of the product, 10a (0.17 mmol) were dissolved in dry DMF (4.0 ml), then potassium carbonate (0.072 gr, 0.52 mmol) was added followed by MeI (64 µl, 1.04 mmol) and the mixture was stirred for one hour at room temperature. The mixture was diluted with DCM and washed with brine. The organic layer was separated, dried with sodium sulfate, filtered and evaporated to dryness under reduced pressure. The crude was purified by column chromatography (100% EtOAc, then 5% MeOH/DCM to 15% MeOH/DCM) to give a dark blue solid (55% yield).

$^1$H-NMR (400 MHz, DMSO-d6): δ 6.87 [s, 2H], 3.62 [t, J=6.0 Hz, 4H], 3.57 [t, J=6.0 Hz, 4H], 3.48 [s, 3H], 1.84 [t, J=6.0 Hz, 4H], 1.70 [t, J=6.0 Hz, 4H], 1.65 [s, 12H], 1.15 [s, 12H].

19F-NMR: δ −82.22, −136.62, −148.82, −151.26.

Figure 22A:
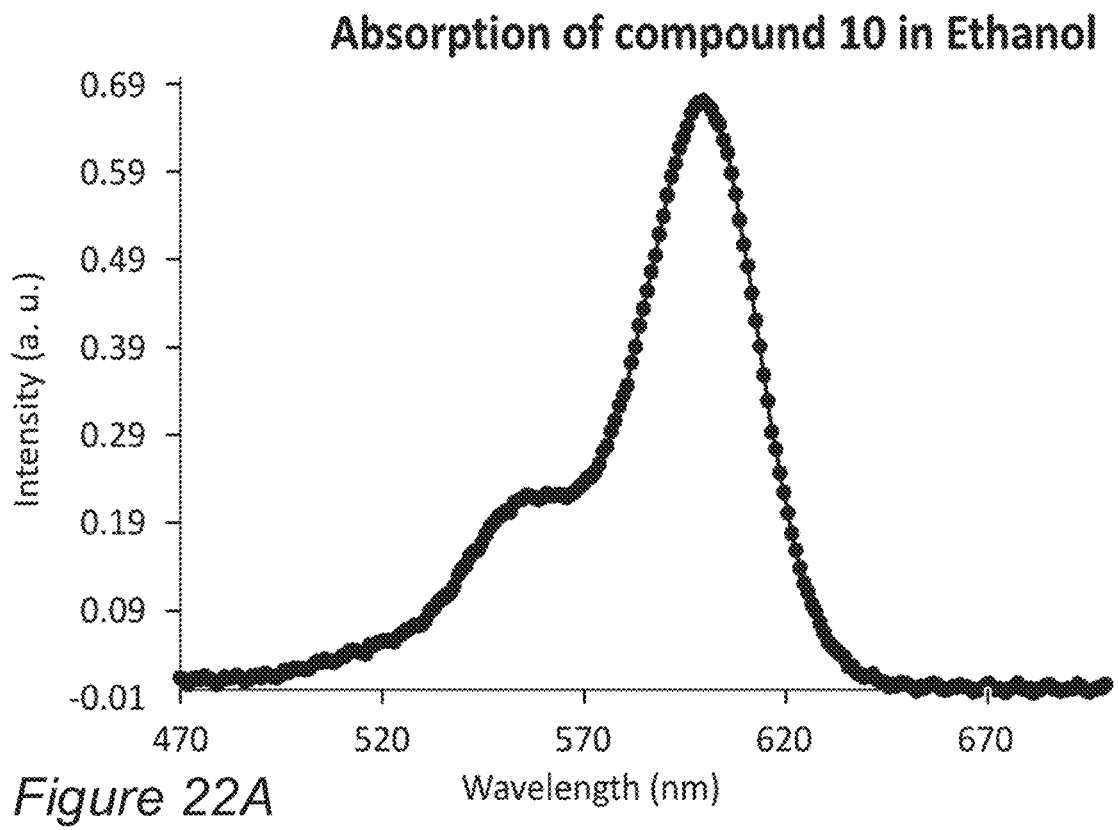
FIGS. 22A-22B depict absorption and emission spectra of compound 10 in ethanol.

UV-Vis absorption: 604 nm (in EtOH) (See FIG. 22A).

Figure 22B:
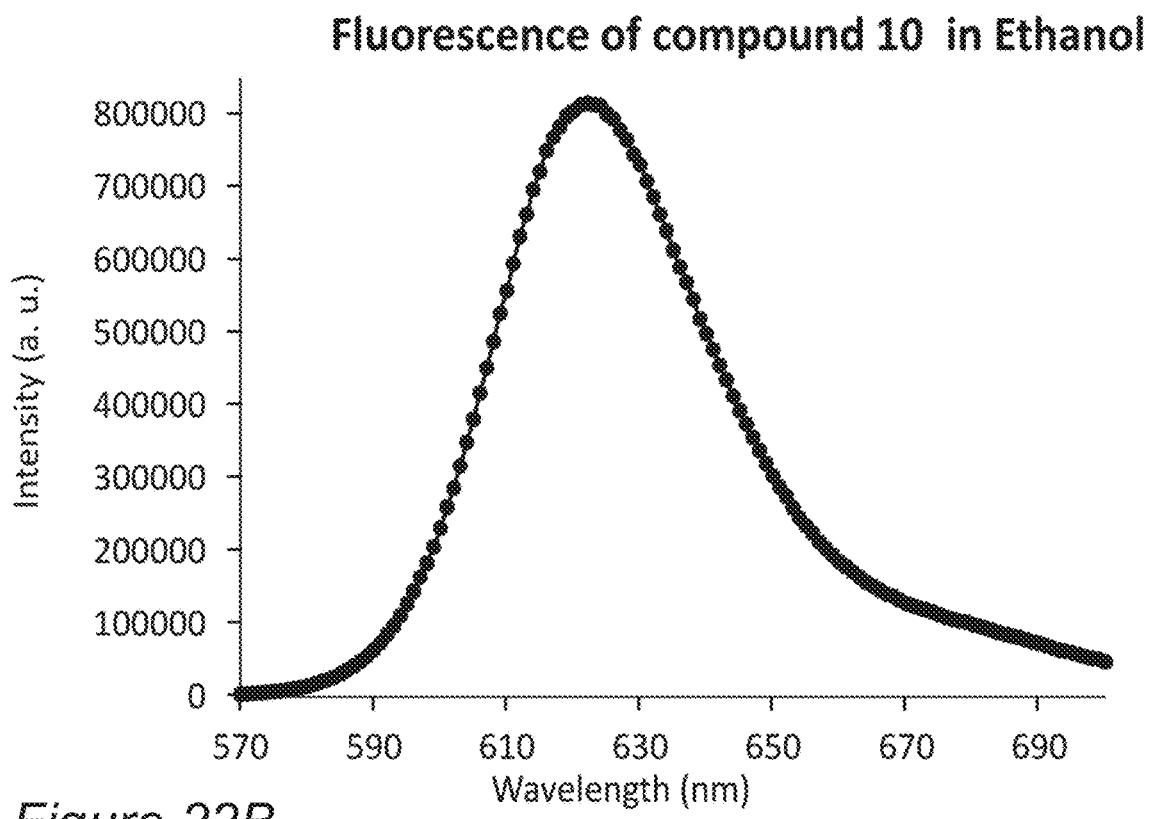
Figure 24A:
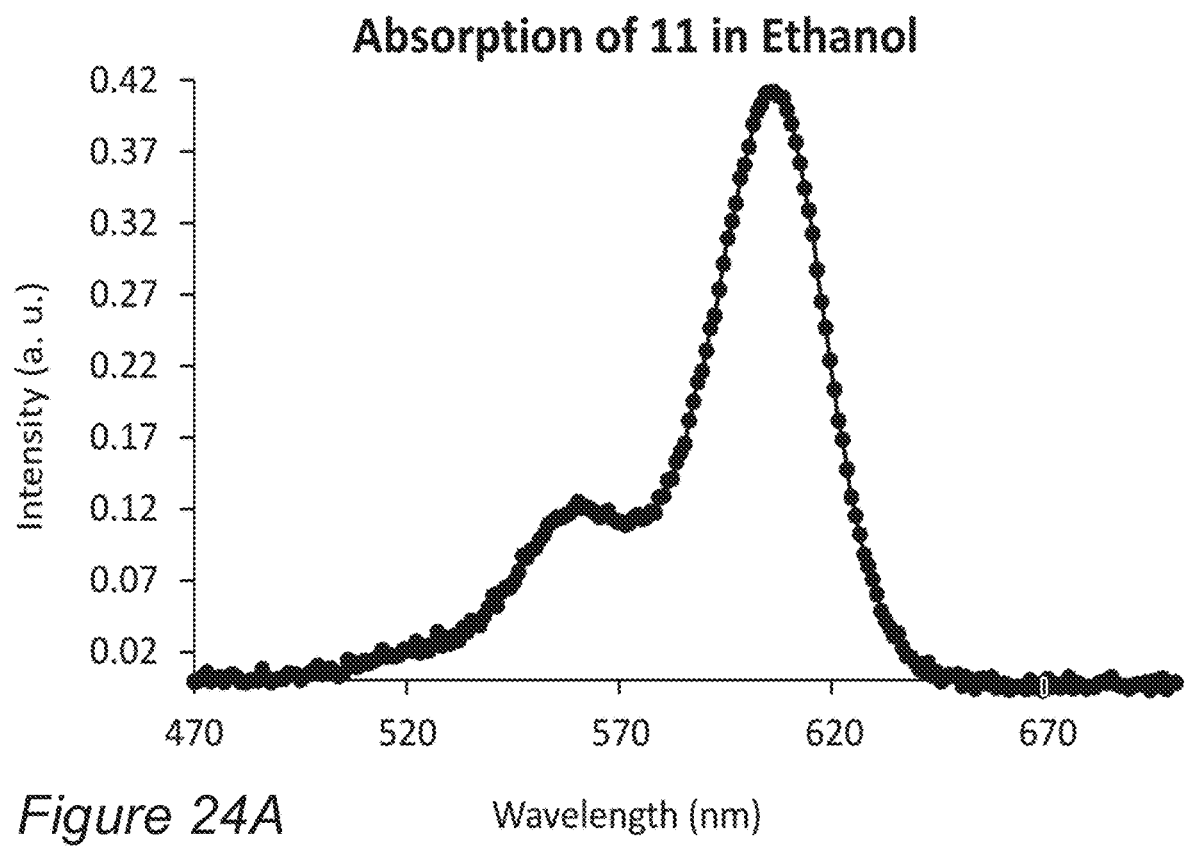
FIGS. 24A-24B depict absorption and emission spectra of compound 11 in ethanol.
Figure 24B:
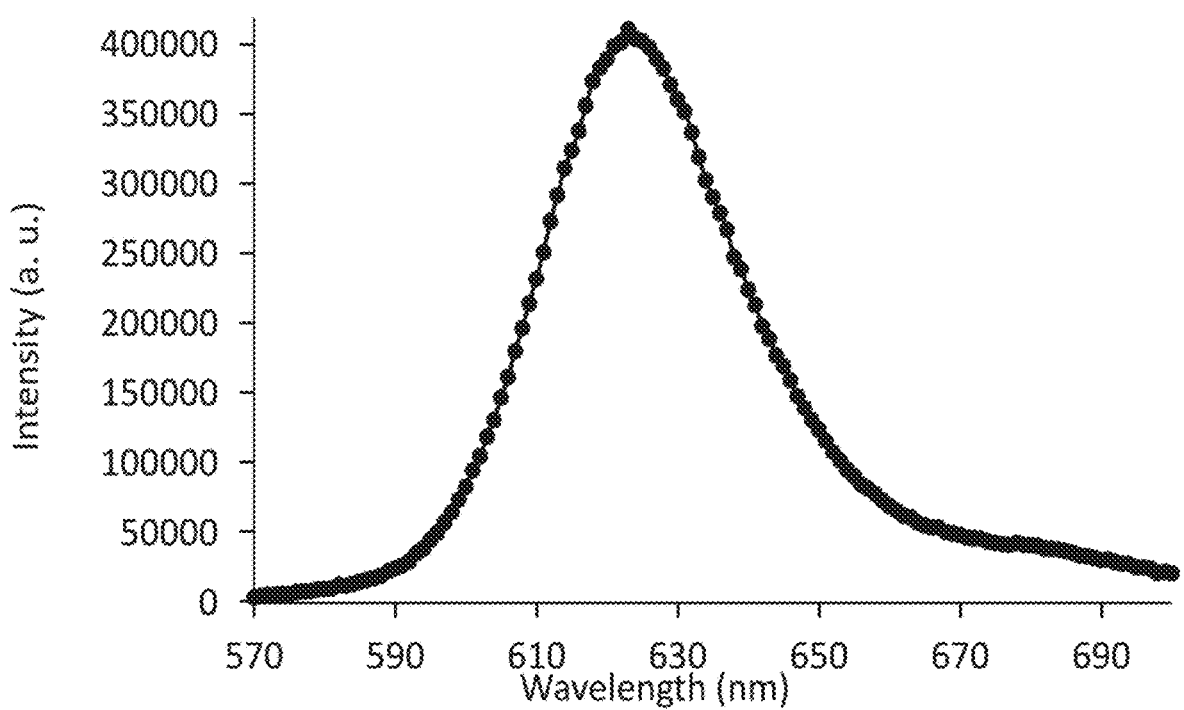

Fluorescence emission: 621 nm (in EtOH) (See FIG. 22B).

FWHM=40 nm.

Quantum yield: 67% (in ethanol).

Example 11

Synthesis of Compound 11a

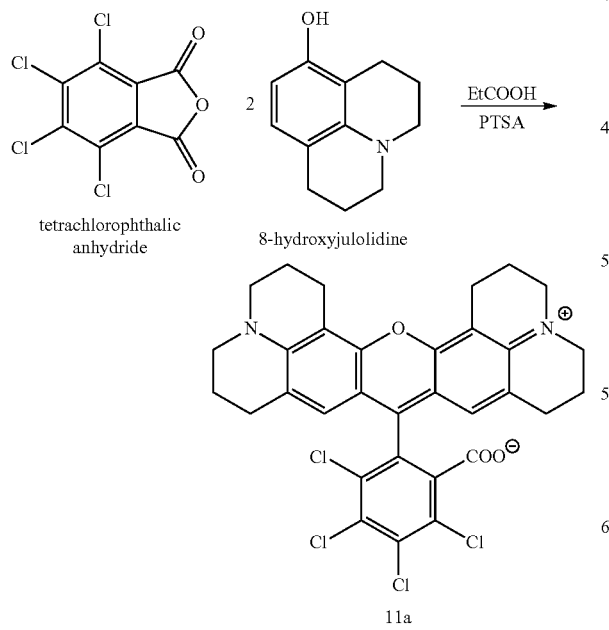

8-Hydroxyjulolidine (0.4 gr, 2.1 mmol), tetrachlorophthalic anhydride (0.38 gr, 1.32 mmol) and p-toluene sulfonic acid monohydrate (0.02 gr, 0.11 mmol) were dissolved in propionic acid (3.0 ml) under nitrogen atmosphere. The reaction was heated to reflux for 6 days. After cooling to room temperature, the solvent was removed under reduced pressure. The crude product was further purified using flash chromatography (DCM:MeOH 9:1). The pure product was obtained as dark purple solid 11-a (yield 24%).

1H NMR (400 MHz, DMSO-d6): δ 6.64 [s, 2H], 3.43-3.37 [m, 8H], 2.94-2.89 [m, 4H], 2.66-2.62 [m, 4H], 2.01-1.95 [m, 4H], 1.86-1.80 [m, 4H].

UV-Vis absorption: 594 nm (in EtOH) (See FIG. 23A).

Fluorescence emission: 609 nm (in EtOH) (See FIG. 23B).

FWHM=33 nm.

Example 12

Synthesis of Compound 11

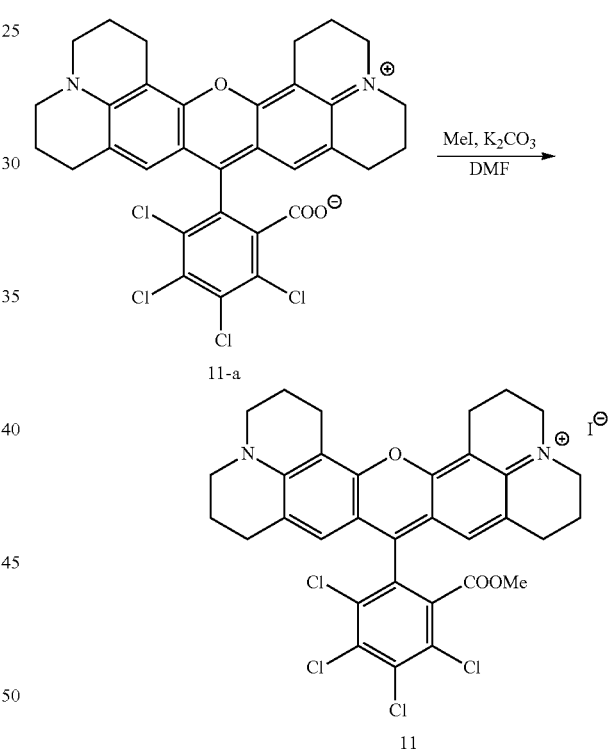

Compound 11a (0.35 gr, 0.56 mmol) was dissolved in dry DMF (6.0 ml) under nitrogen atmosphere. Potassium carbonate (0.24 gr, 1.67 mmol) was added followed by MeI (0.1 ml, 1.67 mmol). The mixture was stirred for one hour at room temperature. Upon completion, the mixture was diluted with DCM and washed with brine. The organic layer was separated, dried with sodium sulfate, and the solvent was evaporated under reduced pressure. The crude was purified by column chromatography (DCM:MeOH 9:1) to give a dark brown solid 11 (70% yield).

$^1$H NMR (400 MHz, DMSO-d6): δ 6.92 [s, 2H], 3.54-3.49 [m, 8H], 3.41 [s, 3H], 2.94 [t, J=6.16 Hz, 4H], 2.72-2.68 [m, 4H], 2.02-1.96 [m, 4H], 1.89-1.83 [m, 4H].

Example 13

Synthesis of Compounds 12a and 12b

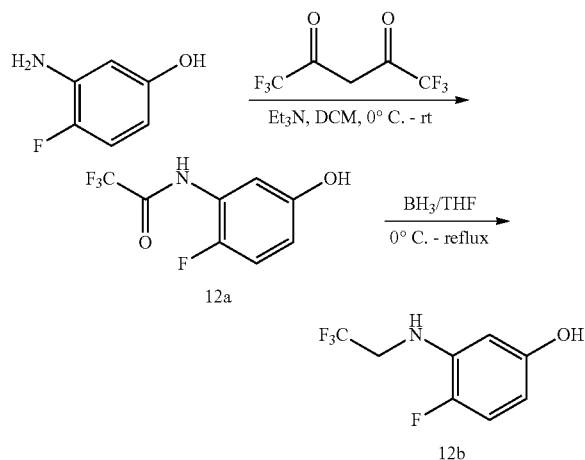

Synthesis of 2,2,2-trifluoro-N-(2-fluoro-5-hydroxyphenyl)acetamide (12a)

To a stirred solution of 3-amino-4-fluorophenol (2.0 gr, 15.7 mmol) and trimethylamine (8.8 ml, 62.8 mmol) in DCM (52 ml), trifluoroacetic anhydride (2.6 ml, 18.8 mmol) in DCM (8 ml) was added dropwise at 0° C. The reaction was stirred overnight at room temperature. After reaction completion, the mixture was diluted with H₂O (50 ml), the organic layer was separated and washed with HCl (N, 50 ml), water (50 ml) and brine (50 ml). The organic solution was dried over MgSO₄ and concentrated under reduced pressure to yield a white solid 12a (3.4 gr, 98%).

¹H NMR (CD3OD-d4, 400 MHz): δ 7.07 (dd, J=6.0 Hz, J=2.8 Hz, 1H), 7.02 (dd, J=10.4 Hz, J=9.2 Hz, 1H), 6.70 (ddd, J=9.2 Hz, J=4.0 Hz, J=3.2 Hz, 1H).

Synthesis of 4-fluoro-3-((2,2,2-trifluoroethyl)amino)phenol (12b)

To a stirred solution of 12a (3.4 gr, 15.2 mmol) in THF (40 ml), 1 M solution of BH₃ in THF (52.2 mL) was added at 0° C. and the reaction mixture was refluxed overnight. After reaction completion, MeOH (8 ml), followed by 1N NaOH (32 ml) were added at 0° C. After stirring at room temperature for 20 minutes, the mixture was diluted with ether (120 ml), and the organic layer was separated. The aqueous layer was extracted with ether (3×60 ml). Combined organic solutions were washed with sat. aq. NaHCO₃ (150 ml), brine (150 ml), dried over MgSO₄ and concentrated under reduced pressure. Purification by flash column chromatography (SiO₂, EtOAc:Hex) afforded the pure product 12b as a white solid (3.0 g, 95%). ¹H NMR (CDCl₃, 400 MHz): δ 6.76 (dd, J=11.6 Hz, J=8.7 Hz, 1H), 6.28 (dd, J=7.4 Hz, J=2.8 Hz, 1H), 6.05 (ddd, J=8.7 Hz, J=3.5 Hz, J=2.9 Hz, 1H), 3.80 (q, J=9.3 Hz, 2H).

Example 14

Synthesis of 6,6'-((2-methoxyphenyl)methylene)bis(4-fluoro-3-((2,2,2-trifluoroethyl)amino)phenol) (12c)

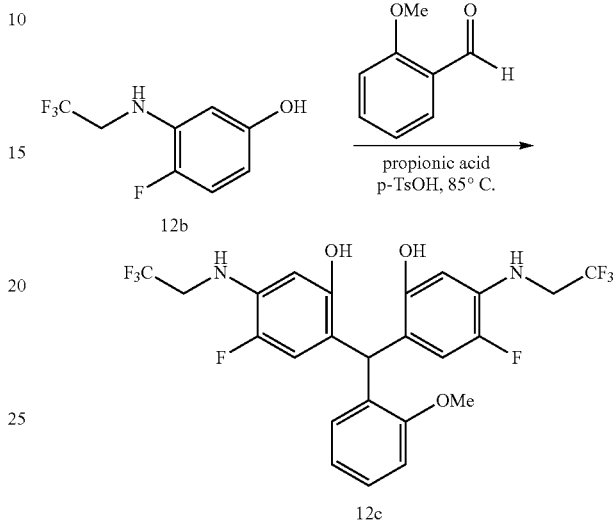

This process is based on B. R. Peterson et al. (*Beilstein J. Org. Chem.* 2012, 8, 2156-2165). Compound 12b (0.3 gr, 1.4 mmol) was dissolved in propionic acid (15 ml). Then o-anisaldehyde (0.098 gr, 0.72 mmol) and catalytic p-TsOH were added at room temperature, and the reaction was heated to 80-85° C. for 20 hours. After reaction completion, the solution was cooled to 0° C., poured into excess of aqueous sodium acetate solution (3 M, 50 ml) and extracted with ethyl acetate (75 ml). The organic layer was washed twice with water (50 ml), dried over MgSO₄ and concentrated under reduced pressure. Purification by flash column chromatography (SiO₂, EtOAc:Hex) afforded the pure product 12c as a brown solid (0.34 g, 89%). ¹H NMR (CDCl₃, 400 MHz, ppm): δ 7.30-7.27 (m, 1H), 6.97-6.91 (m, 3H), 6.50 (d, J=12.4 Hz, 2H), 6.51 (d, J=7.6 Hz, 2H), 5.83 (s, 1H), 3.78 (s, 3H), 3.73 (q, J=8.8 Hz, 4H).

Example 15

Synthesis of 6,6'-((2-methoxyphenyl)methylene)bis(4-fluoro-3-((2,2,2-trifluoroethyl)amino)phenol) (13a)

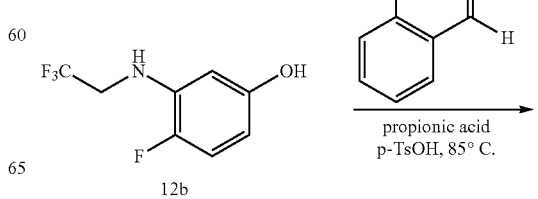

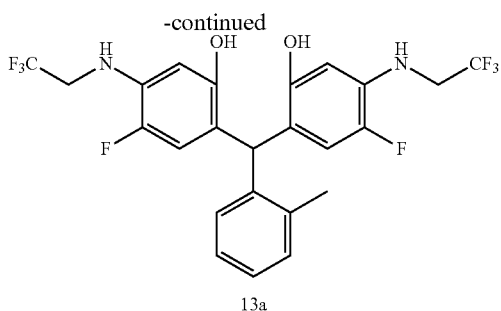

13a

This process is based on B. R. Peterson et al. (*Beilstein J. Org. Chem.* 2012, 8, 2156-2165). Compound 12b (0.3 gr, 1.4 mmol) was dissolved in propionic acid (15 ml). Then o-tolualdehyde (0.085 ml, 0.72 mmol) and catalytic p-TsOH were added at room temperature, and the reaction was heated to 80-85° C. for 20 hours. After reaction completion, the solution was cooled to 0° C., poured into excess of aqueous sodium acetate solution (3 M, 50 ml) and extracted with ethyl acetate (75 ml). The organic layer was washed twice with water (50 ml), dried over MgSO$_4$ and concentrated under reduced pressure. Purification by flash column chromatography (SiO$_2$, EtOAc:Hex) afforded the pure product 13a as a brown solid (0.35 gr, 93%).

$^1$H NMR (CDCl3, 400 MHz): δ 7.21-7.12 (m, 3H), 6.89 (m, 1H), 6.39 (d, J=12.4 Hz, 2H), 6.30 (d, J=7.6 Hz, 2H), 5.67 (s, 1H), 3.74 (q, J=8.8 Hz, 4H), 2.20 (s, 3H).

Example 16

Synthesis of 6,6'-(phenylmethylene)bis(4-fluoro-3-((2,2,2-trifluoroethyl)amino)phenol) (14a)

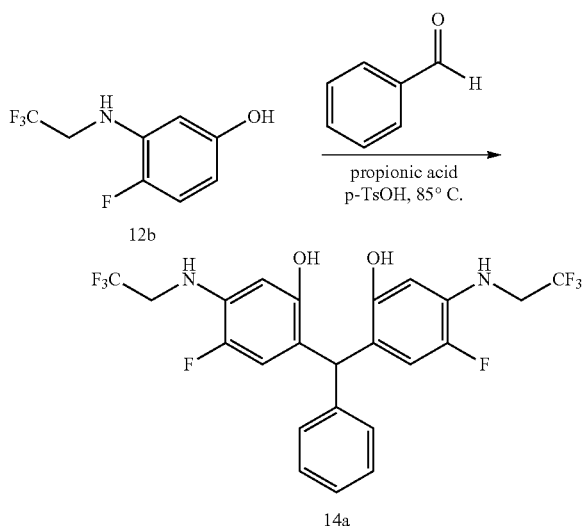

This process is based on B. R. Peterson et al. (*Beilstein J. Org. Chem.* 2012, 8, 2156-2165). Compound 12b (0.3 gr, 1.4 mmol) was dissolved in propionic acid (15 ml). Then benzaldehyde (0.073 ml, 0.72 mmol) and catalytic p-TsOH were added at room temperature, and the reaction was heated to 80-85° C. for 20 hours. After reaction completion, the solution was cooled to 0° C., poured into excess of aqueous sodium acetate solution (3 M, 50 ml) and extracted with ethyl acetate (75 ml). The organic layer was washed twice with water (50 ml), dried over MgSO$_4$ and concentrated under reduced pressure. Purification by flash column chromatography (SiO$_2$, EtOAc:Hex) afforded the pure product 14a as a brown solid (0.26 gr, 73%).

$^1$H NMR (CDCl$_3$, 400 MHz): δ 7.35-7.25 (m, 3H), 7.15-7.13 (m, 2H), 6.50 (d, J=12.4 Hz, 2H), 6.28 (d, J=7.6 Hz, 2H), 5.65 (s, 1H), 3.71 (q, J=8.8 Hz, 4H).

Example 17

Synthesis of 6,6'-((2-fluorophenyl)methylene)bis(4-fluoro-3-((2,2,2-trifluoroethyl)amino)phenol) (15a)

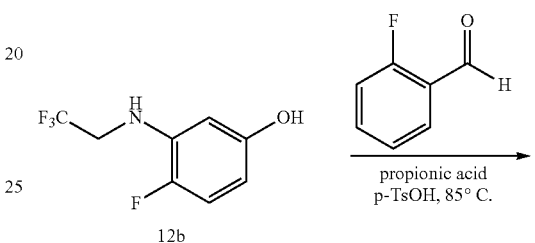

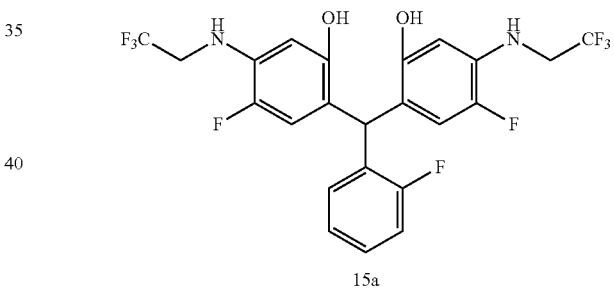

15a

This process is based on B. R. Peterson et al. (*Beilstein J. Org. Chem.* 2012, 8, 2156-2165). Compound 12b (0.3 gr, 1.4 mmol) was dissolved in propionic acid (15 ml). Then fluorobenzaldehyde (0.075 ml, 0.72 mmol) and catalytic p-TsOH were added at room temperature, and the reaction was heated to 80-85° C. for 20 hours. After reaction completion, the solution was cooled to 0° C., poured into excess of aqueous sodium acetate solution (3 M, 50 ml) and extracted with ethyl acetate (75 ml). The organic layer was washed twice with water (50 ml), dried over MgSO$_4$ and concentrated under reduced pressure. Purification by flash column chromatography (SiO$_2$, EtOAc:Hex) afforded the pure product 15a as a brown solid (0.15 gr, 40%).

$^1$H NMR (CDCl$_3$, 400 MHz): δ 7.11-6.94 (m, 4H), 6.47 (d, J=12.0 Hz, 2H), 6.29 (d, J=7.6 Hz, 2H), 5.89 (s, 1H), 3.74 (q, J=7.6 Hz, 4H).

Example 18

Synthesis of 6,6'-((2-fluorophenyl)methylene)bis(4-fluoro-3-((2,2,2-trifluoroethyl)amino)phenol) (16a)

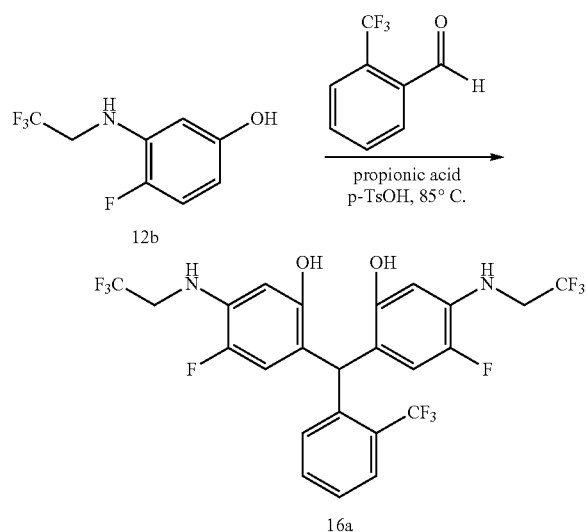

This process is based on B. R. Peterson et al. (*Beilstein J. Org. Chem.* 2012, 8, 2156-2165). Compound 12b (0.3 gr, 1.4 mmol) was dissolved in propionic acid (15 ml). Then o-(trifluoromethyl)benzaldehyde (0.095 ml, 0.72 mmol) and catalytic p-TsOH were added at room temperature, and the reaction was heated to 80-85° C. for 20 hours. After reaction completion, the solution was cooled to 0° C., poured into excess of aqueous sodium acetate solution (3 M, 50 ml) and extracted with ethyl acetate (75 ml). The organic layer was washed twice with water (50 ml), dried over MgSO₄ and concentrated under reduced pressure. Purification by flash column chromatography (SiO₂, EtOAc:Hex) afforded the pure product 16a as a brown solid (0.33 gr, 79%). ¹H NMR (CDCl₃, 400 MHz, ppm): δ 7.72 (d, J=7.6 Hz, 1H), 7.52-7.37 (m, 2H), 7.19-716 (m, 1H), 6.37 (d, J=12.3 Hz, 2H), 6.27 (d, J=7.5 Hz, 2H), 6.01 (s, 1H), 3.78-3.71 (m, 4H).

Example 19

Synthesis of 6,6'-((4-methoxyphenyl)methylene)bis(4-fluoro-3-((2,2,2-trifluoroethyl)amino)phenol) (17a)

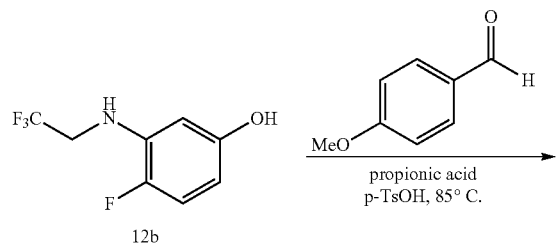

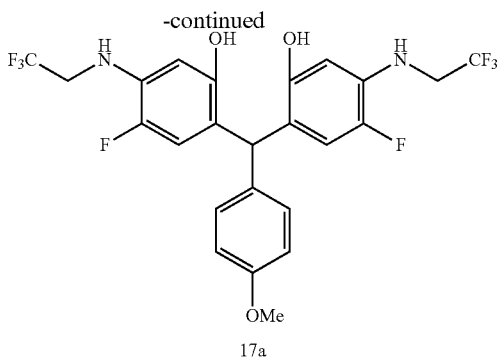

This process is based on B. R. Peterson et al. (*Beilstein J. Org. Chem.* 2012, 8, 2156-2165). Compound 2 (0.4 gr, 1.9 mmol) was dissolved in propionic acid (10 ml). Then 4-methoxybenzaldehyde (0.12 ml, 0.96 mmol) and catalytic p-TsOH were added at room temperature, and the reaction was heated to 80-85° C. for five hours. After reaction completion, the solution was cooled to 0° C., poured into excess of aqueous sodium acetate solution (3 M, 40 ml) and extracted with ethyl acetate (60 ml). The organic layer was washed twice with water (40 ml), dried over MgSO₄ and concentrated under reduced pressure. Purification by flash column chromatography (SiO₂, EtOAc:Hex) afforded the pure product 17a as a brown solid (0.40 gr, 78%).

¹H NMR (CDCl3, 400 MHz): δ 7.06 (d, J=8.6 Hz, 2H), 6.87 (d, J=8.7 Hz, 2H), 6.48 (d, J=12.3 Hz, 2H), 6.29 (d, J=7.6 Hz, 2H), 5.54 (s, 1H), 3.80 (s, 3H), 3.74 (q, J=7.2 Hz, 4H).

Example 20

Synthesis of 6,6'-((4-hydroxyphenyl)methylene)bis(4-fluoro-3-((2,2,2-trifluoroethyl)amino)phenol) (18a)

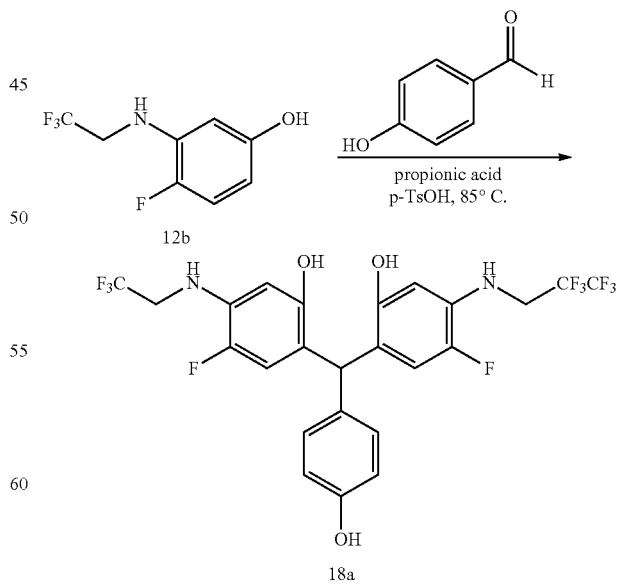

This process is based on B. R. Peterson et al. (*Beilstein J. Org. Chem.* 2012, 8, 2156-2165).

Compound 2 (2.0 gr, 9.5 mmol) was dissolved in propionic acid (40 ml). Then 4-hydroxybenzaldehyde (0.584 gr, 4.8 mmol) and catalytic p-TsOH were added at room temperature, and the reaction was heated to 80-85° C. for five hours. After reaction completion, the solution was cooled to 0° C., poured into excess of aqueous sodium acetate solution (3 M, 300 ml) and extracted with ethyl acetate (450 ml). The organic layer was washed twice with water (300 ml), dried over MgSO₄ and concentrated under reduced pressure. Purification by flash column chromatography (SiO₂, EtOAc: Hex) afforded the pure product 14 as a brown-yellow solid (1.19 gr, 47%).

$^1$H NMR (CDCl₃, 400 MHz): δ 7.02 (d, J=8.4 Hz, 2H), 6.80 (d, J=8.6 Hz, 2H), 6.49 (d, J=12.3 Hz, 2H), 6.30 (d, J=7.5 Hz, 2H) 5.54 (s, 1H), 4.21-4.17 (m, 2H), 3.78-3.69 (m, 4H).

Example 21

Synthesis of (Z)-N-(2,7-difluoro-9-(2-methoxyphenyl)-6-((2,2,2-trifluoroethyl)amino)-3H-xanthen-3-ylidene)-2,2,2-trifluoroethanaminium (12)

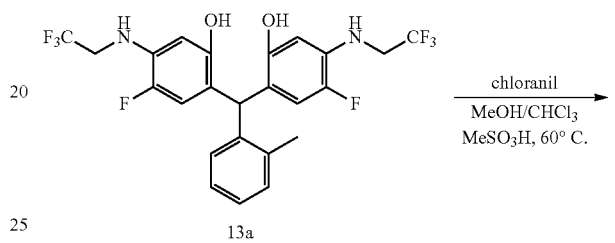

This process is based on B. R. Peterson et al. (*Beilstein J. Org. Chem.* 2012, 8, 2156-2165). To a stirred solution of 12c (0.34 gr, 0.64 mmol) and chloranil (0.24 gr, 0.96 mmol) in MeOH/CHCl₃ (1:1, 30 ml), MeSO₃H (2.0 ml) was added and the reaction mixture was heated at 60° C. for two hours. After reaction completion, solvents were evaporated, the crude was dissolved in EtOAc (50 ml) and washed with water (3×30 ml). The combined water fractions were extracted with THF (3×50 ml). The combined organic fractions were dried over MgSO₄ and concentrated under reduced pressure. Purification by flash column chromatography (SiO₂, Acetone:Methanol) afforded the pure product 12 as a brown solid.

$^1$H NMR (CDCl₃, 400 MHz): δ 7.55-7.51 (m, 1H), 7.14-7.08 (m, 3H), 6.60 (d, J=11.6 Hz, 2H), 6.53 (d, J=6.8 Hz, 2H), 3.96 (q, J=9.2 Hz, 4H), 3.73 (s, 3H).

Figure 25A:
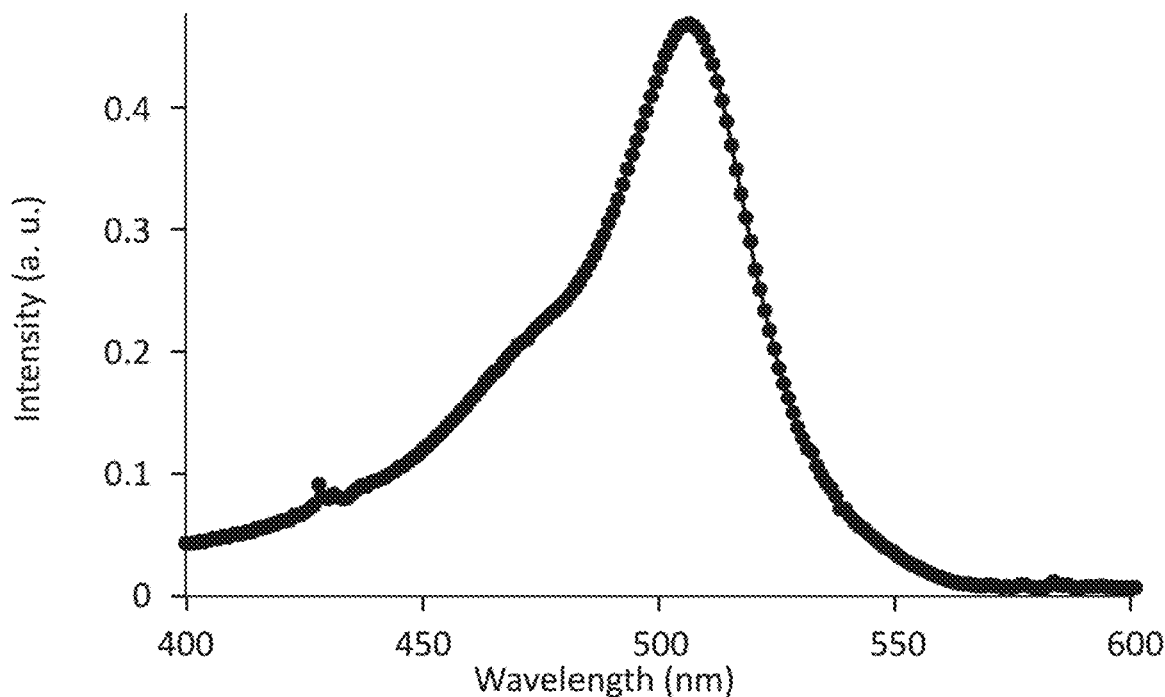
FIGS. 25A-25B depict absorption and emission spectra of compound 12 in ethanol.

UV-Vis absorption of Compound 12 is: 506 nm (in ethanol) (See FIG. 25A).

Figure 25B:
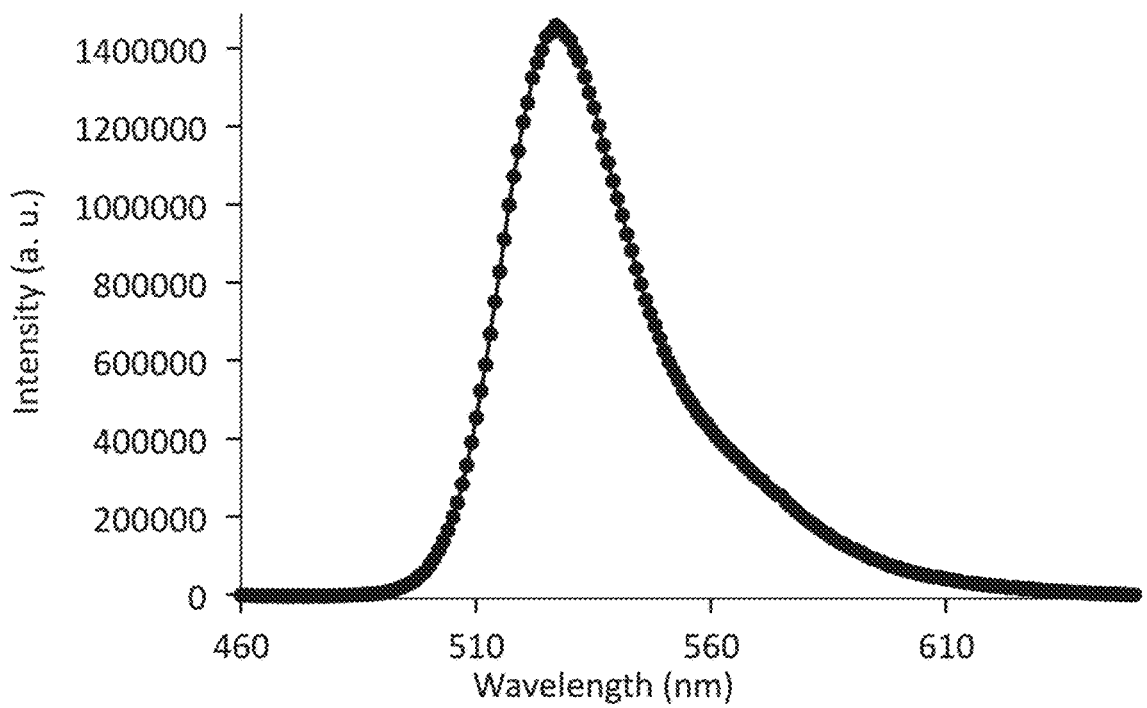

Fluorescence emission: 527 nm (in ethanol) (See FIG. 25B).

FWHM=32 nm.

Example 22

Synthesis of (Z)-N-(2,7-difluoro-9-(2-methylphenyl)-6-((2,2,2-trifluoroethyl)amino)-3H-xanthen-3-ylidene)-2,2,2-trifluoroethanaminium (13)

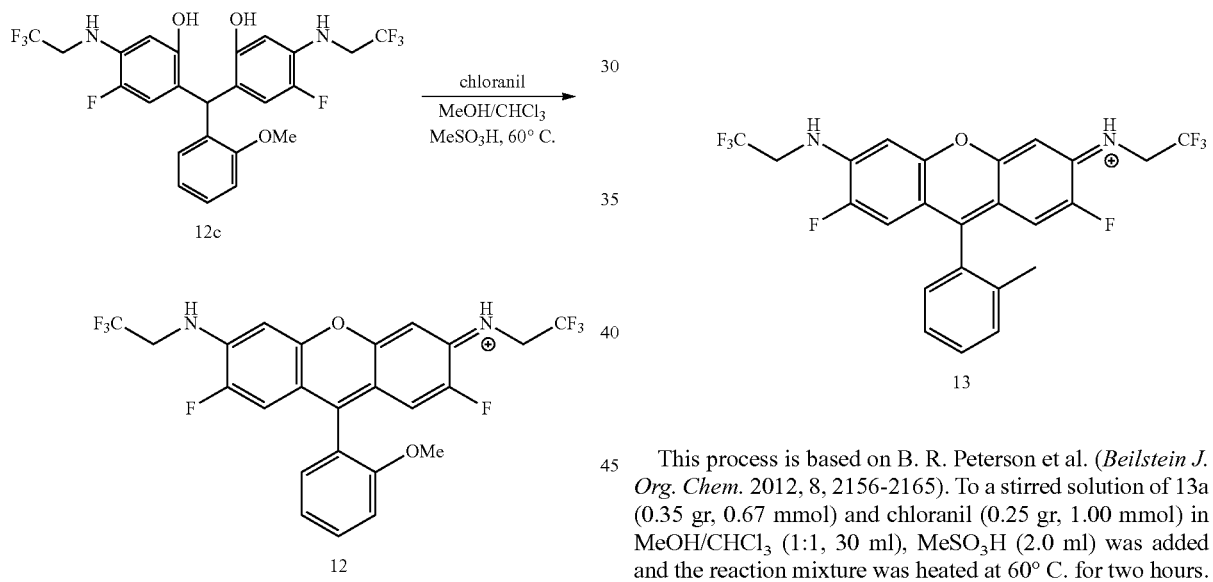

This process is based on B. R. Peterson et al. (*Beilstein J. Org. Chem.* 2012, 8, 2156-2165). To a stirred solution of 13a (0.35 gr, 0.67 mmol) and chloranil (0.25 gr, 1.00 mmol) in MeOH/CHCl₃ (1:1, 30 ml), MeSO₃H (2.0 ml) was added and the reaction mixture was heated at 60° C. for two hours. After reaction completion, solvents were evaporated, the crude was dissolved in EtOAc (50 ml) and washed with water (3×30 ml). The combined water fractions were extracted with THF (3×50 ml). The combined organic fractions were dried over MgSO₄ and concentrated under reduced pressure. Purification by flash column chromatography (SiO₂, Acetone:Methanol) afforded the pure product 13 as a brown solid.

$^1$H NMR (CDCl₃, 400 MHz): δ 7.45-7.34 (m, 3H), 7.10 (d, J=7.2 Hz, 1H), 6.57 (d, J=6.8 Hz, 2H), 6.53 (d, J=11.6 Hz, 2H), 5.12 (br s, 2H), 3.98 (q, J=8.8 Hz, 4H), 2.06 (s, 3H).

Figure 26A:
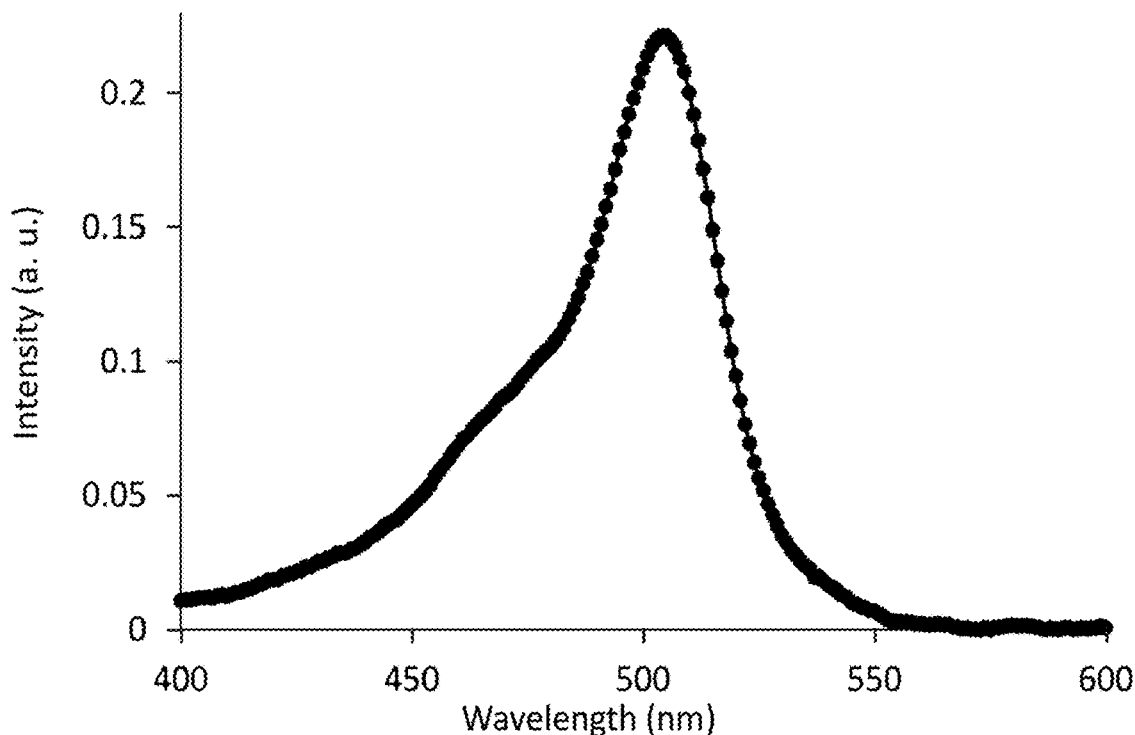
FIGS. 26A-26B depict absorption and emission spectra of compound 13 in ethanol.

UV-Vis absorption of Compound 13 is: 505 nm (in ethanol) (See FIG. 26A).

Figure 26B:
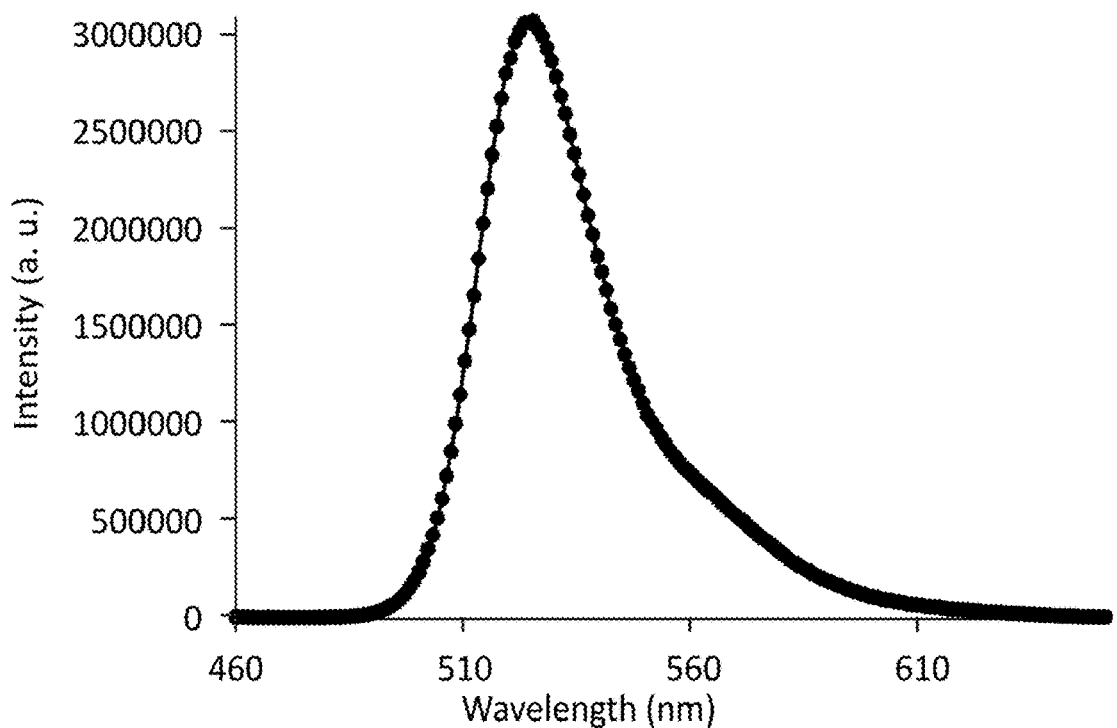

Fluorescence emission: 525 nm (in ethanol) (See FIG. 26B).

FWHM=32 nm.

Example 23

Synthesis of (Z)-N-(2,7-difluoro-9-phenyl-6-((2,2,2-trifluoroethyl)amino)-3H-xanthen-3-ylidene)-2,2,2-trifluoroethanaminium (14)

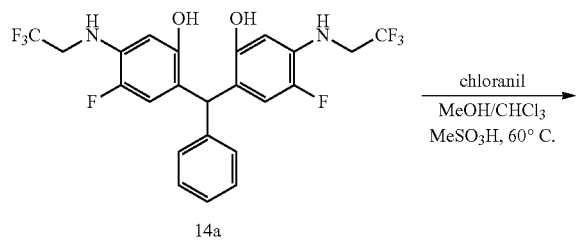

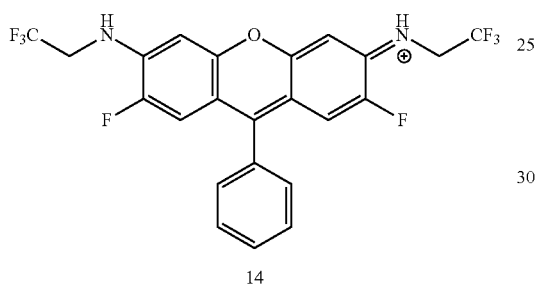

This process is based on B. R. Peterson et al. (*Beilstein J. Org. Chem.* 2012, 8, 2156-2165). To a stirred solution of 14a (0.26 gr, 0.52 mmol) and chloranil (0.19 gr, 0.78 mmol) in MeOH/CHCl₃ (1:1, 30 ml), MeSO₃H (2.0 ml) was added and the reaction mixture was heated at 60° C. for two hours. After reaction completion, solvents were evaporated, the crude was dissolved in EtOAc (50 ml) and washed with water (3×30 ml). The combined water fractions were extracted with THF (3×50 ml). The combined organic fractions were dried over MgSO₄ and concentrated under reduced pressure. Purification by flash column chromatography (SiO₂, Acetone:Methanol) afforded the pure product 14 as a brown solid.

$^1$H NMR (CDCl₃, 400 MHz): δ 7.37-7.34 (m, 2H), 7.28-7.25 (m, 2H), 7.20-7.16 (m, 1H), 6.74 (d, J=12.0 Hz, 2H), 6.50 (d, J=7.6 Hz, 2H), 4.38-4.34 (m, 2H), 3.86-3.77 (m, 4H), 2.90 (s, 3H).

Figure 27A:
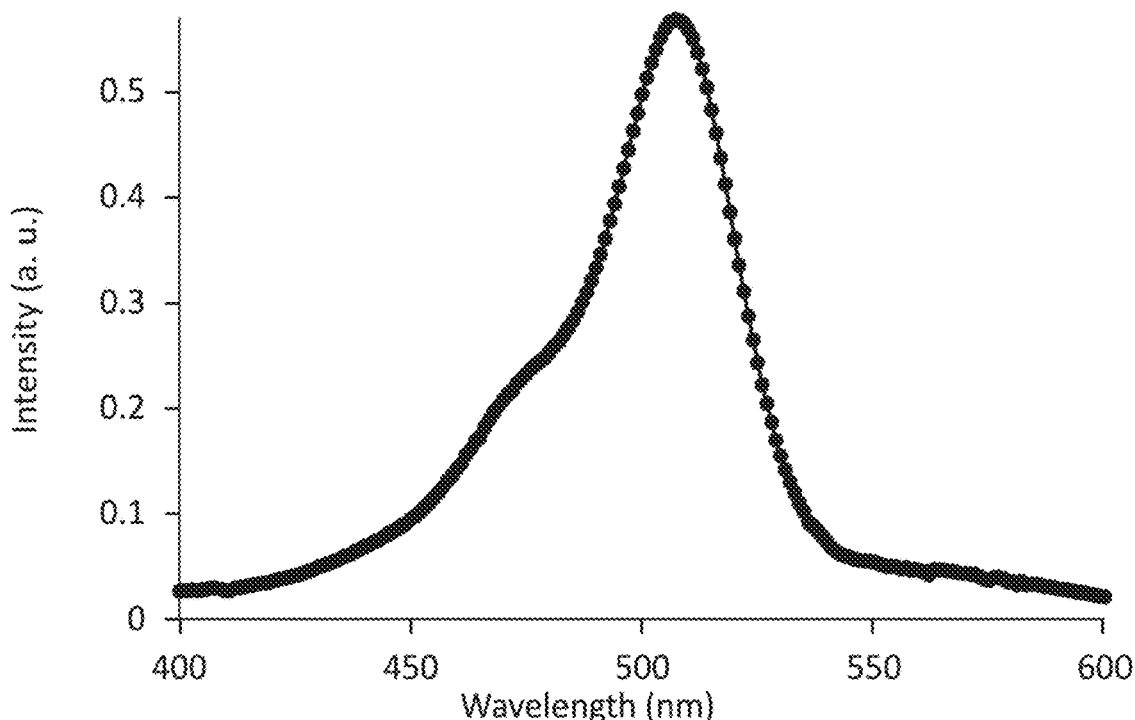
FIGS. 27A-27B depict absorption and emission spectra of compound 14 in ethanol.

UV-Vis absorption of Compound 14 is: 507 nm (in ethanol) (See FIG. 27A).

Figure 27B:
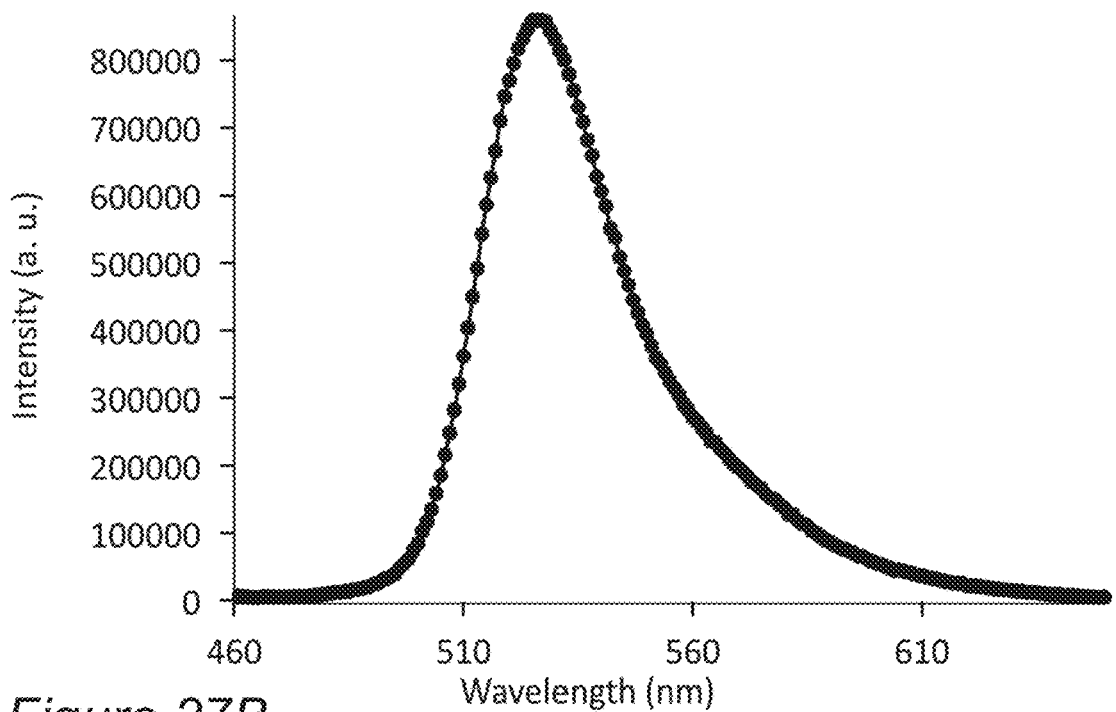

Fluorescence emission: 525 nm (in ethanol) (See FIG. 27B).

FWHM=35 nm.

Quantum yield: 89% (in ethanol).

Example 24

Synthesis of (Z)-N-(2,7-difluoro-9-(2-fluorophenyl)-6-((2,2,2-trifluoroethyl)amino)-3H-xanthen-3-ylidene)-2,2,2-trifluoroethanaminium (15)

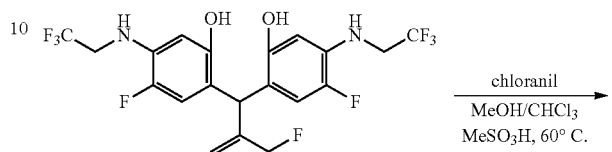

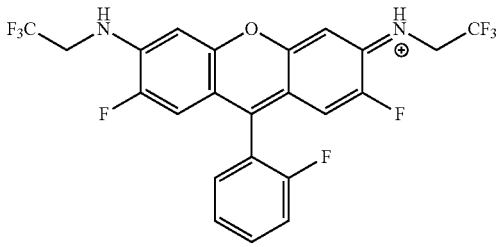

This process is based on B. R. Peterson et al. (*Beilstein J. Org. Chem.* 2012, 8, 2156-2165). To a stirred solution of 15a (0.15 gr, 0.29 mmol) and chloranil (0.11 gr, 0.43 mmol) in MeOH/CHCl₃ (1:1, 15 ml), MeSO₃H (0.5 ml) was added and the reaction mixture was heated at 60° C. for two hours. After reaction completion, solvents were evaporated, the crude was dissolved in EtOAc (25 ml) and washed with water (3×15 ml). The combined water fractions were extracted with THF (3×25 ml). The combined organic fractions were dried over MgSO₄ and concentrated under reduced pressure. Purification by flash column chromatography (SiO₂, Acetone:Methanol) afforded the pure product 15 as a brown solid.

$^1$H NMR (CDCl₃, 400 MHz): δ 8.09-8.05 (m, 1H), 7.25-7.21 (m, 2H), 6.83-6.21 (m, 1H), 6.69 (d, J=11.6 Hz, 2H), 6.50 (d, J=8.8 Hz, 2H), 4.36-4.33 (m, 2H), 3.85-3.76 (m, 4H), 2.84 (s, 3H).

Figure 28A:
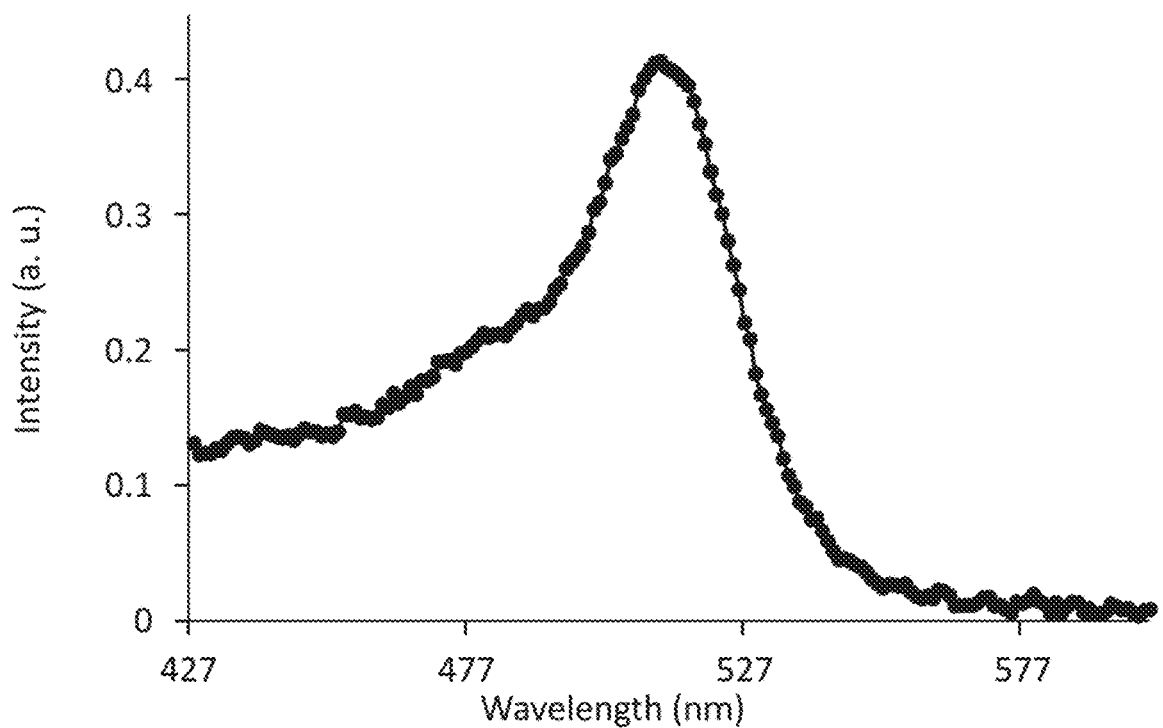
FIGS. 28A-28B depict absorption and emission spectra of compound 15 in ethanol.

UV-Vis absorption of Compound 15 is: 512 nm (in ethanol) (See FIG. 28A).

Figure 28B:
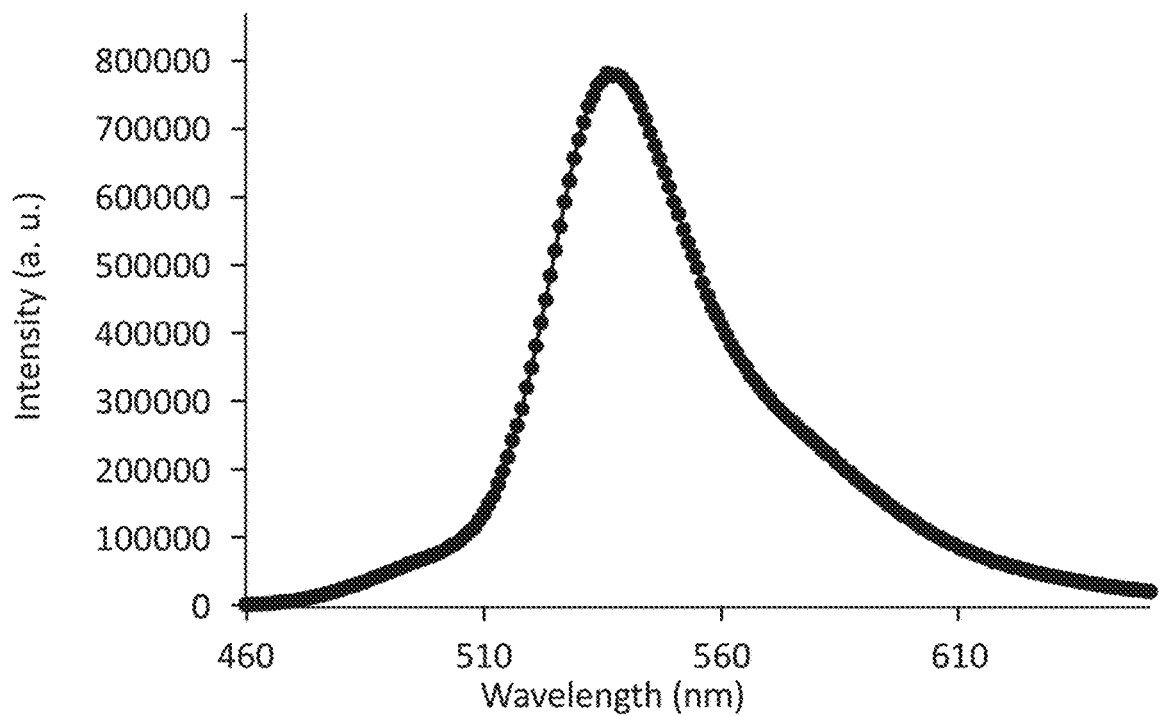

Fluorescence emission: 538 nm (in ethanol) (See FIG. 28B).

FWHM=41 nm.

Example 25

Synthesis of (Z)-N-(2,7-difluoro-9-(2-trifluoromethyl)phenyl)-6-((2,2,2-trifluoroethyl)amino)-3H-xanthen-3-ylidene)-2,2,2-trifluoroethanaminium (16)

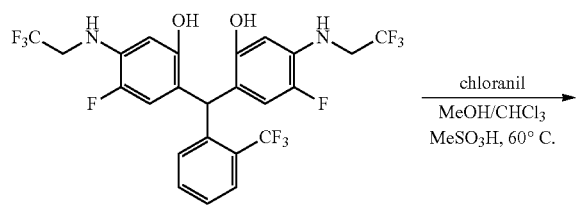

16a

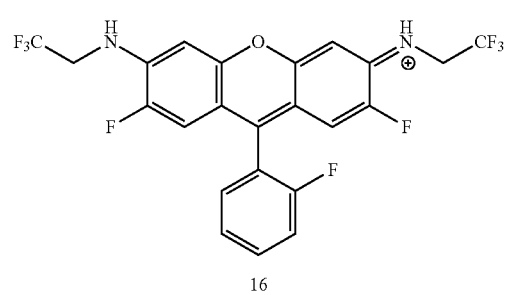

16

Example 26

Synthesis of (Z)-N-(2,7-difluoro-9-(4-methoxyphenyl)-6-((2,2,2-trifluoroethyl)amino)-3H-xanthen-3-ylidene)-2,2,2-trifluoroethanaminium (17)

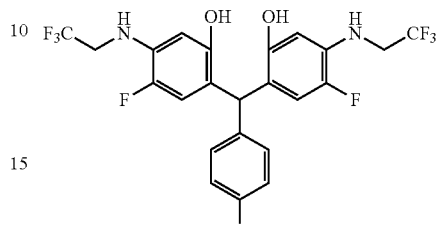

17a

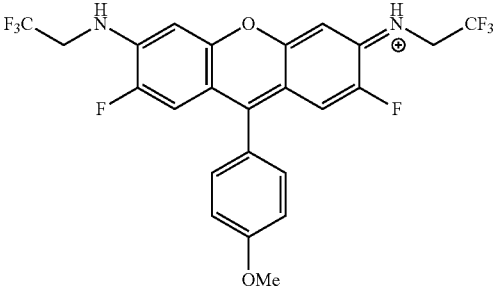

17

This process is based on B. R. Peterson et al. (*Beilstein J. Org. Chem.* 2012, 8, 2156-2165). To a stirred solution of 16a (0.33 gr, 0.57 mmol) and chloranil (0.21 gr, 0.85 mmol) in MeOH/CHCl$_3$ (1:1, 30 ml), MeSO$_3$H (1.0 ml) was added and the reaction mixture was heated at 60° C. for two hours. After reaction completion, solvents were evaporated, the crude was dissolved in EtOAc (50 ml) and washed with water (3×30 ml). The combined water fractions were extracted with THF (3×50 ml). The combined organic fractions were dried over MgSO$_4$ and concentrated under reduced pressure. Purification by flash column chromatography (SiO$_2$, Acetone:Methanol) afforded the pure product 16 as a brown solid.

$^1$H NMR (CDCl$_3$, 400 MHz): δ 7.91 (d, J=7.2 Hz, 1H), 7.77-7.68 (m, 2H), 7.28 (d, J=7.6 Hz, 2H), 6.48 (d, J=6.4 Hz, 2H), 6.26 (d, J=11.6 Hz, 2H), 3.93 (q, J=8.8 Hz, 4H).

Figure 29A:
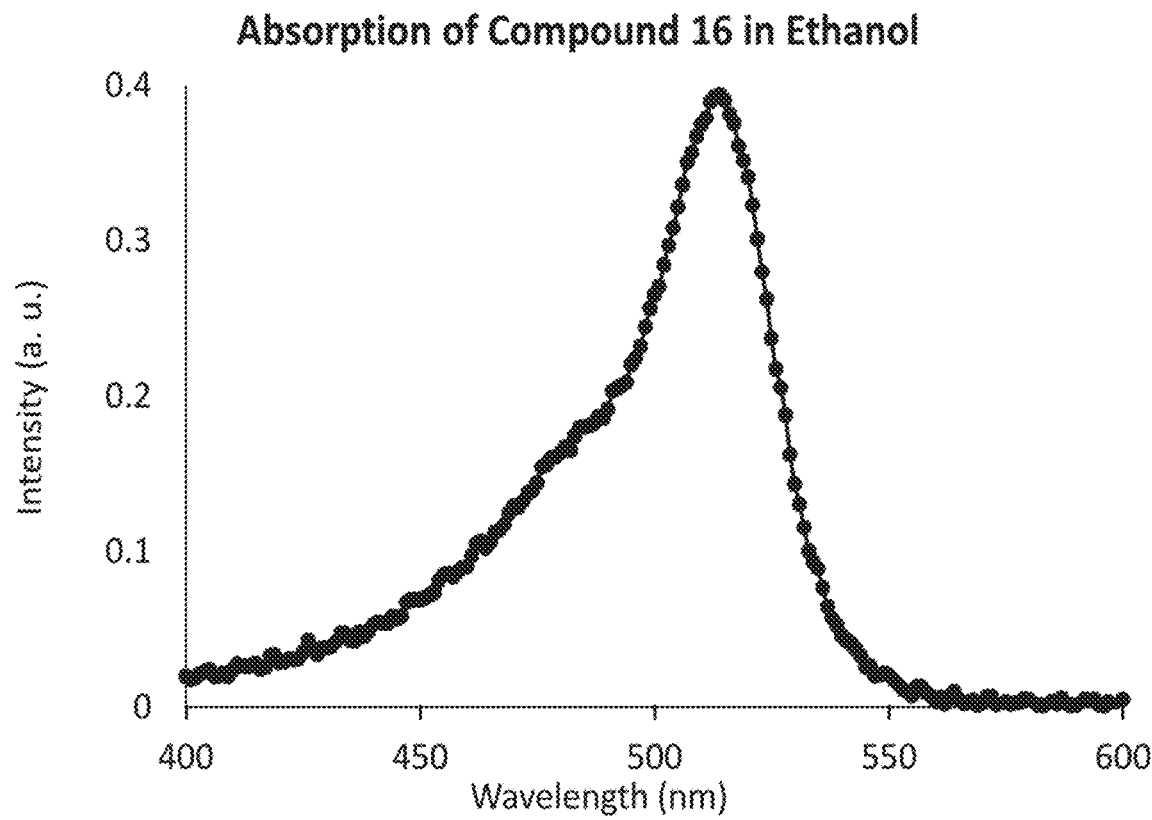
FIGS. 29A-29B depict absorption and emission spectra of compound 16 in ethanol.

UV-Vis absorption of Compound 16 is: 514 nm (in ethanol) (See FIG. 29A).

Figure 29B:
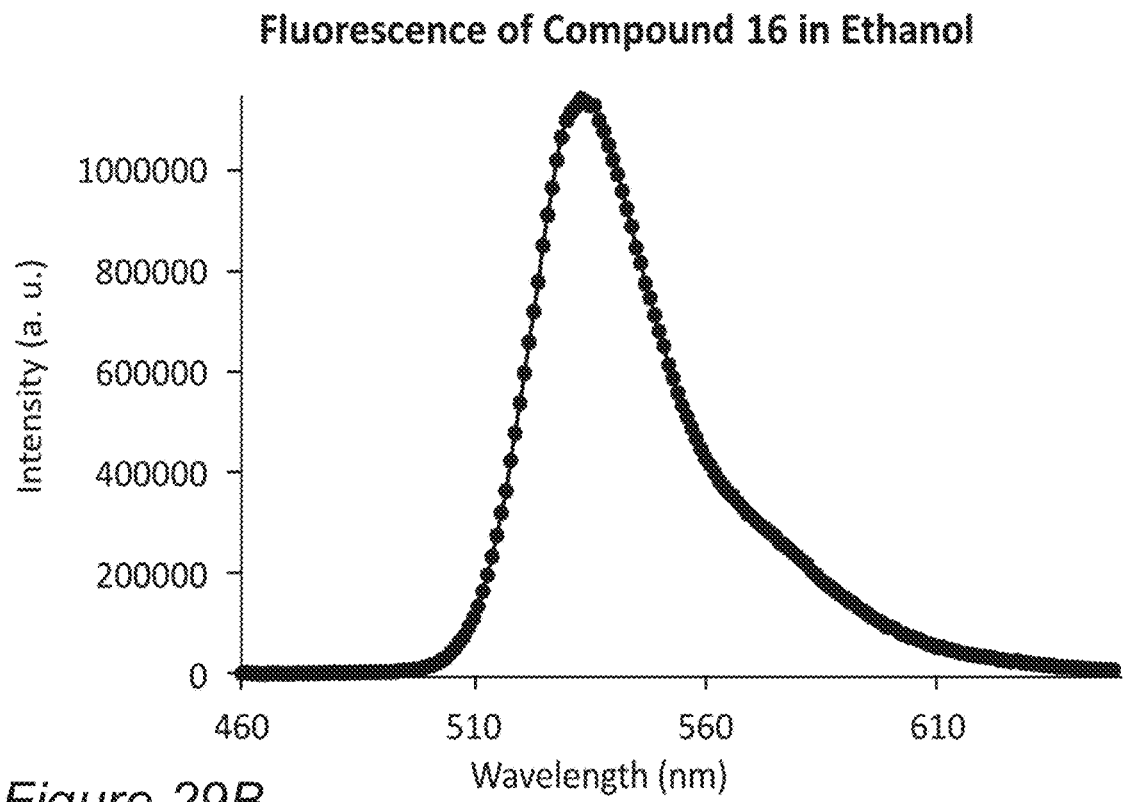

Fluorescence emission: 533 nm (in ethanol) (See FIG. 29B).

FWHM=35 nm.

This process is based on B. R. Peterson et al. (*Beilstein J. Org. Chem.* 2012, 8, 2156-2165). To a stirred solution of 17a (0.40 gr, 0.74 mmol—see Example 19) and chloranil (0.27 gr, 1.1 mmol) in MeOH/CHCl$_3$ (1:1, 30 ml), MeSO$_3$H (2.0 ml) was added and the reaction mixture was heated at 60° C. for two hours. After reaction completion, solvents were evaporated, the crude was dissolved in EtOAc (50 ml) and washed with water (3×30 ml). The combined water fractions were extracted with THF (3×50 ml). The combined organic fractions were dried over MgSO$_4$ and concentrated under reduced pressure. Purification by flash column chromatography (SiO$_2$, Acetone:Methanol) afforded the pure product 17 as a brown solid.

$^1$H NMR (MeOD-d4, 400 MHz): δ 7.53 (d, J=8.4 Hz, 2H), 7.48 (d, J=6.6 Hz, 2H), 7.41 (d, J=11.9 Hz, 2H), 5.30 (d, J=8.2 Hz, 2H), 4.35 (q, J=8.9 Hz, 4H), 3.98 (s, 3H).

Figure 30A:
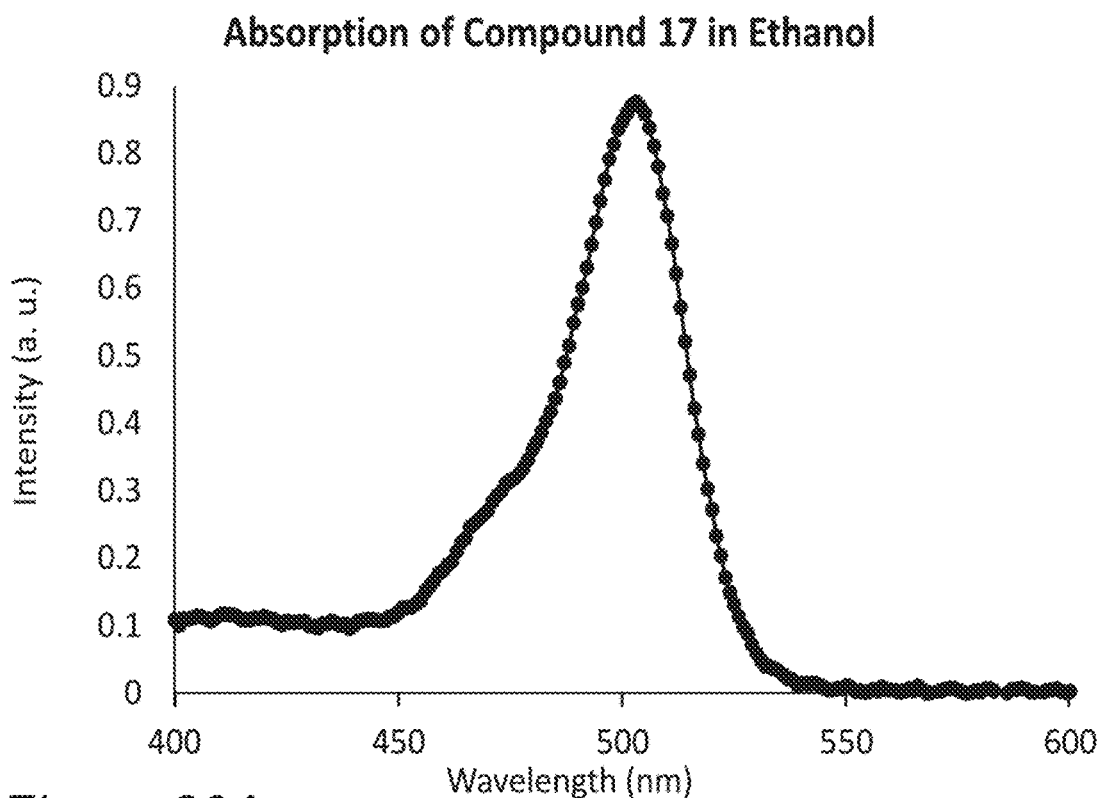
FIGS. 30A-30B depict absorption and emission spectra of compound 17 in ethanol.

UV-Vis absorption of Compound 17 is: 503 nm (in ethanol) (See FIG. 30A).

Figure 30B:
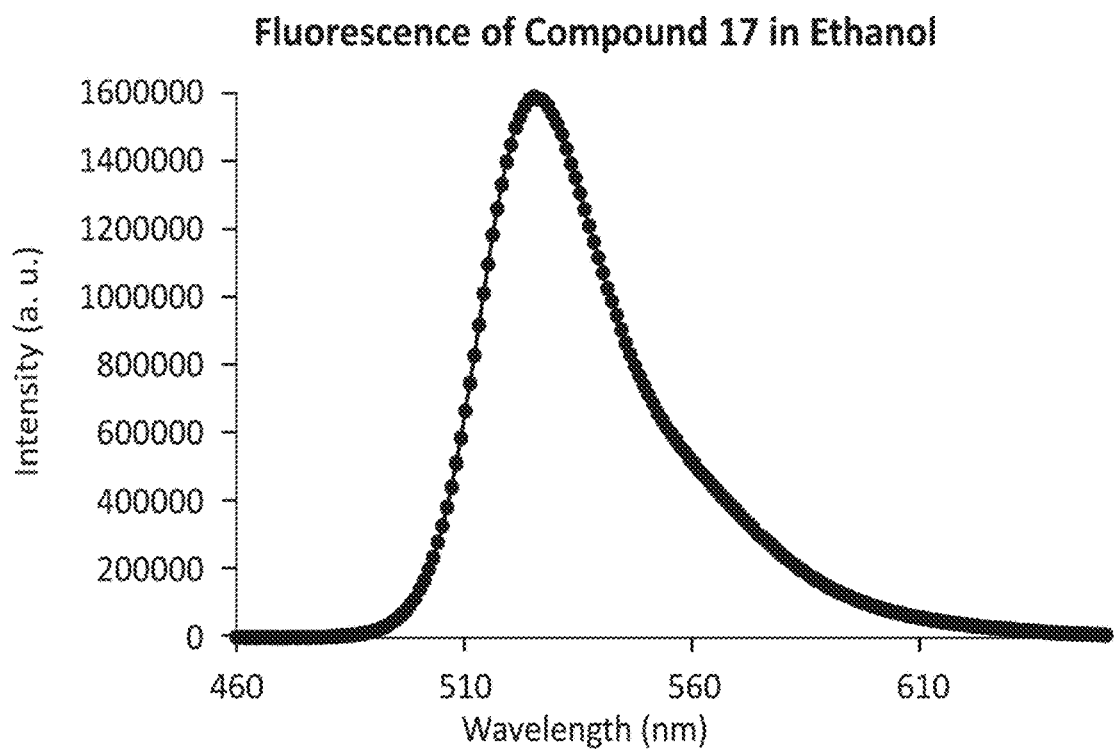

Fluorescence emission: 525 nm (in ethanol) (See FIG. 30B).

FWHM=35 nm.

Example 27

Synthesis of (Z)-N-(2,7-difluoro-9-(4-hydroxyphenyl)-6-((2,2,2-trifluoroethyl)amino)-3H-xanthen-3-ylidene)-2,2,2-trifluoroethanaminium (18)

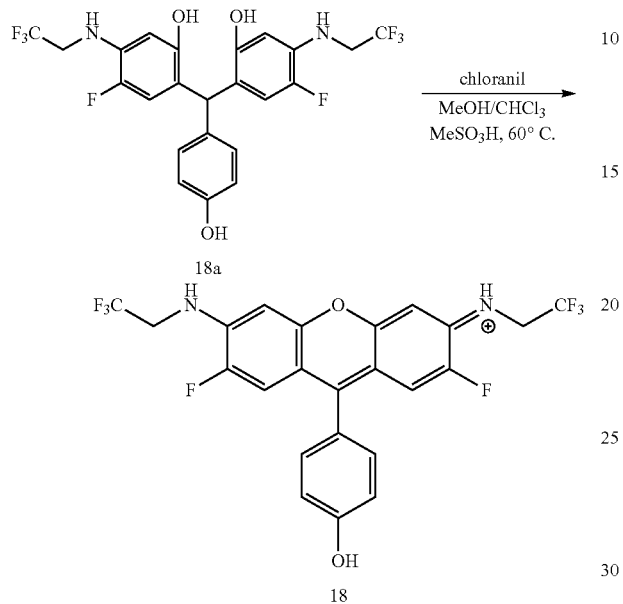

This process is based on B. R. Peterson et al. (*Beilstein J. Org. Chem.* 2012, 8, 2156-2165). To a stirred solution of 18a (0.262 gr, 0.5 mmol-See Example 20) and chloranil (0.185 gr, 0.8 mmol) in MeOH/CHCl₃ (1:1, 15 ml), MeSO₃H (1.4 ml) was added and the reaction mixture was heated at 60° C. for two hours. After reaction completion, solvents were evaporated, the crude was dissolved in EtOAc (25 ml) and washed with water (3×15 ml). The combined water fractions were extracted with THF (3×25 ml). The combined organic fractions were dried over MgSO₄ and concentrated under reduced pressure. Purification by flash column chromatography (SiO₂, Dichloromethane:Methanol) afforded the pure product 18 as a brown solid.

$^1$H NMR (DMSO-d6, 400 MHz): δ 8.94-8.90 (m, 2H), 7.62 (d, J=7.1 Hz, 2H), 7.46-7.39 (m, 4H), 7.11 (d, J=8.6 Hz, 2H), 4.51-4.47 (m, 4H).

Figure 31A:
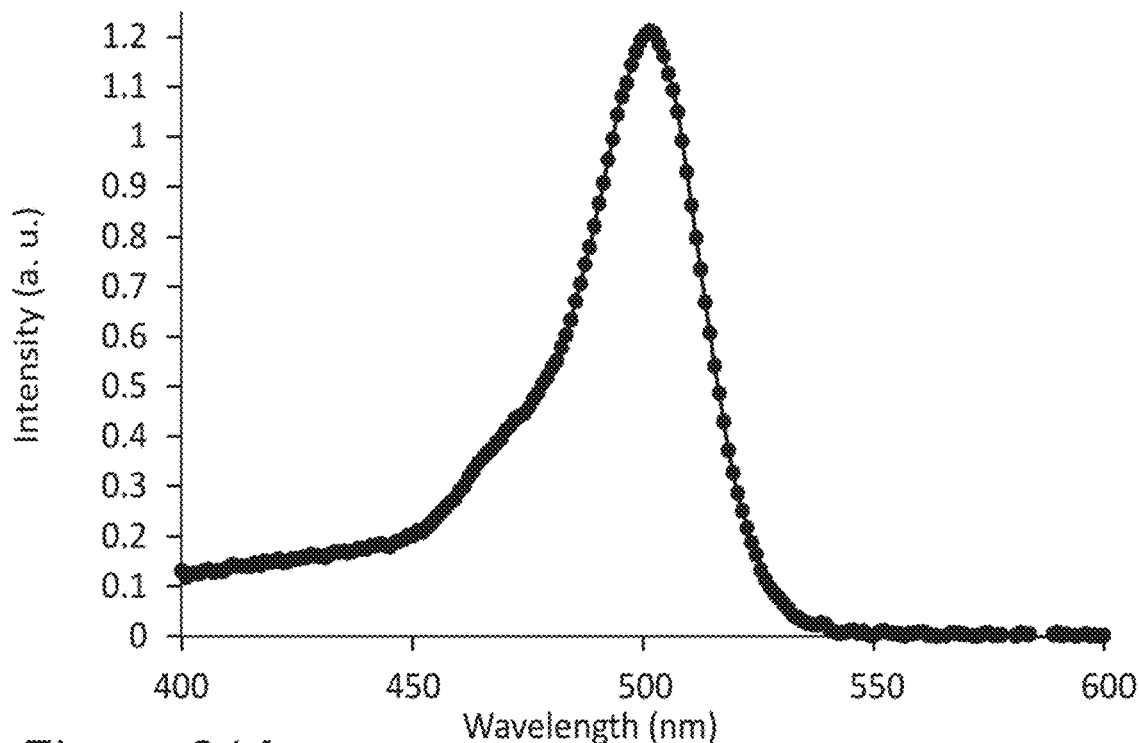
FIGS. 31A-31B depict absorption and emission spectra of compound 18 in ethanol.

UV-Vis absorption of Compound 18 is: 501 nm (in ethanol) (See FIG. 31A).

Figure 31B:
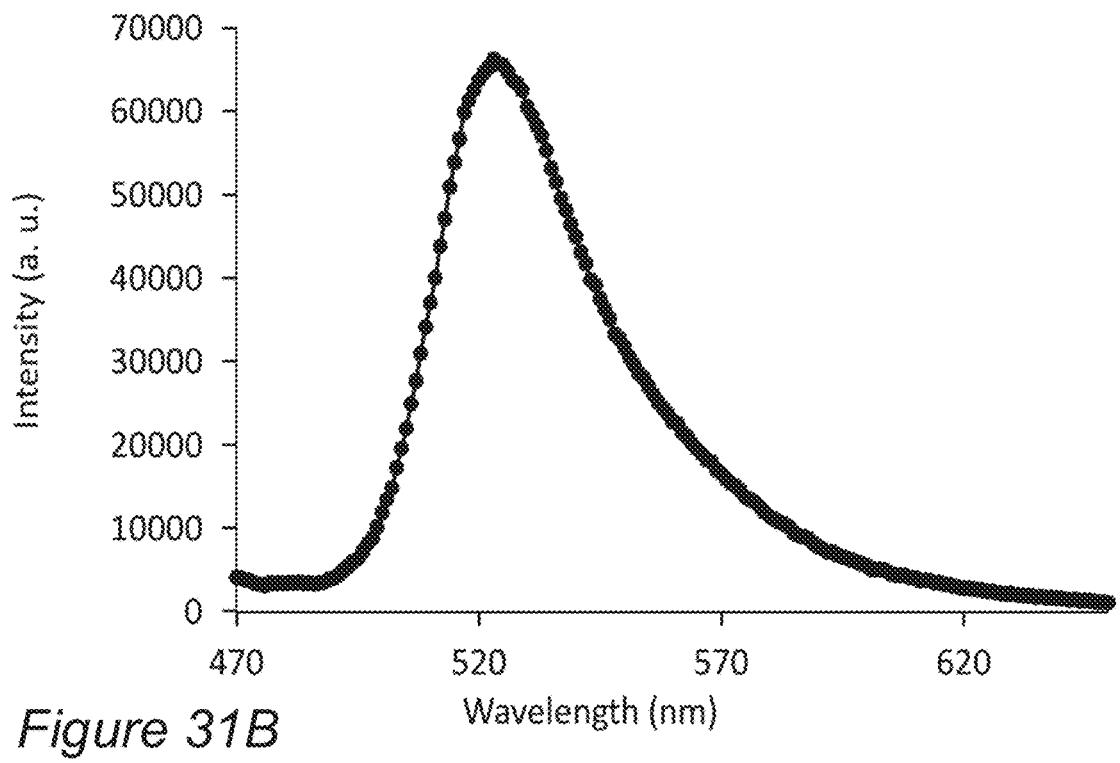

Fluorescence emission: 523 nm (in ethanol) (See FIG. 31B).

FWHM=41 nm.

Example 28

Synthesis of Compound 19b

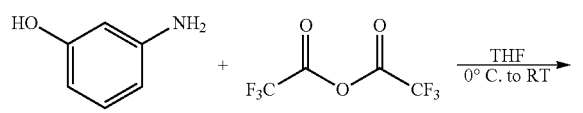

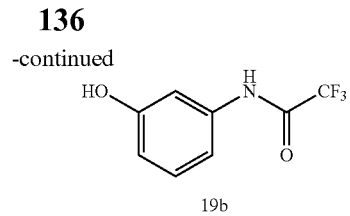

To a stirred solution of 3-aminophenol (3.00 gr. 27.49 mmol) in dry THF (78 ml), a solution of trifluoroacetic anhydride (4.66 ml, 32.99 mmol in 12 ml THF) was added dropwise at 0° C. The reaction was heated to room temperature and stirred overnight. The solution was then concentrated under reduced pressure, diluted with ethyl acetate and washed twice with saturated NaHCO₃ solution followed with brine. Finally, it was dried over MgSO₄ and the solvent was removed under reduced pressure to give 19b as an off-white solid.

Example 29

Synthesis of Compound 19a

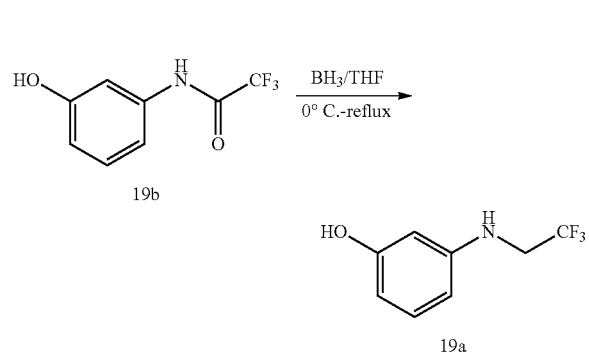

A solution of 19b (3.00 gr. 14.62 mmol) in dry THF (9.0 ml) was cooled to 0° C. under inert atmosphere. A solution of 1M BH₃ in THF (36.56 ml) was added dropwise. Then, the reaction was heated to reflux overnight. After the reaction was completed, it was allowed to cool to room temperature and quenched with MeOH (7.0 ml) followed with 1M NaOH. The product was extracted twice with ethyl acetate. The organic fractions were united and washed with saturated NaHCO₃, followed with brine, then dried over MgSO₄. The solvent was removed under reduced pressure. Purification by flash column chromatography (SiO₂, EtOAc: Hex) afforded the pure product 19a as a colourless oily liquid.

Example 30

Synthesis of Compound 19

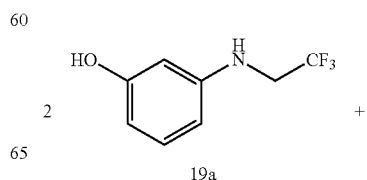

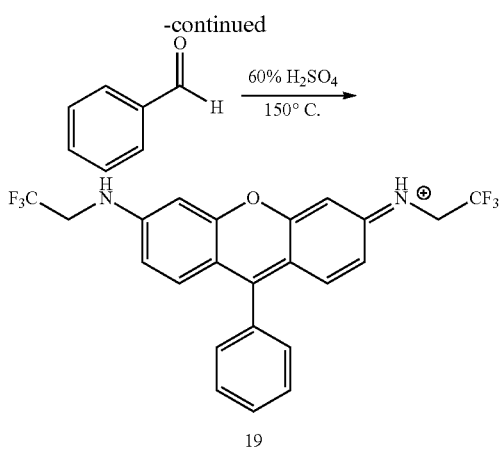

To a stirred solution of 19a (2.00 gr. 10.46 mmol) in 60% H₂SO₄ (17 ml), benzaldehyde (0.53 ml, 5.23 mmol) was added at 0° C. The reaction was heated to 150° C. for three hours. After the reaction was completed, it was cooled to 0° C. and neutralized with NaOH 10M. The crude product was extracted with THF, dried over MgSO₄, and the solvent was removed under reduced pressure.

$^1$H NMR (MeOD, 400 MHz): δ 7.73-7.67 (m, 3H), 7.54-7.49 (m, 2H), 7.48 (d, J=9.3 Hz, 2H), 7.18 (s, 2H), 7.13-7.04 (m, 2H), 4.31 (q, 4H).

Figure 32A:
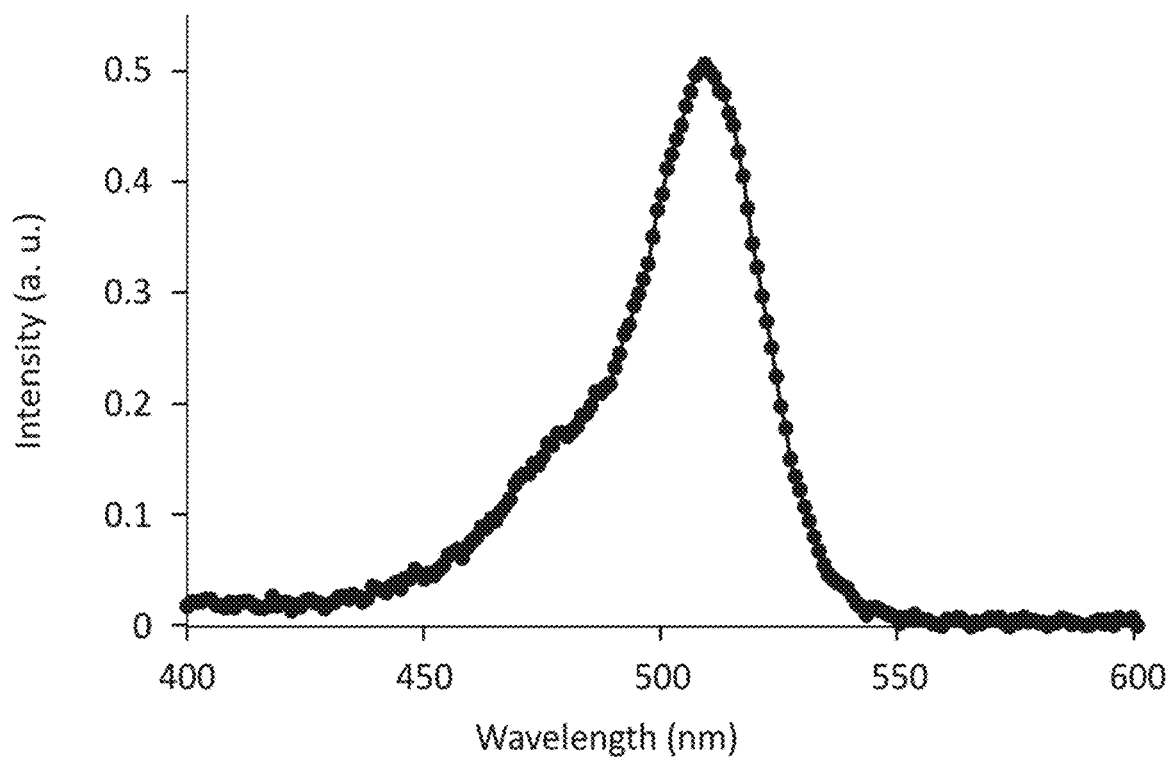
FIGS. 32A-32B depict absorption and emission spectra of compound 19 in ethanol.

UV-Vis absorption of Compound 19 is: 509 nm (in ethanol) (See FIG. 32A)

Figure 32B:
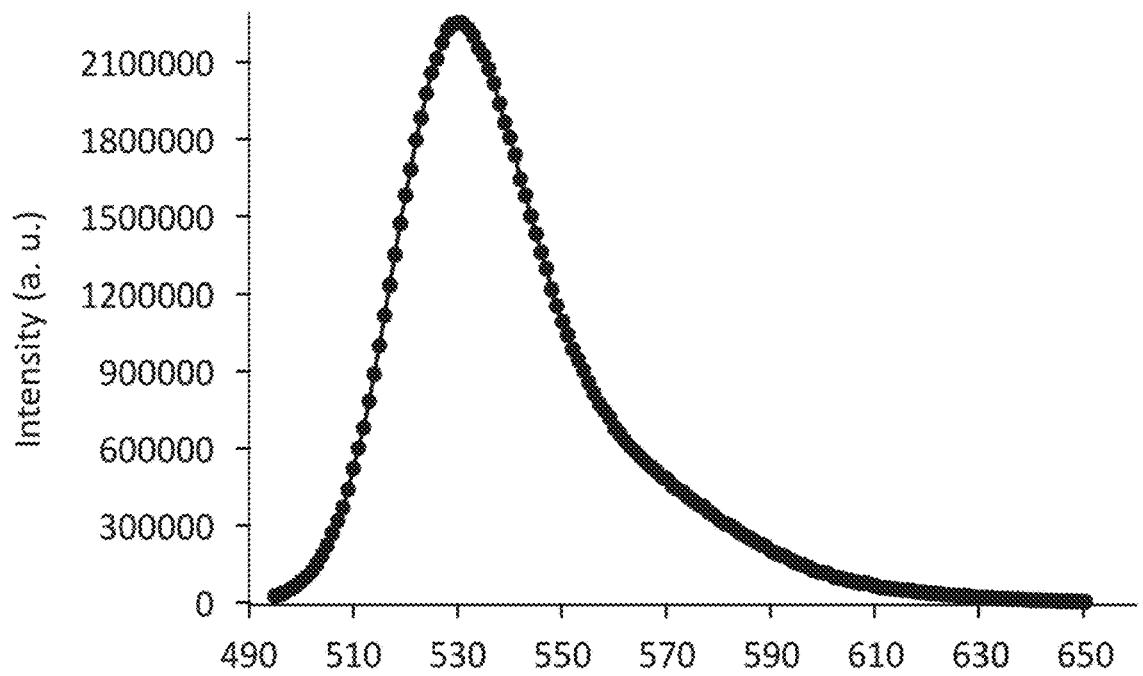

Fluorescence emission: 531 nm (in ethanol) (See FIG. 32B)

FWHM=34 nm

Quantum yield: 68%.

Example 31

Synthesis of Compound 20

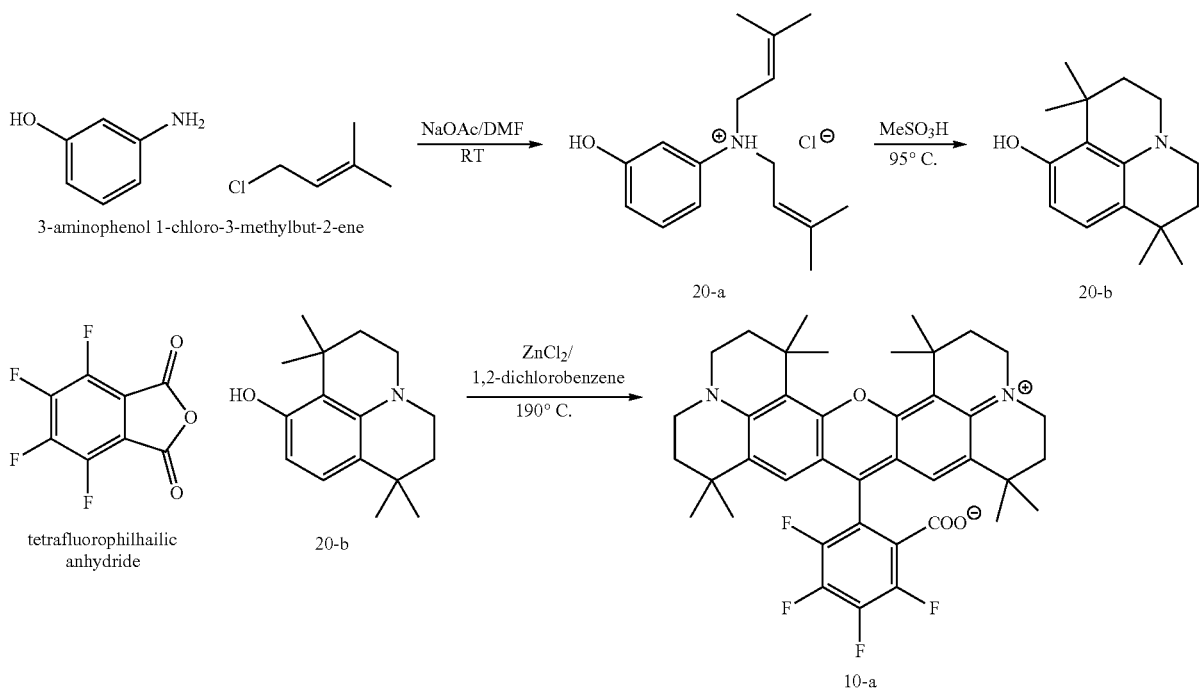

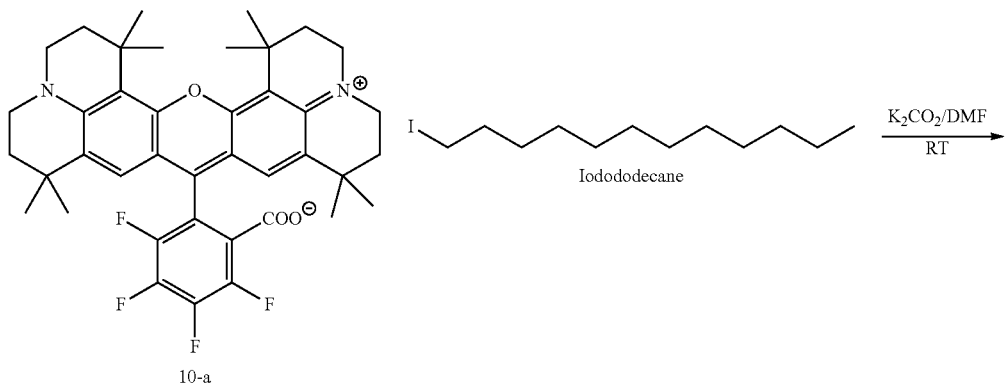

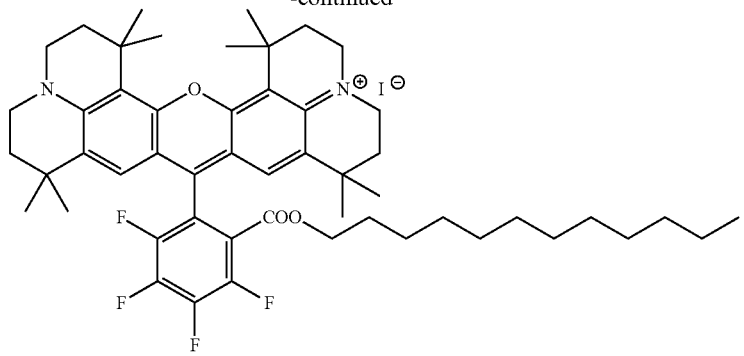

20

Step I

A mixture of 3-aminophenol (2.0 gr, 18.33 mmol), sodium acetate (4.1 gr, 49.48 mmol) and 1-chloro-3-methyl-2-butene (4.5 ml, 40.32 mmol) were stirred over night at room temperature in DMF (5 ml). The mixture was diluted with a saturated solution of ammonium chloride and extracted with diethyl ether. The organic phase was washed with brine. The solution was concentrated by reduced pressure, then diluted with 5 ml DMF and cooled in an ice bath. HCl 32% (30 ml) was added to the cold solution, and it was stirred for 20 minutes at room temperature. The product was then filtered and washed with THF to obtain 20-a as a white solid (2.14 gr).

Step II

A solution of 20-a (2.4 gr, 8.51 mmol) in methane sulfonic acid (25 ml) was heated to 95° C. for two hours. The reaction was allowed to cool to room temperature. Then, the solution was neutralized with ammonium hydroxide 28%. The solution was diluted with water and extracted twice with ethyl acetate. The combined organic phases were washed with brine and dried over $MgSO_4$. The solvent was removed by reduced pressure and the crude product was purified by column chromatography (1:9 EtOAc/Hexane) to give 20-b as a white solid.

Step III

A mixture of 20-b (461 mg, 1.88 mmol), tetrafluorophthalic anhydride (289 mg, 1.31 mmol), and $ZnCl_2$ (512 mg, 3.76 mmol) where heated to 140° C. under inert atmosphere. 1,2-dichlorobenzene (1.5 ml) was added and the solution was heated to 180° C. for four hours. The solution was cooled to room temperature, diluted with dichloromethane, washed with brine, and the solvent removed under reduced pressure. The crude product was purified by column chromatography (1:18 $MeOH/CH_2Cl_2$) to give 10-a as a dark purple solid.

Step IV

To a stirred solution of 10-a (260 mg, 0.36 mmol) and anhydrous potassium carbonate (76 mg, 0.55 mmol) in DMF (2.6 ml), iodododecane (271 µl, 1.10 mmol) was added under inert atmosphere. After the reaction had completed, the mixture was diluted with dichloromethane and washed with brine. Then, it was dried over $MgSO_4$ and the solvent was removed under reduced pressure. The crude product was purified by column chromatography (1:9 MeOH/$CH_2Cl_2$) to give 20 as a dark purple solid.

$^1$H-NMR (MeOD, 400 MHz): δ 6.95 (s, 2H), 3.86 (t, J=6.3 Hz, 2H), 3.70-3.66 (m, 4H), 3.62-3.59 (m, 4H), 1.94-1.91 (m, 4H), 1.79-1.78 (m, 4H), 1.76 (s, 12H), 1.28-1.03 (m, 32H), 0.92 (t, J=6.6 Hz, 3H).

$^{19}$F NMR (MeOD, 400 MHz): δ −140.29, −140.92, −153.37, −154.40.
UV-Vis absorption: 603 nm (in EtOH).
Fluorescence emission: 622 nm (in EtOH).
FWHM=36 nm.
Quantum yield: 66% (in ethanol).

Example 32

Synthesis of Compound 21

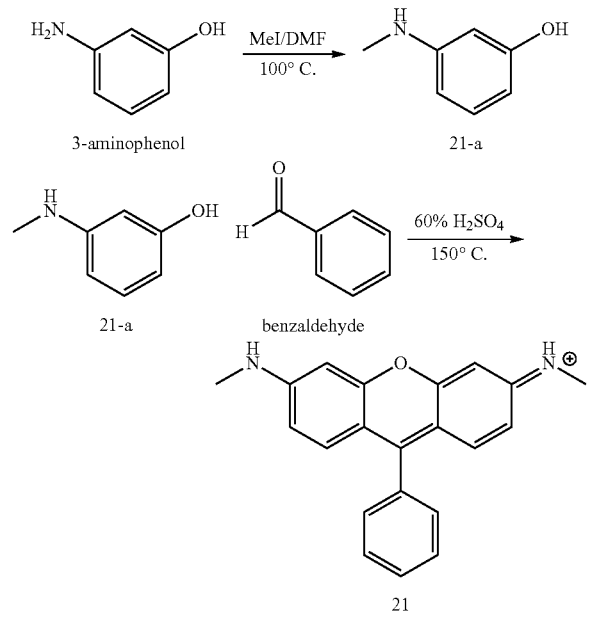

Step I

To a stirred solution of 3-aminophenol (2 gr, 18.33 mmol) and anhydrous potassium carbonate (3.80 gr, 27.49 mmol) in DMF (10 ml), methyl iodide (1.14 ml, 18.33 mmol) was added under inert atmosphere. The reaction was heated to 100° C. for three hours. The reaction was allowed to cool to room temperature and was filtered to remove the potassium carbonate. The solution was diluted with water and extracted twice with diethyl ether. Then, it was dried over $MgSO_4$ and the solvent was removed under reduced pressure. The crude product was purified by column chromatography (1:4 EtOAc/Hexane) to give 21-a as a yellow oily liquid.

Step II

To a stirred solution of 21-a (596 mg, 4.84 mmol) in 60% $H_2SO_4$ (7.8 ml), benzaldehyde (0.247 ml, 2.42 mmol) was added at 0° C. The reaction was heated to 150° C. for two hours. After the reaction was completed, it was cooled to 0° C. and neutralized with NaOH 10 M. The crude product was extracted with THF, dried over $MgSO_4$, and the solvent was removed under reduced pressure. The crude product was purified by column chromatography (1:9 MeOH/DCM) to give 21 as a dark pink solid.

$^1$H-NMR (MeOD, 400 MHz): δ 7.67-7.63 (m, 3H), 7.46-7.44 (m, 2H), 7.27-7.26 (m, 2H), 6.89-6.84 (m, 2H), 6.83-6.82 (m, 2H), 3.04 (s, 6H).

UV-Vis absorption: 528 nm (in EtOH).
Fluorescence emission: 549 nm (in EtOH).
FWHM=35 nm.
Quantum yield: 55% (in ethanol)

Example 33

Synthesis of Compound 22

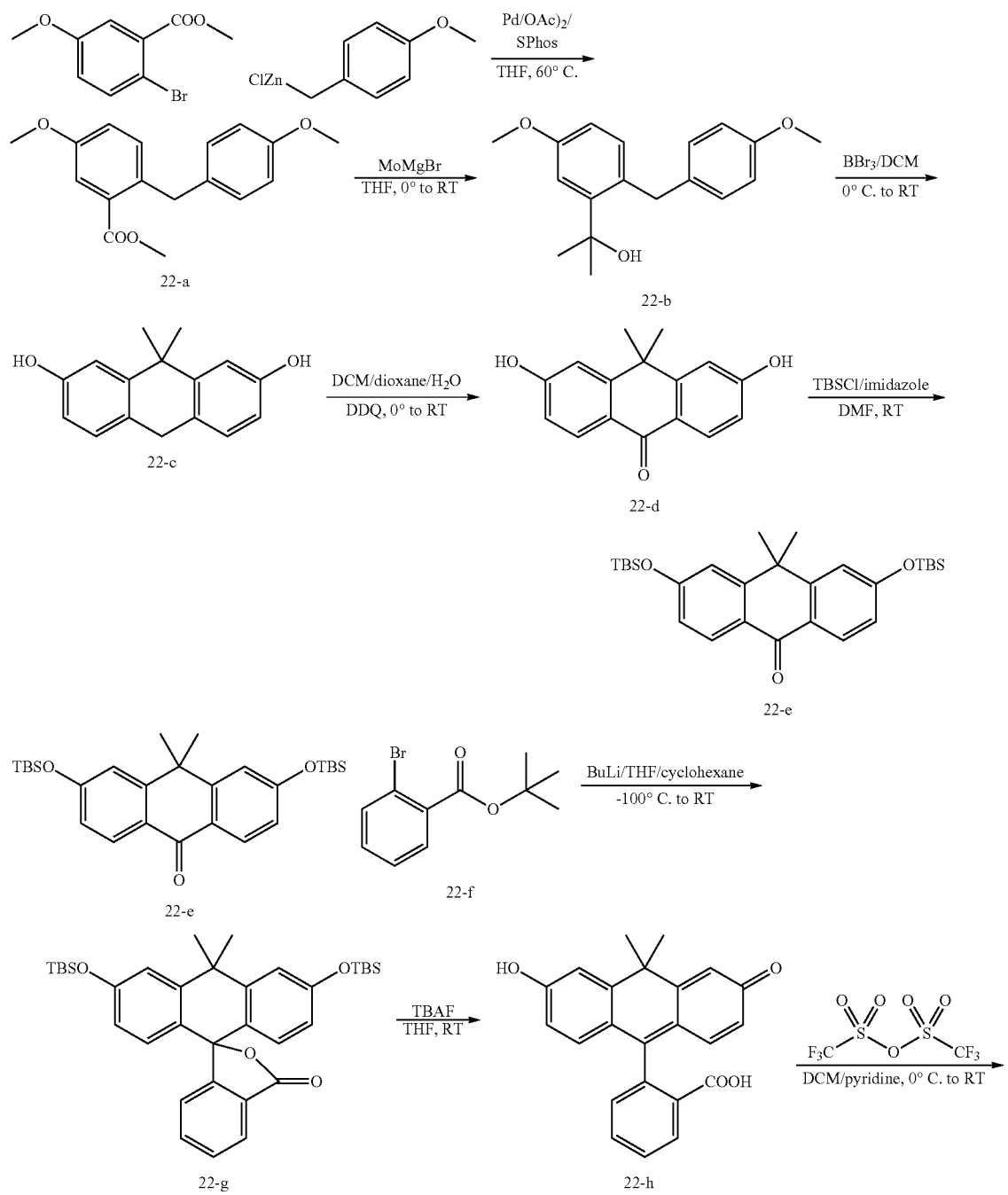

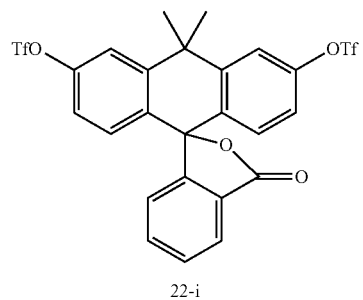

22-i

Pddba$_2$/XPhos/Cs$_2$CO$_3$
dioxane/azetidine, 100° C.

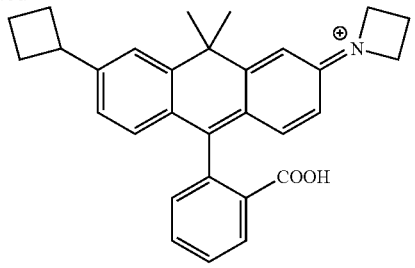

22-j

AcCl/MeOH
reflux

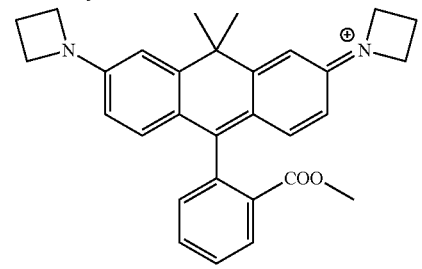

22

Step I

A round bottom flask equipped with a reflux condenser was charged with Pd(OAc)$_2$ (275 mg, 1.22 mmol, 0.05 eq) and SPhos (1.01 g, 2.45 mmol, 0.10 eq). The flask was evacuated and backfilled with nitrogen (3×). Degassed THF (100 ml) was added, followed by methyl 2-bromo-5-methoxybenzoate (6.00 g, 24.5 mmol) and 4-methoxybenzylzinc chloride (0.5 M in THF, 73.4 mL, 36.7 mmol, 1.5 eq). The reaction was stirred under nitrogen in a 60° C. oil bath for 6 hours. It was subsequently cooled to room temperature, quenched with saturated NH$_4$Cl, diluted with water, and extracted with ethyl acetate (2×). The combined organic extracts were washed with brine, dried (MgSO$_4$), filtered, and concentrated in vacuo. Flash chromatography on silica gel (0-20% EtOAc/hexanes, linear gradient) afforded 22-a 6.77 g (97%) as a pale yellow oil.

$^1$H NMR (CDCl$_3$, 400 MHz) δ 7.40 (d, J=2.8 Hz, 1H), 7.11 (d, J=8.5 Hz, 1H), 7.07-7.01 (m, 2H), 6.97 (dd, J=8.5, 2.8 Hz, 1H), 6.82-6.77 (m, 2H), 4.23 (s, 2H), 3.82 (s, 3H), 3.81 (s, 3H), 3.76 (s, 3H).

Step II

A solution of ester 22-a (6.51 g, 22.7 mmol) in THF (100 ml) was cooled to −78° C. under nitrogen. Methylmagnesium bromide (3 M in Et2O, 22.7 ml, 68.2 mmol, 3 eq) was added; the reaction was allowed to warm to room temperature and stirred overnight. It was subsequently quenched with saturated NH$_4$Cl, diluted with water, and extracted with ethyl acetate (2×). The combined organic extracts were washed with brine, dried (MgSO$_4$), filtered, and concentrated in vacuo. The residue was purified by silica gel chromatography (0-25% EtOAc/hexanes, linear gradient) to provide 22-b (5.70 g, 88%) as a colorless oil.

$^1$H NMR (CDCl$_3$, 400 MHz) δ 7.06-6.97 (m, 4H), 6.83-6.77 (m, 2H), 6.74 (dd, J=8.4, 2.8 Hz, 1H), 4.28 (s, 2H), 3.80 (s, 3H), 3.77 (s, 3H), 1.68 (s, 1H), 1.62 (s, 6H).

Step III

Alcohol 22-b (2.13 g, 7.44 mmol) was taken up in CH$_2$Cl$_2$ (50 ml) under nitrogen and cooled to 0° C. Boron tribromide (1 M in CH$_2$Cl$_2$, 26.8 ml, 26.8 mmol, 3.6 eq) was added dropwise. The reaction was warmed to room temperature and stirred for two hours. It was then carefully quenched with water (~50 ml) and vigorously stirred for 30 minutes. The mixture was neutralized (to pH ~7) with saturated NaHCO$_3$ and extracted with CH$_2$Cl$_2$ (2×) and ethyl acetate (2×). The combined organics were dried (MgSO$_4$), filtered, concentrated in vacuo, and deposited onto silica gel. Flash chromatography on silica gel (10.50% EtOAc/Hexanes, linear gradient; dry load with silica gel yielded 1.62 g (91%) of 22-c as an air-sensitive, off-white solid.

$^1$H NMR (DMSOd6, 400 MHz) δ 9.08 (s, 2H), 7.04 (d, J=8.1 Hz, 2H), 6.91 (d, J=2.4 Hz, 2H), 6.57 (dd, J=8.1, 2.4 Hz, 2H), 3.79 (s, 2H), 1.44 (s, 6H).

Step IV

Phenol 22-c (3.66 g, 15.2 mmol) was taken up in a mixture of CH$_2$Cl$_2$ (100 ml) and dioxane (50 ml), and water (12.5 ml) was added. The mixture was cooled to 0° C., and DDQ (10.37 g, 45.7 mmol, 3 eq) was added. The reaction was warmed to room temperature and stirred overnight. The crude reaction mixture was deposited onto Celite and concentrated to dryness. Flash chromatography (10-100% EtOAc/Hexanes, linear gradient; dry load with Celite) afforded 22-d (3.34 g, 86%) as a yellow-orange foam.

$^1$H NMR (DMSO-d6, 400 MHz) δ 10.31 (s, 2H), 8.03 (d, J=8.6 Hz, 2H), 7.09 (d, J=2.3 Hz, 2H), 6.86 (dd, J=8.6, 2.3 Hz, 2H), 1.60 (s, 6H).

Step V

To a solution of 22-d (2.99 g, 11.8 mmol) in DMF (60 mL) were added imidazole (2.40 g, 35.3 mmol, 3 eq) and TBSCl (5.32 g, 35.3 mmol, 3 eq). The reaction was stirred at room temperature for three hours. It was subsequently diluted with water and extracted with ethyl acetate (2×). The combined organic extracts were washed with water and brine, dried (MgSO$_4$), filtered, and concentrated in vacuo. Silica gel chromatography (0-10% EtOAc/hexanes, linear gradient) afforded 5.47 g (96%) of 22-e as a colorless solid.

$^1$H NMR (CDCl3, 400 MHz) δ 8.26 (d, J=8.6 Hz, 2H), 7.04 (d, J=2.3 Hz, 2H), 6.88 (dd, J=8.6, 2.3 Hz, 2H), 1.67 (s, 6H), 1.02 (s, 18H), 0.27 (s, 12H).

Step VI

In a 50 ml round bottom flask, a degassed solution of 22-f (479 mg, 1.864 mmol, 2 eq) in anhydrous THF (5.2 ml) and pentane (2.1 ml) was cooled to −100° C. (bath temperature, diethyl ether—liquid nitrogen). N-Butyllithium (0.93 ml, 2M solution in cyclohexane, 1.86 mmol, 2 eq) was added dropwise. The solution was stirred at −100° C. for 10 minutes, and the solution of 22-e in THF (450 mg, 0.93 mmol, in 2.6 ml) was added dropwise. The flask was then placed into a −80° C. (bath temperature, ethyl acetate—liquid nitrogen) and the solution was stirred for 10 minutes. The cooling bath was removed, the mixture was allowed to warm to room temperature and stirred for further 30 minutes. The reaction was quenched with water (2.6 ml), adjusted to pH ~5 with acetic acid, extracted with ethyl acetate. The combined organic layers were washed with brine and dried over $Na_2SO_4$. The crude product was obtained as an orange solid, which could be used in the next step as 22-g.

$^1$H NMR (CDCl$_3$, 400 MHz) δ 8.03-7.97 (m, 1H), 7.61 (td, J=7.4, 1.4 Hz, 1H), 7.56 (td, J=7.4, 1.3 Hz, 1H), 7.08-7.02 (m, 3H), 6.63-6.57 (m, 4H), 1.80 (s, 3H), 1.71 (s, 3H), 0.98 (s, 18H), 0.20 (s, 12H).

Step VII

To a solution of silyl ether 22-g (314 mg, 0.535 mmol) in THF (8 mL) was added TBAF (1.0 M in THF, 2.14 ml, 2.14 mmol, 4 eq). The reaction was stirred at room temperature for 30 minutes. It was subsequently acidified with 1N HCl, diluted with water, and extracted with ethyl acetate (2×). The organic extracts were dried ($MgSO_4$), filtered, evaporated, and deposited onto silica gel. Flash chromatography (20-100% EtOAc/hexanes, linear gradient, with constant 1% v/v AcOH additive; dry load with silica gel) yielded 22-h (190 mg, 99%) as a pale orange solid.

$^1$H NMR (MeOD, 400 MHz) δ 7.98 (dt, J=7.5, 1.0 Hz, 1H), 7.70 (td, J=7.5, 1.2 Hz, 1H), 7.64 (td, J=7.5, 1.0 Hz, 1H), 7.10 (d, J=2.4 Hz, 2H), 7.08-7.02 (m, 1H), 6.58 (dd, J=8.6, 2.5 Hz, 2H), 6.52 (d, J=8.6 Hz, 2H), 1.81 (s, 3H), 1.70 (s, 3H).

Step VIII

Carbofluorescein 22-h (190 mg, 0.530 mmol) was taken up in $CH_2Cl_2$ (5 ml) and cooled to 0° C. Pyridine (343 μl, 4.24 mmol, 8.0 eq) and trifluoromethanesulfonic anhydride (357 μl, 2.12 mmol, 4.0 eq) were added, and the ice bath was removed. The reaction was stirred at room temperature for one hour. It was subsequently diluted with water and extracted with $CH_2Cl_2$ (2×). The combined organic extracts were washed with brine, dried ($MgSO_4$), filtered, and concentrated in vacuo. Flash chromatography on silica gel (0-25% EtOAc/hexanes, linear gradient) afforded 250 mg (76%) of 22-i as a colorless foam.

$^1$H NMR (CDCl$_3$, 400 MHz) δ 8.11-8.04 (m, 1H), 7.73-7.63 (m, 2H), 7.55 (d, J=2.5 Hz, 2H), 7.09 (dd, J=8.8, 2.5 Hz, 2H), 7.07-7.02 (m, 1H), 6.90 (d, J=8.8 Hz, 2H), 1.90 (s, 3H), 1.80 (s, 3H).

Step IX

Carbofluorescein ditriflate 22-i (75 mg, 0.120 mmol), Pd$_2$(dba)$_3$ (11 mg, 0.012 mmol), XPhos (17 mg, 0.036 mmol), and Cs$_2$CO$_3$ (204 mg, 0.626 mmol) were stirred under inert atmosphere in anhydrous dioxane (0.96 ml). Azetidine hydrochloride (27 mg, 0.289 mmol) was added, and the reaction was heated to 100° C. for 18 hours. It was then cooled to room temperature, diluted with methanol, deposited onto Celite, and concentrated to dryness. The crude product was purified by Flash chromatography on silica gel (0-10% MeOH/DCM), linear gradient, dry load with Celite) to afford 22-j as a pale blue solid.

$^1$H NMR (CDCl$_3$, 400 MHz) δ 8.00-7.95 (m, 1H), 7.58 (td, J=7.4, 1.4 Hz, 1H), 7.53 (td, J=7.4, 1.2 Hz, 1H), 7.08-7.03 (m, 1H), 6.58 (d, J=2.4 Hz, 2H), 6.55 (d, J=8.5 Hz, 2H), 6.20 (dd, J=8.6 Hz, 2H), 3.90 (t, J=7.2 Hz, 8H), 2.37 (p, J=7.2 Hz, 4H), 1.82 (s, 3H), 1.72 (s, 3H).

UV-Vis absorption: 598 nm (in EtOH).
Fluorescence emission: 626 nm (in EtOH).
FWHM=41 nm.
Quantum yield: 65% (in ethanol)

Step X

A stirred solution of carborhodamine 22-j (100 mg, 0.240 mmol) in methanol (25 ml) was cooled to 0° C. under inert atmosphere. Acetyl chloride (1.1 ml, 15.7 mmol) was added dropwise. Then, the solution was heated to reflux. After the reaction was completed, the solvent was removed under reduced pressure and the crude product was purified by flash chromatography on silica gel (MeOH/DCM) to afford 22.

Example 34

Synthesis of Compound 26

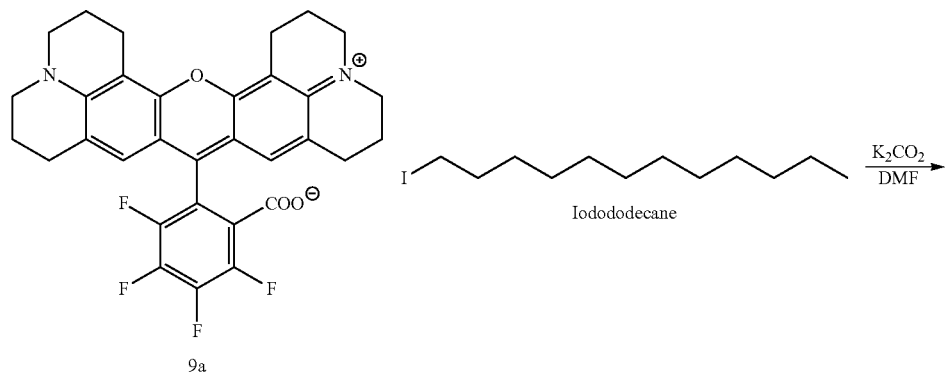

9a

-continued

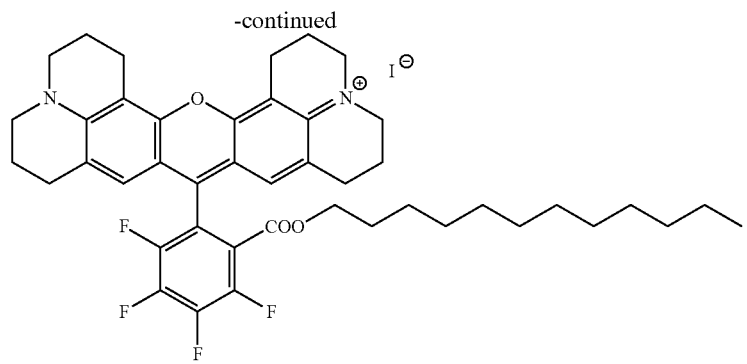

26

Compound 9a (0.10 gr, 0.17 mmol) was dissolved in dry DMF (1.0 ml) under nitrogen atmosphere. Potassium carbonate (0.037 gr, 0.26 mmol) was added followed by 1-iodododecane (131 µl, 0.53 mmol). The mixture was stirred for one hour at room temperature. Upon completion, the mixture was diluted with DCM and washed with brine. The organic layer was separated, dried with magnesium sulfate, and the solvent was evaporated under reduced pressure. The crude product was purified by column chromatography (0-10% MeOH/DCM) to give 26 as a dark blue solid (94% yield).

$^1$H NMR (400 MHz, MeOD $d_4$): δ 6.88 [s, 2H], 3.96 [t, J=6.3 Hz, 2H], 3.59-3.54 [m, 8H], 3.08-3.05 [m, 4H], 2.79-2.76 [m, 4H], 2.13-2.10 [m, 4H], 2.00-1.97 [m, 4H], 1.33-1.21 [m, 14], 1.19-1.04 [m, 6H], 0.92-0.89 [m, 3H].

$^{19}$F NMR (400 MHz, MeOD $d_4$): δ 140.69, −140.80, −153.64, −155.92.

Figure 33A:
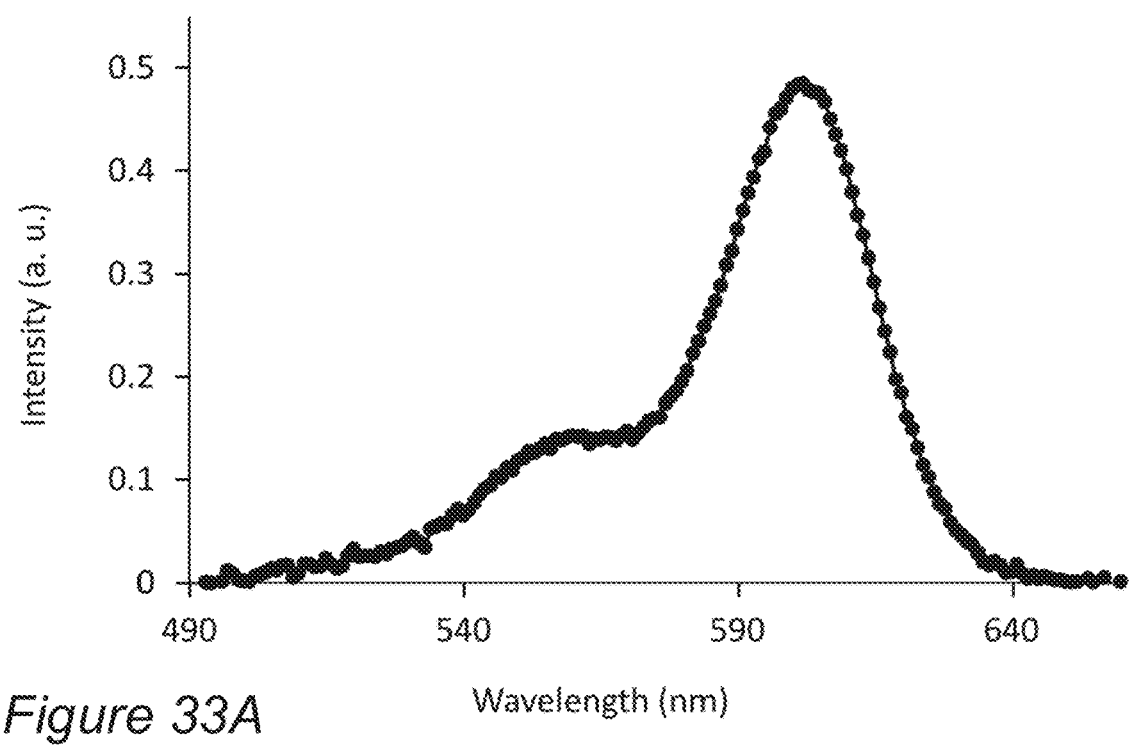
FIGS. 33A-33B depict absorption and emission spectra of compound 26 in ethanol.
Figure 33B:
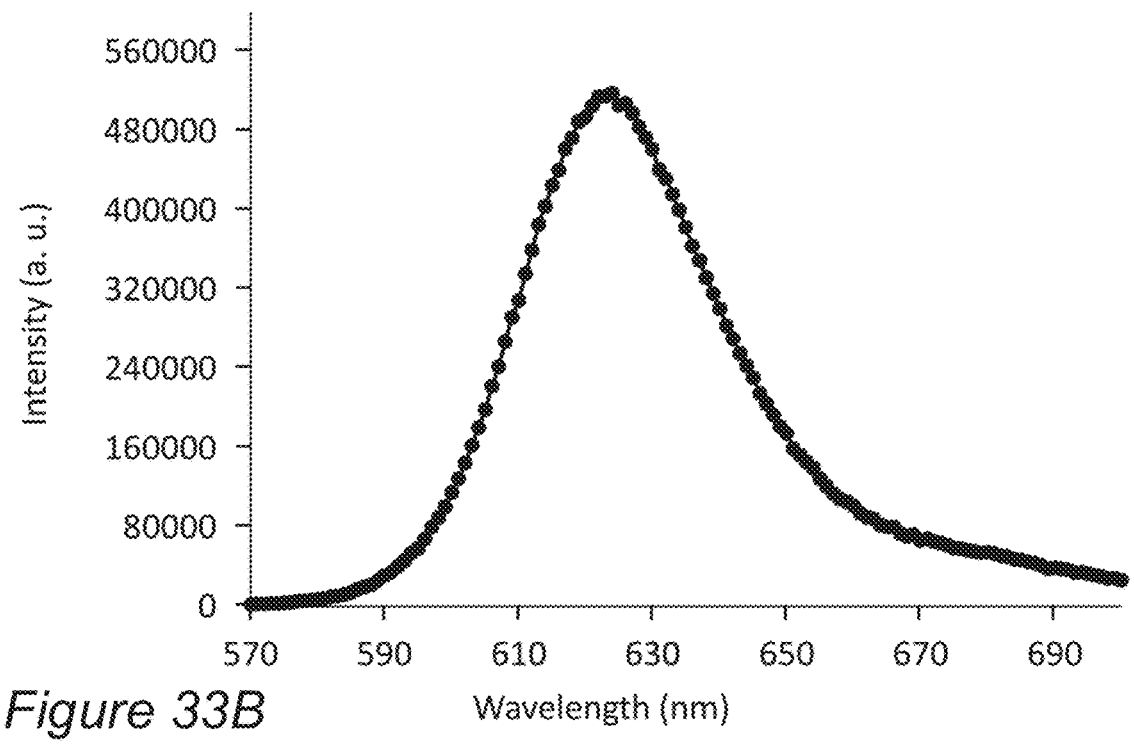
Figure 34A:
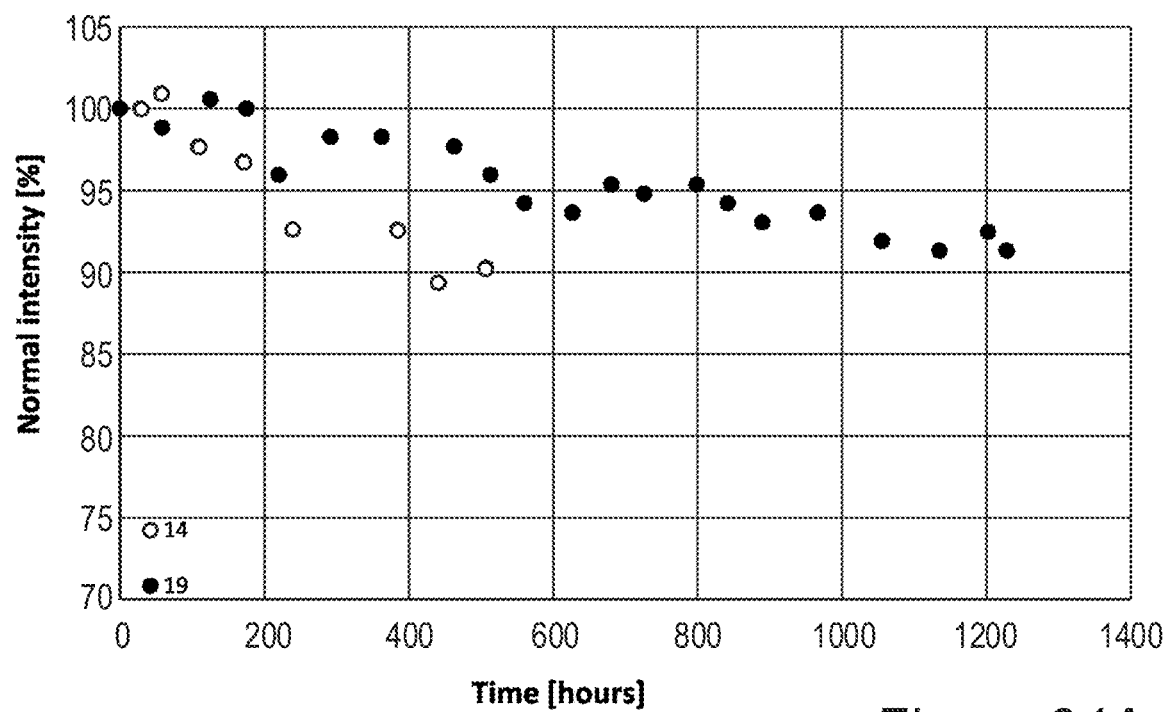
FIGS. 34A-34B depict photostability data for compounds 14 and 19.
Figure 34B:
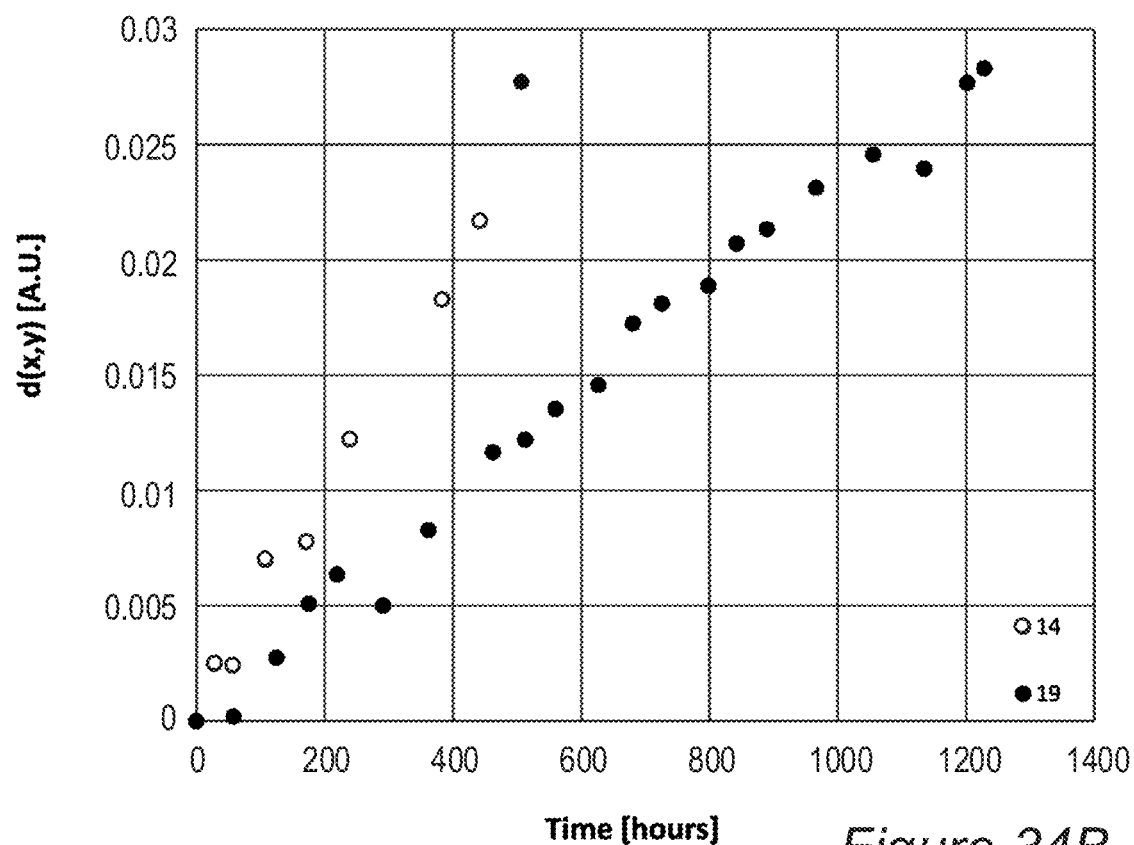

UV-Vis absorption: 602 nm (in EtOH) (See FIG. 33A)
Fluorescence emission: 621 nm (in EtOH) (See FIG. 33B)
FWHM=36 nm
Quantum Yield: 69% (in EtOH)

Example 35

Photostability of Compounds 19 and 14

Both compounds 14 and 19 showed very good photostability in a photoluminescent device (FIGS. 22A-B). The emission intensities of both compounds decayed to some extent after about 500 hours; however, compound 14 decayed more rapidly (FIG. 22A compound 14 and FIG. 22B compound 19). When compared, compound 19 displayed better photostability than compound 14 in terms of chromaticity i.e. smaller change in d(x,y). Photoluminescent devices were fabricated as described in US Publication No. 2017/0137630; briefly, compound 14 in trimethoxy(3,3,3-trifluoropropyl)silane ($F_1$TMOS) and compound 26 in trimethoxyphenylsilane (PhTMOS) and compound 19 in $F_1$TMOS and compound 26 in PhTMOS were measured in a Flame Oceanview Spectrometer at a temperature of 60° C., in a flux of 3 mW/cm² and excited at a wavelength of 452 nm.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

We claim:
1. An LCD (liquid crystal display) comprising:
a backlight unit configured to provide illumination, and
an LCD panel configured to receive illumination from the backlight unit and comprising, sequentially with respect to the received illumination: a polarizing film, a liquid crystal layer, an analyzer film, an RGB (red, green, blue) color filter layer which is integrated with a color conversion film that is folded into a zig-zag shape, and a protective layer, the RGB color filter layer comprises RBG filters, wherein in respect to the received illumination—the RGB filters follows the color conversion film; wherein each of the RGB color filters is configured to (a) pass a RGB light component and (b) to remove two other RGB light components;
wherein the color conversion film comprises rhodamine-based fluorescent (RBF) compounds selected to (a) absorb illumination from the backlight unit, (b) perform color conversion and (c) emit emitted radiation, wherein the RBF compounds have at least one of a Red emission peak and a Green emission peak;

wherein the color conversion film is positioned between a first optical element that comprises a dual brightness enhancement film (DBEF) film which is transparent to blue light and reflective to red and green light, and a second optical element that comprises another DBEF film that is transparent to the blue light and reflective to the red and green light.

2. An LCD (liquid crystal display) comprising:
a backlight unit configured to provide illumination, and
an LCD panel configured to receive illumination from the backlight unit and comprising, sequentially with respect to the received illumination: a polarizing film, a liquid crystal layer, an analyzer film, an RGB (red, green, blue) color filter layer which is integrated with a color conversion film that is folded into a zig-zag shape, and a protective layer, the RGB color filter layer comprises RGB color filters, wherein in respect to the received illumination—the RGB filters follows the color conversion layer, wherein each of the RGB color filters is configured to (a) pass a RGB light component and (b) to remove two other RGB light components;

wherein the color conversion film further comprises at least one fluorescent compound selected to have, when embedded in the color conversion film, an absorption peak outside a respective transmission region of one of the RGB filters and a fluorescence peak inside the respective transmission region of a RGB filter of the RGB filters, wherein the color conversion film comprises rhodamine-based fluorescent (RBF) compounds selected to (a) absorb illumination from the backlight unit, (b) perform color conversion and (c) emit emitted radiation, wherein the RBF compounds have at least one of a Red emission peak and a Green emission peak; and wherein the color conversion film is positioned between a first optical element that comprises a dual brightness enhancement film (DBEF) film which is transparent to blue light and reflective to red and green light, and a second optical element that comprises another DBEF film that is transparent to the blue light and reflective to the red and green light.

3. An LCD (liquid crystal display) comprising:
a backlight unit configured to provide illumination, and
an LCD panel configured to receive illumination from the backlight unit and comprising, sequentially with respect to the received illumination: a polarizing film, a liquid crystal layer, an analyzer film, an RGB (red, green, blue) color filter layer which is integrated with a color conversion film, and a protective layer, the RGB color filter layer comprises RGB color filters, wherein in respect to the received illumination—the RGB filters follows the color conversion layer, wherein each of the RGB color filters is configured to (a) pass a RGB light component and (b) to remove two other RGB light components;

wherein the color conversion film is positioned between a first optical element that comprises a dual brightness enhancement film (DBEF) film which is transparent to blue light and reflective to red and green light, and a second optical element that comprises another DBEF film that is transparent to the blue light and reflective to the red and green light;

wherein the color conversion film further comprises at least one fluorescent compound selected to have, when embedded in the color conversion film, an absorption peak outside a respective transmission region of one of the RGB filters and a fluorescence peak inside the respective transmission region of a RGB filter of the RGB filters; and wherein the color conversion film comprises rhodamine-based fluorescent (RBF) compounds selected to (a) absorb illumination from the backlight unit, (b) perform color conversion and (c) emit emitted radiation, wherein the RBF compounds have at least one of a Red emission peak and a Green emission peak.

* * * * *